(12) United States Patent
Campos et al.

(10) Patent No.: US 10,636,974 B2
(45) Date of Patent: Apr. 28, 2020

(54) MOLECULAR COMPOSITIONS, MATERIALS, AND METHODS FOR EFFICIENT MULTIPLE EXCITON GENERATION

(71) Applicants: THE TRUSTEES OF COLUMBIA UNIVERSITY IN THE CITY OF NEW YORK, New York, NY (US); BROOKHAVEN SCIENCE ASSOCIATES, LLC, Upton, NY (US)

(72) Inventors: Luis Miguel Campos, Brooklyn, NY (US); Matthew Y. Sfeir, Bethpage, NY (US); Jianlong Xia, New York, NY (US); Erik Michael Allan Busby, Patchogue, NY (US); Jonathan Zhaozhi Low, New York, NY (US)

(73) Assignees: THE TRUSTEES OF COLUMBIA UNIVERSITY IN THE CITY OF NEW YORK, New York, NY (US); BROOKHAVEN SCIENCE ASSOCIATES, LLC., Upton, NY (US)

(*) Notice: Subject to any disclaimer, the term of this patent is extended or adjusted under 35 U.S.C. 154(b) by 80 days.

(21) Appl. No.: 15/333,043

(22) Filed: Oct. 24, 2016

(65) Prior Publication Data

US 2017/0141318 A1 May 18, 2017

Related U.S. Application Data

(63) Continuation-in-part of application No. PCT/US2015/027660, filed on Apr. 24, 2015, and a
(Continued)

(51) Int. Cl.
*C08G 61/00* (2006.01)
*H01L 51/00* (2006.01)
(Continued)

(52) U.S. Cl.
CPC ........ *H01L 51/0036* (2013.01); *C08G 61/126* (2013.01); *H01L 51/0043* (2013.01);
(Continued)

(58) Field of Classification Search
CPC .......... C08G 2261/124; C08G 2261/18; C08G 2261/91; H01L 51/42
See application file for complete search history.

(56) References Cited

U.S. PATENT DOCUMENTS 5,198,153 A 3/1993 Angelpoulos et al.
5,892,244 A 4/1999 Tanaka et al.
(Continued)

FOREIGN PATENT DOCUMENTS

EP 0528662 B1 2/1995
EP 0889350 A1 1/1999
(Continued)

OTHER PUBLICATIONS

Dell et al., "The Preparation of Thiophene-S, S-dioxides and Their Role in organic Electronics", Journal of Materials Chemistry, 2012, vol. 22, pp. 12945-12952.*
(Continued)

*Primary Examiner* — Mark S Kaucher
(74) *Attorney, Agent, or Firm* — Hunton Andrews Kurth LLP

(57) ABSTRACT

Embodiments of the present invention provides compounds, compositions, and methods for their preparation that provide efficient intramolecular fission, such that local order and strong nearest neighbor coupling is no longer a design constraint. Inventive materials include organic oligomers and polymers designed to exhibit strong intrachain donor-acceptor interactions and provide intramolecular singlet fission, whereby triplet populations can be generated in very high yields of, e.g., 170% or more. The inventive disclosure
(Continued)

is directed to polymers of the general formula: [SA-SD]n with a strong electron acceptor (SA), a strong electron donor (SD), and n a positive integer equal to or greater than two; methods for their preparation and monomers used therein, blends, mixtures and formulations containing them; the use of the polymers, blends, mixtures and formulations as semiconductors in organic electronic (OE) devices, especially in organic photovoltaic (OPV) devices, and to OE and OPV devices comprising these polymers, blends, mixtures or formulations.

14 Claims, 52 Drawing Sheets
(6 of 52 Drawing Sheet(s) Filed in Color)

Related U.S. Application Data continuation-in-part of application No. PCT/US2015/000309, filed on Dec. 23, 2015.

(60) Provisional application No. 61/983,996, filed on Apr. 24, 2014, provisional application No. 62/124,596, filed on Dec. 23, 2014.

(51) Int. Cl.

| | |
|---|---|
| C08G 61/12 | (2006.01) |
| H01L 51/42 | (2006.01) |
| H01L 51/05 | (2006.01) |
| H01L 51/50 | (2006.01) |

(52) U.S. Cl.
CPC .... *H01L 51/4253* (2013.01); *C08G 2261/124* (2013.01); *C08G 2261/1412* (2013.01); *C08G 2261/1424* (2013.01); *C08G 2261/18* (2013.01); *C08G 2261/228* (2013.01); *C08G 2261/3223* (2013.01); *C08G 2261/3243* (2013.01); *C08G 2261/334* (2013.01); *C08G 2261/344* (2013.01); *C08G 2261/414* (2013.01); *C08G 2261/514* (2013.01); *C08G 2261/91* (2013.01); *H01L 51/0558* (2013.01); *H01L 51/42* (2013.01); *H01L 51/5012* (2013.01); *Y02E 10/549* (2013.01)

(56) References Cited

U.S. PATENT DOCUMENTS

| | | | |
|---|---|---|---|
| 5,998,804 | A | 12/1999 | Suh et al. |
| 6,723,394 | B1 | 4/2004 | Sirringhaus et al. |
| 7,095,044 | B2 | 8/2006 | Brown et al. |
| 7,868,302 | B2 | 1/2011 | Alexander et al. |
| 8,106,289 | B2 | 7/2012 | Dutta |
| 8,426,725 | B2 | 4/2013 | Woods et al. |
| 8,691,931 | B2 * | 4/2014 | Brown .......... C07D 487/04 136/263 |
| 2003/0021913 | A1 | 1/2003 | O'Neill et al. |
| 2007/0102696 | A1 | 5/2007 | Brown et al. |
| 2009/0044864 | A1 | 2/2009 | Thompson et al. |
| 2010/0193011 | A1 | 8/2010 | Mapel et al. |
| 2011/0114184 | A1 * | 5/2011 | Brown .......... C07D 487/04 136/263 |
| 2012/0211074 | A1 | 8/2012 | Sager et al. |
| 2012/0228586 | A1 | 9/2012 | Thompson et al. |
| 2012/0292594 | A1 | 11/2012 | Zhou et al. |
| 2013/0009131 | A1 | 1/2013 | Kazlas et al. |
| 2013/0043434 | A1 | 2/2013 | Tierney et al. |
| 2013/0098448 | A1 | 4/2013 | Zhu et al. |
| 2013/0240850 | A1 | 9/2013 | Forrest et al. |
| 2013/0248831 | A1 | 9/2013 | Pan et al. |
| 2013/0312801 | A1 | 11/2013 | Carroll |
| 2014/0224329 | A1 * | 8/2014 | Congreve .......... H01L 51/0055 136/263 |

FOREIGN PATENT DOCUMENTS

| | | | |
|---|---|---|---|
| WO | 9621659 | 7/1996 | |
| WO | WO-2013168709 A1 * | 11/2013 | .......... C07D 471/04 |

OTHER PUBLICATIONS

International Search Report for International Patent Application No. PCT/ 2015/000309 dated Jun. 3, 2016.
International Written Opinion for International Patent Application No. PCT/US2015/000309 dated Jun. 3, 2016.
International Search Report for International Patent Application No. PCT/US2015/027660 dated Sep. 2, 2015.
International Written Opinion for International Patent Application No. PCT/US2015/027660 dated Sep. 2, 2015.
Tautz et al al., "Charge Photogeneration in Donor-Acceptor Conjugated Materials: Influence of Excess Excitation Energy and Chain Lengths" J. Am. Chem Soc. 2013,pp. 4282-4290.
Farinola et al., "Fluorinated poly(p-phenylenevinylene)s: Synthesis and Optical Properties of an Intriguing Class of . . . ", Materials, 2010, vol. 3, pp. 3077-3091.
Benanti et al., "Organic Solar Cells: An overview focusing on Active Layer Morphology," Photosynthesis Research, vol. 87, pp. 73-9\81, 2006.
Kippelen et al., "Organic Photovoltaics," Energy Environ, Sci., vol. 2, pp. 251-261, 2009.
Hoppe et al., "Organic Solar Cells: An Overview," J. Mater. Res., vol. 19, No. 7, pp. 1924-1945, Jul. 2004.
Congreve et al., "External Quantum Efficiency Above 100% in a Singlet-Exciton-Fission-Based Organic Photovoltaic Cell," Science, vol. 340, pp. 334-337, Apr. 19, 2013.
Johnson et al., "Toward Designed Singlet Fission: Solution Photophysics of Two Indirectly Coupled Covalent Dimers of 1, 3-Diphenylisobenzofuran," J. Phys. Chem. B, vol. 117, pp. 4680-4695, 2013.
Zimmerman et al., "Mechanism for Singlet Fission on Pentacene and Tetracene: from Single Exciton to Two Triplets," J. Am. Chem. Soc. vol. 133, pp. 19944-19952, 2011.
Smith et al., "Singlet Fission," Chemical Reviews, vol. 110, pp. 6891-6936, 2010.
J.K. Stille, "Palladium Catalyzed Coupling of Organotin Reagents with Organic Electrophiles," Pure & Appl. Chem., vol. 57, No. 12, pp. 1771-1780, 1985.
Bao et al., "Synthesis of Conjugated Polymer by the Stille Coupling Reaction," Chem. Mater. vol. 5, pp. 2-3, 1993.
Kularatne et al., "Donor-Acceptor Semiconducting Polymers for Organic Solar Cells," Journal of Polymer Science, Patent A: Polymer Chemistry, vol. 51, pp. 743-768, 2013.
"Wayback Machine" [Retrieved from the Internet] https://web.archive.org/details/arxiv.org/pdf/1510.04773.pdf.
Guo et al., "Light-Controlled Organic/INorganic P-N Junction Nanowires," J. Am. Chem. Soc., vol. 130, pp. 9198-9199, 2008.
Crowley et al., "A Three-Dimensional Approach to Solubility," Journal of Paint Technology, vol. 38, No. 496, pp. 269-280, May 1966.
"Solvents," Second Edition, Federation Series on Coatings Technology, pp. 1-12, Oct. 1998.
Leatherdale et al., "On the Absorption Cross Section of CdSe Nanocrystal Quantum Dots," J. Phys. Chem, B. vol. 106, pp. 7619-7622, 2002.
Chen et al., "High Sensitive Biological and Chemical Sensors based on Reversible Fluorescence quenching in a Conjugated Polymer," PNAS, vol. 96, No. 22, pp. 12287-12292, Oct. 26, 1999.
Wang et al., "Biosensors from Conjugated Polyelectrolyte Complexes," PNAs, vol. 99, No. 1, pp. 49-53, Jan. 8, 2002.
McQuade et al., "Conjugated Polymer-Based Chemical Sensors," Chem. Rev., vol. 100, pp. 2537-2574, 2000.

(56) References Cited

OTHER PUBLICATIONS

Yu et al., "Polymer Photovoltaic Cells: Enhanced Efficiencies via a Network of Internal Donor-Acceptor Heterojunctions," Science, vol. 270, pp. 1789-1791, Dec. 15, 1995.
Coackley et al., "Conjugated Polymer Photovoltaic Cells," Chem. Mater, vol. 16, pp. 4533-4542, 2004.
Muller et al., "Novel Cross-likable Hole-Transport Monomer for Use in Organic Light Emitting Diodes," Snythetic Metals, vols. 111-112, pp. 31-34, 2000.
Sanchez et al., "Photoluminescence Stability of Cyanoterphenyl Chromophore in Liquid Crystalline Polymeric Systems," Journal of Applied Physics, vol. 88, No. 12, pp. 7124-7128, Dec. 15, 2000.
Weder et al., "Incorporation of Photoluminescent Polarizers into Liquid Crystal Displays," Science, vol. 279, pp. 835-837, Feb. 6, 1998.
Koller et al., "Organic Plasmon-Emitting Diode," Nature, vol. 2, pp. 684-687, Nov. 2008.
Dicesare et al., "Saccharide Detection Based on the Amplified Fluorescence Quenching of a Water-Soluble Poly (phenylene ethynylene) by Boronic Acid Functionalized Benzyl Viologen Derivative," Langmuir, vol. 18, pp. 7785-7787, 2002.
Tang, C.W. "Two-Layer Organic Photovoltaic Cell," Appl. Phys. Lett., vol. 48. pp. 183-185, 1986.
Gelinas, Simon et al., "Ultrafast Long-Range Charge Separation in Organic Semiconductor Photovoltaic Diodes." Science, vol. 343, pp. 512-516, 2014.
Bredas, Jean-Luc et al., "Molecular understanding of Organic Solar Cells: The Challenges," Acc. Chem. Res., vol. 42, pp. 1691-1699, 2009.
Erb, Tobias et al., "Correlation Between Structural and Optical Properties of Composite Polymer/Fullerene Films for Organic Solar Cell**," Adv. Funct. Mater., vol. 15, pp. 1193-1196, 2005.
Kim Jin Young et al., "Efficient Tandem Polymer Solar Cells Fabricated by All-Solution Processing," Science, vol. 317, pp. 222-225, 2007.
You, Jingbi et al., "A Polymer Tandem Solar Cell with 10.6% Power Conversion Efficiency," Nature Commun., vol. 4, No. 1446, pp. 1-10, 2013.
Small, Cephas E. et al., "High-Efficiency Inverted Dithienogermole-Thienopyrrolodione-based Polymer Solar Cells," Nature Photon., vol. 6, pp. 115-120, 2012.
Sun, Yanming et al., "Solution-Processed Small-Molecule Solar Cells with 6.7% Efficiency," Nature Mater. vol. 11, pp. 44-48, 2012.
Shockley, William et al., Detailed Balance Limit of Efficiency of p-n Junction Solar Cells, Appl. Phys., vol. 32, pp. 510-519, Mar. 1961.
Hanna, M. C. et al., "Solar Conversion efficiency of Photovoltaic and Photoeleotrolysis Cells with Carrier Multiplication Absorbers," Appl. Phys., vol. 100, pp. 074510-1-074510-8, 2006.
Ehrler, Bruno et al., "In situ Measurement of Exciton Energy in Hybrid Singlet-fisson Solar Cells," Nature Commun., vol. 3, pp. 1-6, May 2, 2012.
Tritsch, John R. et al., "Harvesting Singlet Fission for Solar Energy Conversion via Triplet Energy Transfer," Nature Commun , vol. 4, pp. 1-7, 2013.
Johnson, Justin C. et al., "The Role of Chromophore Coupling in Singlet Fission," Acc. Chem. Res., vol. 46, pp. 1290-1299, 2013.
Roberts, Sean T. et al., "Efficient Singlet Fission Discovered in a Disordered Acene Film," J. Am. Chem. Soc., vol. 134, pp. 6388-6400, 2012.
Yost, Shane R. et al., "A transferable Model for Singlet-Fission Kinetics," Nature Chem., vol. 6, pp. 492-497, 2014.
Antognazza, Maria Rosa at al., "Ultrafast Excited State Relaxation in Long-Chain Polyenes," Chem. Phys., vol. 373, pp. 115-121, 2010.
Kraabel, B. et al., "Triplet Exciton Generation, Transport and Relaxation in Isolated Polydiacetylene Chains; Subppicosecond Pump-Probe Experiments," Chem. Phys., vol. 227, pp. 83-98, 1998.
Musser, Andrew J. et al., "Activated Singlet Exciton Fission in a Semiconducting Polymer," J. Am. Chem. Soc., vol. 135, pp. 12747-12754, 2013.
Gradinaru, Claudiu C. et al., "An unusual Pathway of Excitation energy Deactivation in Carotenoids: Singlet-to-triplet conversion on an Ultrafast timescale in a Photosynthetic Antenna," Proc. Natl Acad. Sci. USA, vol. 98, pp. 2364-2369, Feb. 27, 2001.
Papagiannakis, Emmanouil et al., "Light Harvesting by Carotenoids Incorporated into the B850 Light-Harvesting Complex from Rhodobacter sphaeroides R-26.1: Excited-State Relaxation, Ultrafast Triplet Formation, and Energy Transfer to Bacteriochlorophyll," J. Phys. Chem. B, vol. 107, pp. 5642-5649, 2003.
Wei, Sujun et al., "Bandgap engineering through Controlled Oxidation of Polythiophenes," Angew. Chem. Int. Ed., vol. 53, pp. 1832-1836, 2014.
Beljonne, D. et al., "Charge-Transfer Excitations Steer the Davydov Splitting and Mediate Singlet Fission in Pentacene," Phys. Rev. Lett., vol. 110, pp. 226402-1-226402-5, May 31, 2013.
Berkelbach, Timothy C. et al., "Microscopic theory of Singlet Exciton Fission. I. General Formulation," J. Chem. Phys., vol. 138, pp. 114102-1 to 114102-16, 2013.
Berkelbach, Timothy C. et al., "Microscopic Theory of Singlet Exciton Fission. II. Application to Pentacene Dimers and the Role of Superexchange," J. Chem. Phys., vol. 138, 114103-1 to 114103-12, 2013.
Chan, Wai-Lun et al., "The Quantum Coherent Mechanism for Singlet Fission: Experiment and Theory." Acc. Chem. Res., vol. 46, pp. 1321-1329, 2013.
Chan, Wai-Lun et al., "Observing the Multiexciton State in Singlet Fission and Ensuing Ultrafast Muitielectron Transfer," Science, vol. 334, pp. 1541-1545, 2011.
Chan, Wai-Lun et al., "The Energy Barrier in Singlet Fission can be Overcome Through Coherent Coupling and Entropic Gain," Nature Chem., vol. 4, pp. 840-845, 2012.
Sharifazdeh, Sahar et al., "Low-energy Charge-Transfer Excitons in Organic Solids from First Principles: The Case of Pentacene," J. Phys. Chem. Lett, vol. 4, pp. 2197-2201, 2013.
Zhou, Huaxing et al., "Rational Design of High Performance Conjugated Polymers for Organic Solar Calls," Macromolecules, vol. 45, p. 607-632, 2012.
Kitamura, Chitoshi et al., "Design of Narrow-Bandgap Polymers, Snytheses and Properties of Monomers and Polymers Containing Aromatic-Donor . . . ," Chem. Mater., vol. 8, pp. 570-578, 1996.
Bredas, J.L. "Relationship between band gap and bond length alternation in Organic Conjugated Polymers," J. Chem. Phys., vol. 82, No. 8, pp. 3808-3811, Apr. 15, 1985.
Havinga, E.E. et al., "A New class of Small band Gap Organic Polymer Conductors," Polymer Bulletin, vol. 29, pp. 119-126, 1992.
Szarko, Jodi M. et al., "Electronic Processes in Conjugated Diblock Oligomers Mimicking Low Band-Gap Polymers: Experimental and Theoretical Spectral Analysis," J. Phys. Chem., vol. 114, pp. 14505-14513, 2010.
Guo, Jiamo et al., "Near-IR Femtosecond Transient Absorption Spectroscopy of Ultrafast Polaron and Triplet Exciton Formation in Polythiophene Films with Different Regioregularities," J. Am. Chem. Soc., vol. 131, pp. 16869-16880, 2009.
Mullen, Katharine M. et al., "Algorithms for Separable Nonlinear Least Squares with Application to Modelling time-resolved Spectra," J. Glob. Optim, vol. 38, pp. 201-2013, 2007.
Van Stokkum, Ivo H.M. et al., "Global and Target Analysis of Time-Resolved Spectra" Biochimica et Biophysica Acta, vol. 1657, pp. 82-104, 2004.
Wishart, James F. et al., "The LEAF Pioosecond Pulse Radiolysis Facility at Brookhaven National Laboratory," Review Scientific Instruments, vol. 75, No. 11, pp. 4359-4366, Nov. 2004.
Head-Gordon, Martin et al., "Analysis of Electronic Transitions as the Difference of Electron Attachment and Detachment Densities," Rev. Sci. Instrum., vol. 75, pp. 4359-4366, 1995.
Oliva, Maria Moreno et al., "Do [all]-S,S'-Dixide Oligothiophenes Show Electronic and Optical Properties of Oligoenes and/or of Oligothlophenes," J. Phys. Chem. Soc., vol. 132, pp. 6231-6242, 2010.
Amir, Elizabeth et al., "Synthesis and Characterization of Soluble Low-Bandgap Oligothiophene-[all]-S,S-dioxides-Based Conjugated Oligomers and Polymers," J. Polym. Sci., vol. A 49, pp. 1933-1941, 2011.

(56) References Cited

OTHER PUBLICATIONS

Sreearunothai, Paiboon et al., "Triplet Transport to and Trapping by Acceptor End Groups on Conjugated Polyfluorene Chains," J. Phys. Chem., vol. C 115, pp. 19569-19577, 2011.

Heinzelmann, W. et al., "Triplet-Triplet Spectra and Triplet Quantum Yields of Some Aromatic Hydrocarbons in Liquid Solution," vol. 4, No. 1, pp. 20-24, Sep. 15, 1969.

Kanimozhi, Catherine et al., "Synthesis of Diketopyrrolopyrrole Containing Copolymers: A Study of Their Optical and Photovoltaic Properties," J. Phys. Chem. B, vol. 114, pp. 3095-3103, 2010.

Amir, Elizabeth et al., "Stimuli-responsive Azulene-Based Conjugated Oligomers with Polyaniline-like Properties," J. Am. Chem. Soc., vol. 133, pp. 10046-10049, 2011.

Barbarella, Giovanna et al., "Bright Oligothiophene N-Succinimidyl Esters for Efficient Fluorescent Labeling of Proteins and Oligonucleotides," Bioconjugate Chem., vol. 17, pp. 58-67, 2006.

Busby, Erik et al., "Excited-State Self-Trapping and Ground-State Relaxation Dynamics in Poly(3-Hexylthiophene) Resolved with Broadband Pump-Dump-Probe Spectroscopy," J. Phys. Chem. Lett, vol. 2, pp. 2764-2769, 2011.

Carmeichael, Ian et al., "Molecules in Condensed Phases: A least-Squares Analysis," J. Phys. Chem. Ref. Data, vol. 16, pp. 239-260, 1987.

Wu, Qin et al., "Direct Optimization Method to Study Constrained Systems within Density-functional theory," Physical Review A, vol. 72, pp. 024502-1 to 025402-4, 2005.

Shao, Yihan et al., "Advances in Methods and Algorithms in a Modern Quantum Chemistry Program Package," Phys. Chem. Chem. Phys., vol. 8, pp. 3172-3191, 2006.

Maitra, Neepa et al., "Double Excitations within Time-Dependent Density Functional Theory Linear Response," J. Chem. Phys., vol. 120, No. 13, pp. 5932-5937, Apr. 1, 2004.

Busby, Erik et al., "A Design Strategy for Intramolecular Singlet Fission Mediated by Charge-transfer States in Donor-Acceptor Organic Materials," Nat. Mater., vol. 14, pp. 426-433, Apr. 2015.

Cabanetos, Clement et al., "Linear Side Chains in Benzo [1,2-b:4,5-b']dithipphene-Thieno[3,4-c]pyrrole-4,6-dinoe Polymers Direct Self-Assembly and Solar Cell Performance," J. Am. Chem. Soc., vol. 135, pp. 4656-4659, 2013.

Dell, Emma J. et al., "Molecular length dictates the nature of Charge Carriers in Single-Molecule Junctions of Oxidized Oligothiophenes," Nature Chemistry, vol. 7., pp. 209-214, Mar. 2015.

Liu, Hong-Yi et al., "Quinoxaline-Based Polymer Dots with Ultrabright Red to Near-Infrared Fluorescence for in Vivo Biological Imaging," J. Am. Chem. Soc., vol. 137, No. 32. pp. 10420-10429, 2015.

Hagemann, Ole et al., "Synthesis of an All-in-One Molecule (for Organic Solar Cells)," J. Org. Chem., vol. 71, pp. 5546-5559, 2006.

Berlin, Anna et al., "3,4-Ethylenedioxy-substitued bithiophene-alt-thiophene-S,S-dioxide regular Copolymers. Synthesis and Conductive, Magnetic and Luminescence Properties," J. Mater. Chem., vol. 13, pp. 27-33, 2003.

Zhai, Yaxin et al., "Singlet Fission of hot Excitons in . . . ," Phil, Trans. R Soc. A vol. 373, pp. 1-8, 2015.

McCormick, Theresa M. et al., "Conjugated Polymers: Evaluating DFT Methods for more Accurate Orbital Energy Modeling," Macromolecules, vol. 46, pp. 3879-3886, 2013.

Aryanpour, Karan et al., "Theory of Primary Photoexcitations in Donor-Acceptor Copolymers," Phys, Rev. Lett., vol. 115, pp. 1-5, 2015.

Chng, Delano P. et al., "Recent Advances in Computational Chemistry, Part 1," Singapore, World Scientific, pp. 1-424, 1995.

\* cited by examiner

FIG. 5
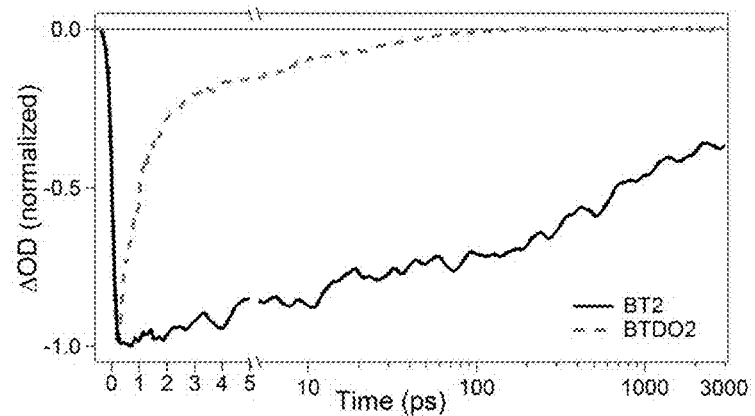
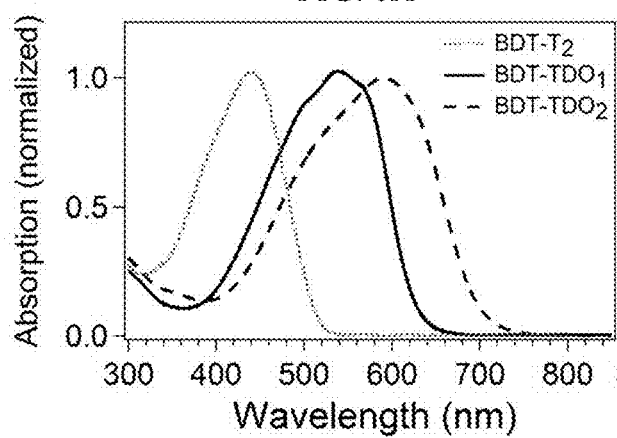
FIG. 6A
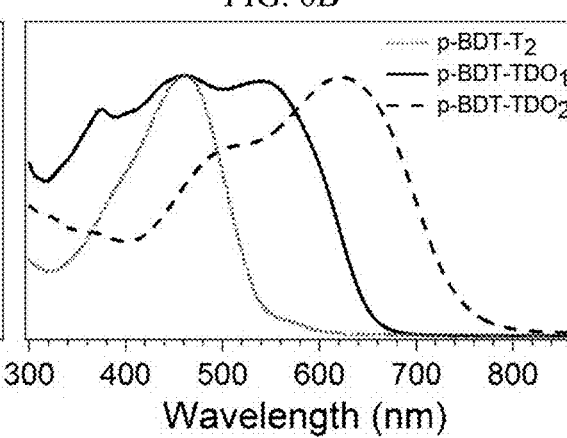
FIG. 6B

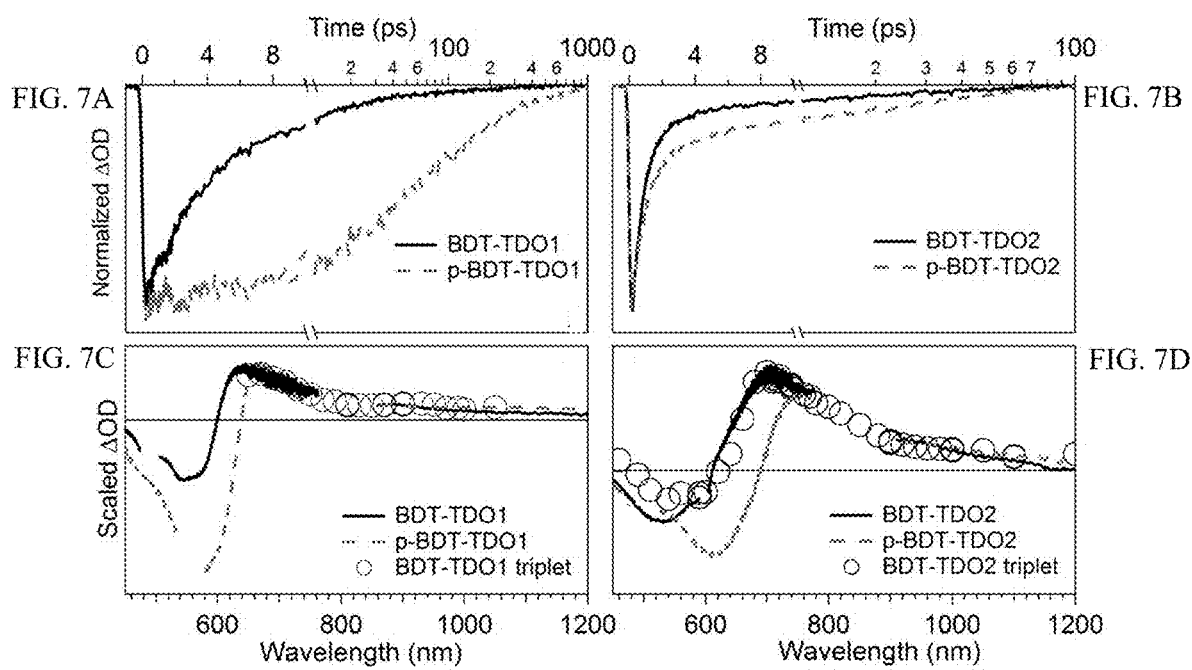

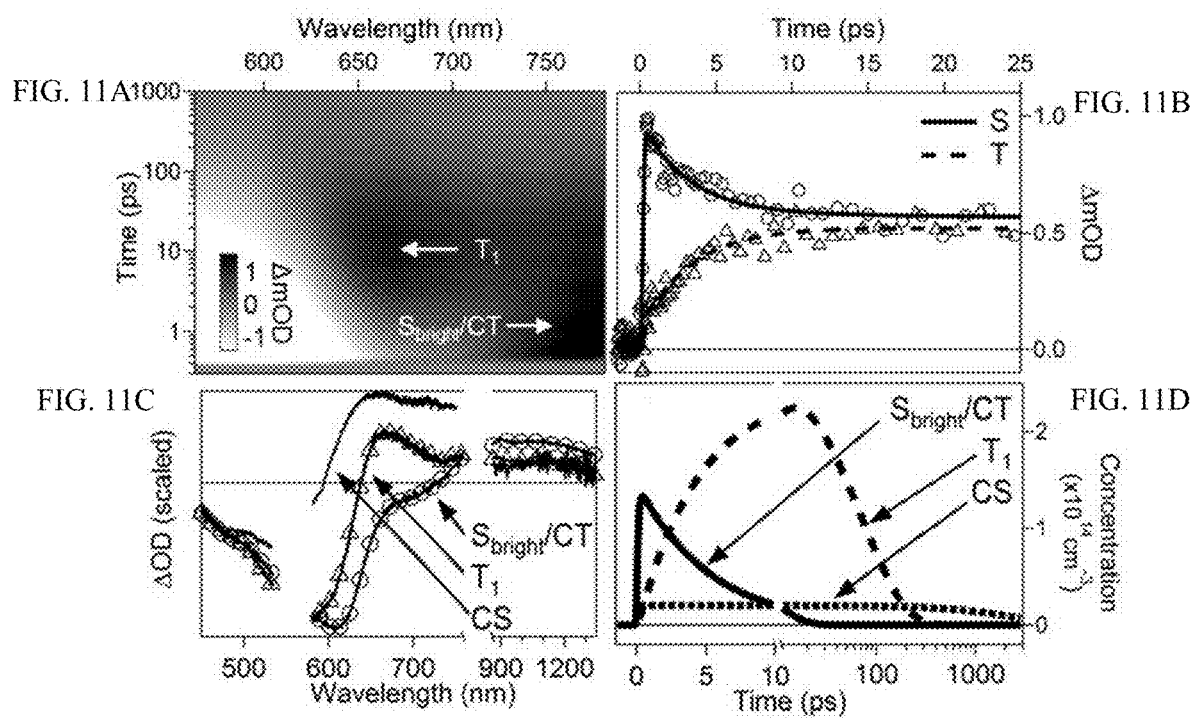

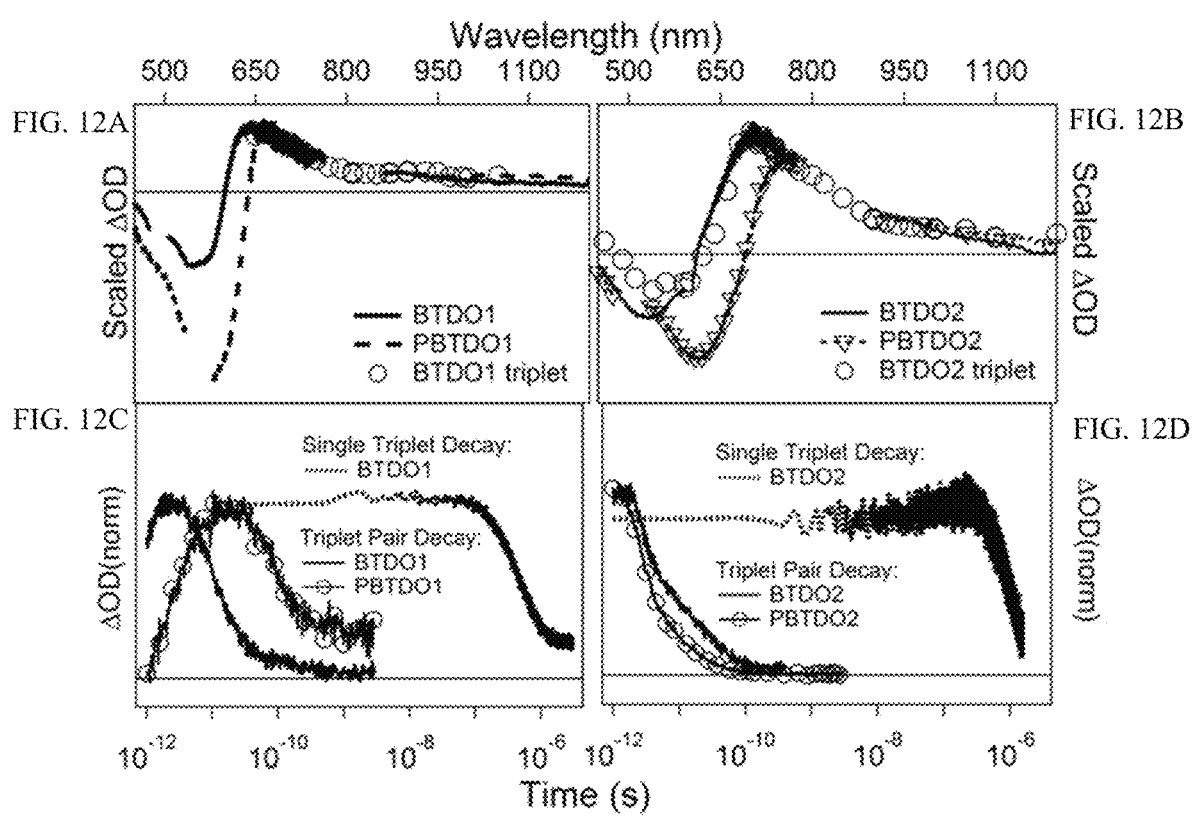

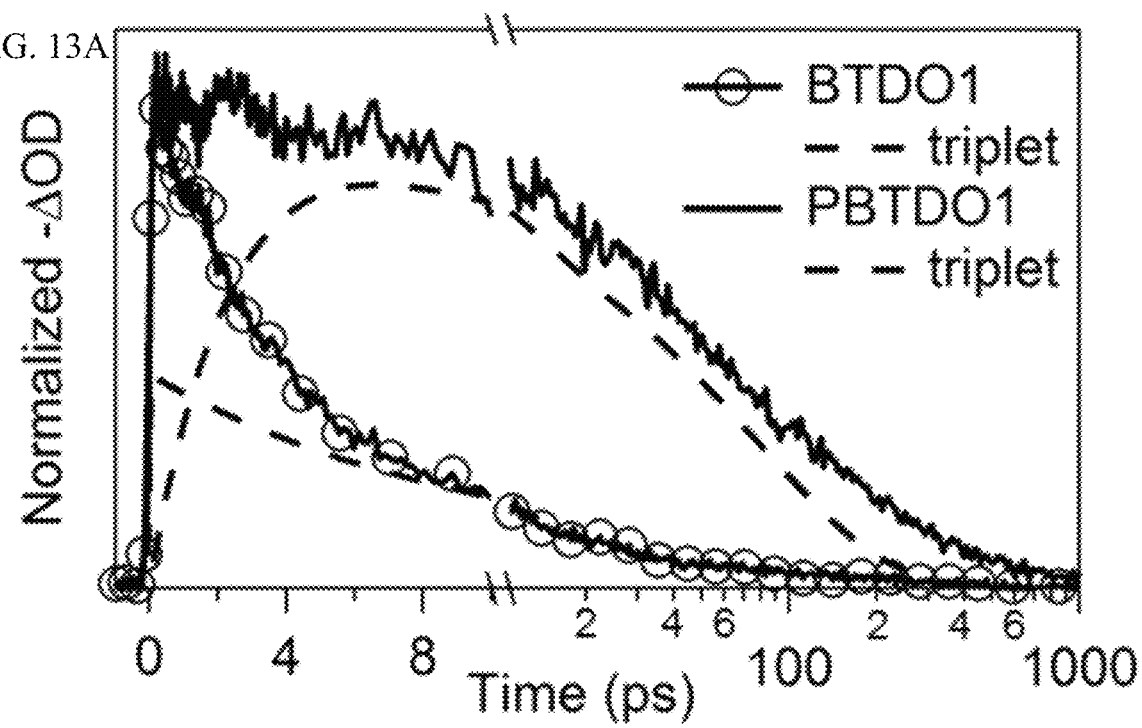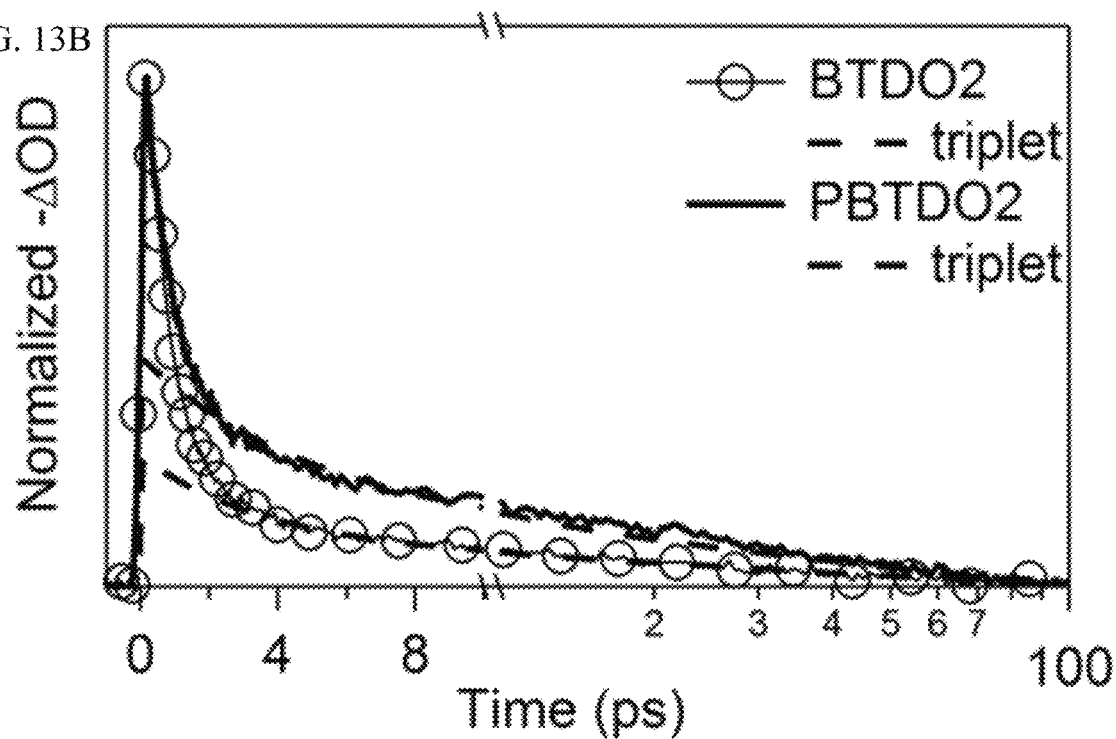

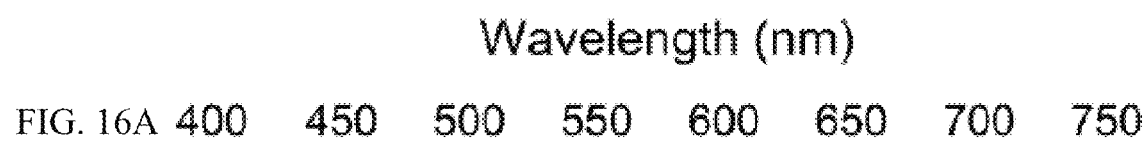
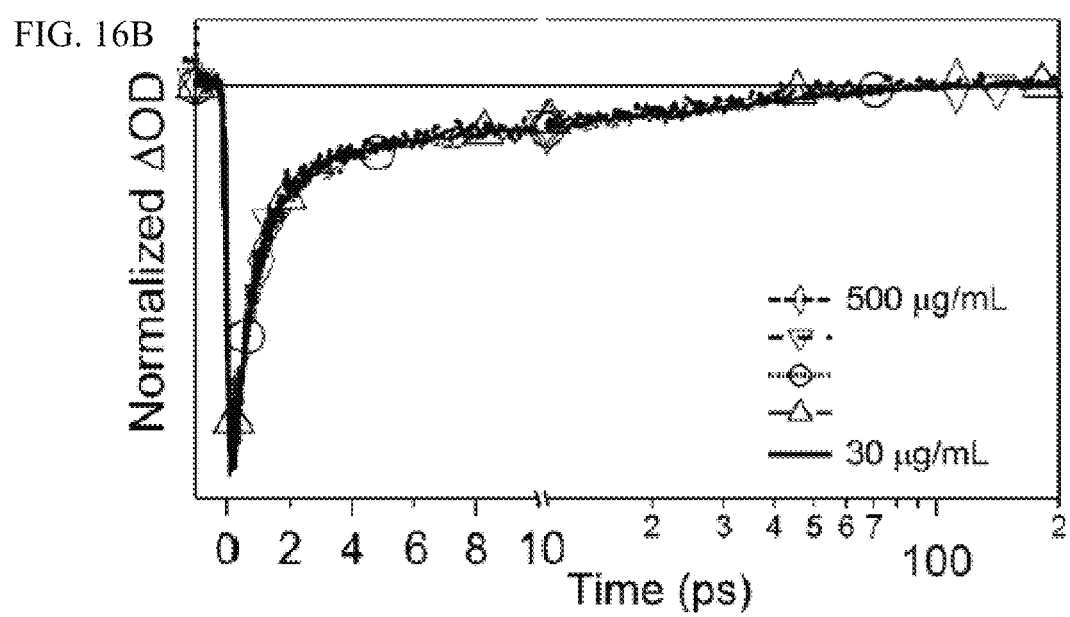

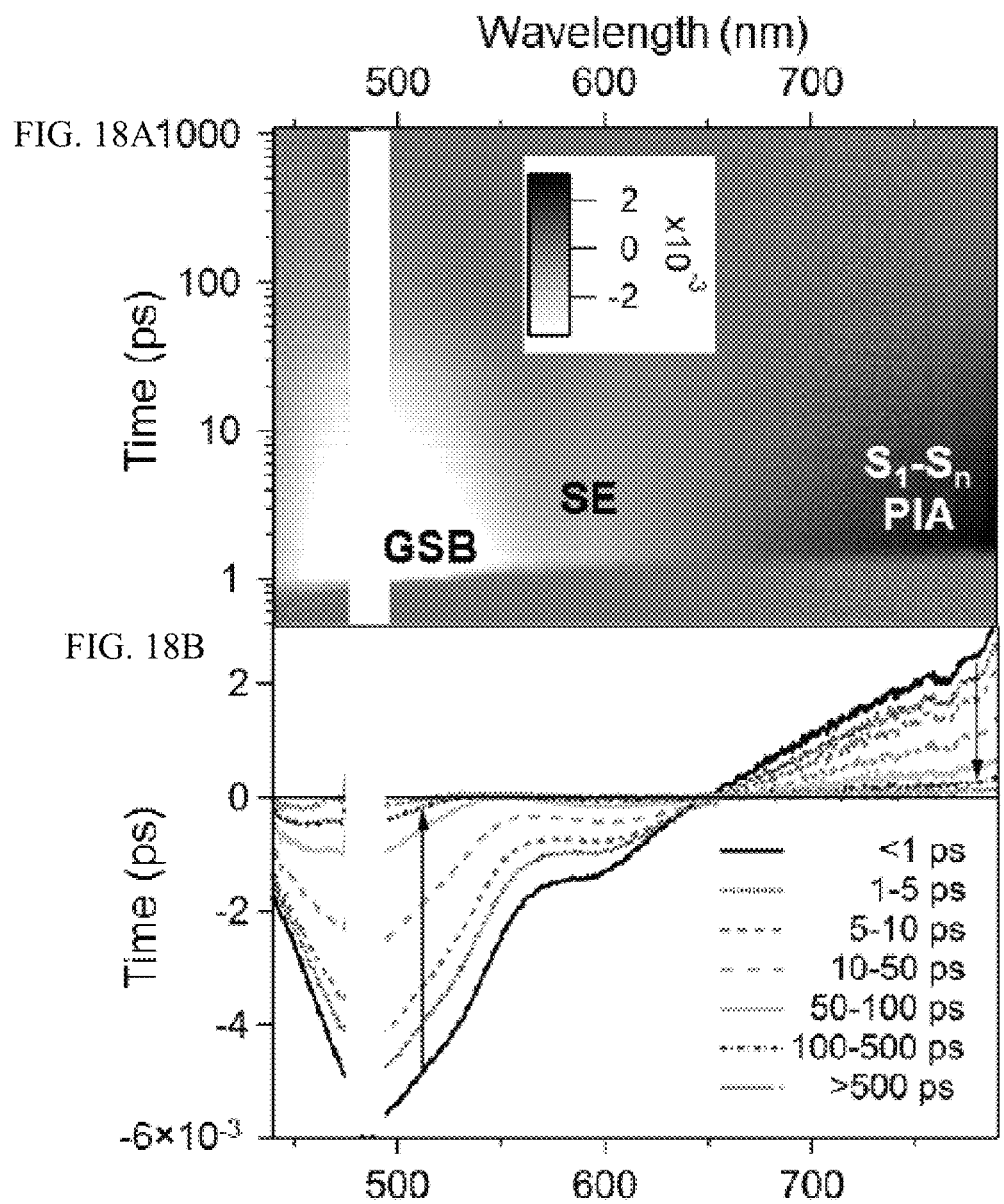

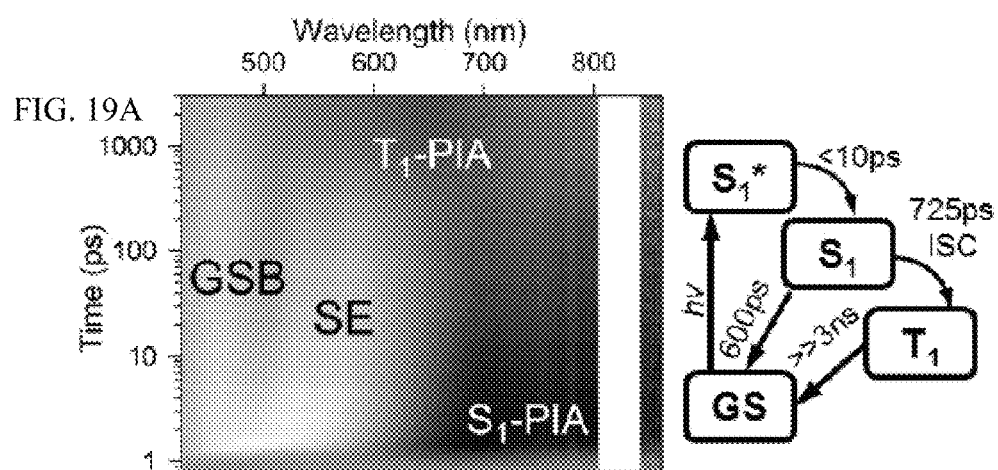
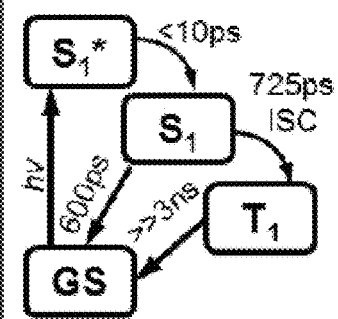
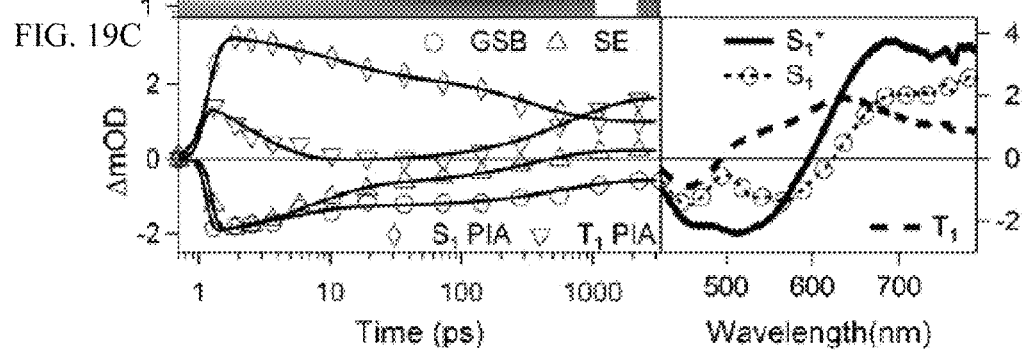
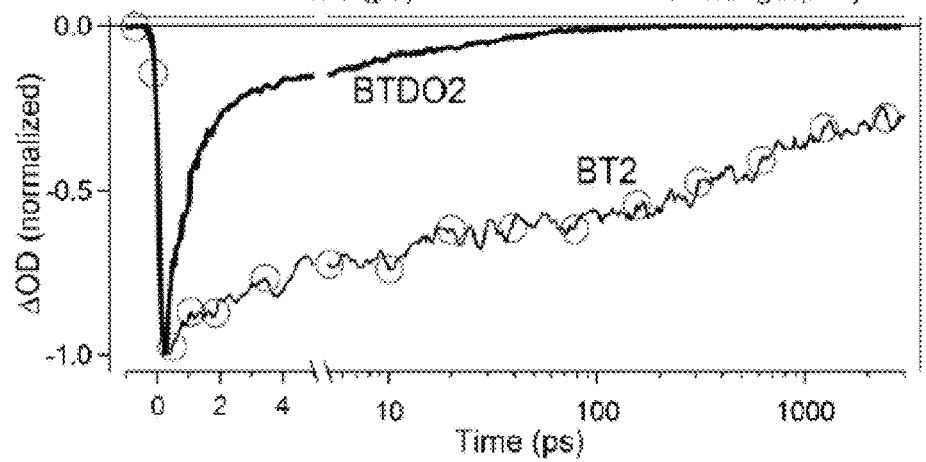

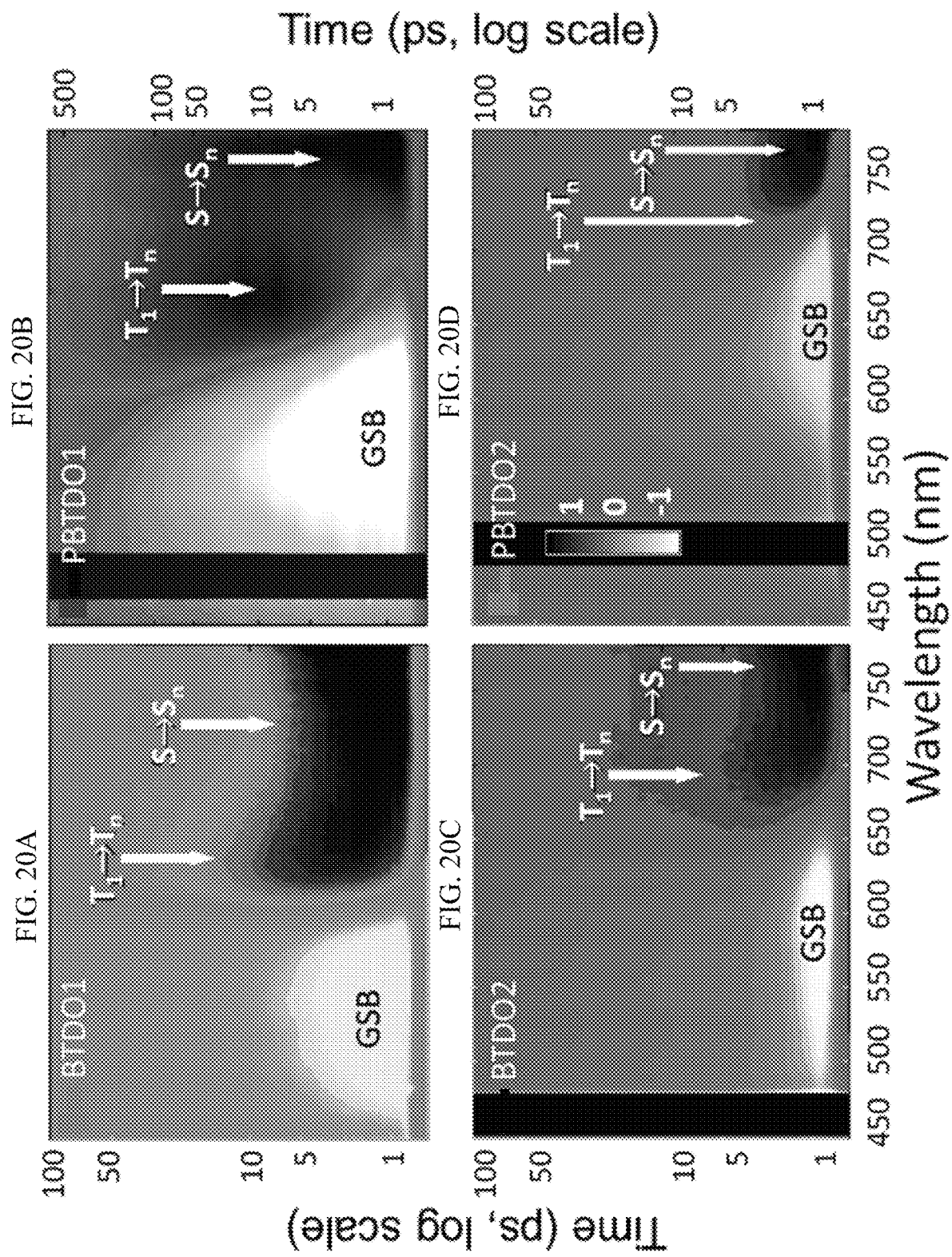

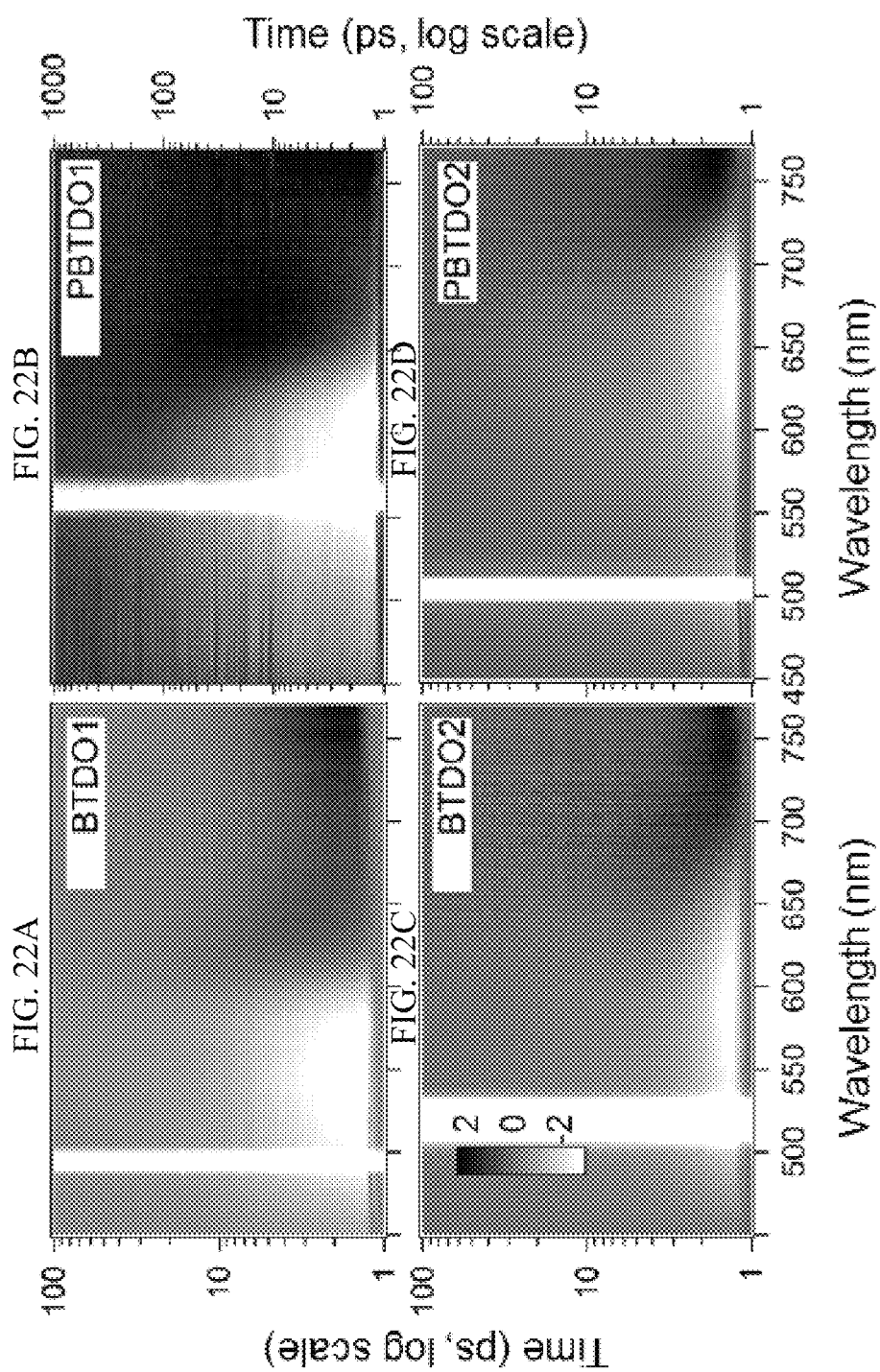

Hole Wavefunction (*detachment*)

Electron Wavefunction (*attachment*)

Singlet Deactivation Pathways

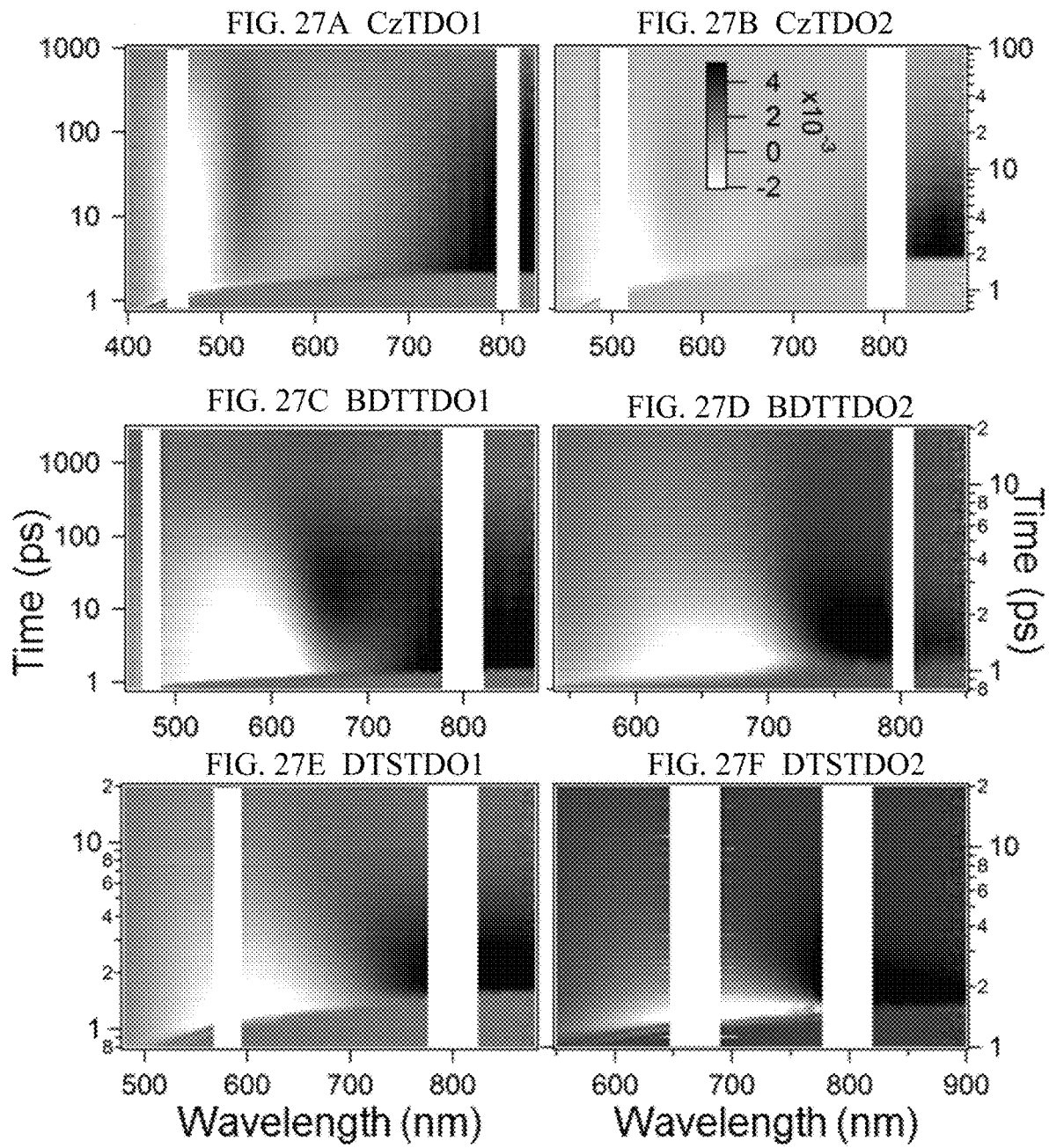

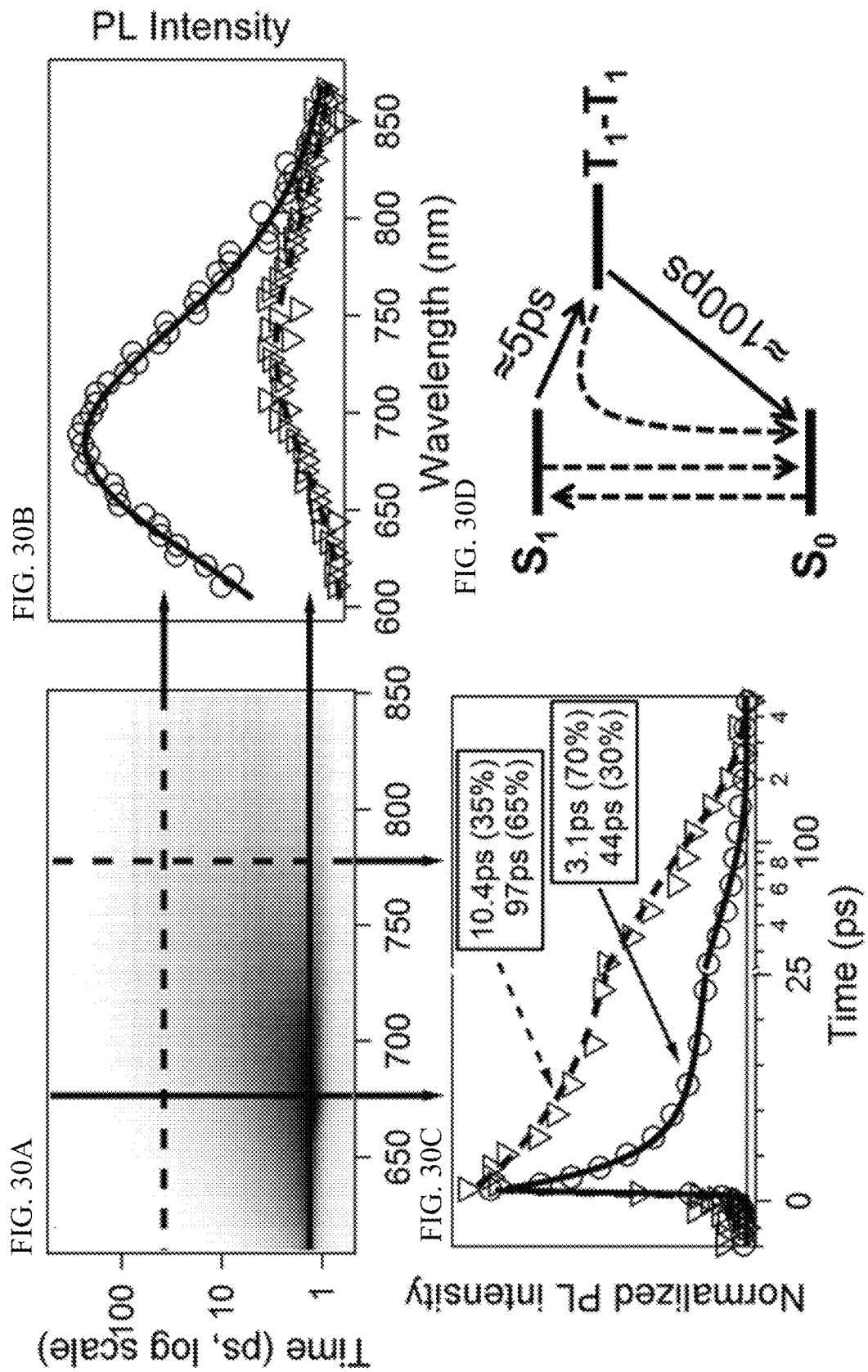

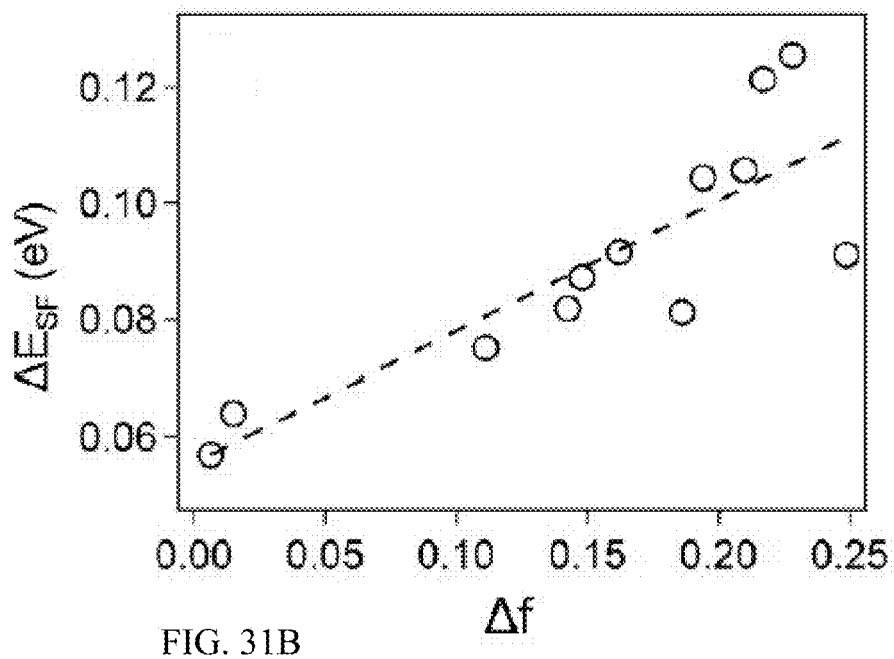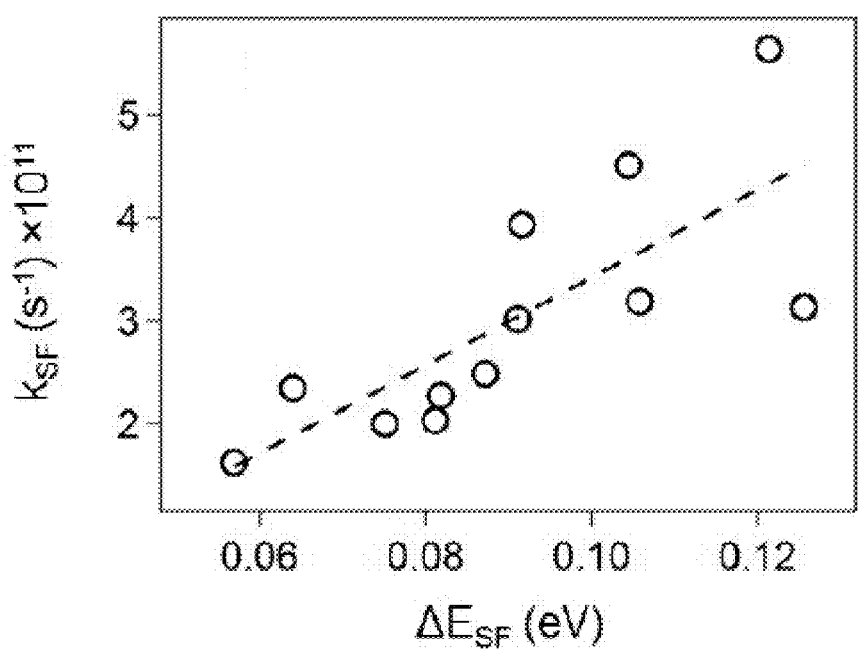

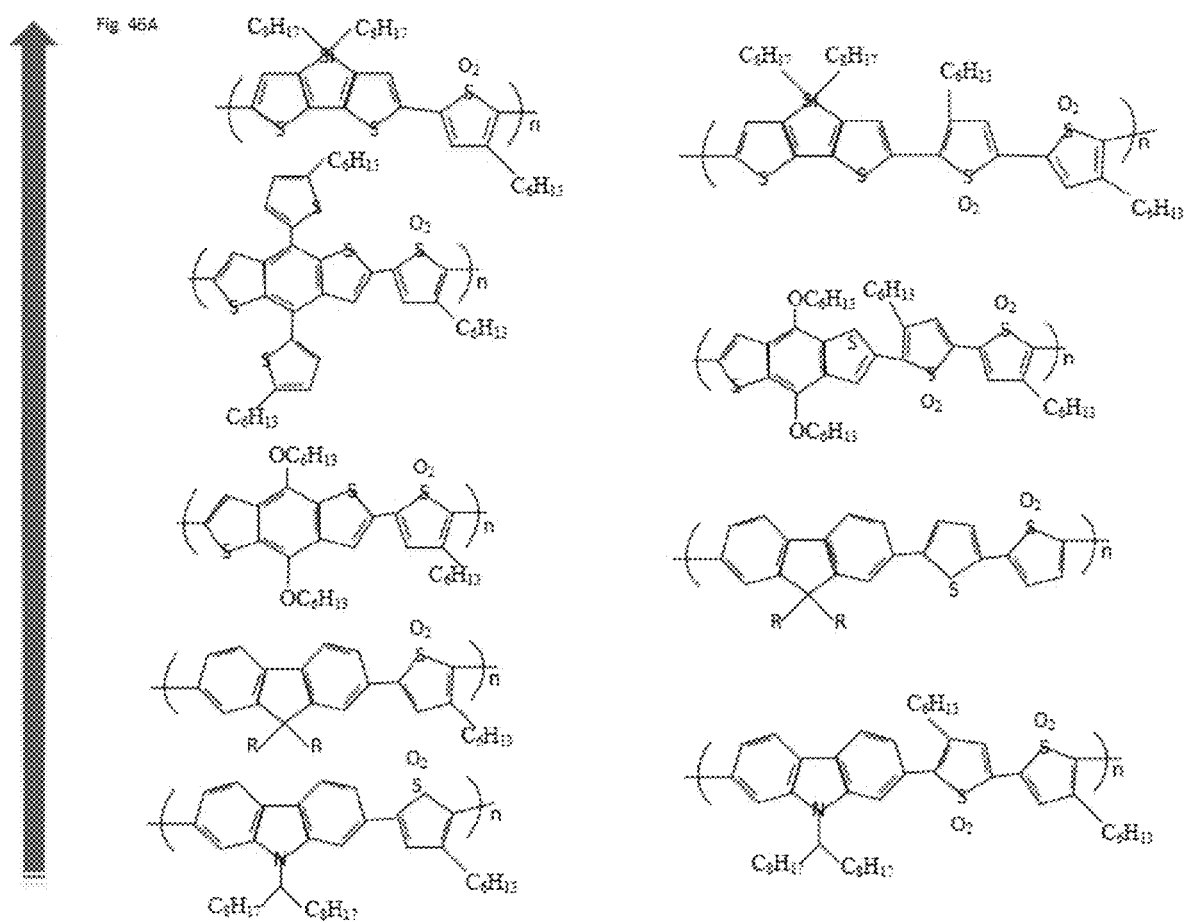

MOLECULAR COMPOSITIONS, MATERIALS, AND METHODS FOR EFFICIENT MULTIPLE EXCITON GENERATION

CROSS-REFERENCE TO RELATED APPLICATIONS

This application is a continuation-in-part of International Patent Application PCT/US2015/027660, filed Apr. 24, 2015 and is a continuation-in-part of International Patent Application PCT/US2015/000309, filed Dec. 23, 2015 and claims the benefit of priority from U.S. Provisional Patent Application No. 61/983,996, filed Apr. 24, 2014 and U.S. Provisional Patent Application No. 62/124,596, filed Dec. 23, 2014, all of which applications are incorporated herein by reference in their entireties.

STATEMENT REGARDING FEDERALLY SPONSORED RESEARCH OR DEVELOPMENT

This invention was made with government support under DE-AC02-98CH10886, DE-SC0001085, and DE-SC0012704 awarded by the Department of Energy and 1351293 awarded by the National Science Foundation. The government has certain rights in the invention.

NAMES OF PARTIES TO A JOINT RESEARCH AGREEMENT

The claimed invention was made by, on behalf of, and/or in connection with Brookhaven Science Associates, LLC to a joint research agreement within the meaning of 35 U.S.C. § 103(c). The claimed invention was made as a result of activities undertaken within the scope of the agreement.

FIELD OF THE INVENTION

The present inventions relate to compounds that are designed to produce efficient singlet fission and their use in compositions and singlet fission processes. More particularly, the present inventions relate to organic compounds that are designed to produce efficient singlet fission and their use in compositions and singlet fission processes that can produce triplet excitons in high yields, and their use in various materials and devices.

BACKGROUND OF THE INVENTION

Singlet fission (SF) has recently attracted much interest for its potential to increase the theoretical maximum efficiency for solar cells. Many small molecule organic compounds have been found to undergo intermolecular and intramolecular singlet fission (xSF and iSF, respectively), the latter generally being considered more useful for implementation into devices since it alleviates the need for well-oriented, crystalline materials. However, polymeric systems are a rarity with only a few examples reported thus far[21,57,65]. Furthermore, benzodithiophene (BDT)-and thiophene dioxide (TDO)-based polymers were able to reach efficiencies of about 170% or greater, i.e., about ~190%[57] while other systems still lag behind.

While SF has been extensively studied in molecular crystals and aggregates, made possible by an intermolecular process, intramolecular SF (iSF) is not well understood in molecular and polymeric materials. Fundamentally, a core challenge is the development of materials capable of efficient intramolecular singlet fission. Challenges arise due to the many species that can form following initial photoexcitation, such as polarons and polaron pairs, creating difficulties in assigning iSF in polymers compared to small molecules. Recent work has gone into identifying the mechanism of iSF in small molecule systems, with pentacene dimers as a model system. It is unclear if charge transfer (CT) states play any role in the iSF process. Even with reports on iSF in polymers, there are much fewer design rules. Hence, there is a need to elucidate the iSF mechanism. It is an onerous task considering the lack of discrete chromophores, and that excited species in polymers are more delocalized.

Solar cells, also known as photovoltaic cells, are electrical devices that convert light energy directly into electricity by, what is known as, the photovoltaic effect. The photovoltaic effect is the creation of voltage or electric current in a material upon exposure to light. The photovoltaic effect is related to the photoelectric effect, although they are different processes.

Generally, when sunlight or any other light is incident upon a material, electrons present in the valence band can absorb energy and become excited from the absorption of energy. When the light energy exceeds bandgap, an electron can be promoted to what is referred to as the conduction band, which is the range of electron energies enough to free an electron from binding with its atom to move freely within the atomic lattice of the material as a delocalized electron, and become free. Then, as the highly excited, non-thermal electrons diffuse, some reach a junction where they are accelerated into a different material by a built-in potential (referred to as Galvani potential). The result is that an electromotive force can be generated. Thus, some of the light energy absorbed may be converted into useful electric energy. The photovoltaic effect can also occur when two photons are absorbed simultaneously in a process called two-photon photovoltaic effect.

Carrier multiplication refers to the phenomenon wherein absorption of a single photon leads to the excitation of multiple electrons from the valence band to the conduction band of a semiconducting material. In a conventional silicon solar cell, each photon is, in theory, only able to excite one electron across the band gap, and any photon energy in excess of the bandgap is dissipated as heat. In a material capable of carrier multiplication, high-energy photons excite on average more than one electron across the band gap, and so in principle the solar cell can produce more useful work.

However, silicon based solar cells are fundamentally limited in their production of useful energy. For example, if an incoming photon does not have sufficient energy, the cell will not absorb it. On the other hand, if a photon has too much energy, the excess energy is wasted as heat. In addition, it is believed that a silicon solar cell cannot generate more than one electron from a single photon absorbed. Thus, the conversion efficiency of photovoltaic cells by these combined effects, known as the Shockley-Queisser limit. The Shockley-Queisser limit is the fundamental upper limit to efficiency in single junction solar cells. This thermodynamic constraint limits the efficiency of single PN-junction solar cells to 33.7%, where a PN-junction is a boundary between two types of semiconductor materials. Scientists have spent decades looking for solutions to the problems posed.

Organic solar cell research has increased over the years and has seen the introduction of new materials, improved materials engineering, and more sophisticated device structures that provide increased power conversion efficiencies.

Solar cells constructed of organic materials are becoming increasingly efficient due to the discovery of the bulk heterojunction concept. See, e.g., Benanti et al., *Organic solar cells: An overview focusing on active layer morphology*, Photosynthesis Research, vol. 87, pp. 73-81 (2006); and Kippelen et al., *Organic Photovoltaics*, Energy Environ. Sci., vol. 2, no. 3, pp. 251-261 (2009).

The field of organic solar cells has benefited from the development of light-emitting diodes based on similar technologies, which have entered the market recently. For a review of the field of organic solar cells, discussion of their different production technologies, and discussion of parameters to improve their performance, see Hoppe et al., Organic solar cells: An overview, *Journal of Materials Research*, Vol. 19, Issue 07, pp 1924-1945 (2004).

Among the several challenges to improve the performance of organic photovoltaics (OPVs) is the Shockley-Queisser limit (~33.7%), as defined above. Thermodynamic modeling predicts that using materials capable of multiple exciton generation (MEG) in a single junction solar cell could theoretically circumvent the Shockley-Queisser limit and increase the upper limit of power conversion efficiency from 33.7% to 44%. The assumption is that SF results in forming two triplet excitons, each of which produces an electron-hole pair.

Recently it was reported that the organic dye pentacene could be useful in providing greater solar efficiency. Congreve et al., External Quantum Efficiency Above 100% in a Singlet-Exciton-Fission-Based Organic Photovoltaic Cell, *Science*, vol. 340, no. 6130, pp. 334-337 (2013). Pentacene is a polycyclic aromatic hydrocarbon consisting of five linearly-fused benzene rings, which acts as an organic semiconductor. As reported by Congreve, a photovoltaic cell based on pentacene could generate two electrons from a single photon, i.e., more electrical current from the same amount of sun light. Various approaches have been taken in efforts to design compounds that will produce more efficient singlet fission. See J. C. Johnson et al., Toward Designed Singlet Fission: Solution Photophysics of Two Indirectly Coupled Covalent Dimers of 1,3-Diphenylisobenzofuran, *J. Phys. Chem. B*, 117, 4680 (2013).

Singlet-exciton fission describes the process in which an arriving photon generates two "excitons" (excited states) that can be made to yield two electrons. Singlet exciton fission is a spin-allowed process for generating two triplet excitons from a single absorbed photon. Fission of singlet excitons into two triplet exciton pairs is spin conserving and, therefore, spin allowed. Theoretically, the efficiency of a conventional solar cell could be improved if a molecular material capable of singlet fission could be incorporated.

The production of two triplet excitons from the absorption of a single photon. To implement this, the two triplets from the singlet fission material need to be successfully harvested. Singlet fission (SF) could dramatically increase the efficiency of organic solar cells by producing two triplet excitons from each absorbed photon. While this process is known, most descriptions have assumed the necessity of a charge-transfer intermediate. See Zimmerman et al., *Mechanism for Singlet Fission in Pentacene and Tetracene: From Single Exciton to Two Triplets,* J. Am. Chem. Soc., 133 (49), pp. 19944-19952 (2011). For an in depth discussion of singlet fission, see Smith et al., *Singlet Fission,* Chem. Rev., 110, pp. 6891-6936 (2010).

Although several existing materials exhibit singlet fission, these materials are generally based on aggregates of conjugated and/ or aromatic molecules, including, for example, acenes, polyenes, and caratenoids. Singlet fission has also been previously demonstrated in polymers including poly-thiopehenevinylene and poly-pheneylenevinylene. Thiophene dioxide (TDO)-containing systems have been studied for other applications. However, these studies were predominately focused on the basic science of molecular TDO-containing entities, particularly on light emission. These previously studied molecular singlet fission systems may offer good singlet fission efficiency; however, they are not very adjustable, efficiencies are low, and triplet lifetimes are very short. The combined effects of which make applications of existing molecular singlet fission systems limited and applications of existing polymeric singlet fission systems impractical.

Conjugated polymers that have been suggested in the literature for use in organic photovoltaic devices ("OPV devices") do still suffer from certain drawbacks. For example, many polymers suffer from limited solubility in commonly used organic solvents, which can inhibit their suitability for device manufacturing methods based on solution processing, or show only limited power conversion efficiency in OPV bulk-hetero-junction devices, or have only limited charge carrier mobility, or are difficult to synthesize and require synthesis methods which are unsuitable for mass production.

While SF has been extensively studied in molecular crystals and aggregates, made possible by an intermolecular process, intramolecular SF is not well understood in molecular and polymeric materials. Fundamentally, a core challenge is the modular synthetic design of building blocks for molecules and polymers that can undergo SF. Coupling chemical structure design with the mechanistic understanding of the physical processes of multiple exciton generation ("MEG") could open avenues of exploration in parallel using families of materials, rather than the current serial approach targeting single compounds, which are generally based on acenes, oligoenes, and select polymeric materials.

Intramolecular SF is a process that has been rarely invoked in soft materials—it has only been observed in oligoenes (carotenoids) and polyenes (polydiacetylene), as well as a thiophene-containing conjugated polymer. It is postulated that these materials are capable of producing multi-exciton states through charge delocalization across these large molecules. However, such observation does not provide the necessary guidelines to build new materials. There is a need for designing and synthesizing novel materials for intramolecular singlet exciton fission in small molecules and polymers that are efficient and configurable singlet fission materials, which important for developing low cost, efficient organic (or hybrid) photovoltaic technologies. Also, there is a need for developing solution processable small molecule and polymeric singlet fission materials which allow for effortless device assembly through a variety of low-cost processing techniques, where these materials may additionally have applications in fuel cells.

The vast efforts towards developing efficient solar cells based on organic materials[1,2] have led to advancements in processing and characterizing semiconducting molecules and polymers[3-5], as well as engineering organic photovoltaic (OPV) device architectures that have yielded significant increases in efficiency[6-9]. To raise the theoretical limit of power conversion efficiency above the Shockley-Queisser limit[10,11], organic materials capable of generating multiple excitons from a single photon have been explored in devices[12,13], with reported external quantum efficiencies exceeding 100%[14]. In these systems, the primary multiexciton generation mechanism is intermolecular singlet fission (xSF) within molecular aggregates or crystals[15], wherein the absorption of one photon leads to the formation of two triplet excitons on adjacent molecules[16]. Because of the intermolecular nature of this process, strong electronic coupling between nearest neighbors is required and, as such, the efficiency of this process is highly sensitive to the crystallinity of the film[17] and the presence of functional groups that expand the unit cell[18]. A more widely applicable route to functional devices would preferably be based on intramolecular processes, where the fission efficiency is an intrinsic property of the designed material—that is, it is not dependent on molecular orientation, intermolecular coupling, or long-range order, among other constraints. Furthermore, this enhances the possibility of using polymers as fission materials that have tunable chemical structure to control solution processability, film morphology, and various other physical and electronic properties. However, intramolecular singlet fission (iSF) has not been observed with high yield and, as a result, the mechanism is poorly understood. iSF has been observed in a few systems (including several vinylene-containing polymers)[19-21], but fission in these systems is typically an activated process requiring a photon with energy in excess of the bandgap. Only the oligoenes (such as carotenoids) have demonstrated non-activated intramolecular singlet fission, although yields have not exceeded 30%[22,23]. The present understanding of iSF provides little insight into how multiple exciton generation can be modularly designed as a feature in molecular materials[24].

There is still a need to better understand iSF, however, some general guidelines for efficient SF have been suggested from studies of intermolecular processes.

Recently, it was found that the coupling between the singlet state and the ME states is weak, but the MEG process is mediated by a strongly coupled intermediate CT state.

Therefore, there is still a need for singlet-fission capable organic semiconducting ("OSC") materials that are easy to synthesize, especially by methods suitable for mass production, show good structural organization and film-forming properties, exhibit good electronic properties, especially a high charge carrier mobility, good processability, especially a high solubility in organic solvents, and high stability in air. Especially for use in OPV cells, there is a need for OSC materials having a low bandgap, which enable improved light harvesting by the photoactive layer and can lead to higher cell efficiencies, compared to the polymers discussed in the literature.

SUMMARY OF THE INVENTION

The present invention provides compounds and materials that are capable of multiple exciton generation. The present invention provides the design of new materials that embody two key design elements grounded on the mechanistic understanding of SF: a) reduce the singlet-triplet gap, such that the triplet energy is approximately half of the singlet energy; and b) a lowest lying optical excitation with significant charge-transfer (CT) character that can act to mediate the SF process.

Accordingly, the present invention provides compounds and materials, including organic molecules, such as oligomers and polymers, capable of singlet fission, specifically efficient intramolecular singlet fission, such that local order and strong nearest neighbor coupling is no longer a design constraint. Compounds and materials of the invention exhibit strong intrachain donor-acceptor interactions that generate triplet populations in very high yields, e.g., yields of 160%, 175%, or more, preferably about 200%. In xSF, it has been found that the energy of the singlet state should be greater than or equal to twice the energy of the triplet state. This energy constraint also applies for efficient iSF, although iSF can still occur from hot excitons if this criteria is not fulfilled. SF from hot excitons must compete with vibrational relaxation, which may explain the low yields previously observed. Thus, the compounds and materials of the invention are prepared by conjugating strong-acceptor and strong-donor building blocks to access a charge-transfer state that is strongly coupled to the multiple-exciton state. The technology of the present invention is applicable to similar families of polymers and small molecules, and provides development of new materials with tunable electronic structure.

There are also many a wider range of energies for the excited states that can form due to the random breaks in conjugation than in a small molecule. The key requirements for molecules that can undergo efficient intramolecular singlet fission are formation of a charge-transfer state immediately following excitation and the presence of a subunit with a low triplet energy such that $E_S \geq 2E_T$.

Polymers of the invention include those of the general formulas: [SD-SA]n, [WD-SA-D-SA-WD]n, [SA-D-SA-WD]n, [SD-SP-SA]n, [SD-SP-SA-SP]n, and the like as described more fully here, wherein D represents an electron donor; SA represents a strong electron acceptor; SD represents a strong electron donor; WD represents a weak electron donor; SP represents a spacer; and n represents a positive integer, methods for their preparation and monomers used therein, blends, mixtures and formulations containing them, the use of the polymers, blends, mixtures and formulations as semiconductor in organic electronic (OE) devices, especially in organic photovoltaic (OPV) devices, and to OE and OPV devices comprising these polymers, blends, mixtures or formulations.

Other applications of the polymers of the invention include use in devices such as but not limited to hybrid photovoltaic devices, nanoparticle/Quantum dot devices, fission sensitizer in inorganic applications (e.g., silicon, CIGS, etc.).

The invention further relates to a formulation comprising a mixture or polymer blend as described above and below and one or more solvents, preferably selected from organic solvents.

The invention further relates to the use of a conjugated polymer, formulation, mixture or polymer blend as described above and below as charge transport, semiconducting, electrically conducting, photoconducting or light emitting material, or in an optical, electrooptical, electronic, electroluminescent or photoluminescent device, or in a component of such a device or in an assembly comprising such a device or component.

The invention further relates to a charge transport, semiconducting, electrically conducting, photoconducting or light emitting material comprising a conjugated polymer, formulation, mixture or polymer blend as described above and below.

The invention further relates to an optical, electrooptical, electronic, electroluminescent or photoluminescent device, or a component thereof, or an assembly comprising it, which comprises a conjugated polymer, formulation, mixture or polymer blend, or comprises a charge transport, semiconducting, electrically conducting, photoconducting or light emitting material, as described above and below.

The optical, electrooptical, electronic, electroluminescent and photoluminescent devices include, without limitation, organic field effect transistors (OFET), organic thin film transistors (OTFT), organic light emitting diodes (OLED), organic light emitting transistors (OLET), organic photovoltaic devices (OPV), organic solar cells, laser diodes, Schottky diodes, photoconductors, photodetectors, printable circuits, capacitors, and sensors.

Another embodiment includes compositions for use in preparing solar cell compositions and/or materials, and the photovoltaic solar cells prepared therefrom.

The components of the above devices include, without limitation, charge injection layers, charge transport layers, interlayers, planarizing layers, antistatic films, polymer electrolyte membranes (PEM), conducting substrates and conducting patterns.

The assemblies comprising such devices or components include, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

In addition the compounds, polymers, formulations, mixtures or polymer blends of the present invention can be used as electrode materials in batteries and in components or devices for detecting and discriminating DNA sequences.

In addition to the compounds, materials, or polymers of the invention described here, a further object of the invention is to provide methods for their preparation and monomers used therein, blends, mixtures and formulations containing them, the use of the polymers, blends, mixtures and formulations as semiconductors in organic electronic (OE) devices, especially in organic photovoltaic (OPV) devices, and to OE and OPV devices comprising these polymers, blends, mixtures or formulations.

A further object of the invention may be directed to a polymer having the Formula 2:

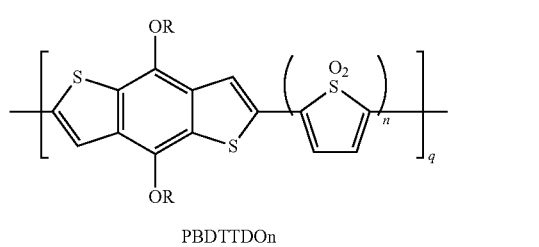

Formula 2

PBDTTDOn wherein "n" is a positive integer, "q" is a positive integer, and "R" may be the same or different and may be selected from: hydrogen, straight or branched chain alkyl of $C_{1-20}$, alkenyl, alkynyl, oligoethylene glycols, and aromatic rings. PBDTTDOn is the backbone of Formula 2, where "P" stands for poly, "BDT" is benzodithiophene, and "TDO" is thiophene dioxide.

Another object of the invention may be directed to a method of designing an intramolecular singlet fission-capable material, comprising reducing a singlet-triplet pair gap, wherein the triplet energy is about half the singlet energy; and containing charge-transfer character in the lowest-energy optical excitation state.

BRIEF DESCRIPTION OF THE DRAWING FIGURES

FIG. 5 is an illustration of the effect of thiophene oxidation on excited state lifetime.

FIGS. 6A and 6B are illustrations of the effects of thiophene oxidation on the optical properties of the materials of Comparative Example 16 showing the linear absorption spectra.

FIGS. 7A-7D illustrate the TA and PRTT for all TDO-containing materials of Comparative Example 16.

As illustrated in FIG. 7A, the BDT-TDO1 compound is represented by the dark (black) line, while the p-BDT-TDO$_1$ compound is represented by the dashed line. As illustrated in FIG. 7B, the BDT-TDO$_2$ compound is represented by the dark line, while the p-BDT-TDO$_2$ compound is represented by the dashed line (grey line). In both FIGS. 7A and 7B, both the BDT-TDO$_1$ and p-BDT-TDO$_1$ compounds (FIG. 7A) and the BDT-TDO$_2$ and p-BDT-TDO$_2$ (FIG. 7B) start at approximately the same normalized ΔOD point at the top of each graph, and drop down equivalently, for each polymer in each graph, respectively, at about the zero (0) seconds mark.

As illustrated in FIG. 7C, the BDT-TDO$_1$ compound is represented by the dark (black) line, the p-BDT-TDO$_1$ compound is represented by the dashed (grey) line, and the BDT-TDO$_1$ triplet is represented by circles. As can be seen, these BDT-TDO$_1$ and p-BDT-TDO$_1$ compounds initially descend on the Scaled ΔOD at the about 630-650 wavelength (nm); all lines approach the same Scaled ΔOD level and the p-BDT-TDO$_1$ triplet appears. As illustrated in FIG. 7D, the BDT-TDO$_2$ (dark solid line) and p-BDT-TDO$_2$ (dashed grey line) compounds, and the p-BDT-TDO$_2$ triplet (solid circles), appear at a wavelength of about 450 nm on the Scaled ΔOD reach their peak at about the 650-700 nm wavelength, 725 to 775 nm wavelength.

Figure 8:
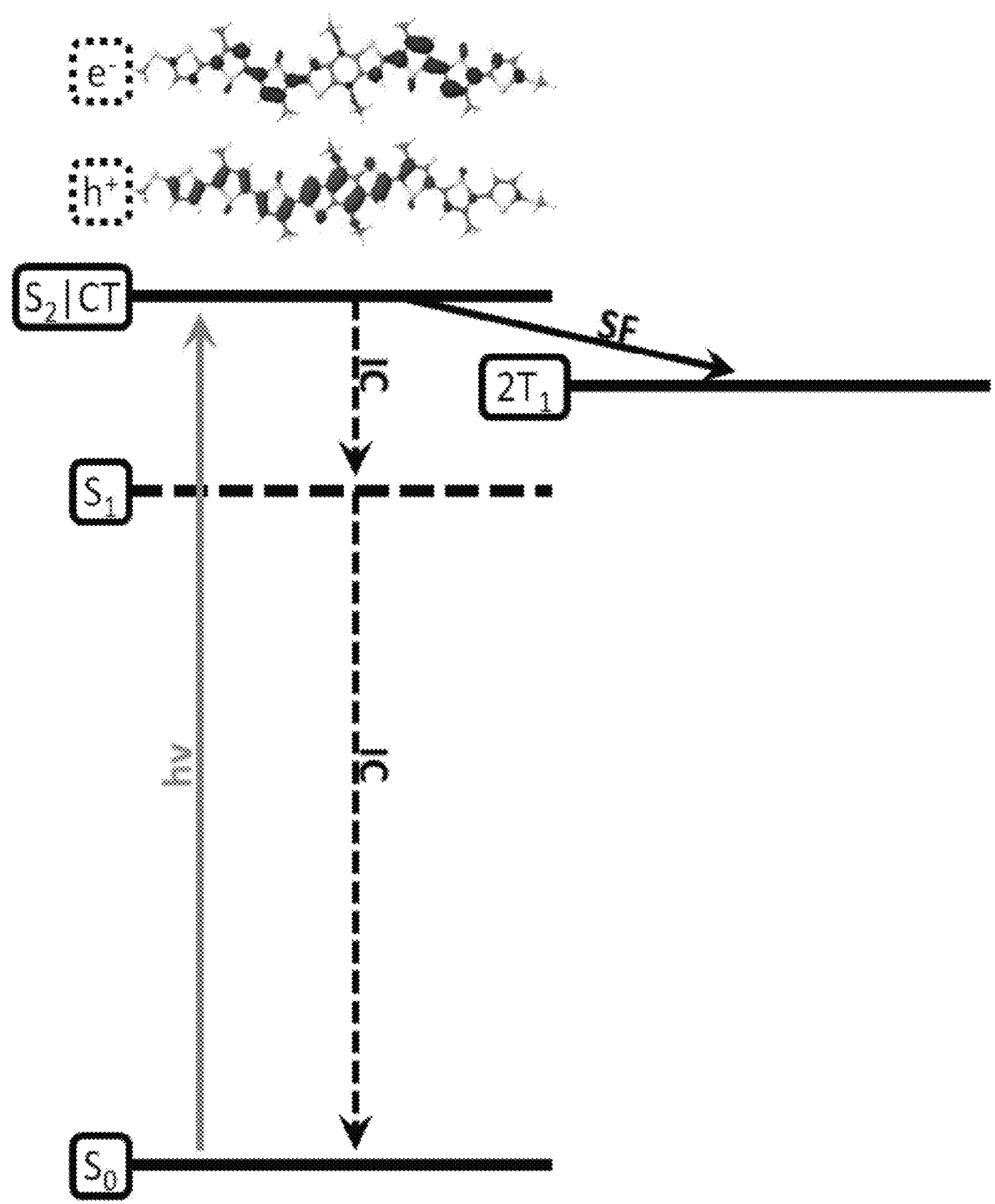

FIG. 8 illustrates a scheme showing the singlet deactivation process.

Figure 9A:
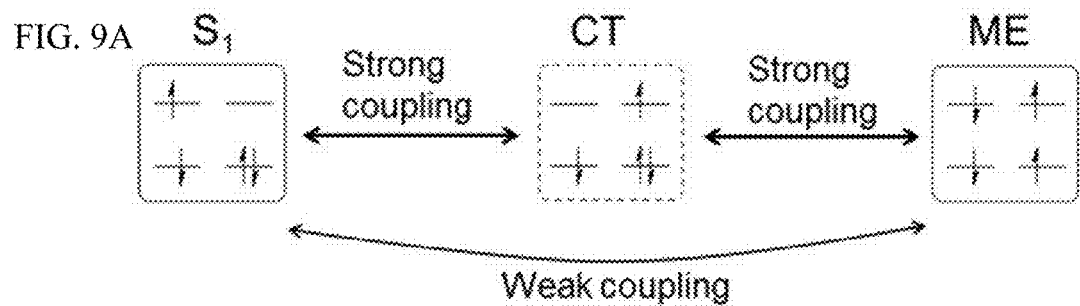
Figure 9B:
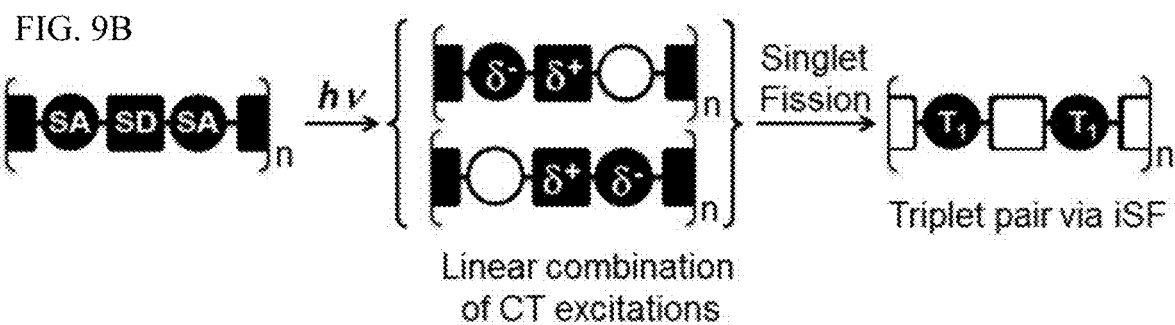

FIGS. 9A and 9B illustrate a design template for singlet-fission-capable molecular and polymeric materials. FIG. 9A shows the mechanism for singlet fission: a singlet exciton (S1) is strongly coupled to a charge-transfer (CT) state, which is in turn strongly coupled to the multiexcitonic triplet state (ME). This charge-transfer mediated process strongly couples the S1 and ME states, whereas the direct S1-to-ME coupling is very weak[28, 29]. FIG. 9B shows a fundamental design for charge-transfer mediated intramolecular singlet fission using strong-donor (SD) and strong-acceptor (SA) units. Singlet excited states can be viewed as a linear combination of intramolecular CT states (denoted as singlet excitons with partial positive (δ+) and negative (δ−) charges on the donor and acceptor, respectively), which mediate the population of localized triplet states (T1) within the SA units through singlet fission.

Figure 10A:
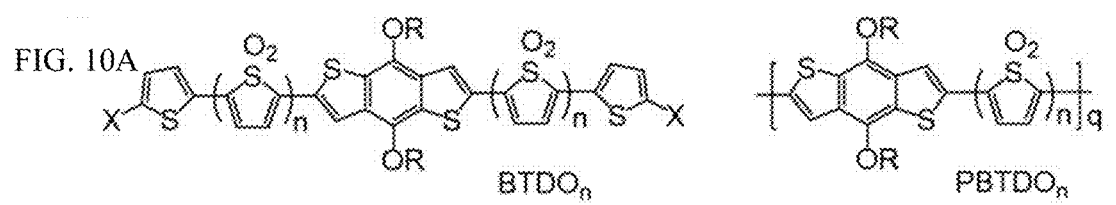
Figure 10B:
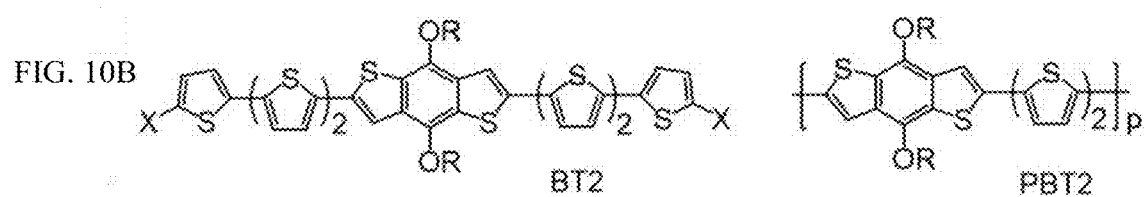
Figure 10C:
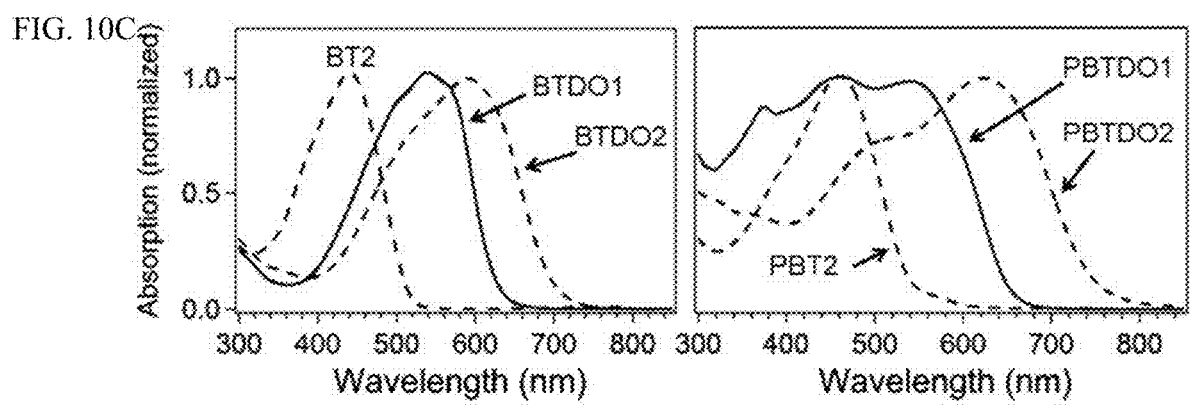

FIGS. 10A-10C illustrate structures and absorption spectra of singlet-fission-exhibiting and control materials. FIG. 10A shows singlet fission small molecules and polymers (η=1,2). The strong electron acceptor units based on TDO are shown in red and the donor units are shown in blue. FIG. 10B shows control small molecule and polymer without SA units. FIG. 10C shows absorption spectra of the molecules and polymers. Unoxidized materials are shown for reference. See the Examples for detailed structures with solubilizing groups.

FIGS. 11A-11D illustrate transient absorption data and global analysis for PBTDO1. FIG. 11A, Transient absorption of PBTDO1 is shown in a pseudo-color plot with singlet/charge-transfer exciton (Sbright/CT) and triplet exciton (T1) features denoted. FIG. 11B shows the dynamics are shown with kinetic traces (open circles) and fits (solid lines) taken through the singlet (>750 nm) and triplet (700-725 nm) absorption features in spectral regions with minimal overlap with other spectral features. FIG. 11C and FIG. 11D show results of global analysis used to model singlet charge-transfer exciton, triplet and charge-separated (CS) populations to extract time independent spectral signatures (FIG. 11C) and population concentration versus time (FIG. 11D). FIGS. 11A-11C are plotted in the unit-less quantity ΔOD or ΔmOD, the change in optical density or parts-per-thousand change in optical density, respectively. Details of the global analysis and concentration calculation are given in the Examples. In FIG. 11C data were excised in the regions obscured by excitation and fundamental scatter, around 550 nm and 800 nm, respectively. Raw transient absorption data are plotted in FIGS. 22A-22D.

FIGS. 12A-12D illustrate TA and PRTT for all TDO-containing materials. FIG. 12A and FIG. 12B show the triplet spectra are compared in TDO1- (FIG. 12A) and TDO2-containing (FIG. 12B) molecules and polymers. The spectra of triplets generated from singlet fission (solid lines) are compared against triplets generated through pulse radiolysis (circles). SF-generated spectral traces are from TA data sets; global target analysis[40,41] was used to extract the triplet spectrum when the triplet had significant temporal overlap with other populations (details in the Examples). Because the triplet is localized on the TDO moieties, the triplet spectrum is equivalent for all materials containing the same number of sequential TDO monomers (aside from the contribution of the overlapping bleach band). FIG. 12C and FIG. 12D show recombination of triplet pairs generated from singlet fission compared against recombination of lone triplets generated through pulse radiolysis (black traces) in TDO1- (FIG. 12C) and TDO2-containing (FIG. 12D) molecules and polymers. The time axes of the pulse radiolysis traces have been offset to exclude the population growth and emphasize the triplet decay. The logarithmic axis highlights several orders of magnitude difference in the triplet and triplet pair recombination lifetimes. In panels FIG. 12A and FIG. 12B, transient absorption data were excised from regions obscured by laser scatter. Raw transient absorption data were plotted in FIG. 22A-22D.

FIGS. 13A and 13B illustrate bleach recovery in transient absorption measurements. FIG. 13A and FIG. 13B show the ground state recovery kinetics are also compared for TDO1- (A) and TDO2-containing (B) materials. The approximate triplet population dynamics, as extracted using global analysis, is compared against the ground state recovery for each material (black dashes).

Figure 14A:
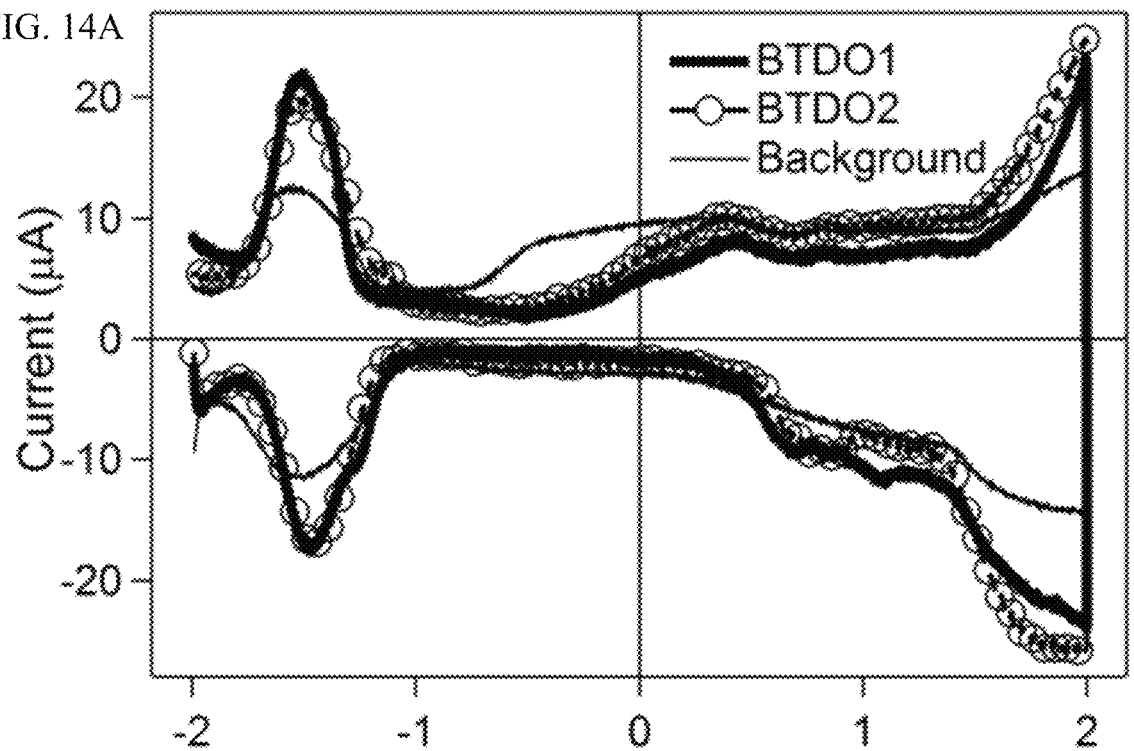
Figure 14B:
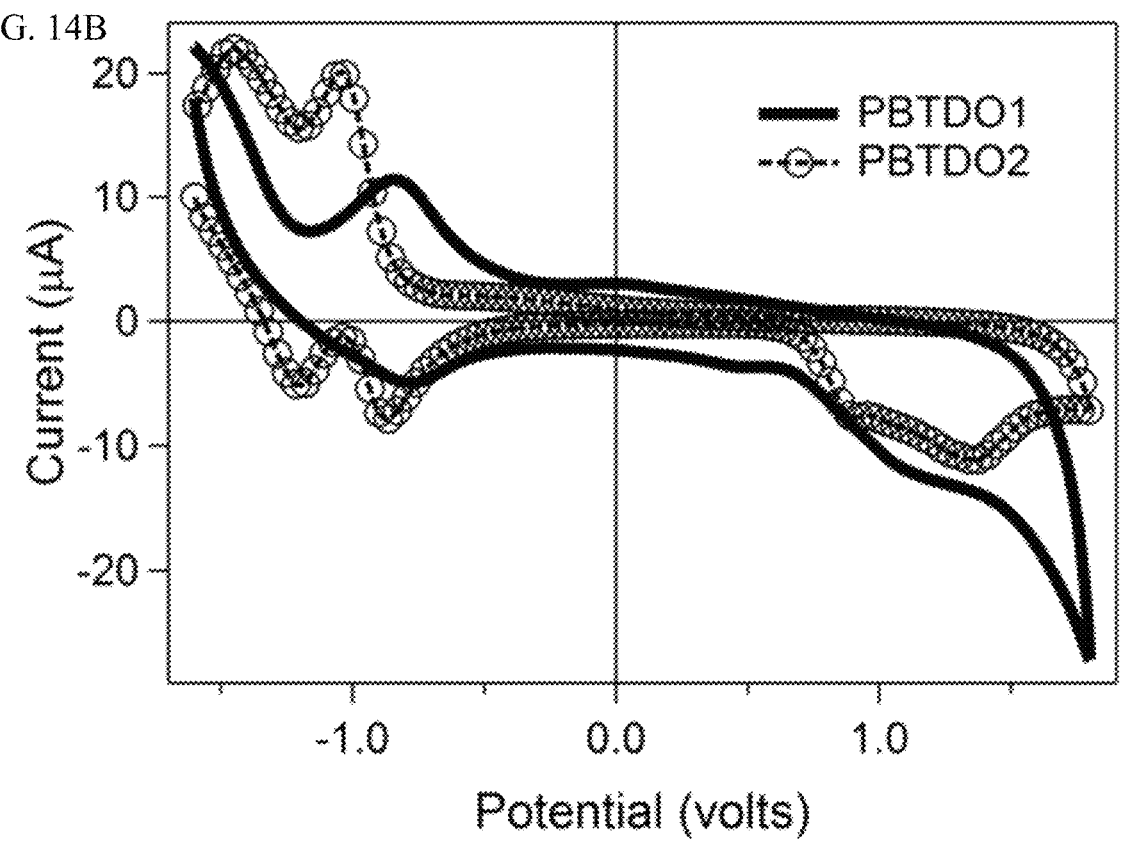

FIGS. 14A and 14B illustrate a cyclic voltammogram of TDO-containing materials. The oxidation and reduction of BTDO1 (FIG. 14A), PBTDO1 (FIG. 14B), BTDO2 (FIG. 14A) and PBTDO2 (FIG. 14B) are displayed. The electrolyte background in the small molecule CV partially obscures the oxidation feature.

Figure 15A:
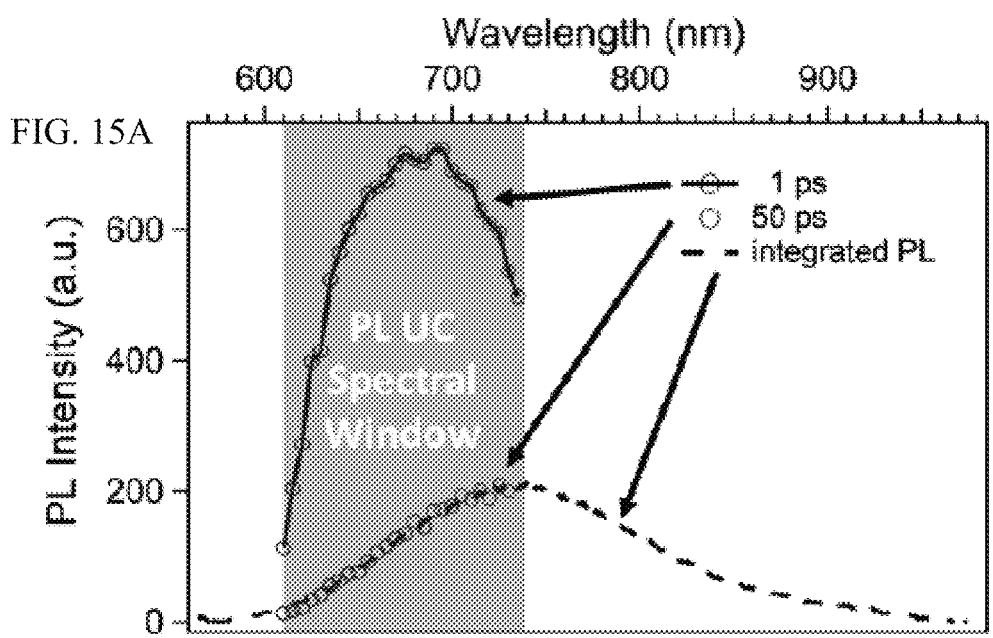

FIG. 15A illustrates photoluminescence up conversion at 1 ps and 50 ps is compared to integrated photoluminescence (dashed line). The 1 ps PL spectrum confirms that singlet excitons are in a bright excitonic state. The spectral similarity between the 50 ps PL and the integrated PL demonstrate that the majority of PL arises from triplet pair recombination. (FIG. 15B. The ultrafast PL kinetics are shown with a biexponential fit with 7 ps and 90 ps time constants, which correspond to the singlet fission and triplet pair recombination lifetimes.

FIGS. 16A and 16B illustrate a concentration dependence where transmission spectra and bleach recovery (500-620 nm) are displayed for BTDO2 at varied concentration in chloroform.

Figure 17:
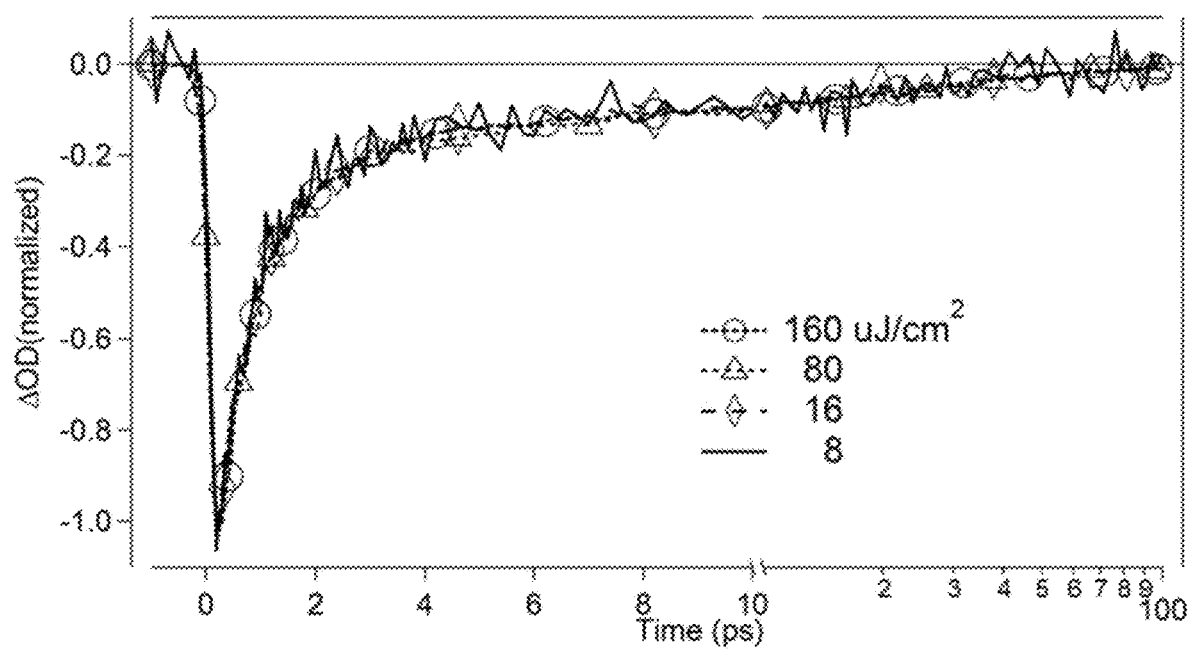

FIG. 17 illustrates fluence dependence where bleach recovery is displayed for BTDO2 following excitation at 600 nm with varied excitation fluence. Over a factor of 20 variation in laser fluence, no significant difference in SF yield or triplet yield or lifetime is observed.

FIGS. 18A and 18B illustrate poly(fluorene-alt-TDO) dynamics in the transient absorption dynamics of PFTDO1. Labels indicate the features associated with the ground state bleach (GSB), stimulated emission (SE), and singlet photoinduced absorption (S1-Sn PIA).

FIGS. 19A-19E illustrate transient absorption of an unoxidized small molecule. To ensure that the thiophene oxidation is the cause of singlet fission, analogous polymers and molecules with benzodithiophene (B) and unoxidized thiophene (Th) were synthesized and analyzed with TA spectroscopy (FIG. 19A). BTh2 is shown. The ground state bleach (GSB), stimulate emission (SE), and photoinduced absorption bands (S1-PIA and T1-PIA) are labeled, as assigned in the text. The data is fit with a three state global target model (FIG. 19B), which provides good kinetic fits traces (FIG. 19C) and deconvolutes the spectral signatures of the populations (FIG. 19D), assigned as S1*, S1, and T1. Data has been excised in regions obscured by fundamental scatter. FIG. 19E illustrates the excited state lifetime of BT2 upon thiophene oxidation compared to PBTDO2.

FIGS. 20A-20D illustrate transient Absorption Data for TDO-containing materials. Displayed are pseudo-color plots of the transient absorption dynamics for TDO-containing molecules (FIG. 20A, FIG. 20C) and polymers (FIG. 20B, FIG. 20D). Each panel shows three prominent features: ground state bleach (GSB), singlet induced absorption (S→Sn), and triplet induced absorption (T1→Tn). Data has been excised from spectral regions obscured by excitation scatter. The time axis for PBTDO1 is longer.

Figure 21:
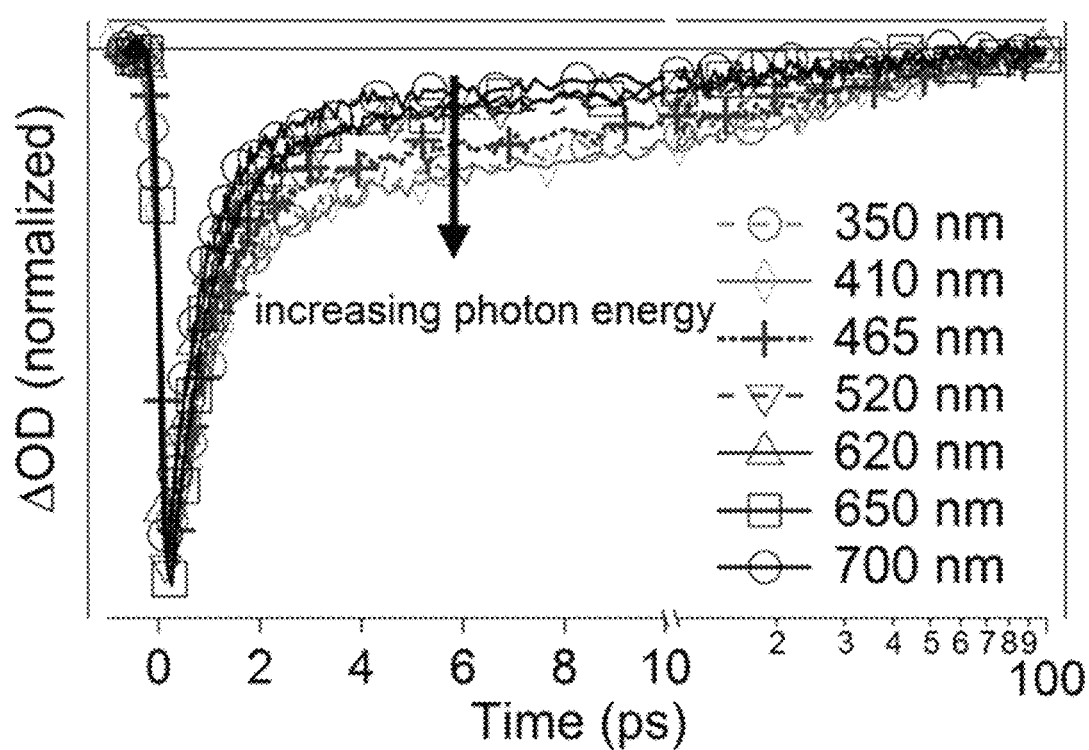

FIG. 21 illustrates excitation wavelength dependence. Excitation wavelength dependent bleach recovery (500-600 nm, excluding regions obscured by excitation scatter) is shown for BTDO2. Relative internal conversion and singlet fission yields can be approximated by the magnitude of their respective about 1 ps and greater than (>) 10 ps decay components.

FIGS. 22A-22D illustrate raw transient absorption data for TDO-containing materials. The data shown correspond to FIGS. 20A-20D, before any processing or background correction is completed. Preceding analysis, these data were background-corrected by subtracting the average of the data at negative delay times. This effectively removes the pseudo-steady state portion of the scattered excitation light. However, fluctuations in the scatter may still present themselves in the data. The regions obscured by this remaining scatter are then removed from the dataset. This is done to prevent scattering artifacts from influencing the global analysis results. The dataset (without scatter) is then globally analyzed (details in methods section) and the results are displayed in FIGS. 11A-11D and 12A-12D. Kinetic traces (FIGS. 13A and 13B) are generated by averaging bleach kinetic traces from regions that do not show significant overlap with scatter or the triplet absorption feature on the low energy side of the bleach.

Figure 23A:
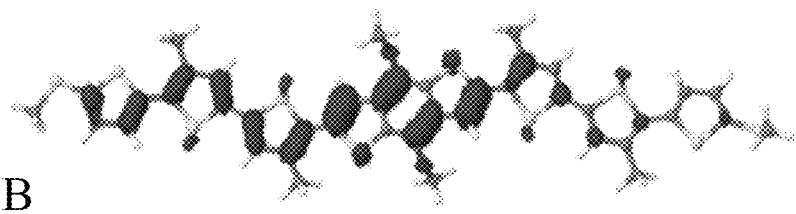
Figure 23B:
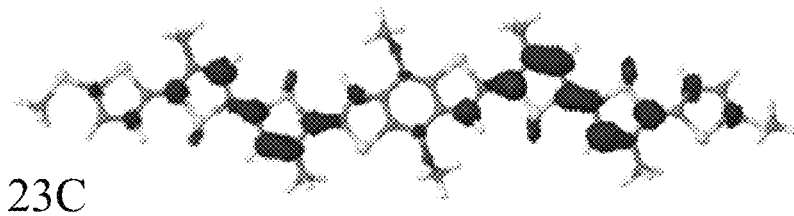
Figure 23C:
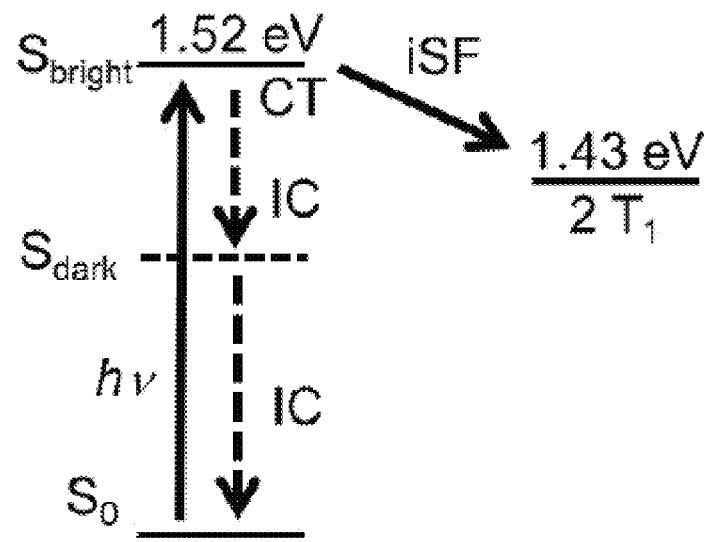

FIGS. 23A-23C illustrate the initial and final electronic states. Initial and Final Electronic States. After optical excitation (hv) the singlet charge transfer exciton (Sbright|CT) is formed. The hole (FIG. 23A) and electron (FIG. 23B) wavefunctions are approximated with detachment/attachment density analysis. (FIG. 23C) The iSF process results in conversion of the Sbright state (1.52 eV) to a pair of localized triplets (2 T1) with a total energy of 1.43 eV. The detrimental internal conversion (IC) pathway, which competes with iSF on a sub-picosecond timescale in some systems, is also displayed. The states displayed here are the initial and final electronic states in the iSF process. The transition from singlet exciton to triplet pair does not occur directly; a more detailed discussion of the iSF mechanism is included in the Examples section.

Figure 24:
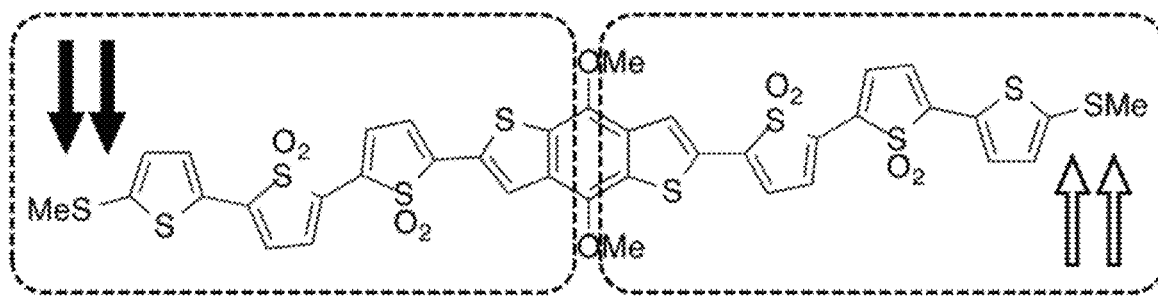

FIG. 24 illustrates the model molecule for computational studies, where the boxes indicate the parts where constraints are applied for constrained DFT calculations.

Figure 25A:
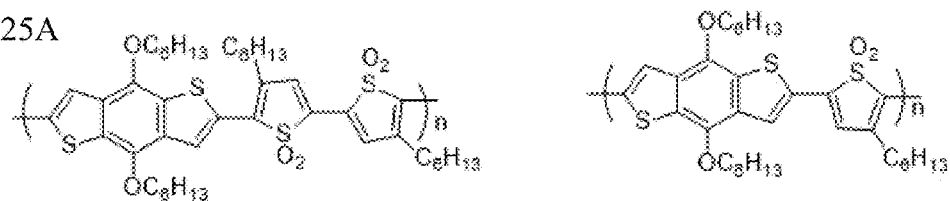
Figure 25B:
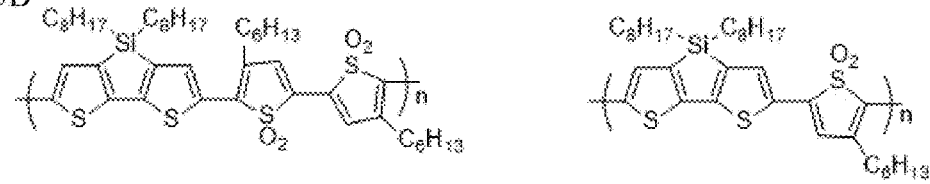
Figure 25C:
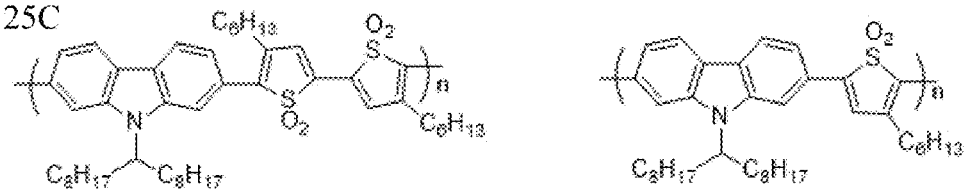

FIGS. 25A-25C illustrate structures of the polymers described here. The left column depicts TDO2 polymers and the right column depicts TDO1 polymers. The row of polymers in FIG. 25A shows the donor benzodithiophene (B), FIG. 25B shows the donor dithieneosilane (D), and FIG. 25C shows carbazole (C).

Figure 26A:
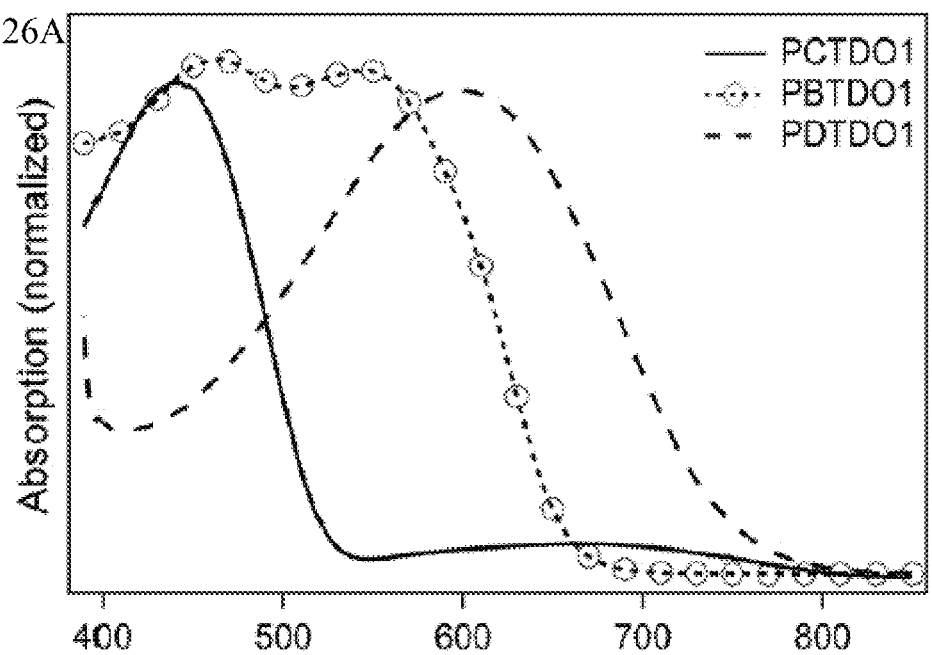
Figure 26B:
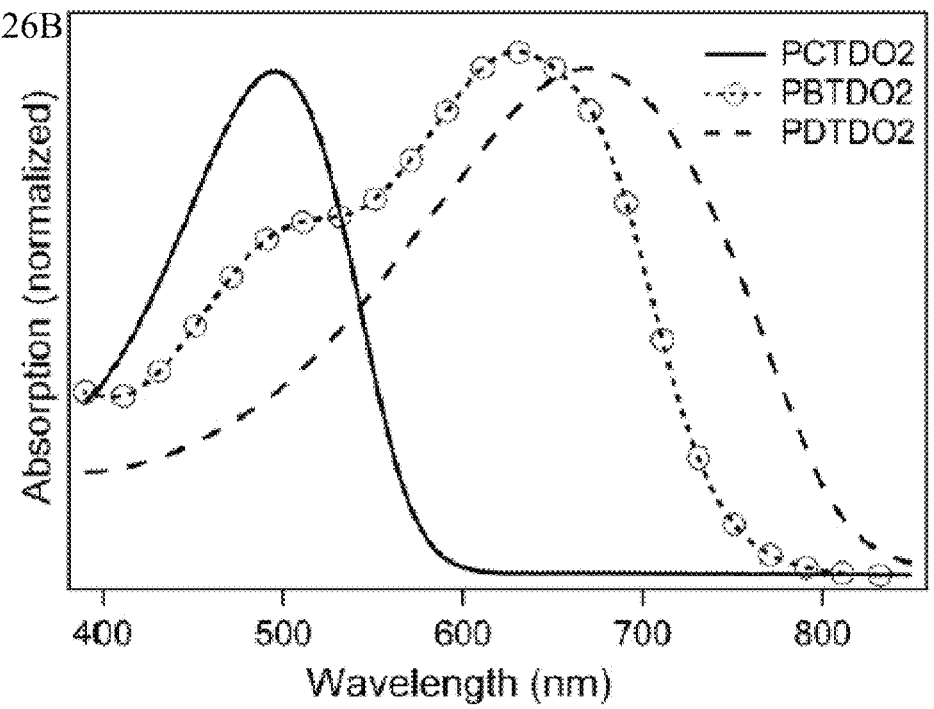

FIGS. 26A and 26B illustrate the normalized UV absorption spectra of polymers. FIG. 26A shows TDO1-containing polymers, and FIG. 26B shows TDO2-containing polymers.

FIGS. 27A-27F illustrate pseudocolor plots of transient absorption for TDO-containing polymers, where the left column (FIGS. 27A, 27C and 27E) depict TDO1-containing polymers and the right column (FIGS. 27B, 27D and 27F) depict TDO2-containing polymers. Note the different time axes.

FIGS. 28A-28D illustrate normalized bleach recovery kinetics for (FIG. 28A) TDO1-containing polymers and (FIG. 28B) TDO2-containing polymers. Triplet populations are approximated as exponential (dashed lines). Note the differing time axes. Triplet transient absorption spectra are plotted for (FIG. 28C) TDO1-containing and (FIG. 28D) TDO2-containing singlet fission-capable materials. Triplet spectra from triplet sensitization experiments of small molecule analogues are also displayed (dots). Note that the triplet spectra differ only due to varying contributions from the ground state bleach.

Figure 29A:
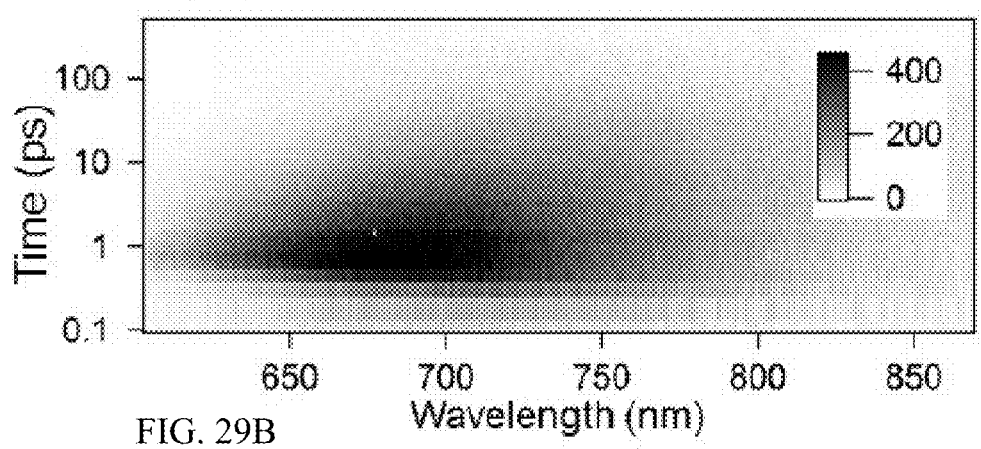
Figure 29B:
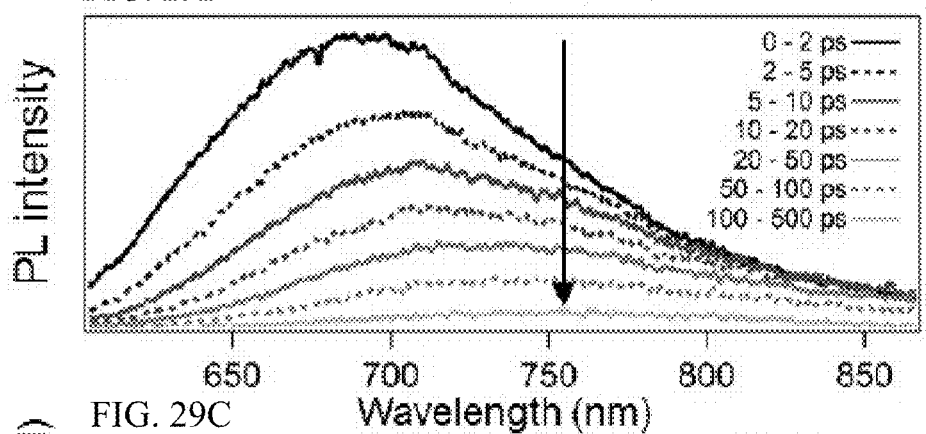
Figure 29C:
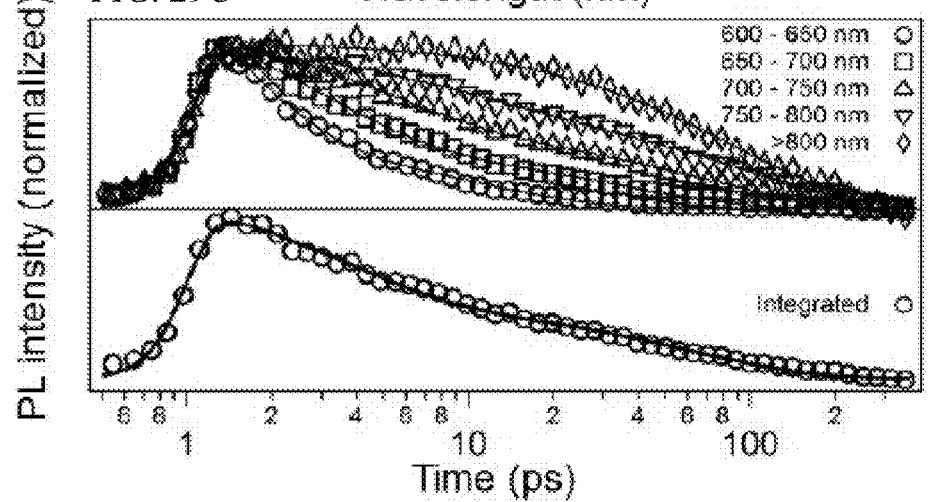

FIGS. 29A-29C illustrate transient photoluminescence data plotted as a pseudocolor surface.

FIGS. 30A-30D illustrate (FIG. 30A) transient photoluminescence data plotted as a pseudocolor surface (FIG. 30B). Spectral traces are displayed for <2 ps and >10 ps with Gaussian-exponential convolution fits (lines) (FIG. 30C). PL kinetics are displayed for 675 nm and 775 nm, the early and late spectral peaks respectively. The excited state processes observed with time resolved photoluminescence (TRPL) are shown (FIG. 30D).

FIGS. 31A and 31B illustrate (FIG. 31A) the difference in the central energy of the singlet and triplet-pair emission features plotted against the solvent orientation dipole (Δf). A linear fit is displayed (dashes). The singlet fission rate is plotted against the difference in the central energy of the singlet and triplet-pair emission features (FIG. 31B). A linear fit is displayed (dashes).

Figure 32:
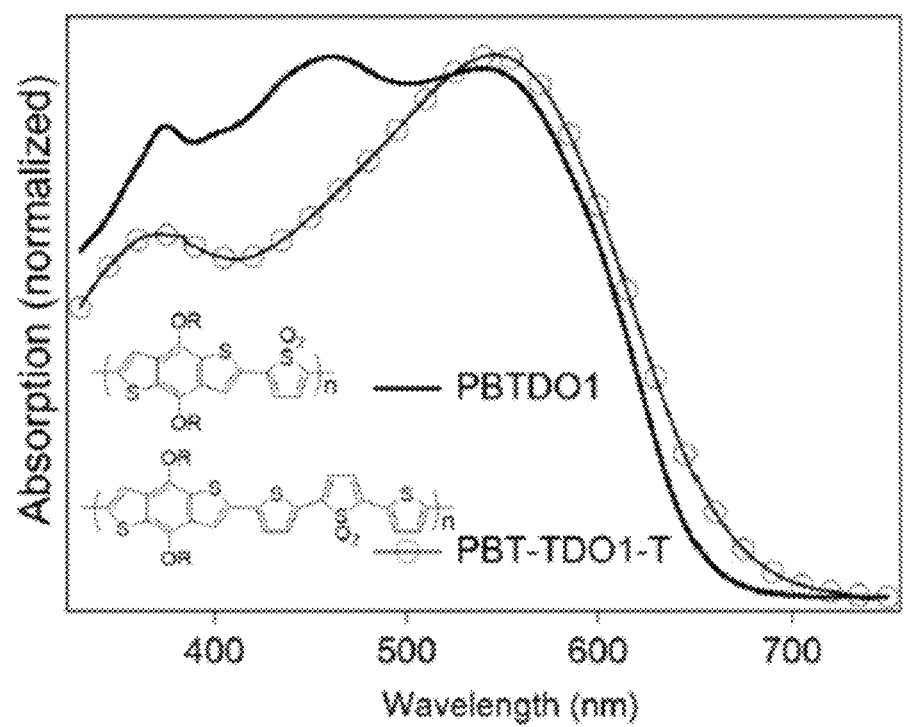

FIG. 32 illustrates the absorption spectra of PBTDO1 and PBT-TDO1-T with their chemical structures.

Figure 33A:
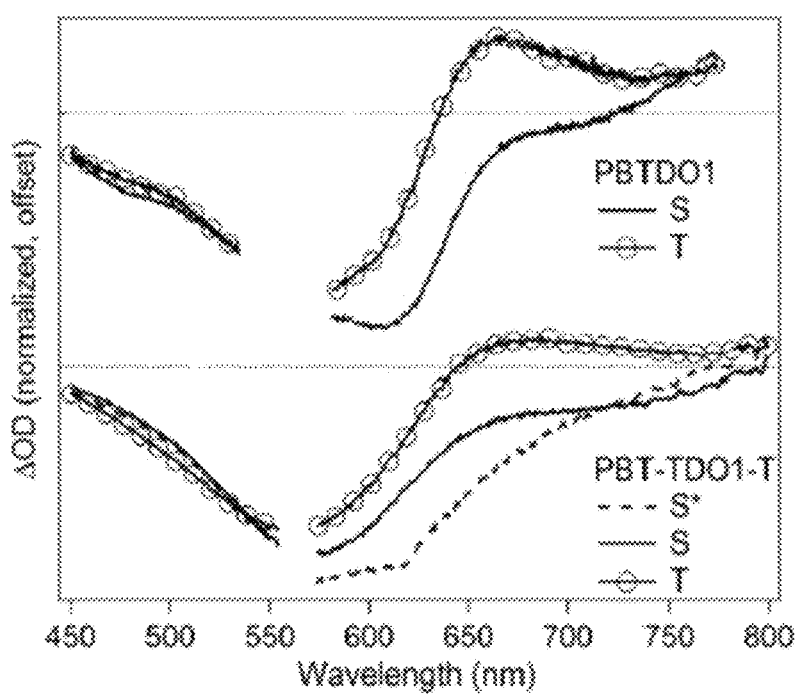
Figure 33B:
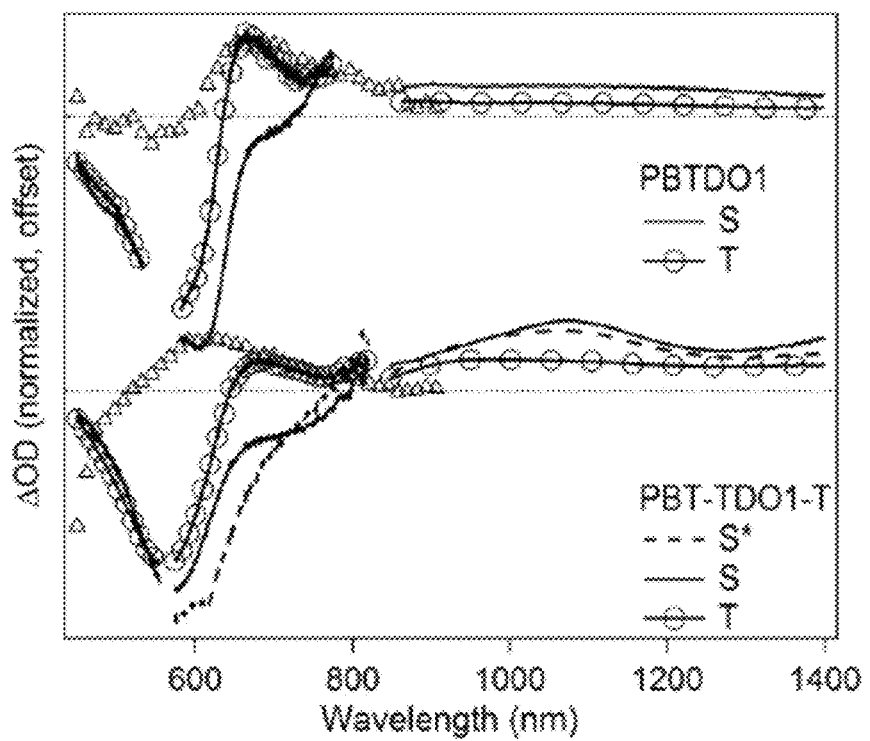
Figure 33C:
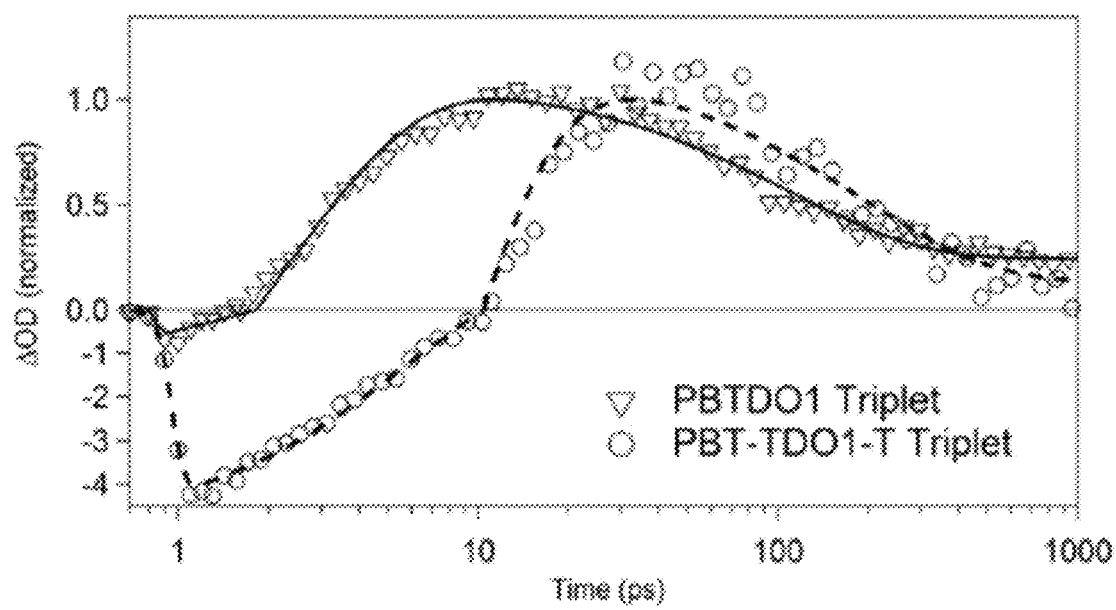

FIGS. 33A-33C illustrate (FIG. 33A and 33B) the singlet and triplet spectra for PBTDO1 and PBT-TDO1-T. These spectra were deconvoluted with global target analysis (FIG. 33C). Kinetics through the peak of the triplet PIA are displayed along tri-exponential fits. Note the split axis scale.

Figure 34:
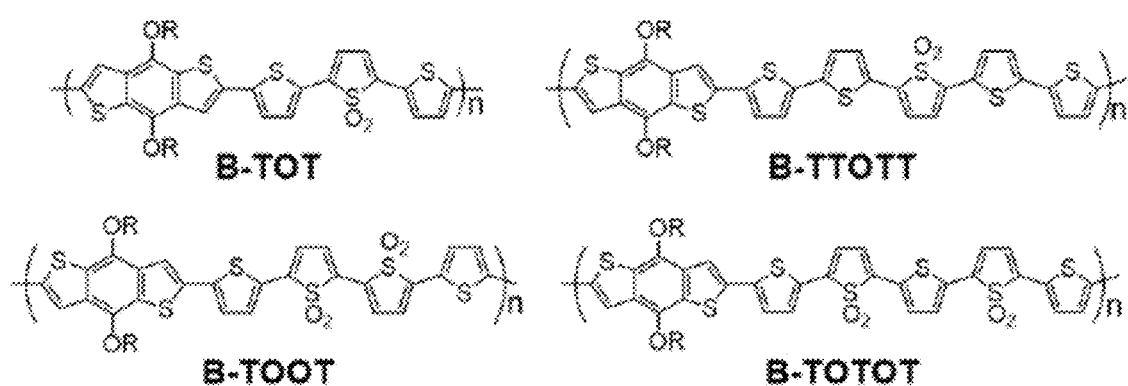

FIG. 34 illustrates exemplary polymer structures described here, including pBTOT (polybenzodithiophene [2,2':5',2"-terthiophene]-1',1'-dioxide); pBTOOT (polybenzodithiophene [2,2':5',2":5",2'''-quaterthiophene]-1',1',1''',1'''-tetraoxide); pBTTOTT (polybenzodithiophene [2,2':5',2":5",2''':5''',2''''-quinquethiophene]-1",1"-dioxide); and pBTOTOT (polybenzodithiophene [2,2':5',2":5",2''':5''',2''''-quinquethiophene]-1',1',1''',1'''-tetraoxide). In the shorthand notation, 'B' denotes benzodithiophene; 'T' denotes thiophene, which may be a spacer; 'O' denotes thiophene dioxide, and 'p' denotes that these compounds are polymers. Note that solubilizing alkyl chains can be placed on the any of the available 3,4 positions of the thiophenes.

Figure 35A:
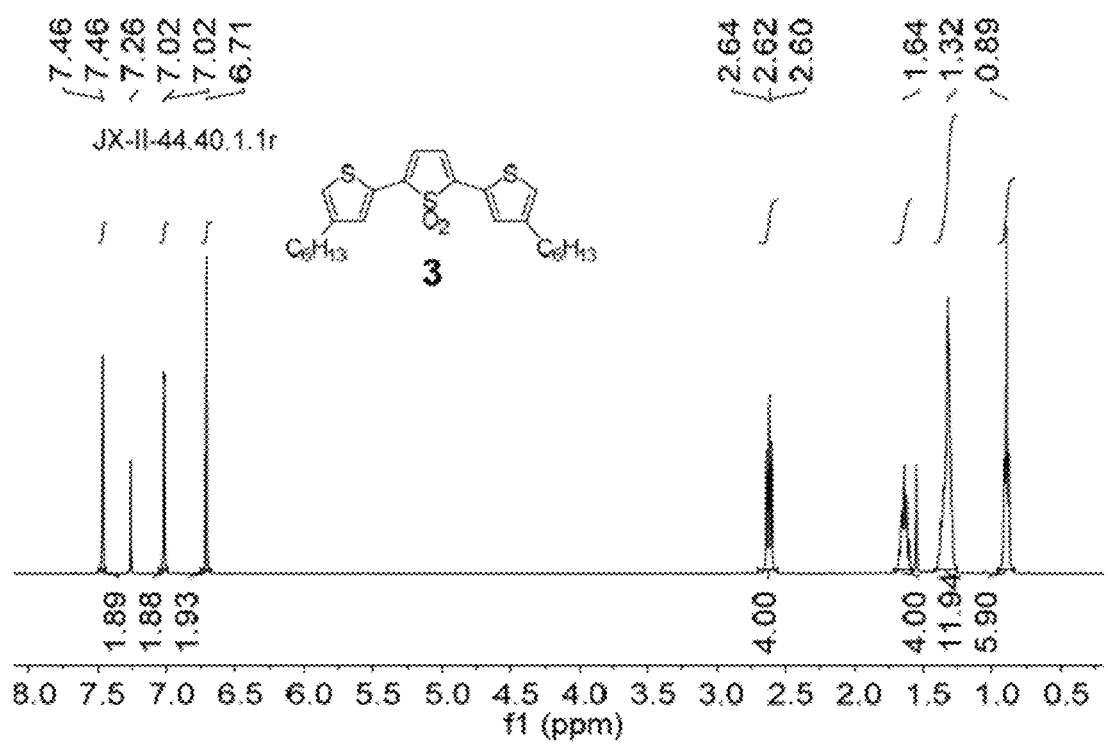
Figure 35B:
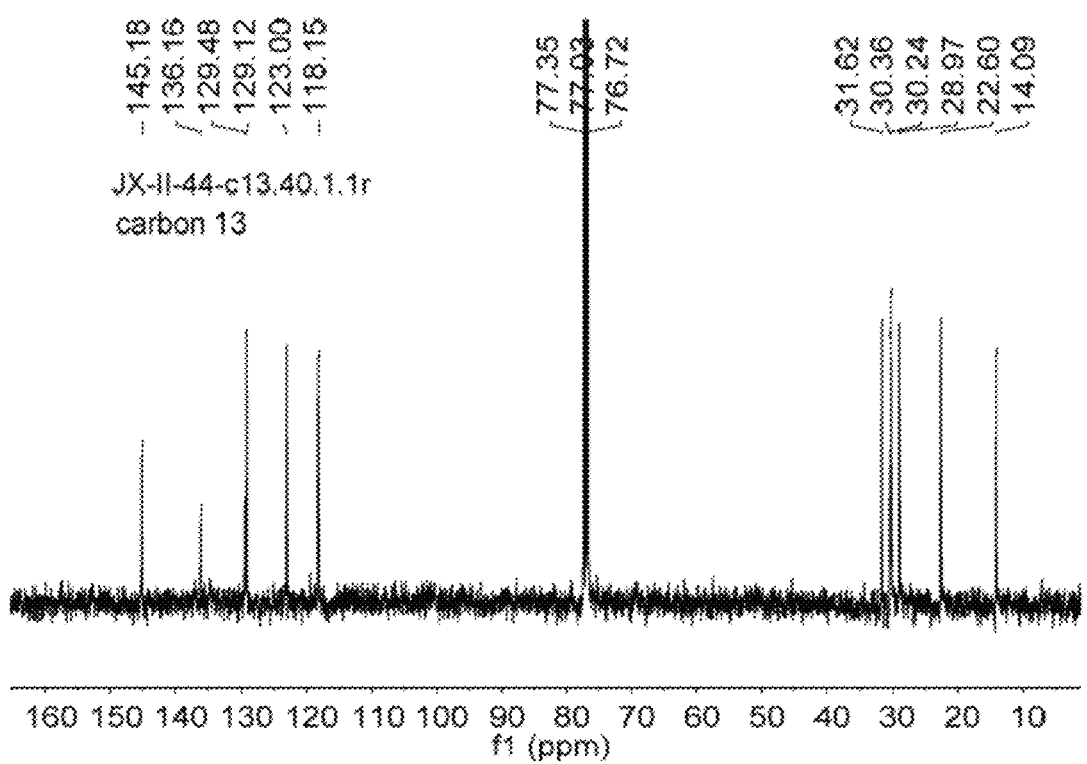

FIGS. 35A and 35B illustrate NMR spectra for TDO Compound 3 (see EXAMPLE 11). (FIG. 35A) 1H NMR spectra and (FIG. 35B) 13C NMR spectra.

Figure 36A:
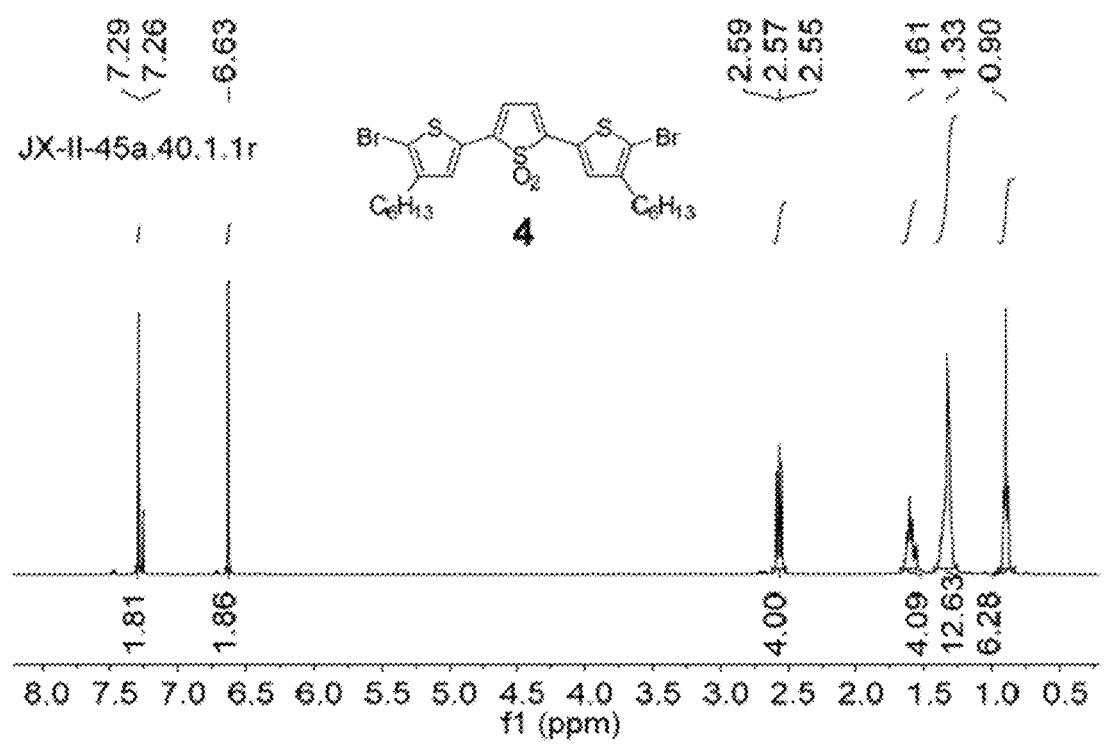
Figure 36B:
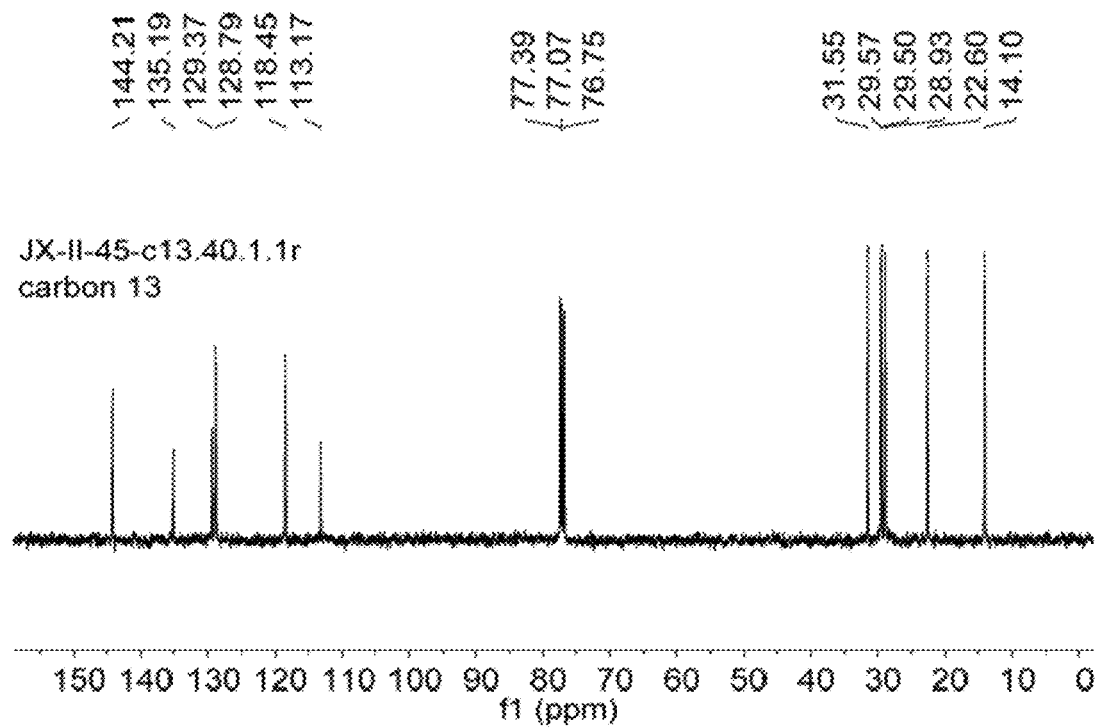

FIGS. 36A and 36B illustrate NMR spectra for TDO Compound 4 (see EXAMPLE 11). (FIG. 36A) 1H NMR spectra and (FIG. 36B) 13C NMR spectra.

Figure 37A:
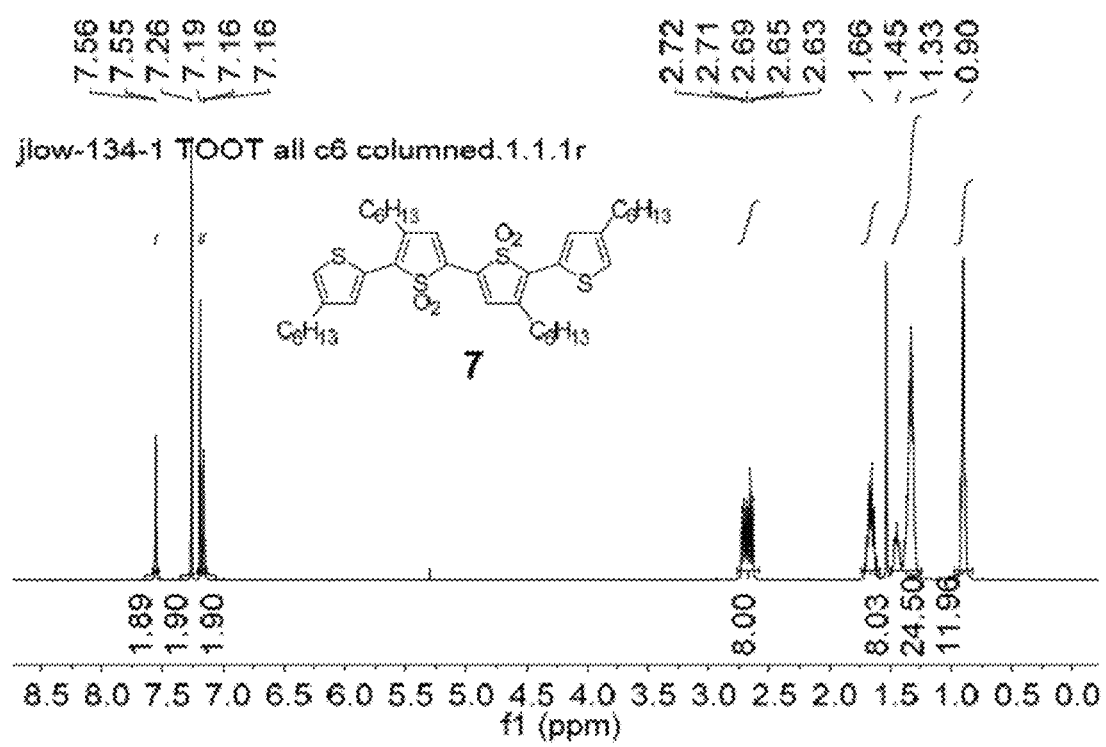
Figure 37B:
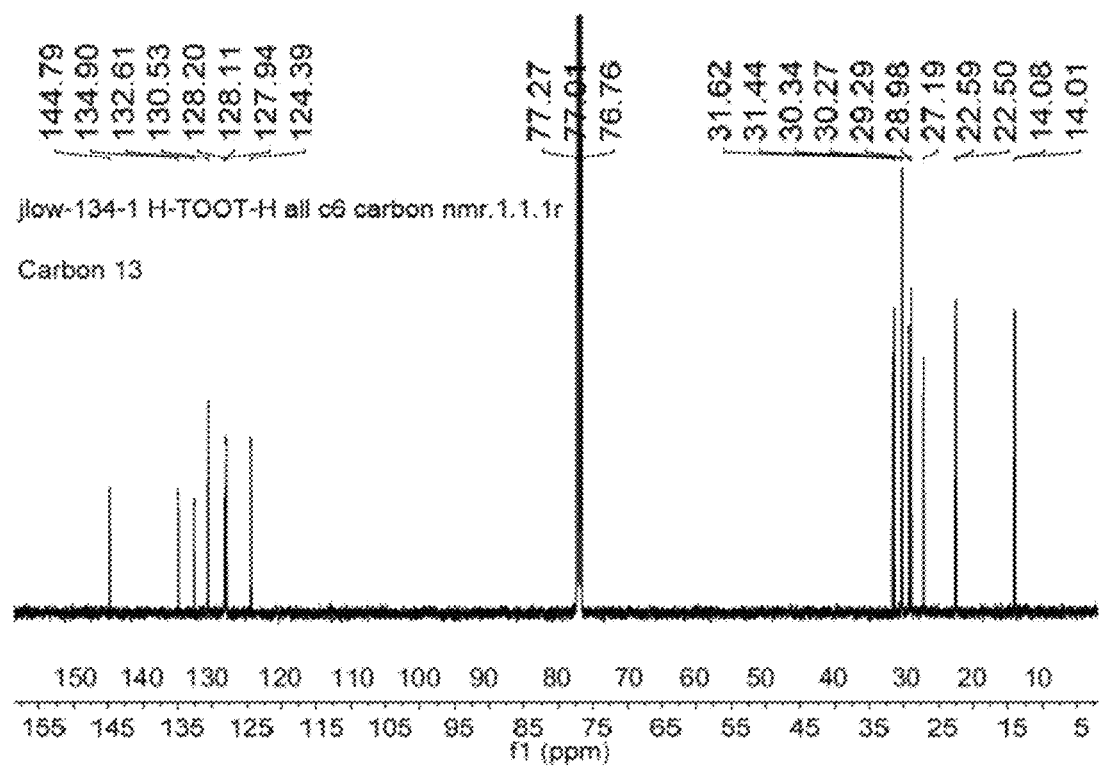

FIGS. 37A and 37B illustrate NMR spectra for TDO Compound 7 (see EXAMPLE 12). (FIG. 37A) 1H NMR spectra and (FIG. 37B) 13C NMR spectra.

Figure 38A:
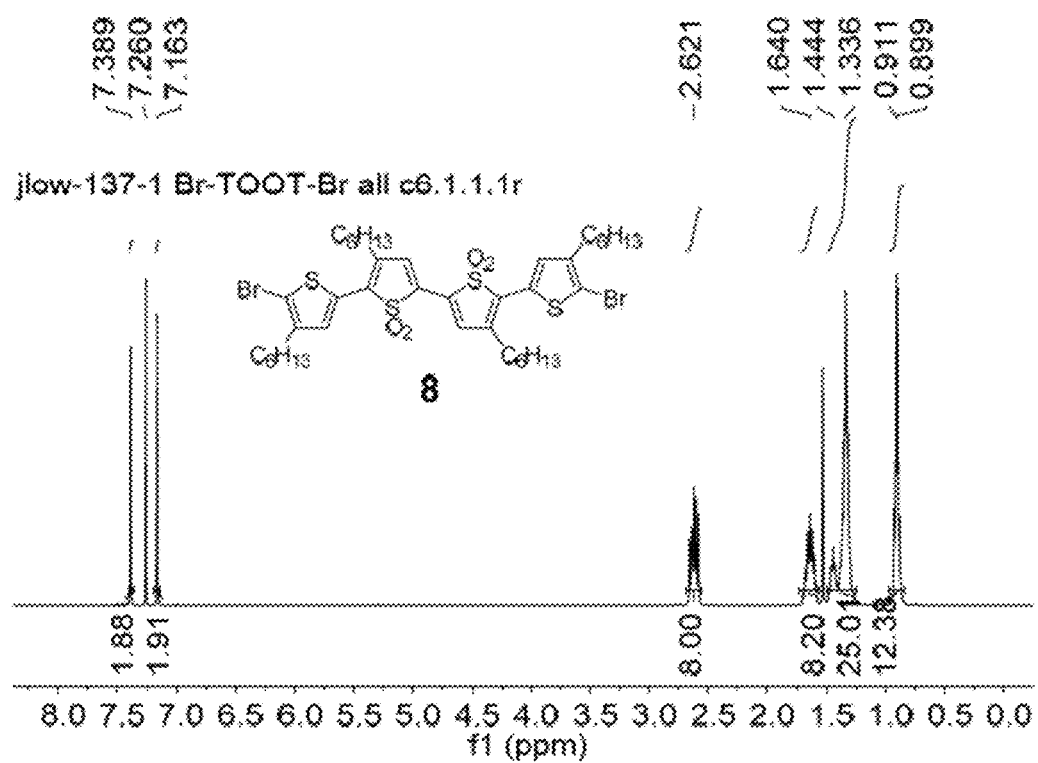
Figure 38B:
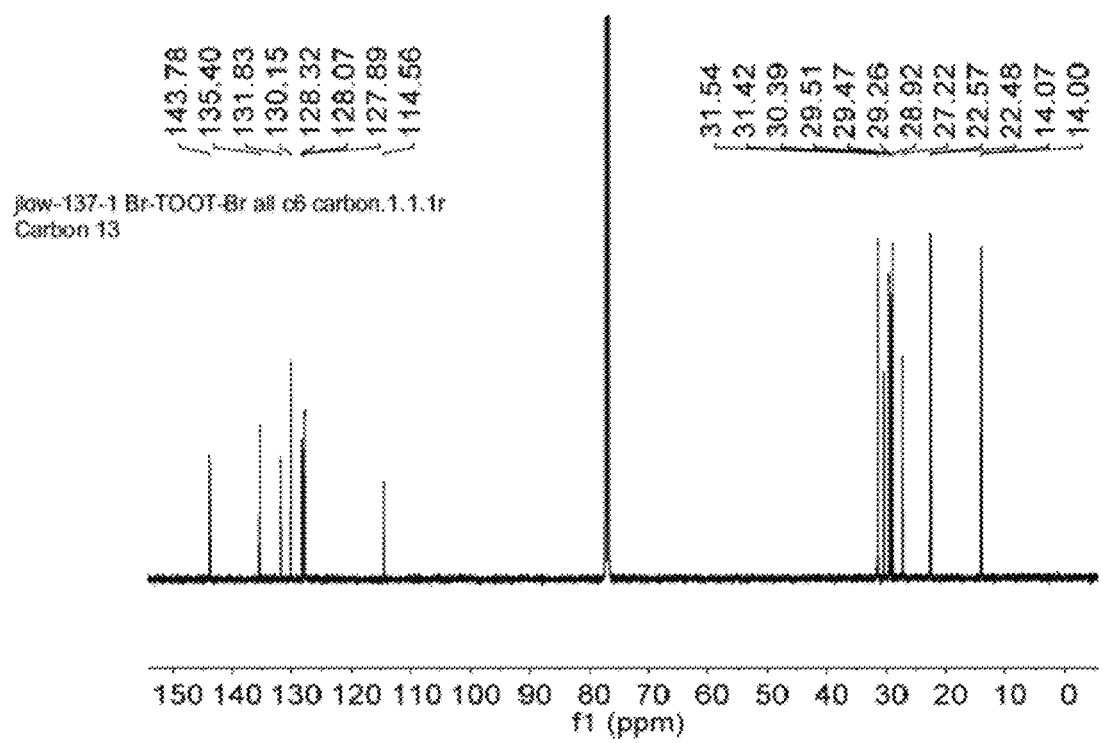

FIGS. 38A and 38B illustrate NMR spectra for TDO Compound 8 (see EXAMPLE 12). (FIG. 38A) 1H NMR spectra and (FIG. 38B) 13C NMR spectra.

Figure 39A:
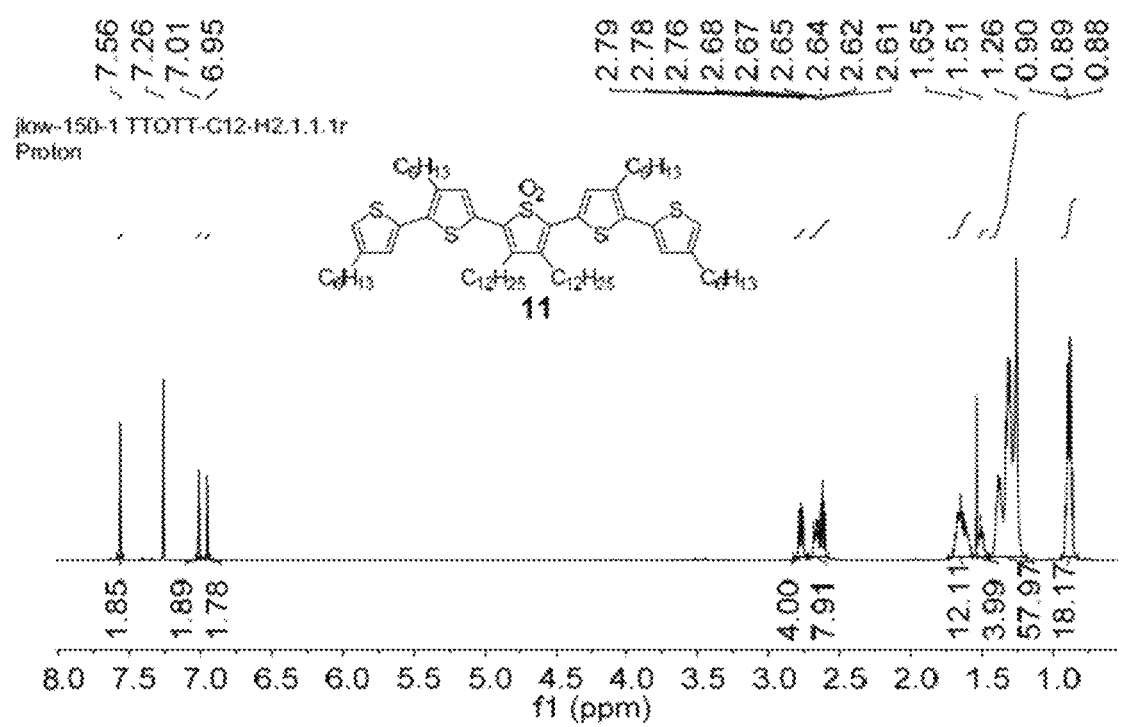
Figure 39B:
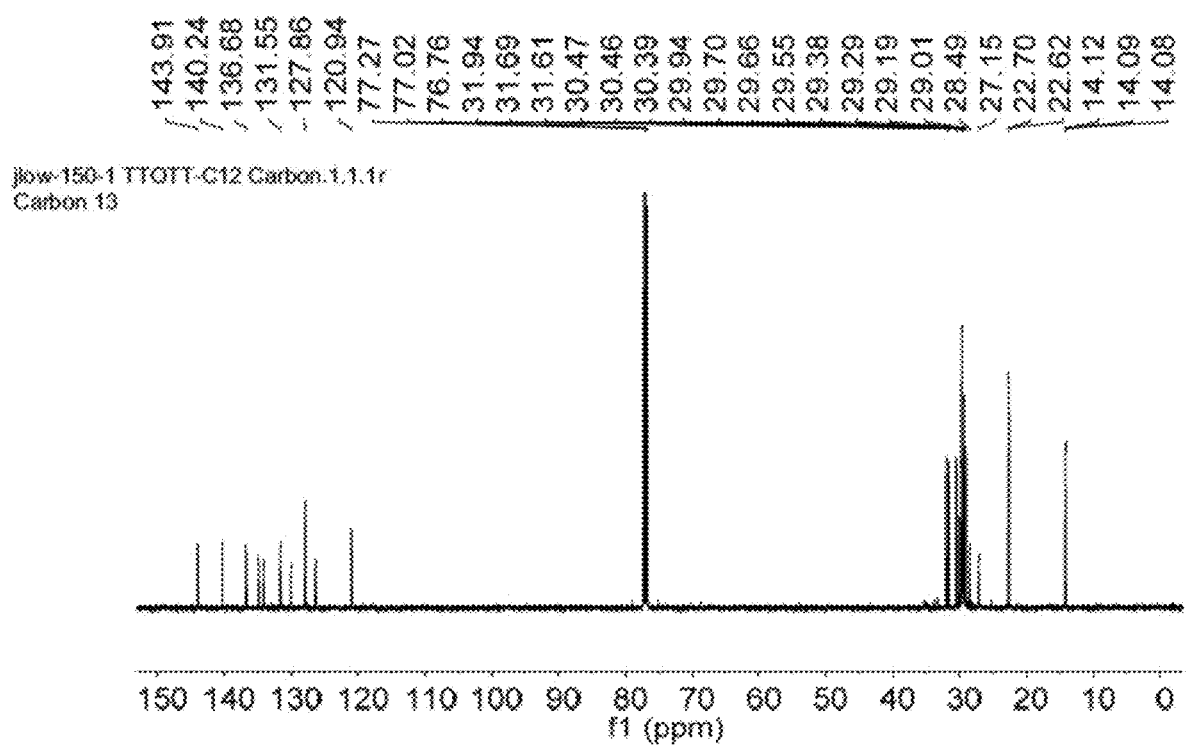

FIGS. 39A and 39B illustrate NMR spectra for TDO Compound 11 (see EXAMPLE 13). (FIG. 39A) 1H NMR spectra and (FIG. 39B) 13C NMR spectra.

Figure 40A:
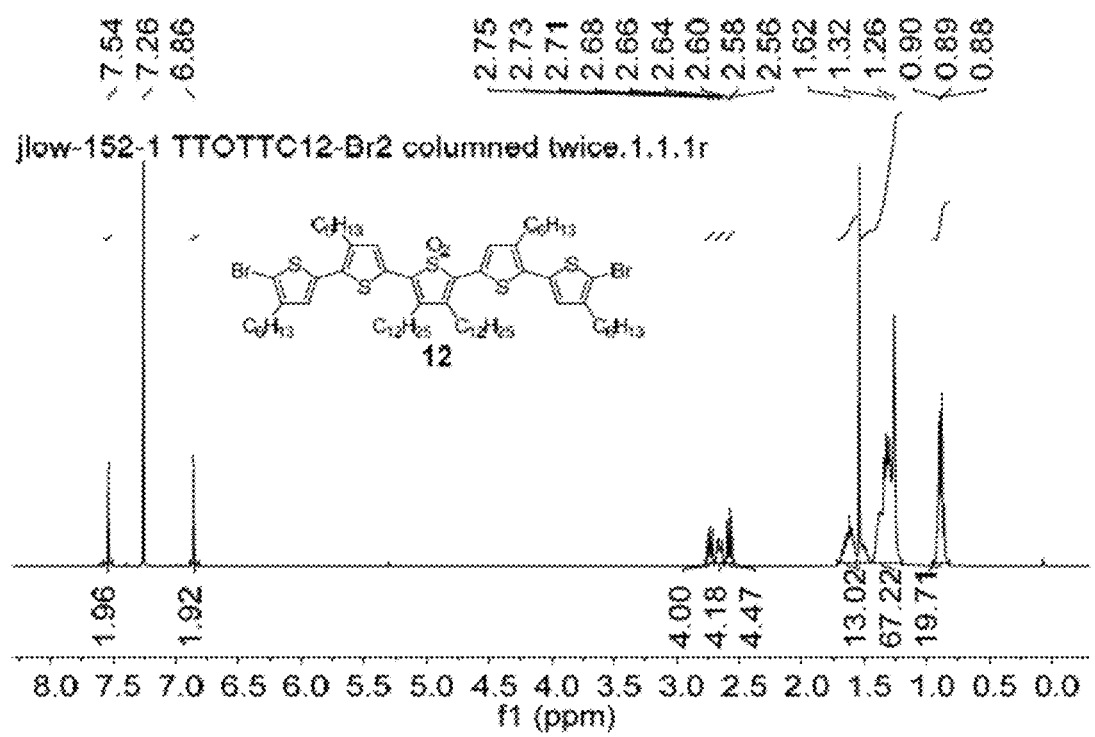
Figure 40B:
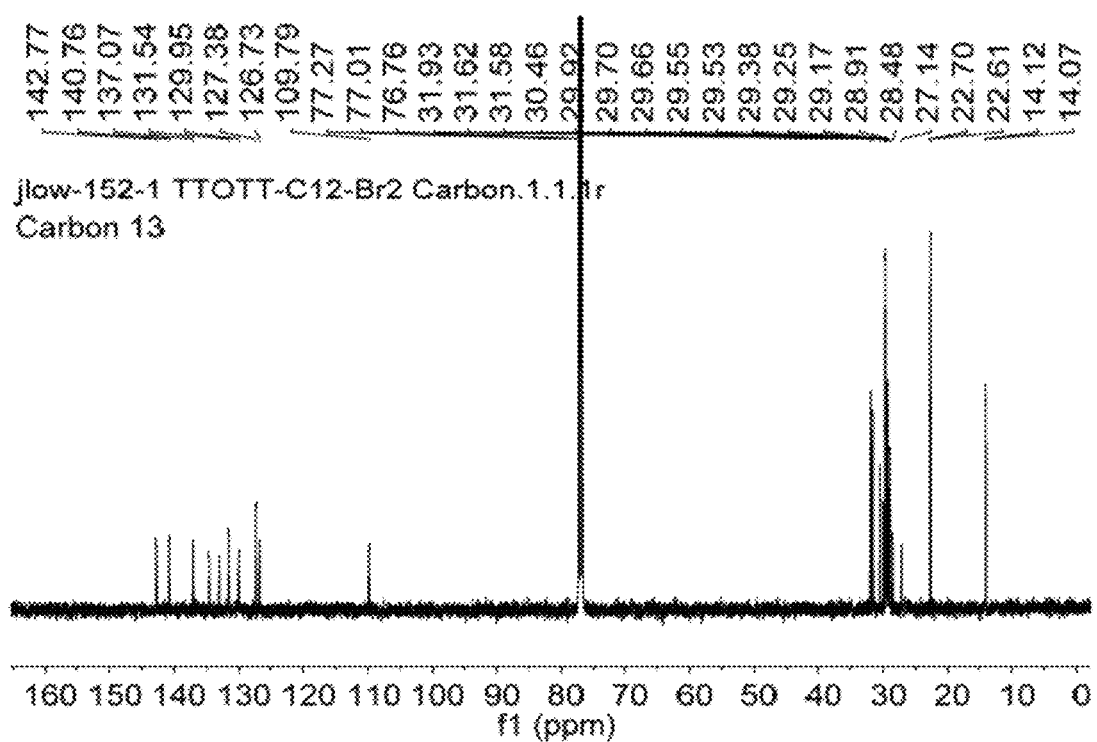

FIGS. 40A and 40B illustrates NMR spectra for TDO Compound 12 (see EXAMPLE 13). (FIG. 40A) 1H NMR spectra and (FIG. 40B) 13C NMR spectra.

Figure 41A:
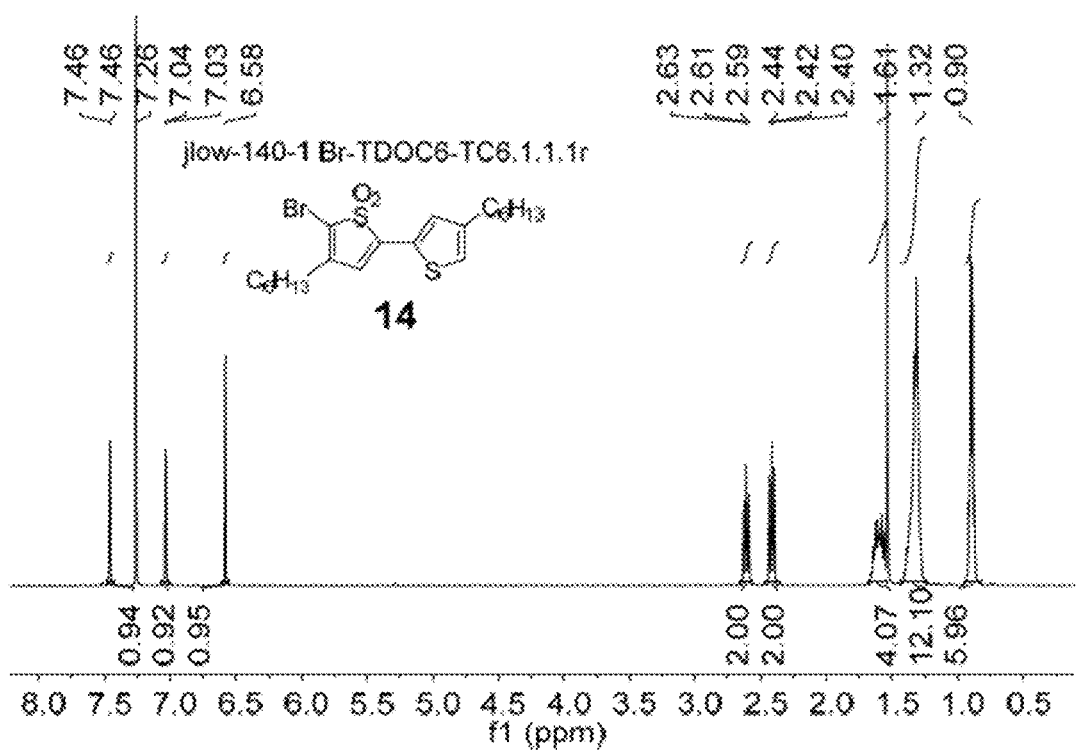
Figure 41B:
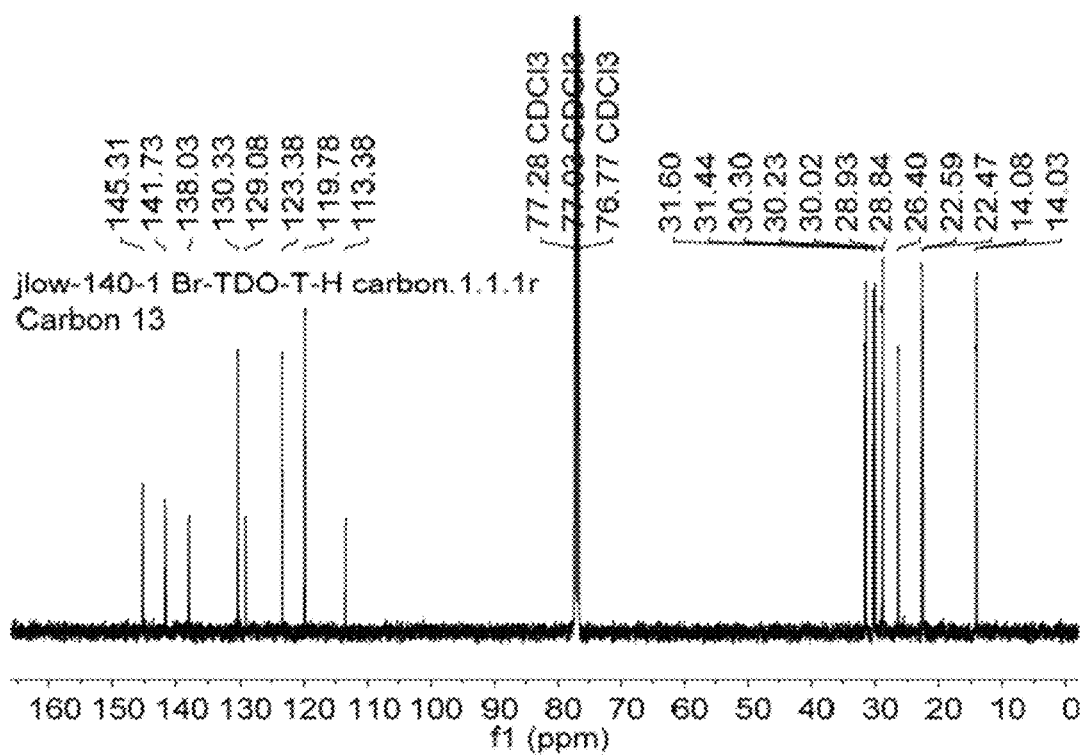

FIGS. 41A and 41B illustrate NMR spectra for TDO Compound 14 (see EXAMPLE 14). (FIG. 41A) 1H NMR spectra and (FIG. 41B) 13C NMR spectra.

Figure 42A:
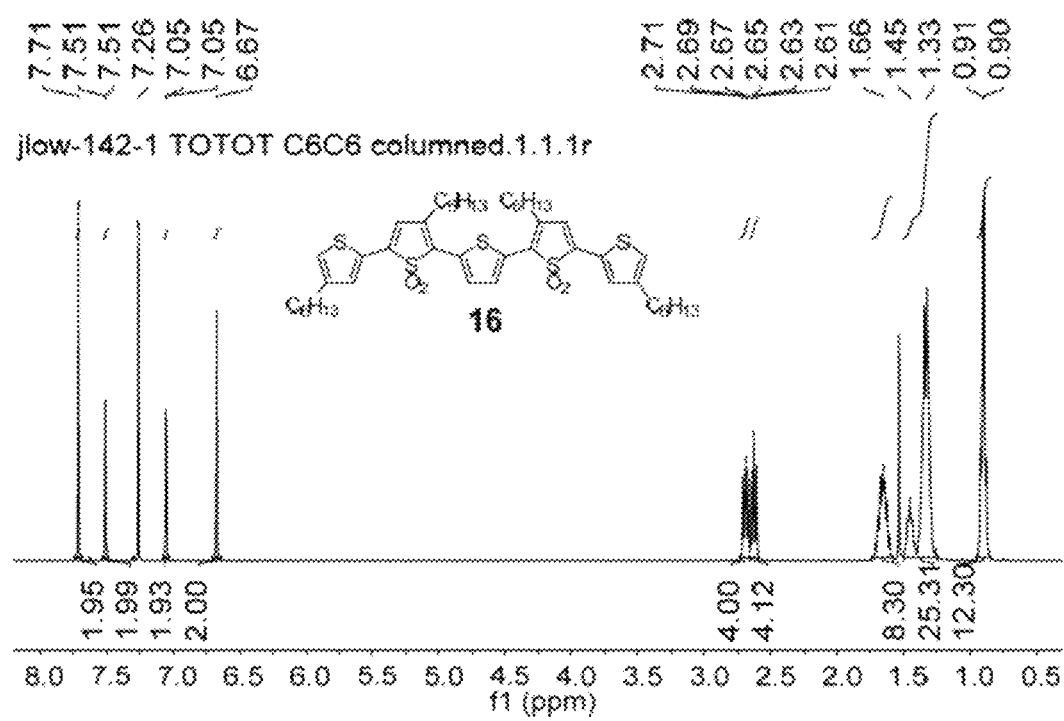
Figure 42B:
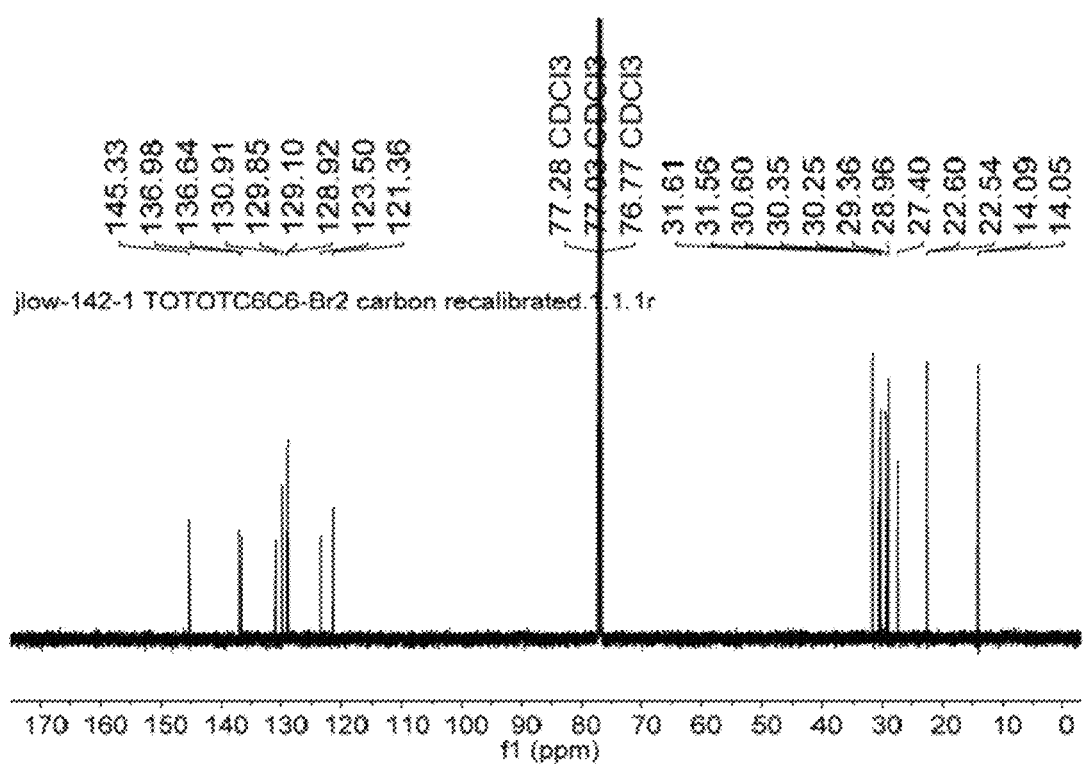

FIGS. 42A and 42B illustrate NMR spectra for TDO Compound 16 (see EXAMPLE 14). (FIG. 42A) 1H NMR spectra and (FIG. 42B) 13C NMR spectra.

Figure 43A:
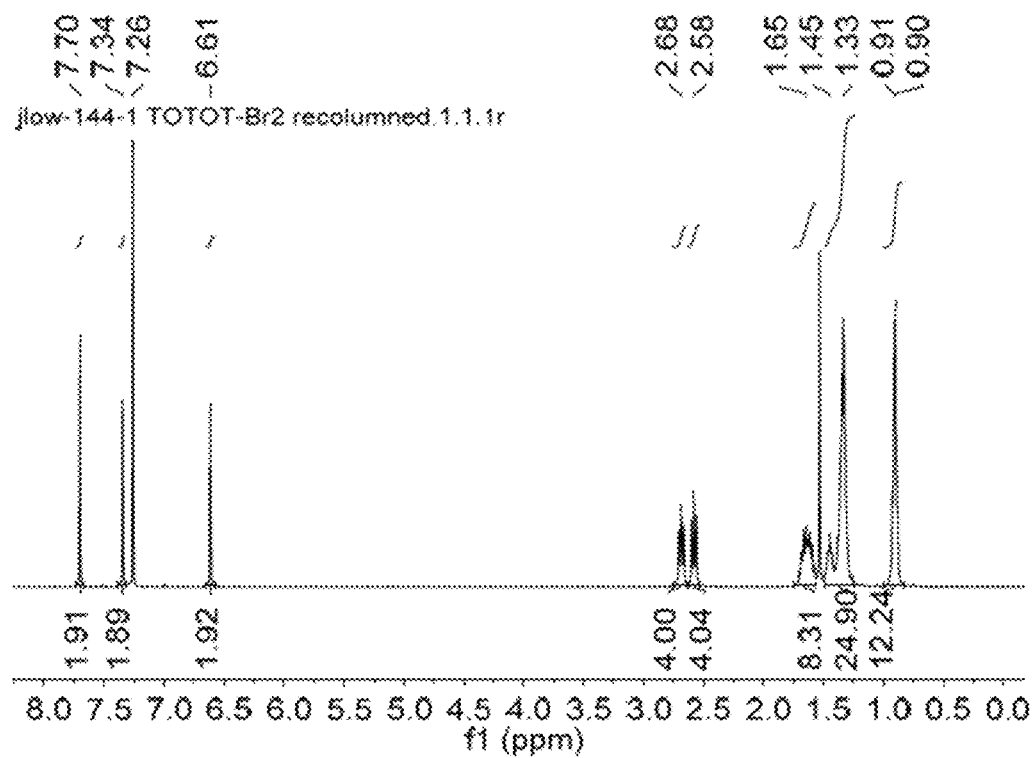
Figure 43B:
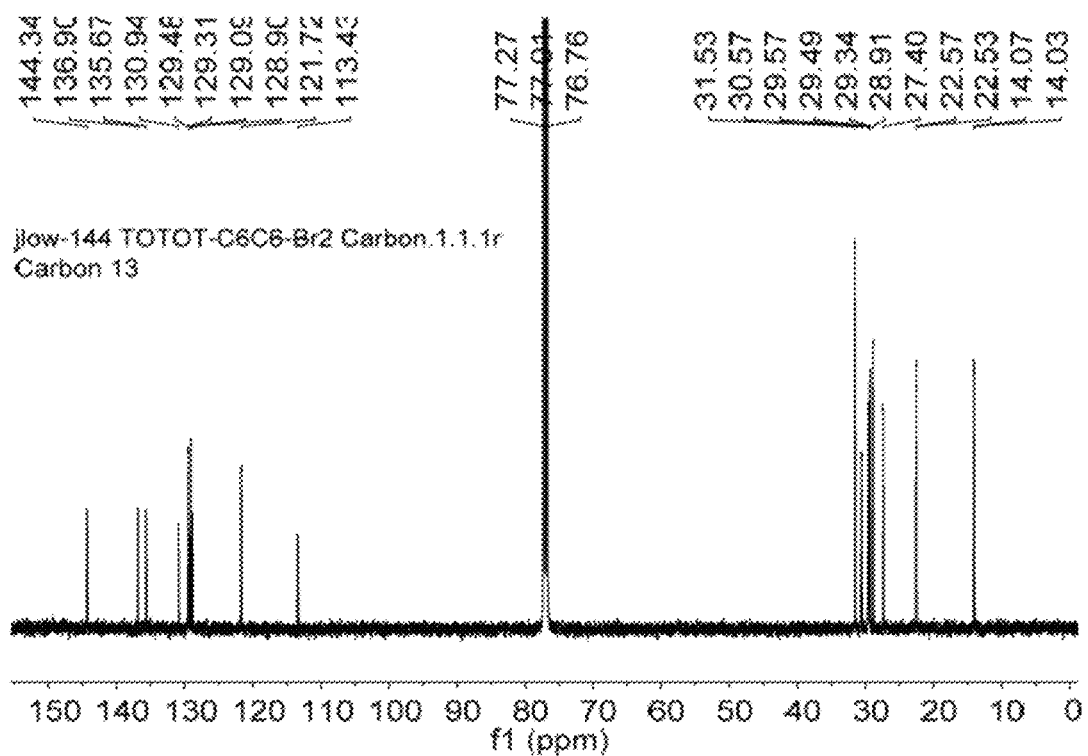

FIGS. 43A and 43B illustrate NMR spectra for TDO Compound 17 (see EXAMPLE 14). (FIG. 43A) 1H NMR spectra and (FIG. 43B) 13C NMR spectra.

Figure 44:
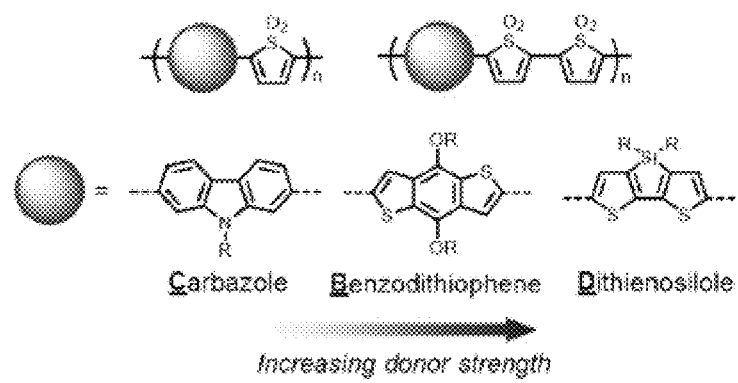

FIG. 44 shows the structures of polymers disclosed herein in order of increasing donor strength.

Figure 45A:
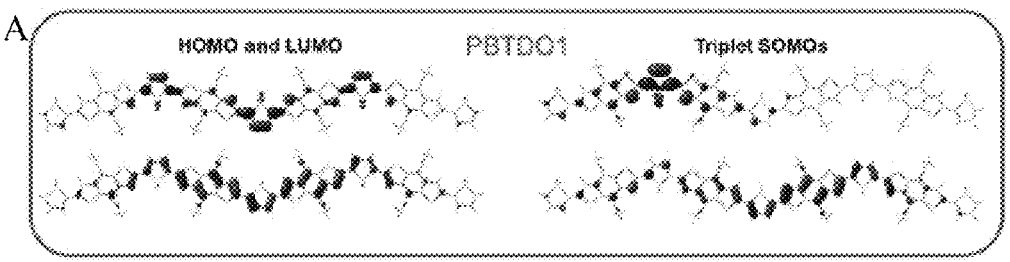
Figure 45B:
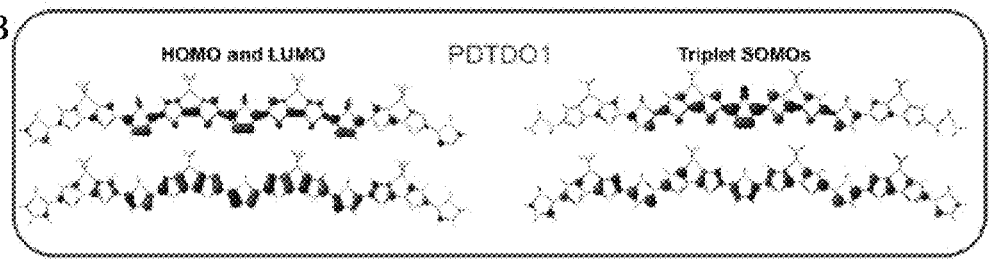

FIGS. 45A and 45B show normalized absorption spectra of PBTDO1- and PDTDO1-containing polymers.

Figure 46B:
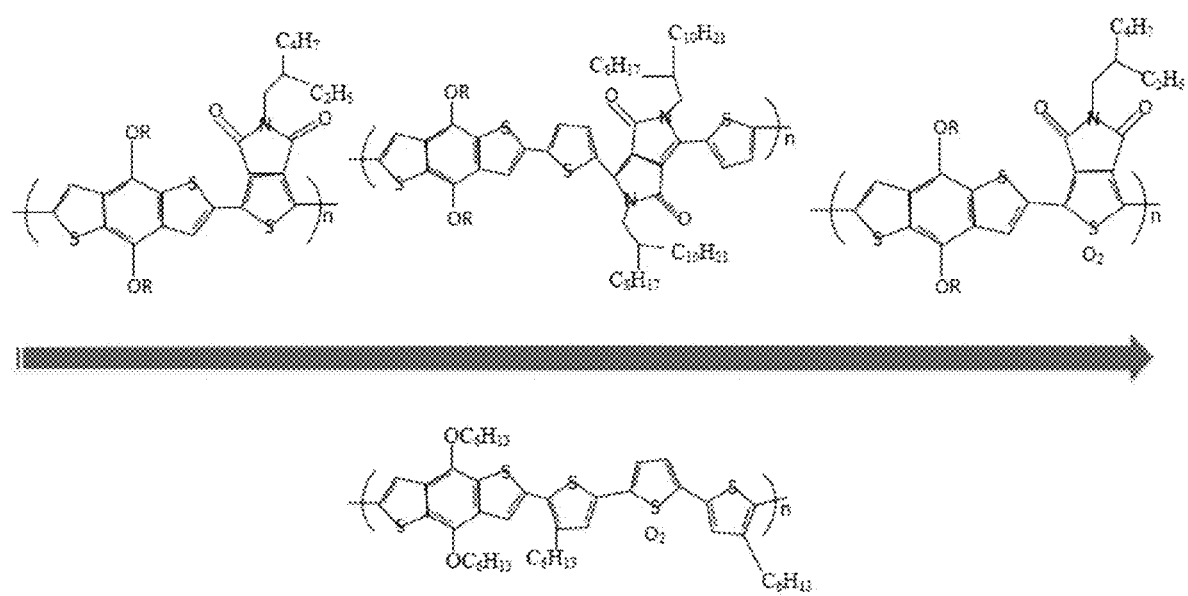

FIGS. 46A and 46B show the full structures of the representations of monomers in certain polymers described in the present disclosure.

DETAILED DESCRIPTION OF THE INVENTION

The ability to advance an understanding of multiple exciton generation (MEG) in organic materials has been restricted by the limited number of materials capable of singlet fission. A particular challenge is the development of materials that undergo efficient intramolecular fission, such that local order and strong nearest-neighbor coupling is no longer a design constraint. A key design feature for organic materials capable of intramolecular singlet fission was found to be strong intrachain donor-acceptor interactions. By conjugating strong-acceptor and strong-donor building blocks, small molecules and polymers with charge-transfer states that mediate population transfer between singlet excitons and triplet excitons are synthesized. Using transient optical techniques, triplet populations can be generated with yields up to about 170%. The yield of triplets is also known as the singlet fission (SF) yield which has a maximum of 200%. These guidelines are widely applicable to similar families of polymers and small molecules, and can lead to the development of new fission-capable materials with tunable electronic structure, as well as a deeper fundamental understanding of MEG.

Singlet fission had not been previously observed in thiophene dioxide (TDO)-containing systems, most likely due to the constraints imposed by conventional thiophene oxidation chemistry. The TDO-containing systems described here represent the first modular and highly-tunable singlet fission system with both molecular and polymeric applications. The unique intramolecular nature of fission TDO composites may also offer the possibility of other applications. Through chemical design, chromophores capable of intramolecular fission can be produced. TDO-containing systems provide a novel approach for material design to improve the utility of the singlet fission process in, for example, photovoltaic, applications. Incorporating TDO into a copolymer configuration allows for a highly tunable singlet fission system. Adjustment of the number of sequential TDO subunits allows for the triplet energy and conduction band (LUMO) energy to be tuned. The monomer or groups of monomers selected for the other component in the copolymer allows for tuning of the bandgap and the valence band (HOMO) energy. Either subunit may be functionalized to tune the polarity and solubility, which in turn controls the polymer morphology solid state modifications, allowing for extensive tuning of electronic, optical, and structural properties.

Throughout this disclosure, the term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention, a polymer means a compound having greater than 1 (>1), i.e., at least 2 repeating units, preferably greater than 5 (>5) repeating units, and an oligomer means a compound having units of between greater than 1 and less than 10 (>1 and <10), preferably less than 5 (<5), repeating units. The terms "repeating unit" and "monomeric unit" mean the constitutional repeating unit (CRU), which is the smallest constitutional unit the repetition of which constitutes a regular macromolecule, a regular oligomer molecule, a regular block or a regular chain (PAC, 1996, 68, 2291).

In one embodiment, the present invention provides a compound, e.g., an oligomer or polymer, of the general formula: [D-A]n, wherein D represents an electron donor; A represents an electron acceptor; and n represents a positive integer.

In a further embodiment, the present invention provides a compound, e.g., an oligomer or polymer, of the general formula: [SD-SA]n, wherein SD represents a strong electron donor; SA represents a strong electron acceptor; and n represents a positive integer.

In another embodiment, the present invention provides a compound, e.g., an oligomer or polymer, of the general formula: [A-D]n, wherein D represents an electron donor; A represents an electron acceptor; and n represents a positive integer.

In another embodiment, the present invention provides a compound, e.g., an oligomer or polymer, of the general formula: [A-D-A]n, wherein D represents an electron donor; A represents an electron acceptor; and n represents a positive integer.

In another embodiment, the present invention provides a compound, e.g., an oligomer or polymer, of the general formula: [D-SA]n, wherein D represents an electron donor; SA represents a strong electron acceptor; and n represents a positive integer.

In another embodiment, the present invention provides a compound, e.g., an oligomer or polymer, of the general formula: [SA-D]n, wherein D represents an electron donor; SA represents a strong electron acceptor; and n represents a positive integer.

In another embodiment, the present invention provides a compound, e.g., an oligomer or polymer, of the general formula: [SA-D-SA]n, wherein D represents an electron donor; SA represents a strong electron acceptor; and n represents a positive integer.

In another embodiment, the present invention provides a compound, e.g., an oligomer or polymer, of the general formula: [D-SA-D-SA-D]n, wherein D represents an electron donor; SA represents a strong electron acceptor; and n represents a positive integer.

In another embodiment, the present invention provides a compound, e.g., an oligomer or polymer, of the general formula: [WD-SA-D-SA-WD]n, wherein D represents an electron donor; SA represents a strong electron acceptor; WD represents a weak electron donor; and n represents a positive integer.

In one preferred embodiment, the present invention provides a compound, e.g., an oligomer or polymer, of the general formula: [D-SA-SD-SA-D]n, wherein D represents an electron donor; SA represents a strong electron acceptor; SD represents a strong electron donor; and n represents a positive integer.

In another preferred embodiment, the present invention provides a compound, e.g., an oligomer or polymer, of the general formula: [SA-SD-SA-SD]n, wherein SD represents a strong electron donor; SA represents a strong electron acceptor; and n represents a positive integer.

In one preferred embodiment, the present invention provides a compound, e.g., an oligomer or polymer, of the general formula: [SD-SP-SA-SP]n, wherein SA represents a strong electron acceptor; SD represents a strong electron donor; SP represents a spacer; and n represents a positive integer.

In a further preferred embodiment, the present invention provides a compound, e.g., an oligomer or polymer, of the general formula: [SD-SP-SA]n, wherein SA represents a strong electron acceptor; SD represents a strong electron donor; SP represents a spacer; and n represents a positive integer.

In another preferred embodiment, the BDT-TDO compounds or polymers with the general formulas described here have efficient singlet fission comprising a singlet fission efficiency of greater than about 25%, preferably about 100% or greater, about 100% to about 200%, and more preferably about 200% or greater. The efficiency necessary for device applications is about 100%. Any efficiency less than about 25% may be too inefficient for most applications.

With respect to the embodiments described throughout this disclosure, it is preferred that D is a strong electron donor (i.e., an SD); SA is a strong electron acceptor; WD is a weak electron donor; and n is an integer of from 1 to 100.

"Electron donor" means a chemical entity that donates electrons to another compound or another group of atoms of a compound. "Electron acceptor" means a chemical entity that accepts electrons transferred to it from another compound or another group of atoms of a compound (see, also, U.S. Environmental Protection Agency, 2009, Glossary of technical terms, hypertext transfer protocol://www.epa.gov/oust/cat/TUMGLOSS.HTM). "Spacer" means a chemical entity that serves as neither an electron donor nor an electron acceptor. Spacers include at least one monomer (or group of monomers) containing at least one pi bond, where non-limiting examples of spacers include acetylene, arylene, vinylene, phenylene, thiophene, furan, and pyrole. The spacers are preferably positioned between the electron donor and electron acceptor subunits identified in the general formulas described here. The electron donors SD, D, and WD, may each be a compound or atom; the electron acceptors A and SA may each be a compound or atom; and the spacers SP may each be a compound or atom. The formulas of the embodiments of the invention may represent one or more compounds or polymers, and the one or more compounds or polymers may be combined in polymeric form, or they may exist separately in a composition.

Non-limiting examples of electron donor monomer compounds include benzodithiophene ("BDT") and its derivatives, which are preferred strong electron donor compounds, and which have the following general structural formula I shown below:

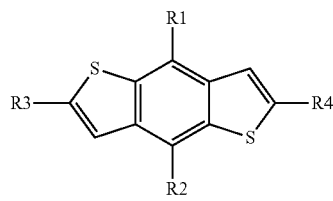

More preferably, the BDT monomer compound has the following general structural formula II shown below:

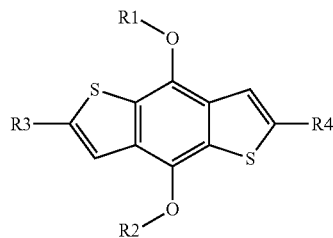

In each of the BDT monomer compound general structures illustrated, each of $R_1$ and $R_2$ may be the same or different and may be selected from: hydrogen, straight or branched chain alkyl of $C_{1-20}$, alkenyl, alkynyl, oligoethylene glycols, aromatic rings (e.g., thiophene, benzene, furan, other heteroatom groups), and other functional alkanes; and each of the $R_3$ and $R_4$ groups may be the same or different and may be selected from: hydrogen, straight or branched chain alkyl of $C_{1-20}$, alkenyl, alkynyl, alkoxy, organotin compounds, 2-ethylhex-1-yl, 2-Ethylundec-1-yl, and 3-Buten-1-yl.

Preferred alkyl substituents for $R_1$ and $R_2$ are $C_{1-10}$, i.e., methyl, ethyl, propyl, butyl, pentyl, hexyl, heptyl, octyl, nonyl, and decyl. Preferred $R_3$ and $R_4$ substituents are boronic acids, boronic esters, organotin compounds $Sn(R_5)_3$, wherein $R_5$ is selected from $C_{1-10}$, i.e., methyl, ethyl, propyl, butyl, pentyl, hexyl, heptyl, octyl, nonyl, and decyl.

A preferred monomer is the BDT derivative having the general structural formula III shown below:

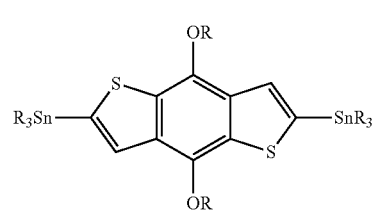

wherein "R" is the same as defined for $R_1$ and $R_2$ in accordance with general structure II above and $SnR_3$ is an organo-tin compound wherein $R_3$ as shown represents three (3) "R" substituents selected from $C_{1-10}$, i.e., methyl, ethyl, propyl, butyl, pentyl, hexyl, heptyl, octyl, nonyl, decyl, an oligoethylene glycol, such as hexaethylene glycol, pentaethylene glycol, tetraethylene glycol, water or polar soluble groups such as hydroxides, sulphates, and carbonates of the Group 2 elements—beryllium, magnesium, calcium, strontium and barium, alcohols, particularly lower alcohols of $C_1$-$C_6$, such as methanol, ethanol, propanol, butanol, pentanol, carboxylic acids of $C_1$-$C_6$, ketones of $C_1$-$C_6$, amines of $C_1$-$C_6$, amides of $C_1$-$C_6$, carboxylate ions of $C_1$-$C_6$, ammonium ions of $C_1$-$C_6$ Preferably each of the foregoing polar groups (e.g., the alcohols, carboxylic acids, ketones, amines, amides, carboxylate ions, and ammonium ion groups) will have a length of around four to five $CH_2$ units (including the C with the polar group). Alternatively, instead of the $SnR_3$ substituents in the general formula III, a boronic acid substituent or a boronic ester substituent (group) may be employed.

Another preferred electron donor has the general structural formula IV shown below:

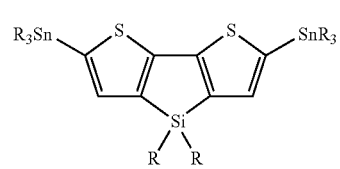

wherein "R" is the same as defined for $R_1$ and $R_2$ in accordance with general structure I above and $SnR_3$ is an organotin compound wherein $R_3$ as shown represents three (3) "R" substituents selected from $C_{1-10}$, i.e., methyl, ethyl, propyl, butyl, pentyl, hexyl, heptyl, octyl, nonyl, decyl, an oligoethylene glycol, such as hexaethylene glycol, pentaethylene glycol, tetraethylene glycol, water or polar soluble groups such as hydroxides, sulphates, and carbonates of the Group 2 elements—beryllium, magnesium, calcium, strontium and barium, alcohols, particularly lower alcohols of $C_1$-$C_6$, such as methanol, ethanol, propanol, butanol, pentanol, carboxylic acids of $C_1$-$C_6$, ketones of $C_1$-$C_6$, amines of $C_1$-$C_6$, amides of $C_1$-$C_6$, carboxylate ions of $C_1$-$C_6$, ammonium ions of $C_1$-$C_6$ Preferably each of the foregoing polar groups (e.g., the alcohols, carboxylic acids, ketones, amines, amides, carboxylate ions, and ammonium ion groups) will have a length of around four to five $CH_2$ units (including the C with the polar group). Alternatively, instead of the $SnR_3$ substituents in the general formula III, a boronic acid sub stituent or a boronic ester sub stituent (group) may be employed.

A preferred weak electron donor (WD) monomer compound is thiophene ("T") which has the general structure V shown below:

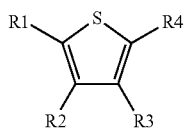

V wherein $R_1$, $R_2$, $R_3$, and $R_4$ may be the same or different and may be selected from hydrogen, straight chain or branched alkyl of $C_{1-20}$, alkenyl, alkynyl, alkoxy, halogen (F, Cl, Br, I), sulfur, organotin compounds $Sn(R_5)_3$, wherein $R_5$ is selected from $C_{1-10}$, i.e., methyl, ethyl, propyl, butyl, pentyl, hexyl, heptyl, octyl, nonyl, decyl, an oligoethylene glycol, such as hexaethylene glycol, pentaethylene glycol, tetraethylene glycol, water or polar soluble groups such as hydroxides, sulphates, and carbonates of the Group 2 elements—beryllium, magnesium, calcium, strontium and barium, alcohols, particularly lower alcohols of $C_1$-$C_6$, such as methanol, ethanol, propanol, butanol, pentanol, carboxylic acids of $C_1$-$C_6$, ketones of $C_1$-$C_6$, amines of $C_1$-$C_6$, amides of $C_1$-$C_6$, carboxylate ions of $C_1$-$C_6$, ammonium ions of $C_1$-$C_6$ Preferably each of the foregoing polar groups (e.g., the alcohols, carboxylic acids, ketones, amines, amides, carboxylate ions, and ammonium ion groups) will have a length of around four to five $CH_2$ units (including the C with the polar group). Alternatively, one or more boronic acid substituents or boronic ester sub stituents (groups) may be employed.

Additional donor compounds include each of the fourteen (14) general structural formulae below, wherein the "R" substituents in the formulae below are the same as defined in accordance with $R_1$ and $R_2$ in general structural formula II above, and X and Y, with respect to each formulae below, may be the same or different and may be the same as defined for $R_3$ and $R_4$ in general structural formula II above, or may be selected from hydrogen, straight chain or branched alkyl of $C_{1-20}$, alkenyl, alkynyl, alkoxy, halogen (F, Cl, Br, I), sulfur, organotin compounds $Sn(R_5)_3$, wherein $R_5$ is selected from $C_{1-10}$, i.e., methyl, ethyl, propyl, butyl, pentyl, hexyl, heptyl, octyl, nonyl, decyl, an oligoethylene glycol, such as hexaethylene glycol, pentaethylene glycol, tetraethylene glycol, water or polar soluble groups such as hydroxides, sulphates, and carbonates of the Group 2 elements—beryllium, magnesium, calcium, strontium and barium, alcohols, particularly lower alcohols of $C_1$-$C_6$, such as methanol, ethanol, propanol, butanol, pentanol, carboxylic acids of $C_1$-$C_6$, ketones of $C_1$-$C_6$, amines of $C_1$-$C_6$, amides of $C_1$-$C_6$, carboxylate ions of $C_1$-$C_6$, ammonium ions of $C_1$-$C_6$ Preferably each of the foregoing polar groups (e.g., the alcohols, carboxylic acids, ketones, amines, amides, carboxylate ions, and ammonium ion groups) will have a length of around four to five $CH_2$ units (including the C with the polar group), or X and Y may be a boronic acid substituent or a boronic ester substituent (group) may be employed:

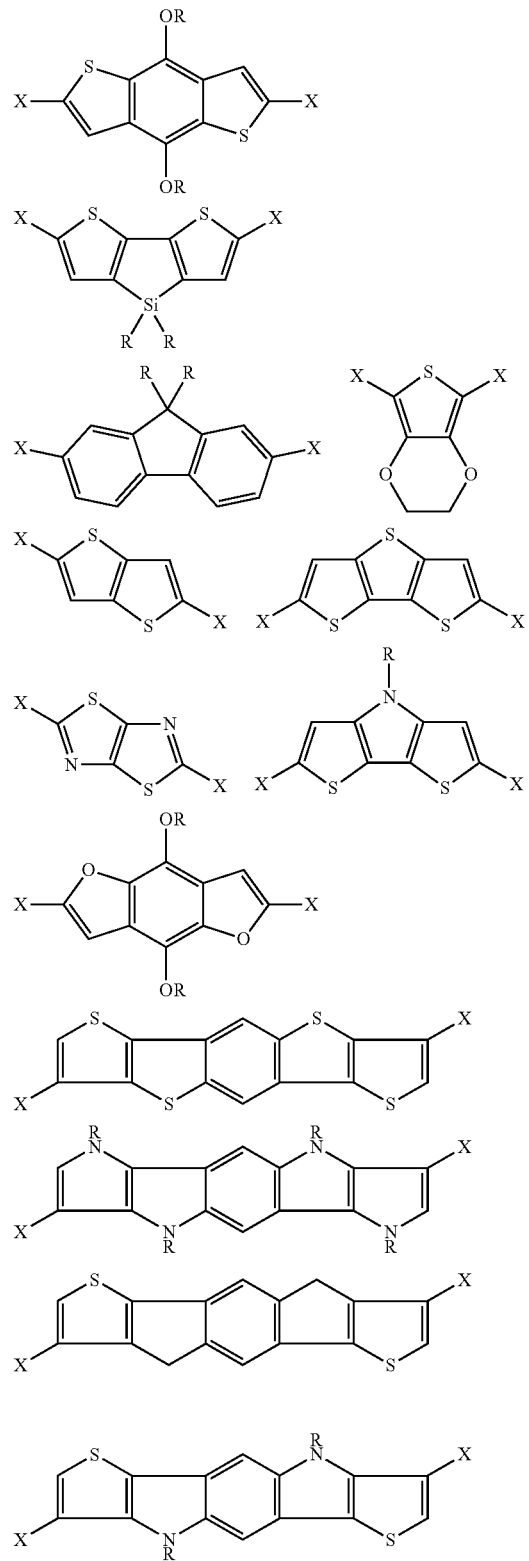

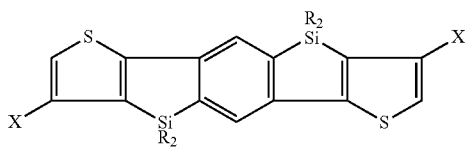
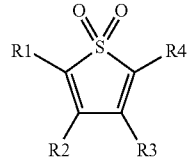

Non-limiting examples of preferred electron acceptor monomer compounds include thiophene derivatives. A strong electron acceptor is (SA) monomer compound is thiophene oxide ("TO"), which has the general structure VI shown below:

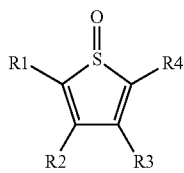

VI wherein $R_1$, $R_2$, $R_3$, and $R_4$ may be the same or different and may be selected from hydrogen, straight chain or branched alkyl of $C_{1-20}$, alkenyl, alkynyl, alkoxy, halogen (F, Cl, Br, I), sulfur, organotin compounds $Sn(R_5)_3$, wherein $R_5$ is selected from $C_{1-10}$, i.e., methyl, ethyl, propyl, butyl, pentyl, hexyl, heptyl, octyl, nonyl, decyl, an oligoethylene glycols, such as hexaethylene glycol, pentaethylene glycol, tetraethylene glycol, water or polar soluble groups such as hydroxides, sulphates, and carbonates of the Group 2 elements—beryllium, magnesium, calcium, strontium and barium, alcohols, particularly lower alcohols of $C_1$-$C_6$, such as methanol, ethanol, propanol, butanol, pentanol, carboxylic acids of $C_1$-$C_6$, ketones of $C_1$-$C_6$, amines of $C_1$-$C_6$, amides of $C_1$-$C_6$, carboxylate ions of $C_1$-$C_6$, ammonium ions of $C_1$-$C_6$ Preferably each of the foregoing polar groups (e.g., the alcohols, carboxylic acids, ketones, amines, amides, carboxylate ions, and ammonium ion groups) will have a length of around four to five $CH_2$ units (including the C with the polar group). Alternatively, one or more boronic acid substituents or a boronic ester substituents (group) may be employed.

A preferred strong electron acceptor (SA) monomer compound is thiophene S,S-dioxide (also known as thiophene 1,1, dioxide) ("TDO") which is a doubly oxidized counterpart of thiophene. TDO exhibits attractive electronic properties. TDOs have been demonstrated to stabilize the lowest unoccupied molecular orbital (LUMO) by their ability to increase the electron affinity, which is useful in order to localize the multiple excitons within these moieties. The TDO-containing oligomers and conjugated polymers exhibit narrowed highest occupied molecular orbital (HOMO)-LUMO bandgaps, in contrast to their unoxidized counterparts. TDO-containing materials may serve as a new type of electron acceptor. TDO has the general structure VII shown below:

VII

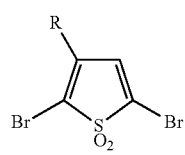

wherein $R_1$, $R_2$, $R_3$, and $R_4$ may be the same or different and may be selected from hydrogen, straight chain or branched alkyl of $C_{1-20}$, alkenyl, alkynyl, alkoxy, halogen (F, Cl, Br, I), sulfur, organotin compounds $Sn(R_5)_3$, wherein $R_5$ is selected from $C_{1-10}$, i.e., methyl, ethyl, propyl, butyl, pentyl, hexyl, heptyl, octyl, nonyl, decyl, an oligoethylene glycol, such as hexaethylene glycol, pentaethylene glycol, tetraethylene glycol, water or polar soluble groups such as hydroxides, sulphates, and carbonates of the Group 2 elements—beryllium, magnesium, calcium, strontium and barium, alcohols, particularly lower alcohols of $C_1$-$C_6$, such as methanol, ethanol, propanol, butanol, pentanol, carboxylic acids of $C_1$-$C_6$, ketones of $C_1$-$C_6$, amines of $C_1$-$C_6$, amides of $C_1$-$C_6$, carboxylate ions of $C_1$-$C_6$, ammonium ions of $C_1$-$C_6$ Preferably each of the foregoing polar groups (e.g., the alcohols, carboxylic acids, ketones, amines, amides, carboxylate ions, and ammonium ion groups) will have a length of around four to five $CH_2$ units (including the C with the polar group). Alternatively, a boronic acid substituent or a boronic ester sub stituent (group) may be employed.

The TDO compound may be employed as a single compound of TDO (e.g., mono-thiophene S,S-dioxide or "TDO1"), or it may be employed in repeat coupled units of more than one TDO compound (e.g., two or more TDO compounds, such as, bi-thiophene S,S-dioxide or "TDO2", tri-thiophene S,S-dioxide or "TDO3", and tetra-thiophene S,S-dioxide or "TDO4", etc., also referred to as "poly TDO" or "pTDO", or $TDO_n$, e.g., a TDO structure wherein n is an integer greater than 1, such as 1, 2, 3, 4, 5, 6, 7, 8, 9, 10, etc.)

Another preferred electron acceptor is the TDO derivative which has the general structural formula VIII shown below:

VIII

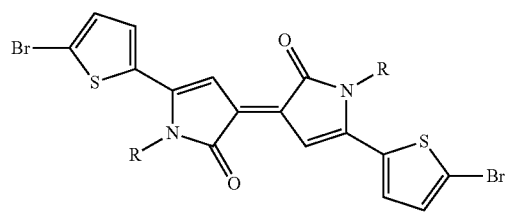

wherein R is the same as defined in accordance with general structural formula VII above.

Another preferred electron acceptor is a thiophene derivative that has the general structural formula IX shown below:

IX wherein R is the same as defined in accordance with general structural formula VI above.

Additional, electron acceptors include compounds of each of the eighteen (18) general structural formulae below, wherein the R substituents are the same as defined in accordance with general structural formula VI above, and X and Y, with respect to each formulae below, may be the same or different and may be selected from hydrogen, straight chain or branched alkyl of $C_{1-20}$, alkenyl, alkynyl, alkoxy, halogen (F, Cl, Br, I), sulfur, organotin compounds $Sn(R_5)_3$, wherein $R_5$ is selected from $C_{1-10}$, i.e., methyl, ethyl, propyl, butyl, pentyl, hexyl, heptyl, octyl, nonyl, decyl, an oligo-ethylene glycol, such as hexaethylene glycol, pentaethylene glycol, tetraethylene glycol, water or polar soluble groups such as hydroxides, sulphates, and carbonates of the Group 2 elements—beryllium, magnesium, calcium, strontium and barium, alcohols, particularly lower alcohols of $C_1$-$C_6$, such as methanol, ethanol, propanol, butanol, pentanol, carboxylic acids of $C_1$-$C_6$, ketones of $C_1$-$C_6$, amines of $C_1$-$C_6$, amides of $C_1$-$C_6$, carboxylate ions of $C_1$-$C_6$, ammonium ions of $C_1$-$C_6$ Preferably each of the foregoing polar groups (e.g., the alcohols, carboxylic acids, ketones, amines, amides, carboxylate ions, and ammonium ion groups) will have a length of around four to five $CH_2$ units (including the C with the polar group), or X and Y may be a boronic acid substituent or a boronic ester substituent (group) may be employed:

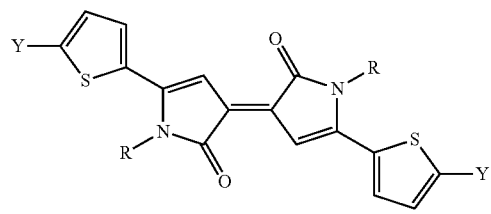

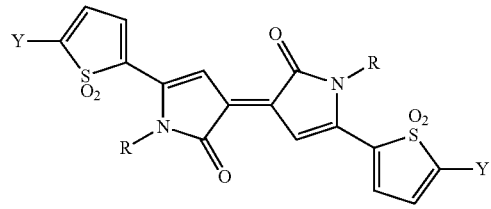

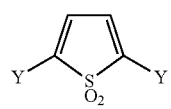

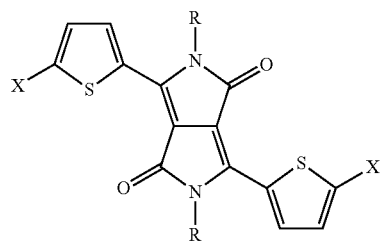

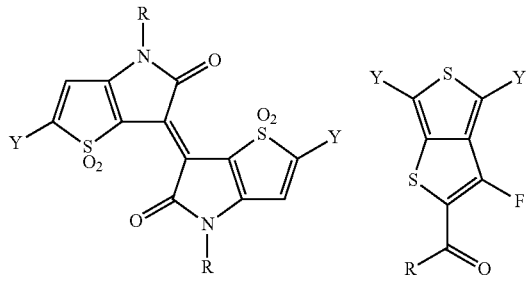

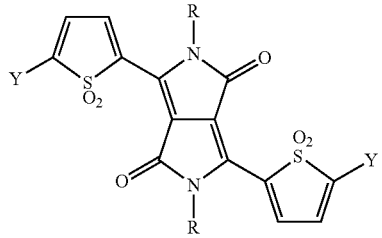

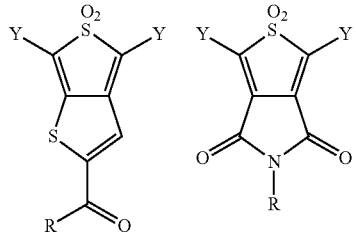

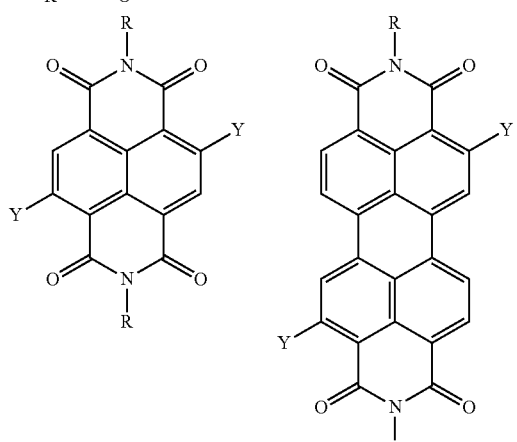

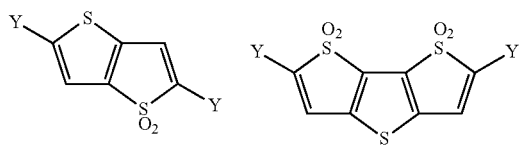

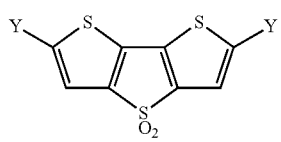

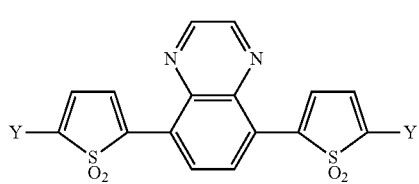

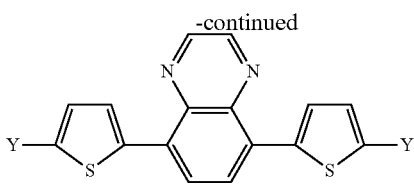

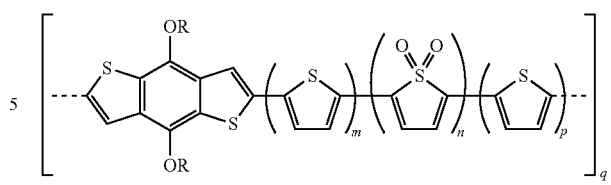

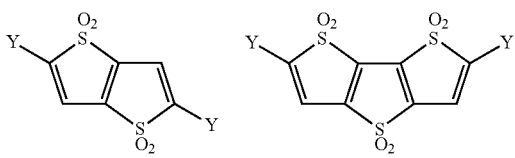

Rozen's reagent (HOF.CH$_3$CN) has revolutionized the oxidation chemistry of thiophenes. Rozen's reagent allows for oxidation of oligomers up to quaterthiophene. Benzodithiophene (BDT) rings are prevalent electron donors as semiconductor building blocks for solar cells. By combining the BDT and TDO building blocks or subunits, a variety of oligomers and conjugated polymers may be synthesized as described here. Intramolecular singlet fission was observed in these synthesized molecules. Photophysical studies indicated that the TTDO2- BDT-TDO2-T oligomer is capable of intramolecular SF with low efficiency, while the singlet fission efficiency is dramatically improved by the extension of the TDO and BDT repeat units in poly-(BDT-TDO). Singlet fission will occur with a repeating unit of any number greater than or equal to 2. The number of repeating units for functionality may be greater than or equal to 2, preferably greater than or equal to 10. Materials presented here may have, for example, 10-25 repeating units. Polymers may have a preferred donor to acceptor (D:A) ratio of 1:1 or 1:2. However, any whole number ratio may be used, for example, 3:1, 2:1, 1:1, 1:2, and 1:3. Preferred BDT-TDO polymers are those with a D:A ratio of 1:1 as they were found to be the most efficient.

Essentially, useful polymers, compounds, and materials may be electron rich subunits coupled to a strongly electron deficient subunits. Polymers may be synthesized or obtained by the Stille condensation polymerization between the bisstannylated BDT and dibromo-TDO. The synthesis of conjugated polymers by the Stille coupling reaction is generally known by a person skilled in the art, see, e.g., J. K. Stille, *Pure Appl. Chem.*, 57(12):1771-1780 (1985); Bao, et al., *Chem. Mater.*, 5 (1): 2-3 (January 1993). Small molecules can also be synthesized from their respective building blocks. The modularity of the polymerization allows for the exploration of various electron rich moieties to couple with oligoTDOs. Controlling the donor strength and solubilizing alkyl groups (R) modifies the electronic effects and packing interactions on singlet fission.

Spacers include any monomer (or group of monomers) containing one or more pi bonds. The spacers are preferably positioned between the electron donating subunits and the electron accepting subunits. For example, a thiophene spacer may separate an electron donor and electron acceptor as shown in the following general structural formula of PBDTTDOT:

wherein "m" is a positive integer, "n" is a positive integer, "p" is a positive integer, "q" is a positive integer, preferably greater than 2, and "R" is as defined for $R_1$ and $R_2$ in accordance with general structure II above, and the BDT-TDO polymer exhibits efficient singlet fission. R may be any chemical functional group, including but not limited to straight or branched chain $C_{1-20}$ alkyl, alkenyl, alkynyl, oligoethylene glycols, and aromatic rings. The R group affects the solubility of the polymer and modifying the R group may thereby assist in processing. This structure may be referred to, interchangeably or in some variation, as poly-BDT-T$_m$-TDO$_n$-T$_p$, p-BDT-T$_m$-TDO$_n$-T$_p$, PBDTT$_m$TDO$_n$T$_p$, or poly-BDTT$_m$TDO$_n$T$_p$.

In a preferred embodiment, a polymer of BDT and TDO in accordance with the invention has the following general structural formula X shown below:

X

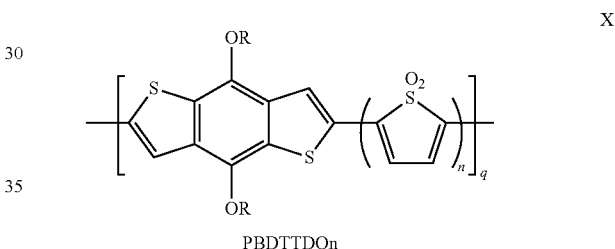

PBDTTDOn wherein "n" is a positive integer, "q" is a positive integer, preferably any positive integer greater than 2, and "R" is as defined for $R_1$ and $R_2$ in accordance with general structure II above. R may be any chemical functional group, including but not limited to straight or branched chain $C_{1-20}$ alkyl, alkenyl, alkynyl, oligoethylene glycols, and aromatic rings, and the BDT-TDO polymer exhibits efficient singlet fission. The R group affects the solubility of the polymer and modifying the R group may thereby assist in processing. This structure may be referred to, interchangeably or in some variation, as poly-BDT-TDO$_n$, p-BDT-TDO$_n$, or PBDTTDO$_n$.

In another preferred embodiment, a polymer of the invention has the following general structural formula XI shown below:

XI

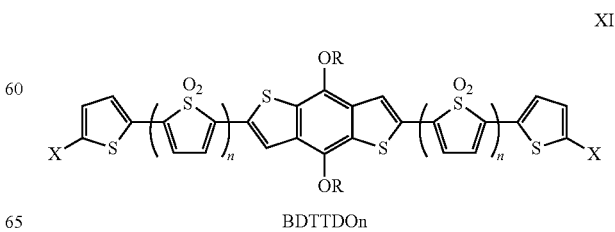

BDTTDOn wherein the benzodithiophene compounds (BDT; the center compound in accordance with general structure II above) and the thiophene compounds (end compounds in accordance with the general structural formula V) are the electron donors, and the electron acceptor compounds are the thiophene dioxide compounds (TDO in accordance with general structural formula VII) which may be poly-TDOs, "n" is a positive integer, "x" is as defined above for $R_1$ and $R_4$ in accordance with general structure V, "R" is as defined for $R_1$ and $R_2$ in accordance with general structure II above, and "q" is a positive integer.

Another preferred polymer has the following general structural formula XII shown below:

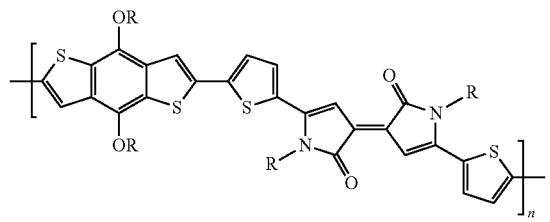

XII wherein the benzodithiophene compound (BDT; the left hand most compound in accordance with general structure II above) is the electron donor and, with respect to the BDT portion, "R" is as defined for $R_1$ and $R_2$ in accordance with general structural formula II above; and the thiophene derivative (similar to general structural formula IX above) is the electron acceptor and, with respect to the thiophene derivative portion, R is as defined in general structural formula IX above, and "n" is a positive integer.

Another preferred polymer has the following general structural formula XIII shown below:

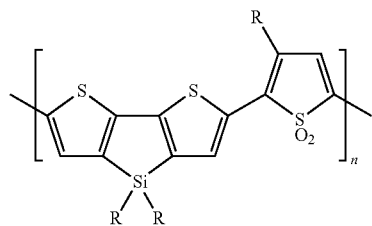

XIII wherein in the Si containing ring structure R is defined as in general structural formula IV above, and in the TDO portion R is the same as defined in the general structural formula VIII above.

Examples of electron donor atoms that may be employed in other embodiments in accordance with the present invention include the metals, which represent the left-hand side of the Periodic Table of Elements, i.e., everything from the left-hand side of the Periodic Table (Group I et seq) to the metalloids is a metal and represents electron donors. Everything to the right of the metalloids is a nonmetal and represents electron acceptors.

One embodiment of the invention may be directed to materials, and methods of preparing the materials, having efficient intramolecular singlet fission by coupling a modular prima facie chemical design strategy with mechanistic studies of the fission process in isolated organic molecules and polymers.

Another embodiment may be directed to a stable, soluble or solution-processing singlet fission material comprising a, or at least one molecule, compound, or material having the structure or compound of Formula 1, where Formula 1 has a singlet fission yield of greater than 100%, and where Formula 1 may be repeated to form a chain:

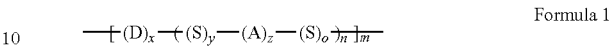

Formula 1 where "D" is any donor, preferably a strong donor, such as but not limited to benzodithiophene (BDT),
"A" is any acceptor, preferably a strong acceptor, such as but not limited to thiophene-1,1-dioxide (TDO),
"S" is any conjugated aromatic spacer, such as but not limited to thiophene, benzene, and thienothiophene.
"x," "z," "m," and "n" are each any positive integer, each of x, z, m, and n is the same or different, where in one embodiment x and z are each 1, and in other embodiments, x is 1-3, z is 1-4, n is 1-2, or m is 2-200, and
"o" and "y" are each 0 or any positive integer, and o and y are preferably 0-4.

A further embodiment is directed to Formula 1, where the stable, soluble or solution-processing singlet fission material is selected from the group consisting of: is poly-benzodithiophene mono-thiophene-1,1-dioxide (PBTDO1), polybenzodithiophene [2,2':5',2"-terthiophene]-1',1'-dioxide (PB-TOT), and the like. It is expected that pBTOOT (polybenzodithiophene [2,2': 5',2":5",2"'-quaterthiophene]-1',1',1",1"-tetraoxide), pBTTOTT (polybenzodithiophene [2,2': 5',2": 5",2'": 5'",2""-quinquethiophene]- 1", 1"-dioxide) and pBTOTOT (polybenzodithiophene [2,2': 5',2":5", 2"':5'",2""-quinquethiophene]-1',1',1"',1"'-tetraoxide) will similarly be good efficient SF materials.

In yet a further embodiment, the invention is directed to a stable, solution-processible singlet fission donor-acceptor material, comprising at least one donor coupled to at least one acceptor via or by no spacer or zero spacer or one or more than one spacer, preferably at least two acceptors coupled to at least one donor via or by zero, one, or more than one spacer where the material exhibits a singlet energy essentially greater than or essentially about, or greater than or about, twice a triplet pair energy, and the material produces a triplet yield of greater than about 100%, or alternatively, the material exhibits a triplet energy that is less than or about half a singlet energy of the material. This material may have benzodithiophene (BDT) as a donor and thiophene-1,1-dioxide (TDO) as an acceptor, and preferably the material is poly-benzodithiophene mono-thiophene-1,1-dioxide (PBTDO1) or polybenzodithiophene [2,2':5',2"-terthiophene]-1',1'-dioxide (PBTOT) and the efficient SF material is not poly-carbazole mono-thiophene-1,1-dioxide (PCTDO1), poly-carbazole di-thiophene-1,1-dioxide (PCTDO2), polydithienosilole-mono-thiophene-1,1-dioxide (PDTDO1), polydithienosilole-di-thiophene-1,1-dioxide (PDTDO2), poly-fluorene mono-thiophene-1,1-dioxide (PFTDO1), or poly-benzodithiophene di-thiophene-1,1-dioxide (PBTDO2) where some materials undergo singlet fission, and yet the material or compound is not considered to be an efficient singlet fission material because it does not reach a triplet yield of about or greater than 100%. It is expected that poly-fluorene di-thiophene-1,1-dioxide (PFTDO2) would not be an efficient SF material.

A preferred embodiment of this stable, solution-processible singlet fission donor-acceptor material comprises a material having a singlet fission rate of less than about 10 ps, less than about 15 ps, or a singlet fission rate ranging from about 100 fs to about 100 ps, or preferably fast rates of singlet fission that is sufficient to compete with parasitic processes. One of skill in the art would understand that these rates may be tuned to be fast or slow as desired.

In another embodiment, the singlet fission donor-acceptor material has a triplet decay rate of greater than about 80 picoseconds, about 160 ps, or a triplet decay rate ranging from about 15 ps to 3 microseconds. Preferably the triplet decay rate is slower than the singlet fission rate or sufficiently long enough to allow extraction of the triplets to occur before they recombine.

Yet a further embodiment is directed to a method of designing a stable, soluble or solution-processing singlet fission material that is efficient or having a triplet yield of greater than or about 100%, and is preferably a donor-acceptor material, such as for example, but not limited to a SF material of Formula 1 or Formula 2, comprising reducing a singlet-triplet pair gap, wherein the triplet energy is about half the singlet energy; and containing a charge-transfer character in the lowest-energy optical excitation state while still allowing for the material to absorb in the visible range.

Another embodiment is directed to a method of designing a stable, soluble or solution-processing singlet fission material, preferably a donor-acceptor material, such as for example but not limited to a SF material of Formula 1 or Formula 2, comprising obtaining a triplet energy that is less than or about half a singlet energy of the material; and modulating the material to have a triplet yield of greater than or about 100%.

One of skill in the art would understand that the number and type of donors and acceptors, the donor strength, the acceptor strength, the charge transfer strength, the number and type of spacers, the type of solvent, the distance between the donor and the acceptor, and polarizability of a charge transfer state environment, LUMO, HOMO, the triplet decay rate, singlet fission rate, and singlet fission yield should be considered when designing or selecting a stable, solution-processing singlet fission material. For example, the donor and acceptor should both be strong electron donors and strong electron acceptors, and the like (Aryanpour, K. et al. hyper text transfer protocol://arxiv.org/abs/1508.00071).

In one embodiment, the singlet fission yield, singlet fission rate, and triplet decay rate of a stable, soluble or solution-processing singlet fission material is preferably similar to that of poly-benzodithiophene mono-thiophene-1,1-dioxide (PBTDO1), polybenzodithiophene [2,2':5',2''-terthiophene]-1',1'-dioxide, and the like, but dissimilar to PCTDO1, PCTDO2, PDTDO1, PDTDO2, and pBTDO2. Although PDTDO1, PDTDO2, and pBTDO2 display some singlet fission, these materials are not particularly efficient and therefore for most applications not useful. If the charge transfer state is too strong, i.e., greater than that of pB-TDO1 or PBTOT, then a parasitic process may occur preventing a good, efficient, or ideal triplet yield (SF yield) and SF rate. In these instances, the design of an efficient SF donor-acceptor material may be modulated to overcome the too strong CT by increasing the distance between the donor and acceptor either through the use of at least one spacer or additional acceptor units, or by modifying the donor unit and/or the acceptor unit.

Another embodiment may be directed to the design of singlet-fission systems having strong intramolecular donor-acceptor interactions in a copolymer architecture. A further embodiment may be directed to a new family of singlet-fission materials. Although many strong-acceptor moieties may be compatible, thiophene-1,1-dioxide (TDO) is notable for its high electron affinity[25,26] and relatively low triplet energy. The modularity of the donor-acceptor scheme allows selection of an arbitrary donor unit (benzodithiophene, B) to tune the absorption relative to the triplet energy. With this model system, iSF with triplet quantum yields up to about 170% in an isolated polymer chain was found. Furthermore, significant fission can be achieved in small molecules that contain the minimum necessary functionality of two acceptor subunits with low-energy triplet states. iSF can be imparted to a variety of systems, although some configurations may introduce competing relaxation channels. In general, this approach could allow for the development of entire families of singlet-fission-capable materials for next-generation SF-OPV and hybrid PV applications.

In a further embodiment, direct coupling between the singlet state and the multiexcitonic (triplet pair) states is weak, but coupling mediated by an intermediate charge-transfer (CT) state can be strong (FIG. 9A)[27-31]. This insight provides design criteria for the selection of building blocks for new iSF-capable materials that satisfy two key requirements for efficient SF: a reduced singlet-triplet pair gap, such that the triplet energy is close to half the singlet energy[16,32]; and a lowest-lying optical excitation with significant CT character that can mediate the SF process[30,33].

The connectivity and conceptual design template for iSF materials based on a framework to meet the above criteria is shown in FIG. 9B. A material composed of alternating electron-rich (strong donor; SD) moieties and electron-deficient (strong acceptor; SA) units will contain significant charge-transfer character in the lowest-energy optical excitation[34]. The resulting charge-transfer state can be directly photoexcited with a large cross-section and can more strongly couple to multiexciton triplet states than singlet Frenkel excitons[28,29,33]. A general understanding of the design can be gained by looking at the fundamental units that can support singlet fission, which in this example consists of two acceptor moieties coupled to an appropriate donor (FIG. 9B). Because two triplets are formed during the fission process, at least two strong-acceptor (SA) units with a low-energy triplet state are required. These properties can be introduced into push-pull polymers in one of two ways: incorporating strong electron-withdrawing substituents into an aromatic system to stabilize the quinoidal resonance structure[35-37], or incorporating oligoene-like moieties[21]. Acceptor units must be coupled to an appropriate donor(s), such that a minimum charge-transfer (CT) character is obtained. As well as providing an excited electronic state with significant charge-transfer character (denoted as partial positive, $\delta^+$, and partial negative, $\delta^-$, charges, FIG. 9B), the modular nature of the donor-acceptor motif allows the selection of units which satisfy the energy requirement: that fission is favored when the energy of the singlet state is at least twice the energy of the triplet state (that is, $E[S_1] \geq 2E[T_1]$).

A further embodiment may be directed to a stable, soluble, solution-processible singlet fission compound or material which has efficient singlet fission exhibiting an energy requirement of $E_S \geq 2E_T$, and produces a triplet yield of greater than 100%. The SF material is preferably exergonic or exoergic, or at least isoergic, and preferably not endergonic. The SF material may have donor and acceptor units coupled, conjugated, or otherwise joined together to form efficient SF compounds, materials, oligomers, or polymers.

Yet another embodiment may be directed to a stable, soluble, solution-processible singlet fission compound or material which has a triplet yield over 100%, a singlet fission rate of less than about 10 picoseconds (ps), preferably less than or equal to about 7 ps, and a triplet decay rate that is greater than or longer than the singlet fission rate, preferably greater than or about 80 ps.

A further embodiment may be directed to a stable, soluble or solution-processible singlet fission material or compound having donor-acceptor interactions comprising at least one donor flanked by at least two acceptors with or without spacers, and the singlet fission material is capable of intra-molecular SF (iSF) producing a triplet yield of greater than about 100%, preferably greater than about 150%, and most preferably about 200%.

As will be understood by those of skill in the art, the number and order of spacers may be altered in order to identify efficient SF materials having a triplet yield of greater than about 100% and a triplet decay rate sufficiently long to allow extraction of the triplets to occur before they recombine. As will be further appreciated by the skilled practitioner, useful iSF materials can be selected by considering several parameters using techniques well known in the art. The identification, selection, synthesis, and modification of useful, efficient iSF materials, depend on a number of parameters, such as the length of the repeating units, distance between the donor and acceptor units, the type and strength of the donor and acceptor units, the strength of the charge transfer states, the type of solvent, the type and number of spacers, polarizability of a charge transfer environment, lowest unoccupied molecular orbital (LUMO) of donor versus LUMO of acceptor, and the like. (see, for example, R. S. Kularatne et. al., J. Polym. Sci., Part A: Polym. Chem., 2013, 51, 743-768).

Donor (acceptor) strength can be defined from the HOMO (LUMO) energy of the donor (acceptor) monomeric units comprising a donor-acceptor polymer. The values of the HOMO and LUMO can be established experimentally through techniques like cyclic voltammetry, or theoretically by density functional theory (DFT) calculations. The higher the HOMO, the stronger the donor. The lower the LUMO, the stronger the acceptor. The strength of the CT is defined by two parameters: 1) the offset between the donor and acceptor HOMOs and 2) the offset between the donor and acceptor LUMOs. Generally, the donor has a HOMO energy higher (less negative) than the acceptor HOMO, while the acceptor has a LUMO energy lower (more negative) than that of the donor. Strong CT can arise from 3 cases: a) The donor and acceptor have similar LUMO energies (within ~0.5 eV), and the donor HOMO is much higher than the acceptor HOMO (>2 eV difference), b) The donor and acceptor have similar HOMO energies (within ~0.5 eV), and the acceptor has a much lower LUMO than the donor (>2 eV difference), and c) The donor HOMO is higher than the acceptor HOMO by ~1 eV or more and the acceptor LUMO is lower than the donor LUMO by ~1 eV or more To demonstrate that materials with strong charge-transfer character and low triplet energies undergo efficient iSF, polymers (PBTDOn) and small molecules (BTDOn) based on building blocks comprising benzodithiophene (B) as the electron-rich unit and mono- or bi-thiophene-1,1-dioxide (TDO1, and TDO2, respectively) as the strong electron acceptor with low triplet energy (FIG. 10A) were synthesized. Specifically, poly-benzodithiophene mono-thiophene-1,1-dioxide (PBTDO1) and poly-benzodithiophene bi-thiophene-1,1-dioxide (PBTDO2) are exemplified here. Control systems with unoxidized thiophenes are shown in FIG. 10B.

Steady-state extinction spectra of all materials (FIG. 10C) show that a large redshift is observed in the optical gap relative to the unoxidized thiophene analogues. As such, the lowest-energy optical excitation was assigned to a singlet exciton with significant charge-transfer character. The reduction in bandgap on oxidation ranges from 300 to 760 meV, and is more prominent in systems with more TDO units (see TABLE 1: Material Properties; and FIGS. 14A and 14B)[25]. The small molecules show a broad visible absorption feature with a single peak and no prominent structure. The PBTDOn polymers, however, show additional excitonic structure, which is typical to other donor-acceptor polymers[38].

TABLE 1

| MATERIAL | BANDGAP, OPTICAL (eV) | HOMO (eV) | LUMO (eV) | TRIPLET QUANTUM YIELD | TRIPLET PAIR LIFETIME (ps) |
|---|---|---|---|---|---|
| BTDO1 | 1.85 | −5.7 | −3.8 | 0.4 ± 0.2 | 75 ± 15 |
| BTDO2 | 1.65 | −5.8 | −4.1 | 0.56 ± 0.1 | 13 ± 8 |
| PBTDO1 | 1.79 | −5.7 | −3.9 | 1.7 ± 0.1 | 80 ± 20 |
| PBTDO2 | 1.53 | −5.6 | −4.1 | 0.6 ± 0.1 | 23 ± 3 |

Small molecule cyclic voltammetry (CV) was conducted using a solution-phase square wave CV experiment to minimize signals from background charging. Polymer CV was conducted using a typical linear-voltage CV experiment on polymer films cast from an about 4 mg/mL solution of polymer in chloroform. Polymer experiments were calibrated with the redox potential of ferrocene/ferrocenium (Fc/Fc$^+$), located at 0.31 V relative to the Ag/AgCl electrode. It is assumed that the redox potential of Fc/Fc$^+$ has an absolute energy level of ~4.80 eV to vacuum. In all experiments, the oxidation potential (HOMO energy level) was clearly observed. However, the reduction peak is partially obscured by the electrolyte background in the small molecule voltammograms. For this reason, all HOMO energy levels were assigned directly from the CV oxidation potential, and approximate the LUMO energy level using the HOMO energy level and the optical bandgap.

The photophysical and electronic material properties are listed for the TDO-containing materials described here. The optical bandgap for each material was determined from the linear absorption spectra (FIG. 10C). The highest occupied molecular orbital (HOMO) was determined by means of cyclic voltammetry (FIGS. 14A and 14B). The lowest unoccupied molecular orbital (LUMO) is approximated using the HOMO energy level and optical bandgap. The triplet pair lifetimes were determined by exponential fitting of TA bleach recovery kinetics. The triplet yields were determined by fitting of TA bleach recovery kinetics and using the triplet absorption cross-section. The values shown are the average of the yields from the two techniques (FIGS. 11A-11D, details in the Examples).

To confirm that singlet fission is occurring, three parameters are verified: triplet formation occurs on an ultrafast timescale, the transient spectrum of the SF-generated triplets matches that of triplets generated through other means (for example, pulse radiolysis), and the triplet pairs generated through SF decay faster than the native triplet owing to the reverse of the singlet-fission process in the former. To avoid added complications of having to distinguish intermolecular species in the solid state, all measurements were carried out in dilute solutions (in e.g., chloroform) of these materials to eliminate bimolecular interactions. The associated optical spectra and dynamics were verified to be insensitive to the concentration of the molecules in solution (FIGS. 16A and 16B). Combined, these criteria unambiguously establish the fact that the triplets are being formed by iSF rather than intersystem crossing (ISC) or intermolecular SF.

FIGS. 16A and 16B demonstrate concentration independent dynamics. In order to ensure that the observed dynamics were intramolecular, the transmission spectra and bleach recovery were measured as a function of BTDO2 concentration (FIG. 16A and FIG. 16B, respectively). The results are shown for an order of magnitude change in chromophore concentration with very minor effects on the transmission spectra and no significant change in the bleach recovery. Based on this, the possibilities of aggregate-induced and diffusion-collision-SF were ruled out in favor of intramolecular SF.

The material with the longest excited state lifetime and highest triplet yield is PBTDO1. Broadband transient absorption (TA) spectroscopy of PBTDO1 is used to follow the time evolution of three spectrally distinct states following optical excitation (FIG. 11A). The initially formed state as a singlet exciton with significant charge-transfer character was assigned, as is commonly observed in donor-acceptor polymer systems[38]. This state and its associated near-infrared-induced (nIR-induced) absorption band (region >750 nm in FIG. 11A and black kinetic trace in FIG. 11B) have an about 7 ps decay, which is correlated with the rise of a second spectral feature (region about 675 nm in FIG. 11A and kinetic trace in FIG. 11B). This population was assigned as a triplet exciton formed as the product of singlet fission (this assignment is confirmed below).

The data indicate that all photogenerated singlets are converted to triplets because the amplitude of the ground state bleach (blue region about 600 nm in FIG. 11A), which tracks the overall excited state population, remains constant during the interconversion process. The triplet population decays with a time constant of about 70 ps. A small sub-population (about 15%) is generated instantaneously, has a broad induced absorption spanning most of the visible spectral range, and persists well after the triplet population decays back to the ground state (>1 ns). Its dynamics are uncorrelated with either the singlet or triplet populations, suggesting an assignment to a charge-separated state formed by auto-ionization of hot excitons, as has been seen in other neat polymer systems[39]. Similar features are observed for the other TDO-containing materials. Global target analysis (details in the Examples) can be used to separate overlapping spectral signatures of the individual species (FIG. 11C) and model the population evolution versus time (FIG. 11D)[40,41]. Taken together, 85% of the initial excitations were determined to go on to form triplets with a formation rate of 7 ps and a decay rate of 70 ps. This gives a triplet quantum yield of about 170%, defined by twice the fraction of singlets that initially undergo fission (2×85%), and represents the maximum triplet population immediately after fission. The yields of other TDO-containing iSF materials are determined similarly.

Because iSF occurs on isolated molecules, triplet sensitization techniques can be used to confirm the above assignment of the triplet ($T_1 \rightarrow T_n$)-induced absorption feature and to measure triplet absorption cross-sections, which can be used as an independent verification of the triplet quantum yields deduced using rate equations. Specifically, pulse radiolysis triplet transfer (PRTT) methods were used (details in Examples) in which an electron pulse generates triplets that are transferred by a sensitizer to the molecule of interest[42]. These single triplets (as opposed to the triplet pairs produced in iSF) are optically probed to yield the triplet-induced absorption spectrum (FIGS. 12A and 12B, black circles), native triplet lifetime (>1 μs for all TDO-based materials) and extinction coefficient (8,700 and 16,300 $M^{-1}$ $cm^{-1}$ for TDO1-containing and TDO2-containing materials, respectively). The spectral agreement of the PRTT $T_1$ spectra and proposed $T_1$-induced absorption from TA confirms that triplets are being formed on an ultrafast timescale following optical excitation in all the TDO-containing materials studied here. Note that all materials with the same number of sequential TDO subunits have similar $T_1$ spectra, although overlapping ground state bleach contributions may lead to net differences in transient experiments (FIGS. 12A and 12B). Whereas triplet spectra are equivalent, irrespective of the triplet generation mechanism, triplet pairs generated by iSF were found to have recombination kinetics distinct from individual triplets generated by sensitization, as confinement of a triplet exciton pair within a molecule leads to faster biexcitonic recombination rates. Using the single triplet absorption cross-section, it is straightforward to independently determine that the fission yield for PBTDO1 is 173±10% (details in Examples). This value unambiguously establishes that iSF is occurring and agrees well with the kinetic determination of the triplet yield (170%) described here.

The triplet recombination dynamics also strongly support SF as the mechanism of triplet generation. Whereas the spectra for triplets formed through sensitization and through fission are very similar, their recombination kinetics are highly distinct because triplet pairs can proceed through spin-allowed triplet-triplet annihilation (to repopulate the singlet exciton state or return to the singlet ground state) rather than the much slower spin-forbidden recombination of lone triplet excitons. In the data described here (FIG. 12C and FIG. 12D), triplets formed by direct photoexcitation recombine more than four orders of magnitude faster than triplets produced through sensitization. The triplet pair lifetime observed here should be regarded as a lower bound, given that the measurements are conducted in a dilute solution where triplets are confined to one dimension along the polymer chain. If triplets are able to diffuse more freely in multiple dimensions, as would happen in the solid state, triplet pair lifetimes can potentially be much longer.

Moreover, the fast formation of triplets (<10 ps) supports singlet fission as the dominant mechanism because observation of ISC on such timescales is generally limited to systems containing heavy atoms that facilitate spin-orbit coupling as a means of circumventing angular momentum conservation selection rules. These assignments are further supported by ultrafast photoluminescence (UFPL) data (FIGS. 15A and 15B), which demonstrate that the singlet exciton emission is quenched by iSF in about 7 ps. Furthermore, UFPL data showed that a fraction of the resultant triplet exciton pairs decayed radiatively through the reverse of the iSF process, which further confirms the generation of triplet pairs rather than individual triplets. Under weak excitation conditions, only triplets generated in pairs will undergo photoluminescence on ultrafast timescales. Finally, owing to the low excitation fluence used in all transient absorption measurements (fluence-independent dynamics are demonstrated in FIG. 17), other exotic nonlin- ear mechanisms that result in the generation of triplets may further be excluded.

FIG. 17 demonstrates fluence independent dynamics. In order to ensure that the observed dynamics were linear and free of artifacts from multi-excitonic processes, an excitation density dependence was conducted. BTDO2 was subjected to 600 nm excitation at varied fluence. The results showed no significant difference in triplet pair yield or lifetime, as evidenced by the bleach recovery dynamics (FIG. 17).

Figure 15B:
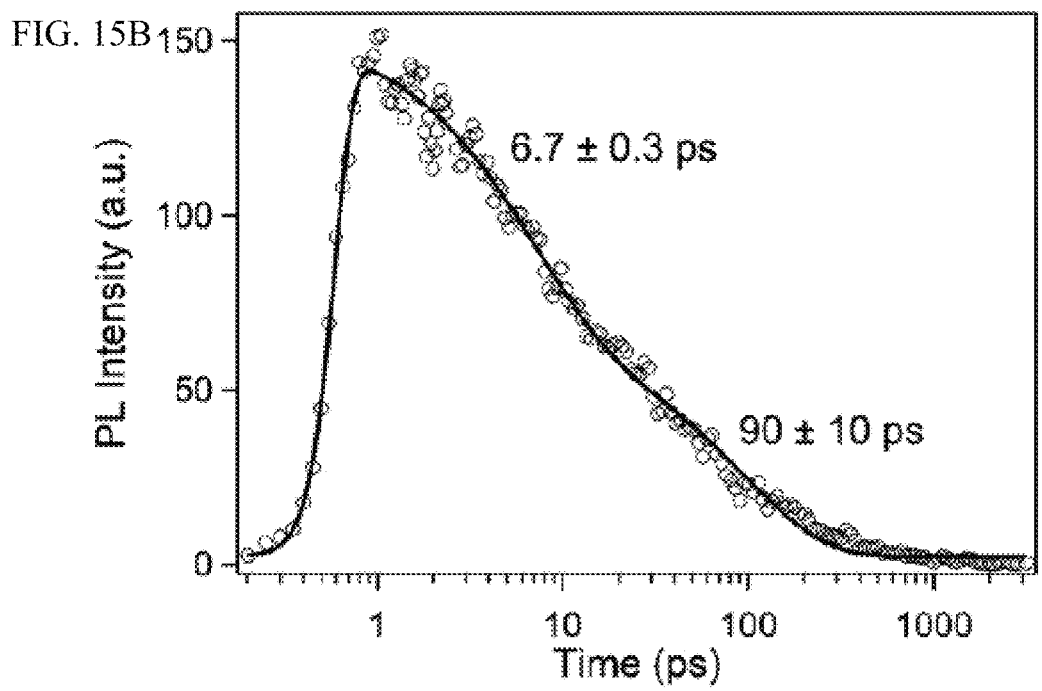

FIGS. 15A and 15B demonstrate transient photoluminescence (PL) of PBTDO1. The photoluminescence of PBTDO1 was measured using an ultrafast transient emission experiment, with a nonlinear up-conversion technique. Following 500 nm excitation, PBTDO1 showed two primary PL features. The first feature appeared immediately and persisted for about 7 ps (FIG. 15B). This feature was centered at 680 nm (FIG. 15A). At later times a second PL feature dominated. This feature decayed with an about 90 ps lifetime. This feature matched the integrated PL spectrum, which was centered at 725 nm. In FIG. 15A, transient spectra corresponding to 1 ps after excitation and 50 ps was shown. The 50 ps transient spectrum overlapped exactly with total integrated PL (dashed line). Due to the use of an 800 nm optical gate pulse (from which ultrafast timing is derived), the up-conversion measurement sensitivity drops off at $\lambda > 750$.

Together with photophysical measurements, density functional theory can be used to confirm the design principles that yield efficient iSF in both molecules and polymers. To better understand how the building blocks within the small molecule influence iSF, BTDO2 was focused on. The above results and the calculated excited state charge distribution (FIG. 23A and FIG. 23B) support the hypothesis that the singlet-fission process in SD-SA copolymers is initiated by direct optical excitation to a charge-transfer state, similar to what has been suggested in select xSF systems[27,30]. However, care must be taken with a simplified picture that depicts the hole carrier density as localized on the 'donor' monomer(s) and the electron density predominately on the 'acceptor' monomer(s)[33]. The charge-transfer character of the $S_{bright}$ state is confirmed by attachment/detachment density analysis[43], which shows the electron density is localized on TDO subunits whereas the hole density is rather delocalized (FIG. 23A and FIG. 23B).

The critical role of charge-transfer states in mediating singlet fission has been extensively addressed in xSF[18,27,29]. Here, the concept that there is a minimum amount of CT character needed to drive the iSF process was experimentally explored. To test the hypothesis that charge-transfer character facilitates iSF, a polymer in which BDT was replaced with a weaker fluorene donor unit (PFTDO1.) was synthesized, while keeping the TDO acceptor unit. Transient absorption spectroscopy reveals that iSF does not occur in PFTDO1 with any measurable yield (FIGS. 18A and 18B). This demonstrated that, even though the energetic driving force for iSF is stronger in PFTDO1. than in PBTDO1, iSF is not observed because the decrease in charge-transfer character significantly reduces the coupling between the singlet and triplet pair states. PFTDO1 confirms that satisfying the energetic requirement for fission and having a strong acceptor are not sufficient, but that both a strong donor and a strong acceptor are needed to efficiently mediate the iSF process.

FIGS. 18A and 18B demonstrate photophysics of PFTDO1, supporting evidence for charge transfer mediation. While charge transfer mediation is a useful lens through which the design of singlet fission materials may be viewed, additional support may be needed to extend this process from the context of intermolecular SF to the intramolecular SF observed here. To this end an alternating copolymer of fluorene and TDO (PFTDO1) was synthesized. This polymer was similar to PBTDO1, but with a weaker donor moiety. The weaker donor resulted in a higher bandgap by depressing the HOMO and reducing the charge transfer character of the lowest optical excitation. The triplet energy was not expected to change significantly, since the triplet predominately resides on the TDO subunit. The result was that the energetic requirement for SF (ES≥2ET) was still met in PFTDO1. Importantly, the charge transfer character of the singlet was reduced. The result was a system wherein SF is energetically viable, but the coupling through the intermediate charge transfer state was significantly reduced.

Transient absorption spectroscopy reveals that PFTDO1 did not exhibit significant SF (FIGS. 18A and 18B). The initially populated state was singlet excitonic in nature, as assigned by the presence of a stimulated emission band. The PIA band ($\lambda > 650$ nm) decayed concomitantly with the stimulated emission hand, and was thus assigned as a singlet absorption feature. The three features decayed to repopulate the ground state completely within about 1 ns Importantly, there was no evidence of triplet formation. While development of a larger library of materials would provide a more quantitative understanding of charge transfer mediated coupling in these systems, this case supported the charge transfer mediation of SF by offering a negative control.

By calculating the energy of the relaxed singlet (after reorganization, $S_{bright}=1.52$ eV) and uncoupled triplet pair energy (in the optimized double-triplet nuclear geometry, $2T_1=1.43$ eV) the following was determined: two relaxed, uncoupled triplets can exist when two TDO units are present and it is energetically downhill to go from the initial to the final states (FIG. 23C). The final relaxed triplet pair is analogous to 'free' triplet pairs generated in intermolecular-fission materials. However, their one-dimensional confinement prevents them from diffusing away from each other and leads to a faster bimolecular recombination process under low-fluence conditions. Interestingly, calculations of the spin density distribution suggest that a triplet state generated in the singlet geometry (as would he expected when fission is sufficiently fast) is partially delocalized across multiple TDO units. This result strongly suggests that multiexciton transition states in intramolecular-fission materials have unique electronic properties, and may involve triplet pairs that are transiently coupled before nuclear relaxation to the final geometry, a process analogous to the multiexciton-to-triplet pair relaxation observed in pentacene aggregates[31].

Despite their structural similarity, the photophysics of the PBTDO1 system, which exhibits a longer singlet state lifetime and much higher fission yield, is markedly different from PBTDO2 or the small molecule analogues. TABLE 1 summarizes the singlet fission yields and triplet lifetimes of the TDO-containing small molecules and polymers. The unoxidized control systems did not exhibit SF (FIGS. 19A-19E). The differences among the molecules can be attributed to the introduction of a fast competing singlet deactivation process in the lower-performing materials due to the emergence of a low-energy dark state. The effect of this dark state on the dynamics can be seen in FIGS. 13A and 13B, where fast (~100 fs) deactivation of the bright singlet state inhibits triplet formation (modelled population density shown with dotted lines). Although the initial $S_{bright} \rightarrow S_{dark}$ internal conversion process is not directly observed, it is clear that it is in competition with the SF process (FIG. 23C and FIGS. 16A and 16B). Furthermore, the lack of a rise in the triplet population after 100 fs confirms that SF originating from the dark state is not occurring. Details of the relaxation dynamics of BTDO1, BTDO2 and PBTDO2 are given in the Examples (FIGS. 20A-20D).

As a negative control experiment, the thiophene (T) versions of TDO-containing materials were synthesized. These systems differed from the iSF-exhibiting materials only in the inclusion of thiophene versus TDO. In FIG. 19E, the data for BT2 were shown, though the other unoxidized materials display similar dynamics.

To characterize the dynamics of this system, broadband femtosecond transient absorption (TA) spectroscopy was employed. The unoxidized system exhibits dynamics typical of many semiconducting polymers (FIGS. 19A-19E). Four spectral features are resolved: ground state bleach (GSB), stimulated emission (SE), and two photoinduced absorption bands ($S_1$-PIA, $T_1$-PIA). The SE, $S_1$-PIA, and a portion of the GSB decayed on an about 600 ps timescale. The $T_1$-PIA and a related portion of the GSB persisted for longer than the 3 ns time range of the TA experiment. Additionally, within the first about 10 ps there was red-shifting of the SE band.

The dynamics in this system were interpreted as the result of three processes: singlet excitonic relaxation, singlet recombination, and intersystem crossing (FIG. 19B). These observed dynamics were very similar to previous reports in polythiophene.[51] The initially formed population was a singlet exciton (S1*). Over the first about 10 ps the S1* state underwent vibration and torsional relaxation to form a relaxed singlet exciton (S1). S1 had an about 600 ps lifetime. Competing with singlet exciton recombination was intersystem crossing to form triplet excitons (also seen in polythiophene).[51] These triplets persisted for longer than time scale of the TA experiment, as was consistent with generation of triplets through ISC. This stands in sharp contrast to the triplet dynamics present in the oxidized systems where triplets were generated in pairs on a ps time scales and decay in a 10-100 ps timescale.

To ensure that the above description was sufficient to completely describe the TA dataset, global target analysis was performed (details on global analysis are in the methods section.) A three state model (FIG. 19B) provided a good fit of the TA data (FIG. 19C) and deconvoluted the $S_1$, $S_1^*$, and $T_1$ spectra (FIG. 19D). Results for the other studied unoxidized materials were in qualitative agreement with the dynamics observed for BT2. The effect of thiophene oxidation on the excited state lifetime was quite dramatic. Perhaps the most simple parameter for accessing the effects of oxidation was the excited state lifetime: the average lifetime of an excitation before it repopulates the ground state. This is well represented by the bleach kinetics. Upon thiophene oxidation, the 600 ps excited state lifetime of BT2 was shortened to <1 ps (FIG. 19E). The minor <10 ps decay component in the BT2 bleach recovery trace was due to the red-shifting of the overlapping SE band during structural relaxation and was not due to population loss. Similar results, to varying degrees of severity, were seen for all measured TDO-containing BDT conjugates and copolymers. This up to 3 orders-of-magnitude change in lifetime strongly suggested that oxidative chemical modification introduced new photophysical relaxation pathways in these TDO-containing complexes.

In agreement with transient absorption measurements in the manuscript, the first feature was assigned as a singlet exciton that quickly deactivated in about 7 ps by singlet fission. This confirmed that SF was occurring out of a bright excitonic state and ruled out the possibility of polyene-like photophysics, in which relaxation to an $A_g$ dark state would occur in sub-ps timescales. The transient absorption ground-state bleach did not decay on this time scale, indicating no net loss of excited state population (FIG. 13A). The second PL feature was assigned to radiative triplet pair recombination. This feature matched the integrated PL spectrum, which indicated that the majority of PL came from triplet pair recombination rather than singlet exciton PL. Neither radiative pathway was particularly efficient, given that the total PLQY was <2%, suggesting an energetically uphill process for triplet-triplet radiative annihilation.

The emergence of the dark state and the resulting marked differences in the overall fission yield by considering the electronic structure of TDO itself. The oxidation of a thiophene monomer results in a transition from a $6\pi \rightarrow 4\pi$ electron system that is an electronic analogue of cis-butadiene (or cyclopentadiene). Without appropriate flanking groups, this electronic modification can result in an oligoene-like excited state character, where excitation into a bright singlet excited state ($S_{bright}$ or $S_2$, $B_u$ symmetry) quickly (about 100 fs) converts internally to a lower-lying dark state ($S_{dark}$ or $S_1$, $A_g$ symmetry), and finally to the ground state ($S_0$, $A_g$)[44]. As evidenced by the about 7 ps singlet lifetime and the associated transient photoluminescence (FIGS. 15A and 15B), this dark state internal conversion process is notably absent in PBTDO1, but apparent both in the lack of photoluminescence and the transient absorption data from the other three materials, where a broad visible-nIR($S_{dark} \rightarrow S_n$)-induced absorption feature that decays concomitantly with a significant portion of the bleach (FIGS. 20A-20D) was observed. Although the polyene-like behavior is parasitic to efficient fission, this behavior is not ubiquitous among all TDO-containing materials. This provides important evidence that this detrimental internal conversion pathway can be controlled with appropriate materials design. The possibility of mitigating the effects of internal conversion is a unique strength of the tunability inherent to donor-acceptor SF copolymer systems.

FIGS. 20A-20D demonstrate transient absorption dynamics of TDO-containing materials. An overview of the excited state dynamics are shown here; the full datasets were plotted in FIGS. 20A-20D. All studied TDO-containing materials showed three prominent features: ground state bleach, singlet induced absorption, and triplet induced absorption. Though not easily visualized in pseudo-color plots, PBTDO1 (FIG. 20B) also showed a small long-lived charge separated population with a broad, featureless absorption band (FIG. 11C). All systems except for PBTDO1 showed sub-unity triplet yield due to internal conversion competing with SF. Additional TA experiments are discussed to further address the nature of SF and the competing internal conversion process.

The fundamental understanding of intermolecular singlet-fission processes was applied to the design of molecules that can undergo efficient intramolecular singlet fission. The key requirements are: formation of a charge-transfer state immediately following excitation and the presence of a subunit with a low triplet energy such that $E_S \geq 2E_T$. The observation of intramolecular singlet-fission yields up to about 170% in this new family of materials provides insight into designed singlet-fission materials using strong intrachain donor-acceptor interactions, which allows the establishment of a new design framework for fission-capable materials. This provides a generalized platform for the development of tunable materials to address the challenges of third-generation photovoltaic devices based on multiple exciton-generation processes.

FIG. 21 demonstrates excitation wavelength dependent dynamics. To better understand the competition between singlet fission and internal conversion, BTDO2 was subjected to an excitation wavelength dependence. As noted in the manuscript, the bleach recovery dynamics occurred on two timescales: about 1 ps was the decay associated with internal conversion and >10 ps was the decay associated with singlet fission. As a result, the relative fraction of population in fast and slow components was a measure of the singlet fission yield. The excitation wavelength dependent bleach recovery (FIG. 21) showed that SF occurred with excitation at any energy, but the yield was correlated with the absorbed photon energy.

This showed that singlet fission occurred with band-edge excitation and did not require excess photon energy to occur with measurable yield. The triplet yield was, however, dependent on excitation wavelength with excess photon energy resulting in increased triplet yield. The polyene-like $S_{bright} \rightarrow S_{dark}$ internal conversion was in kinetic competition with SF. When excited with excess energy, the hot $S_{bright}$ state must first undergo some degree of vibrational cooling before internal conversion to $S_{dark}$ can occur. While this process occurred on a very fast timescale, the effective reduction of the internal conversion rate provided a longer temporal window during which SF could occur. This interpretation, while qualitative, provided some insight to processes otherwise unobserved due to their instrument response limited nature.

FIGS. 22A-22D shows plots of raw transient absorption data for TDO-containing materials.

Fission yield using pulse radiolysis triplet sensitization was also determined. Fission processes in single, solution phase molecules were probed utilizing triplet sensitization techniques to provide quantitative information about the fission yield. This involved first determining the absorption cross-section with the PRTT sensitization technique, then quantifying the number of triplets transiently produced in TA measurements. The calculation was complete for all TDO-containing materials described here. An example calculation is shown below for PBTDO1.

The triplet absorption cross-section with PRTT data was determined as shown below. Previously reported triplet extinction coefficient for biphenyl was used to calculate the initial concentration of biphenyl triplet.[52] This value, along with the triplet transfer efficiency, as determined by the triplet decay rate and the triplet transfer rate, was used to determine the concentration of triplets that are transferred to BTDO1. This concentration, when compared to the magnitude of the TDO1-triplet PRTT signal [ΔABS (TDO1_triplet)] yields the extinction coefficient [ε(TDO1_triplet)] of a triplet on a TDO1 subunit. This extinction coefficient can then be used to determine the triplet concentration in either of the TDO1-containing materials.

$$\varepsilon(\text{biphenyl}) = 25{,}100 M^{-1}cm^{-1}$$

$$conc(\text{biphenyl\_triplet}) =$$

$$\frac{\Delta ABS(\text{biphenyl\_triplet})}{\varepsilon(\text{biphenyl\_triplet})l} = \frac{0.030}{(25{,}100 M^{-1}cm^{-1})(2 \text{ cm})} = 5.97 \times 10^{-7} M$$

$$QY_{triplet\_transfer} = \frac{k_{triplet\_transfer}}{k_{triplet\_transfer} + k_{triplet\_decay}} =$$

$$\frac{1.2 \times 10^7}{1.2 \times 10^7 + 3.1 \times 10^6} = 0.79$$

$$conc(\text{TDO1\_triplet}) =$$

$$conc(\text{biphenyl\_triplet})QY_{triplet\_transfer} = 4.74 \times 10^{-7} M$$

$$\varepsilon(\text{TDO1\_triplet}) = \frac{\Delta ABS(\text{TDOL1\_triplet})}{conc(\text{TDO1\_triplet})l} =$$

$$\frac{8.25 \times 10^{-3}}{(4.74 \times 10^{-7} M)(2 \text{ cm})} = 8{,}685 M^{-1}cm^{-1}$$

Determining the triplet concentration from transient absorption experiment: The extinction coefficient (determined above) is used along with the magnitude of the TA signal (ΔABS) to determine the triplet concentration shortly after SF has occurred:

$$conc(\text{PBTDO1\_triplet\_TA}) =$$

$$\frac{\Delta ABS(\text{PBTDO1\_triplet})}{\varepsilon(\text{TDO1\_triplet})l} = \frac{5.1 \times 10^{-4}}{(8685 M^{-1}cm^{-1})(0.2 \text{ cm})} = 2.93 \times 10^{-7} M$$

Using excitation energy (number of photons, nexcitation), illuminated volume (Vexcitation), and solution extinction (1-T), the concentration of singlet excitons generated in the TA experiment can be calculated:

$$n_{excitation} = 8.52 \times 10^{10} \text{photons}$$

$$n_{absorbed} = (1-T)n_{excitation} = (0.444)\ 852 \times 10^{10} = 3.78 \times 10^{10}$$

$$conc(\text{PBTDO1\_triplet\_TA}) =$$

$$\frac{n_{absorbed}}{V_{excitation}} = \frac{3.78 \times 10^{10}}{3.69 \times 10^{-4} cm^3} = 1.02 \times 10^{14} cm^{-3} = 1.7 \times 10^{-7} M$$

The ratio of triplet:singlet concentrations gives the triplet quantum yield:

$$QY_{triplet} = \frac{conc(\text{PBTDO1\_triplet\_TA})}{conc(\text{PBTDO1\_singlet\_TA})} = \frac{2.93 \times 10^{-7} M}{1.7 \times 10^{-7} M} = 1.73$$

Similar analysis was carried out to determine the triplet extinction coefficient, concentrations and quantum yield for the remaining materials. The triplet-triplet extinction coefficient for TDO1-containing and TDO2-containing materials are about 8,700 and about 16,300 $M^{-1}cm^{-1}$, respectively. BTDO1, BTDO2, and PBTDO2 show triplet quantum yields of 0.58, 0.62, and 0.68, respectively. The triplet quantum yield tabulated in the manuscript are the average of the quantum yield as determined by TA and PRTT (above).

For consistent and accurate description of the many different states involved in the singlet fission process, several methods were employed, all rooted in density functional theory (DFT), to help identify key intermediate states. More specifically, regular DFT calculations for the S0 and $T_1$ states, linear response time-dependent (TD) DFT[53] for the $S_{bright}$ state, and constrained DFT approach[54] for the $T_1T_1$ state. All calculations were performed with the package Q-Chem[55] at the level of B3LYP/6-31G*. Complete results for the model system $BTDO_2$ are provided. All molecular geometries used in calculations are fully optimized, and all energy values are presented as calculated without adjustment. Because most implementations of TDDFT do not provide access to doubly excited states,[56] the $S_{dark}$ state could not be calculated.

A pathway for the intramolecular singlet fission process from the energetic point of view was focused on here. The energy of the $S_0$ state at its optimized geometry was set to be zero, and everything else was in reference to this energy.

The initial absorption happens at the $S_0$ optimized geometry, where the energy of the $S_{bright}$ state was calculated to be 1.67 eV (with an oscillator strength of 2.16), in good agreement with the experimental optical gap. To reveal the charge transfer character of the $S_{bright}$ state, the attachment/detachment density analysis was used.[43] As shown in FIGS. 23A-23C, the electron density was more localized on both left and right TDO units while the hole density was more delocalized over the whole molecule. This suggested a weak charge transfer mixing in the $S_{bright}$ state, which should assist its fission into two triplet states. The $S_{bright}$ state can experience a fast relaxation before deactivation. At its optimized geometry, the $S_{bright}$ state has energy of 1.52 eV. Therefore, approximately 0.15 eV would be lost to heat unless the deactivation is faster than the $S_{bright}$ relaxation. Without studying the dynamics, the minimum available energy of 1.52 eV was probed to determine if it was sufficient for conversion into an intramolecular double triplet state $(T_1T_1)$. First the single triplet state $(T_1)$ of the molecule was examined. The relaxed $T_1$ state had an energy level of 0.73 eV, which suggested that the state of two relaxed triplets was accessible energetically.

Moreover, the unpaired electrons of the relaxed $T_1$ state (as revealed by Mulliken spin charges, which should sum up to 2,) are localized on one side of the molecule, i.e. one of the boxes in FIG. 24. Therefore two decoupled and relaxed triplets can coexist within the same molecule. Constrained DFT (CDFT) was used to simulate the double triplet state where two triplets are placed antiparallel (so the molecule is still a singlet) on either side of the molecule (FIG. 24). After geometry relaxation, this double triplet state sits at 1.43 eV, nearly twice that of a single triplet, which suggests the two triplets in the relaxed double triplet state are decoupled. Therefore the intramolecular decoupled double triplet state was indeed energetically accessible from the $S_{bright}$ state.

However, the $S_{bright}$ state cannot convert into the decoupled double triplet state directly. Instead, the $S_{bright}$ state first goes through a coupled double triplet state. Though this intramolecular coupled double triplet state cannot be directly calculated with DFT, the fact that at the relaxed $S_{bright}$ geometry, the single triplet state has only about 1.6 spin charge on one side of the molecule, and 0.3 on the other side, and 0.1 in the middle, indicates that the double triplet state will be strongly coupled because of the distribution overlap. Therefore, even though the triplet state at the relaxed $S_{bright}$ geometry is calculated to be 0.92 eV, the energy of the double triplet state at this geometry was expected to be much lower than twice single triplet energy due to strong coupling. While this coupled double triplet state with DFT cannot be directly accessed, the results using single point calculations with the restricted active space double spin-flip (RAS-(4,4)-2SF/6-31G*) method are supported.[52] This method is known to overestimate excitation energies, therefore it was only used to find out relative positions of different states. At the TDDFT optimized $S_{bright}$ state geometry, RAS-2SF gives energies for the $S_{bright}$ and double triplet state to be 2.83 eV and 2.39 eV, respectively. These energies agree with the hypothesis that the double triplet state is accessible from the $S_{bright}$ state.

The relationship between the amount of CT and the triplet yields was investigated by varying the strength of the donor component or donor unit. Going from a weak donor (e.g., carbazole) to a strong donor (e.g., benzodithiophene (BDT)) to a stronger (dithienosilole) donor, there is a rise and then fall in triplet yields. Therefore, there appears to be an optimum amount of charge transfer. In an embodiment of the invention, an iSF stable, soluble or solution-processible SF material has a triplet yield of greater than about 100%, preferably greater than or about 150%, more preferably greater than or about 170%, even more preferably greater than or about 190%, and most preferably about 200%, and has or is about an optimum amount of charge transfer.

The localization of the triplet energies on the TDO moieties enables the addition of spacers without significantly altering the triplet energy and therefore still satisfying the energetic requirement for SF. Non-limiting examples of spacers include thiophene, benzene, thienothiophene, any conjugated aromatic spacer, and the like (Huynh, UNV, et al. hyper text transfer protocol://arxiv.org/pdf/1510.04773.pdf). The preferred spacers of the invention are thiophene and benzene; however, spacers that are not preferred include, but are not limited to, alkynes, alkenes, or furans.

Singlet fission in solid state films has been observed before (Guo, Y. et al. *J. Am. Chem. Soc.*, 2008, 130:9198-9199) but the triplets in the inventive iSF system and their solid state films recombine too quickly. Hence, the rate of recombination may be lowered for implementation of these polymers into working SF solar cells.

Triplet lifetimes in polymers can be tuned by the introduction of spacers. This is a significant step toward incorporating SF into functional devices, but challenges remain, such as extracting these triplets with a suitable acceptor.

Altering the coupling, rather than the driving force, provides an additional method for exploring polymer singlet fission. To accomplish this, at least one spacer, such as for example, a π-conjugated spacer is introduced between the donor and the acceptor. PBTDO1 was synthesized with thiophene (T) spacers inserted between B and TDO to yield a new polymer, PBT-TDO1-T. This modification does not have significant effects on the energy of the singlet exciton state, as shown by the similar positions of the lowest energy feature in the absorption spectra with and without the spacer (FIG. 32).

Given the similar ground state properties, we turn to transient absorption spectroscopy to characterize the difference in excited state dynamics. Qualitatively, the two systems behave similarly. The initially excitation is a singlet exciton. This exciton under goes quantitative singlet fission to produce triplet pairs that then recombine via triplet-triplet annihilation. In both systems, the singlet fission yield is less than the 200% theoretical maximum due to some singlet exciton auto-ionization that appears to be instrument response limited.

Quantitatively, the decreased coupling imparted by the spacers has significant impact on the dynamics. Insertion of thiophene and increased conjugation length has little effect on HOMO and LUMO as opposed to the addition of a TDO unit. The rates of both the singlet fission and triplet-triplet annihilation processes are reduced by a factor of two. This difference in rate does not significantly change the yield of fission, because the fission process is still significantly faster than other recombination pathways. However, the increased triplet lifetime resulting from less efficient coupling of the triplet pair back into the singlet manifold, can be beneficial for future device application that will benefit from the increased time allowed for triplet harvesting.

Given the minor changes to the absorption spectra, the major effect of the spacer on the excited state dynamics originates from the decreased electronic coupling rather than a significant change in the energetics of singlet fission. This decreased coupling is caused by an increase in the repeat unit length from ~12.6 Å (B-TDO) to ~20.1 Å (B-T-TDO-T). This increase in distance decreases the coupling between adjacent TDO, the electron acceptor and triplet host. Additionally, this additional spacer causes an increase in the singlet fission yield by decreasing the population loss through singlet exciton auto-ionization from ~15% to ~5%. This results in a triplet yield of ~190% in PBTTDOT, which notably is the highest singlet fission yield to date in a polymer. This decrease in auto-ionization yield is also a product of decreased coupling. The auto-ionization process requires good intrachain electronic coupling to separate charge carriers outside of the Onsager radius before the singlet exciton cools. As a result, this process will be affected by the strength of electronic coupling between adjacent repeat units.

The overall effect of pi-conjugated spacers between donor and acceptor in singlet fission-capable polymers or materials is a decrease in singlet fission and triplet-triplet annihilation or decay rates. This can provide increased time, during which the triplet excitons can be harvested. This can be beneficial for device applications, assuming that the associated decrease in singlet fission rate is not significant enough to decrease the fission yield. Additionally, the decrease in the parasitic charge separation process can result in higher fission yield, which is also beneficial for potential applications.

In one embodiment, the minimum polymer unit that is capable of intramolecular singlet fission (i.e., one donor flanked by two acceptors) was also shown to perform singlet fission. The below TABLE 2 shows the rates of singlet fission for compounds corresponding to those in FIGS. 25A-25C as well as PBTOT. pBTDO1 and pBTOT were found to be iSF materials or compounds with particularly high triplet yields, about 170% and about 190%, respectively. is not a SF material of the invention because it did not undergo SF. "p" represents "poly" in the structures described here and in TABLE 2.

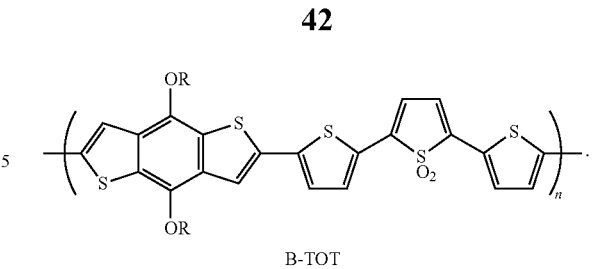

B-TOT

Examples of structures or materials that do not have singlet fission include but are not limited to: poly-carbazole mono-thiophene-1,1-dioxide (PCTDO1), poly-carbazole di-thiophene-1,1-dioxide (PCTDO2), and poly-fluorene mono-thiophene-1,1-dioxide (PFTDO1) with the structure:

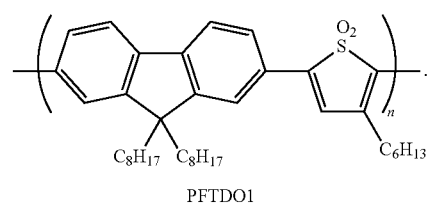

PFTDO1

Accordingly, the inventive singlet fission compounds, materials, or polymers, all of which are used interchangeably here, do not include PCTDO1, PCTDO2, PFTDO1, and the like, particularly those having a carbazole or a fluorene donor.

Two ways to tune the CT character and the resultant effects on iSF include tuning the intrinsic CT character of the polymer chains using donors of different strengths and using

TABLE 2

|       | pCTDO1 | pCTDO2 | pBTDO1 | pBTDO2 | pDTDO1 | pDTDO2 | pBTOT   |
|-------|--------|--------|--------|--------|--------|--------|---------|
| Rate  | No SF  | No SF  | 7 ps   | <10 ps | <1 ps  | <1 ps  | ~25 ps  |
| Yield | No SF  | No SF  | ~170%  | ~60%   | ~50%   | ~50%   | ~190%   |
| Decay | No SF  | No SF  | 80 ps  | 23 ps  | 25 ps  | 8 ps   | ~160 ps |

One embodiment is directed to a, or at least one, stable, solution-processible singlet fission material molecule, or compound, of poly-benzodithiophene mono-thiophene-1,1-dioxide (PBTDO1) having the following PBDT-TDO1 structure:

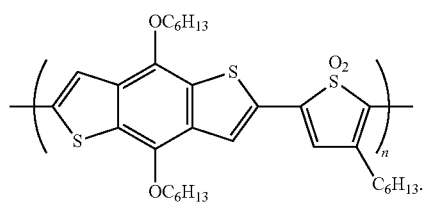

Another embodiment is directed to a, or at least one, stable, solution-processible singlet fission material, molecule, or compound, having the following polybenzodithiophene [2,2':5',2''-terthiophene]-1',1'-dioxide (PBTOT) or (PBT-TDO1-T) structure:

solvent as an external factor to stabilize or destabilize the CT character of the efficient iSF polymer.

One of the advantages of using donor-acceptor copolymers as a medium for singlet fission is the tuneability afforded by the use of modular building blocks. This allows for electron donors and electron acceptors to be chosen independently to optimize the material's properties, specifically the absorption spectrum, singlet energy, and triplet energy can be tuned. As previously noted,[57] there are two requirements for efficient singlet fission: coupling and energy.

The coupling requirement states that electronic coupling between the singlet and triplet pair excitonic state is necessary. Overall, the fission process is a two electron transfer process. Similar to intermolecular SF systems, the SF process can be viewed as a singlet exciton coupled to a triplet pair through an intermediate charge transfer state. Within this context, 'charge transfer-mediated' processes provide more efficient coupling than a 'direct' simultaneous two electron transfer, thus efficient singlet fission can be facilitated by a singlet exciton with some charge transfer character to mediate SF. Donor-acceptor polymers have strong charge transfer character in the lowest lying excited state, and, therefore, will generally satisfy coupling requirements.

The energy requirement for efficient SF requires that SF be exergonic, such that the triplet pair ($E_{TT}$) lies below the singlet ($E_S$) ($\Delta E_{SF} \geq 0$ where $\Delta E_{SF} \approx E_S E_{TT}$). Polymer building blocks must be chosen carefully to ensure that this requirement is met. Within a localized molecular orbital framework, the ionization energy (hole) is predominately defined by the electron donor and the electron affinity (electron) is predominately defined by the electron acceptor. Additionally, the exchange energy and resulting triplet energy is predominately a property of the triplet acceptor, which will most commonly be the electron acceptor. The singlet ($E_S$), triplet ($E_T$), and triplet pair ($E_{TT}$) state energies can be approximated to the first order as the sum of contributions from ionization energy (IE), electron affinity (EA), exciton binding energy ($E_B$) and the triplet exchange energy ($E_X$):

$E_S \approx (IE-EA)-E_B$ $E_T \approx (IE-EA)-E_B-E_X$ $\Delta E_{SF} = E_S - 2E_T \approx -(IE-EA)+E_B+2E_X$ The relative decoupling of the electron and hole contributions to the singlet and triplet energies result in peculiar dependences upon the donor and acceptor constituents. Approximation of the singlet fission driving force ($\Delta E_{SF}$) with these relationships demonstrates that $\Delta E_{SF}$ is a function of all four relevant variables, IE, EA, $E_B$, $E_X$. Perhaps counter-intuitively, this implies that decreasing the singlet energy by using a stronger donor will increase the singlet fission driving force. In the molecular orbital picture, this is equivalent to raising the HOMO. Thus, in a series of materials with a common electron acceptor and triplet host, switching to a stronger donor should preserve singlet fission-capability while decreasing both the singlet and triplet energies.

To explore the effects of electron donor species on SF, six polymers were synthesized. All polymers use one or two sequential thiophene-1,1-dioxide moieties (TDO1 and TDO2, respectively) as electron acceptors. Carbazole (C), benzodithiophene (B), or dithienosilole (D) were chosen as electron donors (listed in order of increasing donor strength/decreasing ionization energy). Their structures are shown in FIG. 44. As expected, the resultant materials show absorption spectra consistent with donor-acceptor polymers with stronger donors yielding a smaller optical gap (see FIGS. 26A, 26B). Following ground state characterization, these materials were investigated by femtosecond transient absorption (TA) spectroscopy.

Figure 28A:
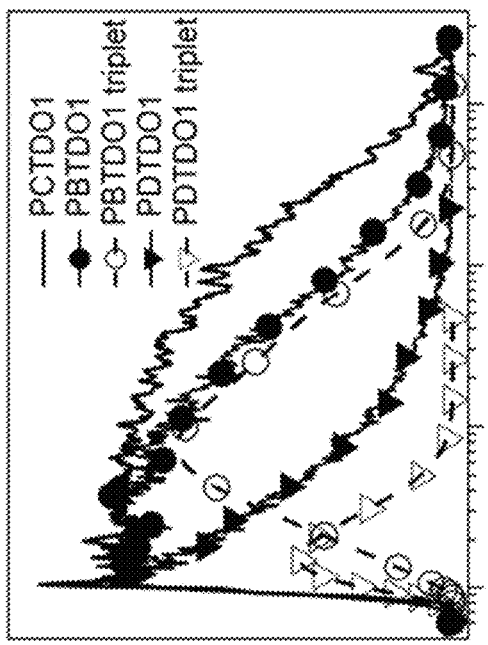
Figure 28B:
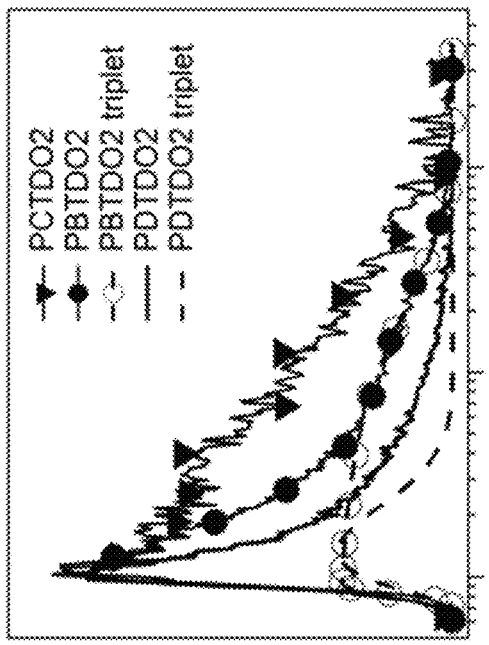

Dynamics in systems with varied donors are markedly different. PCTDO1 and PCTDO2, the polymers with the weakest donor, appears to be incapable of singlet fission. TA reveals three spectral features: ground state bleach, stimulated emission (SE), and a nIR excited state absorption (ESA). The stimulated emission band red-shifts over the first tens of picoseconds. The stimulated emission and nIR ESA band then decay concomitantly on ~300 ps and ~30 ps timescale for PCTDO1 and PCTDO2, respectively, as shown in FIGS. 28A and 28B. The SE and ESA signals may be contributed to singlet excitons. The dynamics is consistent with excitation of a singlet exciton that undergoes relaxation via torsional relaxation, and finally decays via radiative or nonradiative pathways. This is consistent with dynamics in many other excitonic semiconducting polymers, the lack of SF in PCTDO1 and PCTDO2 may be attributed to an increased ionization energy that destabilizes the triplet pair state to an energy higher than the lowest singlet excitonic state.

In contrast to PCTDOn materials, all PBTDOn and PDTDOn materials studied here exhibit significant triplet pair production via singlet fission. The presence of SF in PBTDO1 and PBTDO2 was confirmed using a combination of TA and pulse radiolysis triplet transfer spectroscopies.[57] Similarly, PDTDOn materials undergo singlet fission by confirming that: 1) triplets formed via SF have similar spectral signatures to triplet formed via other means, 2) triplet formation occurs on an ultrafast timescale, and 3) triplet pairs formed via SF decay faster than lone triplet because of the spin-allowed triplet-triplet annihilation process.

Figure 28C:
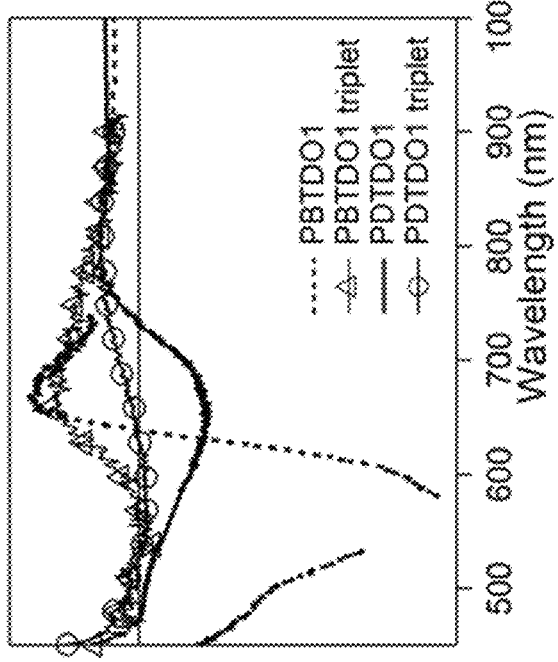
Figure 28D:
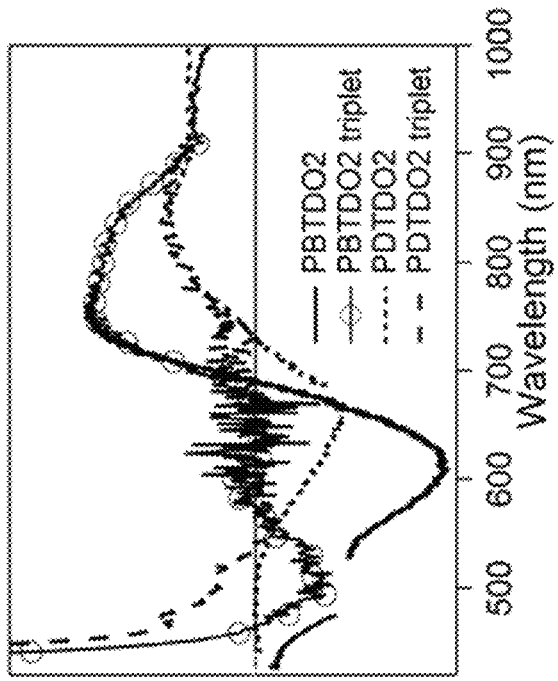

Both PDTDOn materials meet the above standards. The triplet pair ESA spectra are well matched to lone triplet ESA absorption spectra generated through triplet sensitization (aside from differences in the bleaching induced by the sensitization method), as seen in FIGS. 28C and 28D. The triplet formation rate for both PDTDOn materials appears to occur within the 1 ps following excitation, faster that intersystem crossing would typically allow. Lastly, the triplet pair resulting from SF decays in ~25 ps and ~8 ps, for PDTDO1 and PDTDO2, respectively. This is several orders of magnitude faster than the recombination of individual triplet via phosphorescence or intersystem crossing in similar systems. Meeting these criteria confirm that singlet fission is the observed method of triplet formation. As in the PBTDOn systems, the faster decay of the triplets in PDTDO2 may be attributed to the stabilization of dark states induced by having two adjacent TDO units. This introduces non-radiative decay pathways to the system. A comparison of fission rates, triplet yields and triplet recombination rates is shown in Table 3.

TABLE 3

Singlet fission rates, yields, and recombination rates obtained from TAS.

|  | PBTDO1 | PBTDO2 | PDTDO1 | PDTDO2 |
|---|---|---|---|---|
| Rate | 7 ps | <10 ps | <1 ps | <1 ps |
| Yield | ~170% | ~60% | ~50% | ~50% |
| Recombination | 80 ps | 23 ps | 25 ps | 8 ps |

DFT calculations at the B3LYP/6-31G** level were performed on the TDO1 polymers to justify some of the observed differences in SF yields and rates. TD-DFT was used to obtain the energy and nature of the excited state transitions while unrestricted DFT was used to obtain the triplet energy. Four repeat polymer repeat units were used since this is usually where the DFT energy converges.[66] The driving force for fission was estimated using $\Delta E_{SF} = E_{S1} - 2E_{T1}$, and it supports the claim that fission in PCTDO1 is energetically uphill. Across all three model tetramers, the main contribution in the $S_0 \rightarrow S_1$ transition is from HOMO→LUMO, consistent with the CT nature of the lowest energy excitation often noted in conjugated polymer systems. The $S_0 \rightarrow S_2$ transitions are composed of HOMO-1→LUMO and HOMO→LUMO+1 transitions. In oligoenes, these transitions constitute the $2A_g$ dark state and indeed we observed very small oscillator strength for this excitation in our polymers.

Recent theory on excitations in donor-acceptor polymers suggest that there is mixing between TT and $S_1$ states which is dependent on the difference in energies of the donor and the acceptor.[67] Hence, besides being endothermic, fission in PCTDOn polymers may also be suppressed due to weak mixing between these states. Donors of intermediate strength like benzodithiophene appear to be optimal for fission since there is strongest mixing between TT and $S_1$. However, once the donor becomes too strong, the TT oscillator strength drops significantly, which may account for the low fission yield in PDTDOn polymers. The electronic distribution of the triplet may also account for less efficient fission in PDTDOn versus PBTDOn polymers. In both cases, the singly occupied molecular oribtals (SOMOs) of the triplets are qualitatively similar to the HOMO and LUMO (FIGS. 45A and 45B). However, while the LUMO and higher-energy SOMO of PBTDO1 have electron density significantly concentration on the TDO unit, the same orbitals in PDTDO1 are more delocalized over both donor and acceptor moieties. This delocalization may reduce the propensity for SF since the TDO unit is such a strong triplet host.

TABLE 4

Singlet and triplet energy levels of the TDO1 polymers obtained from TD-DFT and DFT respectively. The exorthermicity of singlet fission is also shown, where $\Delta E_{SF} = E_{S1} - 2E_{T1}$.

|  | PCTDO1 | PBTDO1 | PDTDO1 |
|---|---|---|---|
| $E_{S1}$ | 2.17 | 1.71 | 1.42 |
| $E_{T1}$ | 1.31 | 0.72 | 0.63 |
| $\Delta E_{SF}$ | −0.44 | 0.27 | 0.16 |

Both singlet excitons and triplet exciton pairs in PBTDO1 can recombine radiatively. This provides a direct means of probing both the energy and the dynamics of the singlet and triplet pair states via time resolved photoluminescence (TRPL) spectroscopy. Immediately following excitation, the TRPL signal results from singlet exciton. This signal decays as singlet fission occurs to produce triplet pairs. Though most triplets recombine non-radiatively, triplet pairs can also recombine radiatively, depending on the overall spin state of the system. A pair of triplet excitons has nine possible electronic configurations with regard to the L and $m_l$ quantum numbers (shown with Clebsch-Gordon coefficients below). These nine electron configurations yield five quintets, three triplets, and one singlet. Owing to the presence of an overall-singlet configuration of the triplet pair state, two triplets can recombine radiatively. This is also the only electron configurations that can be produced from spin-allowed singlet fission. As a result, all triplet pairs generated via SF will be capable of spin-allowed recombination.

$$|L, m_L\rangle = \begin{bmatrix} |1,1\rangle|1,1\rangle \\ \frac{1}{\sqrt{2}}|1,1\rangle|1,0\rangle \frac{1}{\sqrt{2}}|1,0\rangle|1,1\rangle \\ \frac{1}{\sqrt{6}}|1,1\rangle|1,-1\rangle + \sqrt{\frac{2}{3}}|1,0\rangle|1.0\rangle + \frac{1}{\sqrt{6}}|1,-1\rangle|1,1\rangle \\ \frac{1}{\sqrt{2}}|1,0\rangle|1,-1\rangle + \frac{1}{\sqrt{2}}|1,-1\rangle|1,0\rangle \\ |1,-1\rangle|1,-1\rangle \\ \frac{1}{\sqrt{2}}|1,1\rangle|1,0\rangle - \frac{1}{\sqrt{2}}|1,0\rangle|1,1\rangle \\ \frac{1}{\sqrt{2}}|1,1\rangle|1,-1\rangle - \frac{1}{\sqrt{2}}|1,-1\rangle|1,1\rangle \\ \frac{1}{\sqrt{2}}|1,0\rangle|1,-1\rangle - \frac{1}{\sqrt{2}}|1,-1\rangle|1,0\rangle \\ \frac{1}{\sqrt{3}}|1,1\rangle|1,-1\rangle - \frac{1}{\sqrt{3}}|1,0\rangle|1,0\rangle + \frac{1}{\sqrt{3}}|1,-1\rangle|1,1\rangle \end{bmatrix} =$$

$$\begin{bmatrix} |2,2\rangle \\ |2,1\rangle \\ |2,0\rangle \\ |2,-1\rangle \\ |2,-2\rangle \\ |1,1\rangle \\ |1,0\rangle \\ |1,-1\rangle \\ |0,0\rangle \end{bmatrix} \begin{bmatrix} Q \\ Q \\ Q \\ Q \\ Q \\ T \\ T \\ T \\ S \end{bmatrix}$$

Though radiative recombination is a minority process for both states, the presence of radiative pathways allows for both the singlet and triplet dynamics to be monitored using TRPL spectroscopy. TRPL has the advantage of directly observing changes in both dynamics and PL energy, thus it provides a good technique for comparing subtle changes in the singlet fission process between similar samples. Solvent dependence provides a means of introducing these subtle changes to the environment in which singlet fission occurs. This modulation of energy and coupling allows us to explore the dependences of singlet fission in donor-acceptor systems, specifically PBTDO1. Changing solvent allows for the energy of the singlet and triplet state to be modulated; the resulting change in the singlet fission rate can then be observed with time resolved photoluminescence.

PBTDO1 solutions of the same concentration were prepared in a variety of organic solvents and binary solvent mixtures to provide environments with varied index of refraction and dielectric constant, the combination of which give rise to the observed change in excited state behavior. Useful solvents include but are not limited to dichloromethane, tetrahydrofuran (THF), dichloroethane, cyclohexanone, chloroform, toluene, chlorobenzene, o-dichlorobenzene, xylene, and the like, where the preferred solvent is dichloromethane and THF, while solvents that are not useful include ethanol and acetone because the polymer aggregates and is not soluble, which is useful for device applications. The orientation polarizability ($\Delta f$) approximates the transient solvent response as a function of static and high frequency dielectric constant:

$$\Delta f = \frac{\varepsilon - 1}{2\varepsilon + 1} - \frac{n^2 - 1}{2n^2 + 1}$$

The effects of orientation polarizability, combined with differing dipole moments for the singlet and triplet states, allows for tuning of the driving force for singlet fission by changing the solvent. PBTDO1, like all donor-acceptor polymers, has significant charge transfer character in the excited state, which results in a large excited state dipole relative to the ground state. As a result of exchange interaction, the triplet exciton is expected to be more localized and less polar. The net differential in excited state dipole yields an $\Delta E_{SF}$ that is dependent on the solvent. This dependence allows for the relationship between $\Delta E_{SF}$ and the singlet fission rate ($\Gamma_{SF}$) to be explored within the range of energies accessible with solvent effects.

Advantages of the Donor-Acceptor interactions include the possibility of tuning the polymers. In the scheme below, the arrows indicate increasing strength for donors (top row, left to right) and acceptors (bottom row, left to right). In the polymers described in the description, R is any alkyl solubilizing chain, such as but not limited to $C_8H_{17}$.

The names and abbreviations for the monomers are as follows—top row, left to right: Carbazole (C), fluorene (F), 4,8-bis(thieno)benzodithiophene (BDTT), and dithieneosilole (D). Bottom row, left to right: Thienopyrrolodione (TPD), diketopyrrolopyrrole (DPP), oxidized thienopyrrolodione (TPDO), and [2,2':5',2''-terthiophene]-1',1'-dioxide.

FIGS. 46A and 46B show the full structures of the representations of monomers in polymers shown above the full structures of the representations of monomers in polymers shown above.

It appears that SF may be tuned to occur in materials or polymers by increasing the acceptor strength (i.e., adding more TDO units). However, it is surprising that based on the above hypothesis, BDT-TDO2 should be more efficient than BDT-TDO1, but that is not the case. BDTT-TDO is surprising because although it is the most similar to BDT, BDTT-TDO does not show SF. Although TPDO acceptor has a low band gap, it is capable of undergoing SF, and accordingly, the triplets must be significantly low in energy. For the right most donor, despite having a higher donor strength, it has a lower triplet yield.

Although varying donor and/or acceptor strengths may be used as a means of affecting triplet yield, by varying the actual donor and/or acceptor units, and decreasing donor strength resulted in less triplet yield, and increasing donor strength similarly led to less triplet yield. Introducing spacers allowed for modulation of the strength of the donor acceptor interaction, which apparently may be a better or preferred approach compared to varying the donor and/or acceptor units because a) less triplets are lost to the competing charge separation (or autoionization state); and b) the triplets are further apart, so they recombine more slowly.

Additional spacers were added, both consecutive and alternating, between the donor and acceptor units. PBT-TOTT, PBTOOT, and BOO (aka BDT-TDO2). This com-

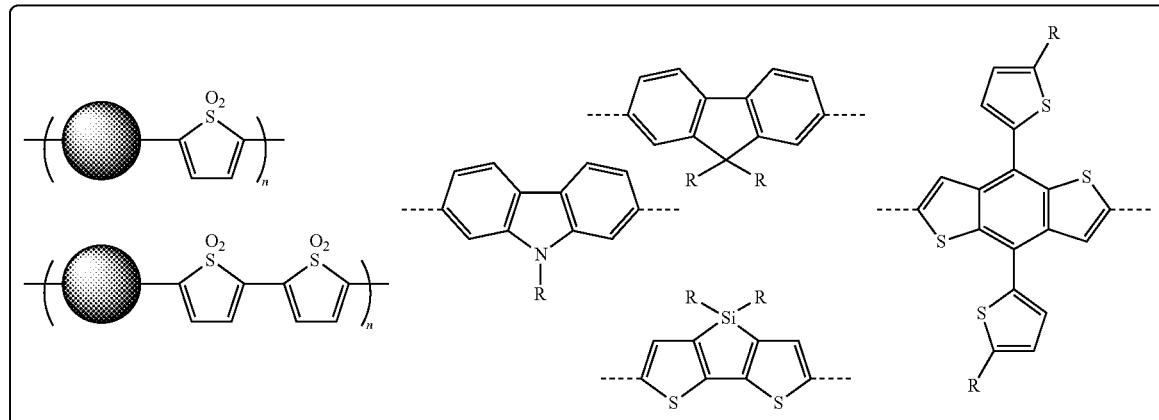

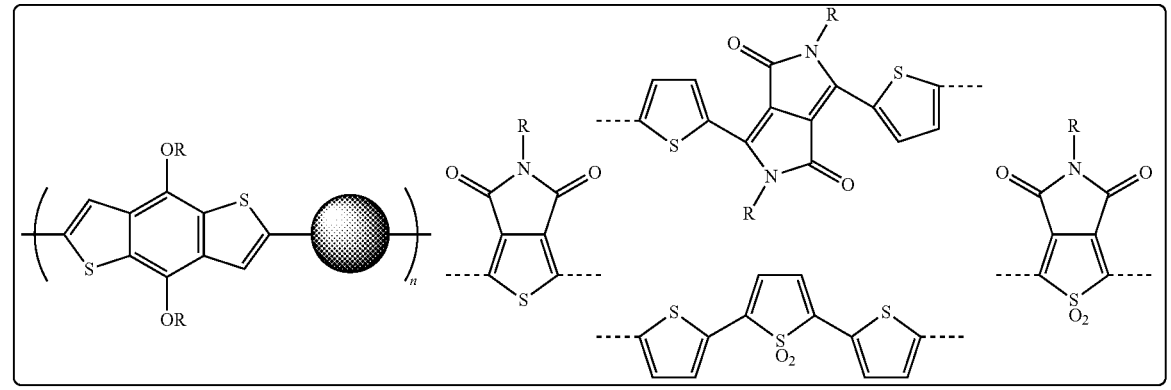

parison is analogous to the BTOT versus BO comparison. By increasing the number of spacers, the triplet yield percentage and decay rate may be modulated.

Although the materials, compounds, and polymers described here may be used in a variety of applications, one of the primary commercial applications for these materials is their use in photovoltaic systems. These TDO-containing materials present a new material class useful as a multifunctional layer in photovoltaic devices. Within this context, the TDO compounds could act as a charge acceptor or charge transport layer that also serves to absorb visible light, undergo fission, and inject down-converted excitons into a lower bandgap active layer. Due to the unique intramolecular nature of fission in TDO-containing systems, singlet fission also occurs in the solution phase. Therefore these materials may also be applied in dye-sensitized photovoltaic or photocatalytic devices. TDO-enabled singlet fission improves photovoltaic device efficiency. Another embodiment of the invention is directed to methods or the use of the polymer, compound, or materials described here as a multifunctional layer in a photovoltaic device. A further embodiment may be directed to a device comprising the polymer, compound, or materials described here which forms a multifunctional layer and the device has a singlet fission efficiency of greater than about 25%, preferably greater than or equal to about 100%, about 100% to about 200%, and more preferably greater than or equal to about 200%.

Incorporation of singlet fission materials into, for example, a solar cell allows for the Shockley-Queisser limitation to be circumvented. The resultant device may have two effective bandgaps without additional current matching constraints or the cost associated with building a secondary active layer. Even for devices far from the Shockley-Queisser efficiency limit, incorporation of a singlet fission layer can increase efficiency.

The polymers according to the present invention can also be used in mixtures or polymer blends, for example together with monomeric compounds or together with other polymers having charge-transport, semiconducting, electrically conducting, photoconducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more polymers, mixtures or polymer blends as described above and below and one or more organic solvents. Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetramethyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzonitrile, 2,5-dimethylanisole, 2,4-dimethylanisole, benzonitrile, 3,5-dimethylanisole, N,N-dimethylaniline, ethyl benzoate, 1-fluoro-3,5-dimethoxybenzene, 1-methylnaphthalene, N-methylpyrrolidinone, 3-fluorobenzotrifluoride, benzotrifluoride, benzotrifluoride, diosane, trifluoromethoxybenzene, 4-fluorobenzotrifluoride, 3-fluoropyridine, toluene, 2-fluorotoluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluorobenzene, 3-chlorofluorobenzene, 1-chloro-2,5-difluorobenzene, 4-chlorofluorobenzene, chlorobenzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents with high boiling temperatures and solvent mixtures are preferred. For spin coating alkylated benzenes like xylene and toluene are preferred.

Examples of especially preferred solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, m ethyl ketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and/or mixtures thereof.

The concentration of the polymers in the solution is preferably 0.1 to 10% by weight, more preferably 0.5 to 5% by weight.

After the appropriate mixing and ageing, solutions are evaluated as one of the following categories: complete solution, borderline solution or insoluble. The contour line is drawn to outline the solubility parameter-hydrogen bonding limits dividing solubility and insolubility. Complete solvents falling within the solubility area can be chosen from literature values such as published in Crowley et al., Journal of Paint Technology, 38, No 496, 296 (1966). Solvent blends may also be used and can be identified as described in Solvents, W. H. Ellis, Federation of Societies for Coatings Technology, pp. 9-10, (1986). Such a procedure may lead to a blend of "non" solvents that will dissolve both the polymers of the present invention, although it is desirable to have at least one true solvent in a blend.

The polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

The polymers, blends, or formulations may also include the use of non-volatile additives including but not limited to dielectrics, electrolytes, or high boiling point solvents. These additives may be used alter the carrier generation efficiency, carrier lifetime, carrier mobility, film morphology, conductivity, dielectric properties, or optical properties.

Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points greater than 100° C., preferably greater than 140° C., and more preferably greater than 150° C., in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point greater than 100° C., more preferably greater than 140° C. Such solvent(s) also enhance film formation in the layer deposited and reduce defects in the layer.

The ink jet fluid (that is mixture of solvent, binder and semiconducting compound) preferably has a viscosity at 20° C. (degrees Celsius) of 1-100 mPas (millipascales), more preferably 1-50 mPas, and most preferably 1-30 mPas.

The polymers or formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colorants, dyes or pigments, sensitizers, stabilizers, nanoparticles or inhibitors.

The polymers according to the present invention are useful as charge transport, semiconducting, electrically conducting, photoconducting or light emitting materials in optical, electrooptical, electronic, electroluminescent or photoluminescent components or devices. In these devices, the polymers of the present invention are typically applied as thin layers or films.

Thus, the present invention also provides the use of the semiconducting polymer, polymer blend, formulation or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a polymer, polymer blend or formulation according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a polymer, polymer blend, formulation or organic semiconducting layer according to the present invention. Especially preferred devices are organic field effect transistors (OFETs), organic thin film transistors (OTFTs), integrated circuits (ICs), logic circuits, capacitors, radio frequency identification tags (RFID tags), organic light emitting diodes (OLEDs), organic light emitting transistors (OLETs), organic photovoltaic devices (OPVs), solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns.

Another embodiment may be directed to applications that include the use of hybrid photovoltaic devices, nanoparticle/Quantum dot devices, and use as a fission sensitizer in inorganic applications (e.g., silicon, copper indium gallium (di)selenide (CIGS), etc.). The general construction of these devices with different polymers or oligomers are disclosed and known in the art. Hybrid photovoltaic devices are described in, for example, U.S. Pat. Nos. 8,426,725; 8,106, 289; and U.S. Publication No. US 20130/312801. Hybrid photovoltaic devices may utilize inorganic materials as the acceptor and electron transporter in a structure. The hybrid photovoltaic devices have a potential for not only low-cost, but also for scalable solar power conversion. Optical applications advantageously utilize quantum dots because of their high extinction coefficient. (Leatherdale, et al. (2002) *The Journal of Physical Chemistry B* 106(31):7619). In electronic applications, they have been shown to operate like a single electron transistor and demonstrate the Coulomb blockade effect. Quantum dot nanoparticles of silicon, cadmium selenide, cadmium sulfide, or indium arsenide may be of particular use to increase efficiencies in producing a higher energy difference. Various nanoparticle/quantum dot devices are disclosed in, for example, U.S. Pat. No. 7,868, 302 and U.S. Publication Nos. US 2013/0009131; US 2012/0292594; and US 2012/0211074. Fission sensitizers may be in the form of nanocrystals or another type of non-covalent aggregate, or may be in the form of a covalent polymer, oligomer, or dimer. Rapid and efficient singlet fission may preferably occur in inorganic applications using, for example but not limited to, silicon and CIGS. Fission sensitizers such as those that are described in, for example, U.S. Publication Nos. US 2013/0240850; US 2012/0228586; and US 2010/0193011, have general constructions that are known in the art, and compounds, polymers, and oligomers of the various embodiments of the invention may be employed in the applications and devices disclosed here.

Especially preferred electronic device are OFETs, OLEDs and OPV devices, in particular bulk heterojunction (BHJ) OPV devices. In an OFET, for example, the active semiconductor channel between the drain and source may comprise the layer of the invention. As another example, in an OLED device, the charge (hole or electron) injection or transport layer may comprise the layer of the invention.

Organic Photovoltaic Devices (OPVs)

A polymer in accordance with the present invention may be used in an OPV device that comprises or contains, more preferably consists essentially of, very preferably exclusively of, a p-type (electron donor) semiconductor and an n-type (electron acceptor) semiconductor. The p-type semiconductor is constituted by a polymer according to the present invention. The n-type semiconductor can be an inorganic material, such as, for example, zinc oxide or cadmium selenide, or an organic material, such as, for example, a fullerene or substituted, for example (6,6)-phenyl-butyric acid methyl ester derivatized $C_{60}$ fullerene, also known as "PCBM" or "$C_{60}$PCBM", as reported, for example, in Yu et al., Science, Vol. 270, p. 1789 (1995), or a structurally analogous compound with, for example, a $C_{70}$ fullerene group ($C_{70}$PCBM), or a polymer (see, for example, Coakley et al., D. *Chem. Mater,* 16, 4533 (2004)). A preferred material of this type is a blend or mixture of a polymer according to the present invention with a $C_{60}$ or $C_{70}$ fullerene or substituted fullerene like $C_{60}$PCBM or $C_{70}$PCBM. Preferably the ratio polymer:fullerene is from 2:1 to 1:2 by weight, more preferably from 1.2:1 to 1:1.2 by weight, most preferably 1:1 by weight. For the blended mixture, an optional annealing step may be necessary to optimize blend morphology and consequently OPV device performance.

A first preferred OPV device according to the invention comprises the following layers (in the sequence from bottom to top): a high work function electrode preferably comprising a metal oxide like for example ITO, serving as anode, an optional conducting polymer layer or hole transport layer, preferably comprising an organic polymer or polymer blend, for example of PEDOT:PSS (poly(3,4-ethylenedioxythiophene): poly(styrene-sulfonate), a layer, also referred to as "active layer", comprising a p-type and an n-type organic semiconductor, which can exist for example as a p-type/n-type bilayer or as distinct p-type and n-type layers, or as blend or p-type and n-type semiconductor, forming a BHJ, optionally a layer having electron transport properties, for example comprising LiF, a low work function electrode, preferably comprising a metal like for example aluminum, serving as cathode, wherein at least one of the electrodes, preferably the anode, is transparent to visible light, and wherein the p-type semiconductor is a polymer according to the present invention.

A second preferred OPV device according to the invention is an inverted OPV device and comprises the following layers (in the sequence from bottom to top): [0210] an electrode comprising for example ITO serving as cathode, optionally a layer having hole blocking properties, preferably comprising a metal oxide like TiO$_x$ or ZnO$_x$, an active layer comprising a p-type and an n-type organic semiconductor, situated between the electrodes, which can exist for example as a p-type/n-type bilayer or as distinct p-type and n-type layers, or as blend or p-type and n-type semiconductor, forming a BHJ, an optional conducting polymer layer or hole transport layer, preferably comprising an organic polymer or polymer blend, for example of PEDOT:PSS, a high work function electrode, preferably comprising a metal like for example gold, serving as anode, wherein at least one of the electrodes, preferably the cathode, is transparent to visible light, and wherein the p-type semiconductor is a polymer according to the present invention.

In the OPV devices of the present invent invention the p-type and n-type semiconductor materials are preferably selected from the materials, like the polymer/fullerene systems, as described above. If the bilayer is a blend an optional annealing step may be necessary to optimize device performance.

Organic Field Effect Transistors (OFETs)

The compound, formulation and layer of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a polymer, polymer blend, formulation or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. Nos. 5,892,244, 5,998,804, and 6,723,394. Due to the advantages, like low cost production using the solubility properties of the compounds according to the invention and thus the processability of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises: a source electrode, a drain electrode, a gate electrode, a semiconducting layer, one or more gate insulator layers, optionally a substrate, wherein the semiconductor layer preferably comprises a polymer, polymer blend or formulation as described above and below.

The OFET device can be a top gate device or a bottom gate device. Suitable structures and manufacturing methods of an OFET device are known to the skilled in the art and are described in the literature.

The gate insulator layer preferably comprises a fluoropolymer, like e.g. the commercially available Cytop 809M™ or Cytop 107M™ (from Asahi Glass). Preferably the gate insulator layer is deposited, e.g., by spin-coating, doctor blading, wire bar coating, spray or dip coating or other known methods, from a formulation comprising an insulator material and one or more solvents with one or more fluorine atoms (fluorosolvents), preferably a perfluorosolvent. A suitable perfluorosolvent is, e.g., FC75™ (available from Acros, catalogue number 12380).

Other suitable fluoropolymers and fluorosolvents are known in prior art, like for example the perfluoropolymers Teflon AF™ 1600 or 2400 (from DuPont) or Fluoropel™ (from Cytonix) or the perfluorosolvent FC 43™ (Acros, No. 12377). Especially preferred are organic dielectric materials having a low permittivity (or dielectric constant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetary value, like stamps, tickets, shares, cheques, etc.

Organic Light Emitting Diodes (OLEDs)

Alternatively, the materials according to the invention can be used in OLEDs, e.g. as the active display material in a flat panel display applications, or as backlight of a flat panel display like e.g. a liquid crystal display. Common OLEDs are fabricated using multilayer structures. An emission layer is generally sandwiched between one or more electron-transport and/or hole-transport layers. By applying an electric voltage, electrons and holes as charge carriers move towards the emission layer where their recombination leads to the excitation and hence luminescence of the lumophore units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, pp. 31-34 (2000); Alcala, *J. Appl. Phys.*, 88, pp. 7124-7128 (2000), and the literature cited therein.

According to another use, the materials according to this invention, especially those showing photoluminescent properties, may be employed as materials of light sources, e.g. in display devices, as described in EP 0 889 350 A1 or by Weder et al., *Science*, 279, pp. 835-837 (1998).

A further aspect of the invention relates to both the oxidised and reduced form of the compounds according to this invention. Either loss or gain of electrons results in formation of a highly delocalized ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The doping process typically implies treatment of the semiconductor material with an oxidizing or reducing agent in a redox reaction to form delocalized ionic centers in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., I2, Cl2, Br2, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^-)$ $(SbF_6^-)$, $(NO_2^+)$ $(SbCl_6^-)$, $(NO_2^+)$ $(BF_4^-)$, $AgClO_4$, $H_2IrCl_6$, $La(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds of the present invention can be used as an organic "metal" in applications including, but not limited to, charge injection layers and ITO planarizing layers in OLED applications, films for flat panel displays and touch screens, antistatic films, printed conductive substrates, patterns or tracts in electronic applications such as printed circuit boards and condensers.

The compounds and formulations according to the present invention may also be suitable for use in organic plasmon-emitting diodes (OPEDs), as described for example in Koller et al., Nature Photonics 2008 (published online Sep. 28, 2008).

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarization charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerizable compounds and/or chromophores for use in or as photoalignment layers, as described in US 2003/0021913.

According to another use, the materials according to the present invention, especially their water-soluble derivatives (for example with polar or ionic side groups) or ionically doped forms, can be employed as chemical sensors or materials for detecting and discriminating DNA sequences. Such uses are described for example in Chen et al., Proc. Natl. Acad. Sci. U.S.A. 1999, 96, 12287; Wang et al., Proc. Natl. Acad. Sci. U.S.A. 99, 49 (2002); DiCesare et al., Langmuir 2002, 18, 7785; and McQuade et al., Chem. Rev., 100, 2537 (2000).

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps. Unless the context clearly indicates otherwise, as used herein plural forms of the terms herein are to be construed as including the singular form and vice versa. Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

DETAILED DESCRIPTION OF THE DRAWING FIGURES

Figure 1:
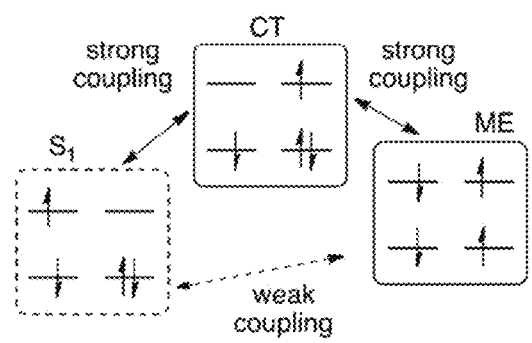
FIG. 1 is an illustration of the steps toward MEG.

As illustrated in FIG. 1, the steps toward MEG are shown starting from the excitation to the S1 state, which is strongly coupled to the charge-transfer (CT) state, leading to the ME states. From studies of intermolecular SF, the current mechanistic understanding of SF suggests that the direct coupling between the singlet state and the multi-excitonic (triplet pair) states is weak, but coupling mediated by an intermediate CT state can be quite strong.

Figure 2:
FIG. 2 is an illustration of a molecular design for intramolecular SF using strong acceptor (SA), strong donor (SD), and donor (D) units.
Figure 3:
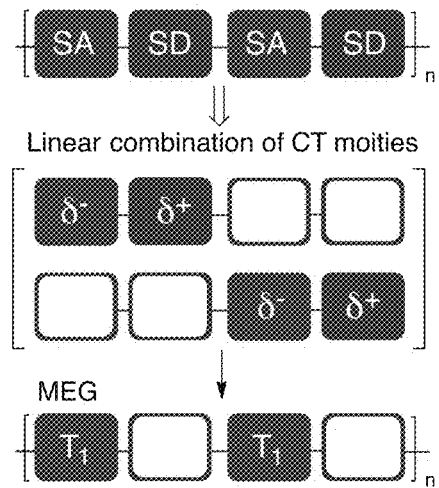
FIG. 3 is an illustration of the connectivity in small molecules, using strong acceptor (SA) and strong donor (SD) units. Polymer design for intramolecular CT mediated singlet-fission.

The connectivity and conceptual design of the building blocks for the small molecules and polymers is shown in FIGS. 2 and 3, respectively. The systems are composed of electron rich (donor) moieties and electron deficient units (acceptor). The strong acceptor (SA) character was introduced to lower the lowest unoccupied molecular orbital (LUMO) and the strong donor raises the highest occupied molecular orbital (HOMO), effectively reducing the band gap of the resultant molecule or polymer. Additionally, the selected SA moiety has a triplet energy low enough to satisfy the energetic requirement for SF. This is an important parameter, given that SF is favored when the energy of the singlet state is at least twice the energy of the triplet state (i.e., $E[S1]>2E[T_1]$). Moreover, the most important feature of this model is that having the SA units conjugated with the D units could lead to effectively accessing the CT states that are required to mediate coupling to ME states. For example, considering a linear combination of the CT moieties in FIG. 3, the charge-transfer mediated SF model suggest that structures bearing $\delta^+$ and $\delta^-$ polarizabilty act in a similar fashion to the CT states in the simplified SF diagram (see, again, FIG. 1). The polymer design for intramolecular CT-mediated singlet-fission (i.e., [SA-SD-SA-SD]n) leads down to the linear combination of CT moities with $\delta^+$ and $\delta$, which finally leads down to MEG.

Figure 4A:
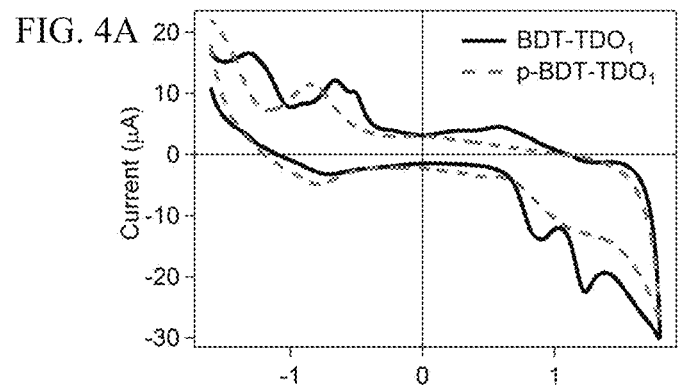
FIG. 4A shows the BDT-TDO1 compound represented by the dark (black) lines, and the p-BDT-TDO1 compound represented by the light (dashed grey) lines.
Figure 4B:
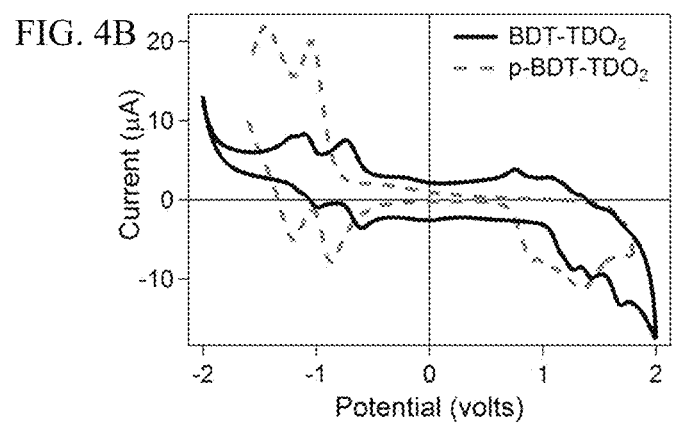
FIG. 4B shows the BDT-TDO2 compound represented by the dark (black) lines and the p-BDT-TDO2 compound represented by the light (dashed grey) lines.

As illustrated in FIGS. 4A and 4B, to characterize the dynamical properties of the polymers of the invention, broadband femtosecond transient absorption (TA) spectroscopy was employed. Two particular systems BDT-TDO1 and p-BDT-TDO1 were examined here. First, unoxidized analogues of the above materials an used as a control experiment. These materials exhibit dynamics typical of many semiconducting polymer systems. These systems show two generalized excited state pathways: excitonic relaxation and relaxation via formation and decay of charge transferred states. Both pathways repopulate the ground electronic state. The molecular system shows initial population of both excitonic and charge-transfer states. The excitonic state decays to form charge-transferred state in ca. 10 ps, which then decays to repopulate the ground state in greater than 3 ns. The polymer system shows similar dynamics, but the excitonic state shows a longer lifetime as a result of stabilization via excitonic relaxation. The result is a singlet excitonic lifetime of about 600 ps. The CT lifetime is greater than 3 ns. These properties qualitatively hold for all studied unoxidized materials.

As illustrated in FIG. 5, the effect of thiophene oxidation on the excited state lifetime is quite dramatic. Perhaps the most simple parameter for accessing the effects of oxidation is the excited state lifetime, the average lifetime of an excitation before it repopulates the ground state. This is well represented by the bleach kinetics. Upon thiophene oxidation, the greater than 3 ns lifetime of BDT-TDO2 is shortened to less than 1 ps. Similar results, to varying degrees of severity, are seen for all measured TDO-containing BDT conjugates and copolymers. This up to 3 orders-of-magnitude change in lifetime strongly suggests that oxidative chemical modification introduces new photophysical relaxation pathways in BDT-TDO complexes. As can be seen, TDO-containing small molecules have an excited state lifetime several orders of magnitude shorter than their unoxidized counterparts. This is due to introduction of additional non-radiative decay pathways resembling those of polyene-containing systems.

As illustrated in FIGS. 6A and 6B, with reference to Comparative Example 16, thiophene oxidation results in significant absorption red-shifting in small molecules and polymers. TDO-containing molecules display a single broad absorption feature, while polymers have discrete singlet and charge-transfer exciton bands. In FIGS. 6A and 6B, the first dotted line (grey line) represents the compound BDT-T2, the second dashed line (black dashed line) represents the compound BDT-TDO2, and the solid dark line represents BDT-TDO1. In the second graph (right hand side) (FIG. 6B), the dotted line that is lowest at the level of 300 nm represents p-BDT-T2, the middle dashed line at 300 nm represents p-BDT-TDO2, and the top solid line (dark line) at 300 nm wavelength represents p-BDT-TDO1.

FIGS. 7A-7D illustrate, with reference to Comparative Example 16, the ground state recovery kinetics compared for TDO1 (FIG. 7A) and TDO2 (FIG. 7B) containing molecules (black solid line) and polymers (grey dashed line). The triplet spectra are also compared in TDO1 (FIG. 7C) and TDO2 (FIG. 7D) containing materials. The spectra of triplets generated from singlet fission (lines) are compared to triplets generated through pulsed radiolysis (circles). SF generated spectral traces are from TA datasets; global target analysis was used to extract the triplet spectrum when the triplet had significant temporal overlap with other populations. Since the triplet is localized to the TDO subunits, the triplet spectrum is equivalent for all materials containing the same number of sequential TDO monomers (aside from the contribution of the overlapping bleach band).

As illustrated in FIG. 8, and discussed further below, starting from the initially excited singlet charge transfer exciton (S2|CT), singlet fission (SF) can occur to form a pair of triplets (2T1) for each singlet. In some systems, internal conversion (IC) through a polyene-like dark state (S1) is observed. This internal conversion process competes with SF on a sub-picosecond timescale, and thereby reduces the SF yield.

EXAMPLES

Synthesis

The following Examples of the invention are provided only to further illustrate the invention, and are not intended to limit its scope. Chemicals were purchased from Sigma-Aldrich and used as received, unless otherwise noted. All reactions were performed in oven-dried round bottom flasks, unless otherwise noted. Compounds $1^{48}$, $3^{49}$, $4^{50}$, $6^{45}$, $8^{49}$ and $9^{48}$ (the superscripts for the compounds 1, 3, 4, 6, 8, and 9 cite to references that follow the examples) were prepared by reported procedures. $^1$H and $^{13}$C nuclear magnetic resonance spectra were recorded at 300 K (unless otherwise noted) on Bruker DRX300 (300 MHz) or Bruker DRX400 (400 MHz) FT NMR spectrometers. High-resolution mass spectra were recorded on a JMS-HX110 HF mass spectrometer (ionization mode: FAB+). UV-vis absorption spectra were taken on a Shimadzu UV-1800 spectrophotometer. Gel permeation chromatography (GPC) was carried out on a Waters separation module equipped with a Waters 2414 refractive index detector and a Waters 2998 photodiode array detector, using THF as the eluent. Molecular weights (MWs) and polydispersity indices (PDIs) are reported relative to polystyrene standards. Acceptor units based on thiophene-1,1-dioxide (TDO) (Compounds 3 and 6 in the Examples) were prepared using HOF chemistry, according to published procedures[45]. All materials were synthesized using the palladium-catalyzed Stille coupling reaction. Detailed procedures are presented in the Examples.

Steady-State Characterization

Absorption spectra were taken on a Shimadzu UV-1800 spectrophotometer. Electrochemical measurements were performed using a Princeton Applied Research Parastat 2273-SYS (for molecular CV) and a CHI instrument model 660C (for polymer CV) in a standard three-electrode configuration. Small-molecule CV was conducted in dichloromethane with glassy carbon, platinum wire and Fc/Fc+ as the working electrode, counter electrode and reference electrode, respectively. Polymer CV was conducted on polymer films in acetonitrile with Pt disk, Pt wire and Ag/AgCl electrode as the working electrode, counter electrode and reference electrode, respectively. All CV measurements were conducted in a 0.1 M tetrabutylammonium hexafluorophosphate ($Bu_4NPF_6$) solution. Small-molecule CV was conducted in square-wave mode. Further experimental details are included in the below Examples.

Ultrafast Spectroscopy

Transient absorption spectroscopy was conducted using a commercial Ti:Sapphire laser system (SpectraPhysics |800 nm|100 fs|3.5 mJ|1 kHz). Excitation light was generated using a commercial optical parametric amplifier (LightConversion). Supercontinuum probe light was generated by focusing the 800 nm fundamental into a sapphire disc. The probe light was split into signal and reference beams, both of which are detected on a shot-by-shot basis with fibre-coupled silicon (visible) or InGaAs (infrared) diode arrays. The pump-probe delay was controlled by means of a mechanical delay stage (Newport). All data shown here are from dilute solutions using chloroform as a solvent. Similar behavior was observed in other organic solvents. The transient photoluminescence was conducted in a photoluminescence up-conversion apparatus under identical sample conditions using the same excitation source. Up-converted signals were detected using a monochromator and a photomultiplier tube.

Global Analysis

Global target analysis (GTA) is a differential equations approach to multidimensional data set modelling and deconvolution. This technique is detailed elsewhere[40,41] but described briefly here. GTA begins with a user-defined number of populations and a set of rate constants describing the connectivity between the populations. These parameters are used to solve a system of first-order differential equations to generate time-dependent population evolution. Using these population trajectories as a basis set, the complete experimental transient absorption data set was fitted. Varying the rate constant matrix iteratively optimized this process. Once complete, this results in the generation of kinetic fits, evolution of populations, and extraction of spectral signatures for each population. This approach was used to separate the triplet difference spectra from the overlapping charge-separated state absorption (FIG. 11C) and to generate the triplet population trajectories (FIG. 11D and FIGS. 13A and 13B, black dashes). Two models are used as described here. First, for PBTDO1, two populations (assigned as a singlet exciton and a charge-separated state) were generated within the about 100-fs instrument response. The singlet then decayed to form a third population (assigned as triplet). The triplet and charge-separated populations then decayed independently to re-form the ground electronic state. Second, within the model used for the other three materials (PBTDO2, BTDO1 and BTDO2), two populations were generated within the instrument response (assigned as triplet and $S_{dark}$). These states then decayed independently to re-form the ground electronic state.

Pulse Radiolysis

Samples were prepared in p-xylene solution containing 100 mM of biphenyl under Ar and ionized with <50 ps electron pulses from the 10 MeV LEAF accelerator[42], as described previously[46]. Pulse radiolysis ionized p-xylene to yield electrons and radical cations, most of which recombined rapidly to produce triplet excited states, which then transferred to the TDO-containing materials. The yield of triplets was enhanced by the high concentration of biphenyl, which has a high quantum yield for intersystem crossing and a long triplet lifetime, so low material concentrations could be used. The accelerator pulse produced about 1 µM of triplets. The amount was calibrated using the known molar absorption coefficient[47] for triplet biphenyl. Sensitization measurements were performed on all materials and show that the triplet spectrum was sensitive to the number of sequential TDO units (for example, TDO1 versus TDO2), but not the total number of repeat units (that is, molecule versus polymer). This allowed the use of identical absorption coefficients for the respective molecular and polymer materials. The triplet population formed through the sensitization experiment exhibited a slow (>1 ns) rise because of the collisional nature of the triplet transfer process. For visualization purposes, the data in FIGS. 12C and FIG. 12D were offset to shift this rise to negative times (not shown). The recombination kinetics were unaffected by this shift.

Example 1

Preparation of BDT Monomer Derivative (Compound 2)

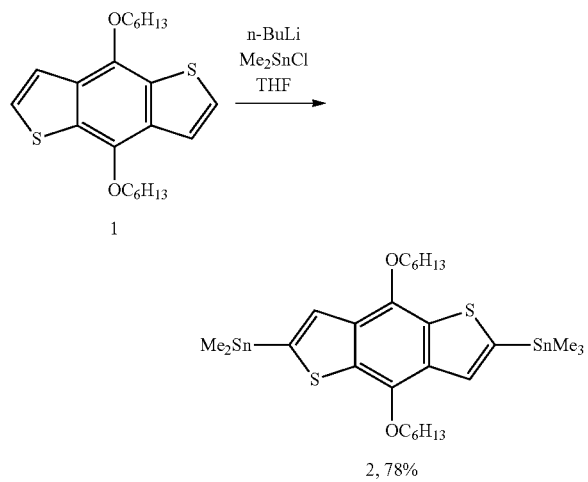

Compound 1 (1.34 g, 3.43 mmol) was dissolved in 60 mL of anhydrous THF and cooled in an ice bath. Butyllithium solution (3.43 mL, 7.55 mmol) was added dropwise under nitrogen. The mixture was kept at 0° C. for 30 min. and then at room temperature (RT) for 1 hour (a great deal of white solid precipitate appeared). The mixture was cooled in the dry ice-IPA bath, 1.51 g of trimethyltin chloride was dissolved in 5 mL dry THF and added in one portion, the reactant turned clear rapidly. The resulting mixture was stirred at room temperature (R.T.) for overnight. The mixture was quenched with 50 mL of water and extracted with ether. The organic extraction was dried with anhydrous sodium sulfate. After removing the solvent, the crude yellow solid was recrystallized from ethanol (EtOH) to give Compound 2 as a white solid (1.92 g, yield: 78%). Results of analyses performed on Compound 2 were as follows: $^1$H NMR (400 MHz, CDCl$_3$, ppm): δ 0.45 (s, 18 H), 0.94 (t, J=6.0 Hz, 6H), 1.38-1.42 (m, 8H), 1.58-1.62 (m, 4H), 1.85-1.92 (m, 4H), 4.31 (t, J=6.8 Hz, 4H), 7.52 (s, 2H). $^{13}$C NMR (100 MHz, CDCl$_3$): δ-8.34, 14.08, 22.69, 25.79, 30.51, 31.68, 73.59, 128.02, 133.00, 134.01, 139.28, 140.48, 141.16. HRMS (FAB) m/z calculated for C$_{28}$H$_{46}$O$_2$S$_2$Sn$_2$: 716.2240, Found: 716.2378.

Example 2

Preparation of T-TDO

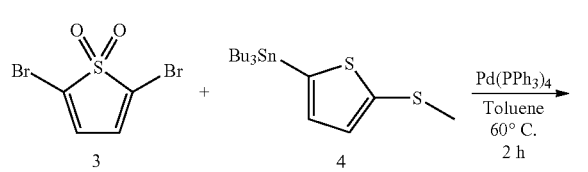

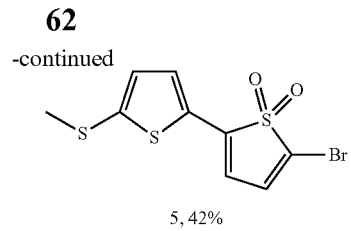

2,5-dibromothiophene-S,S-dioxide (Compound 3) (274 mg, 1 mmol) and Compound 4 (419 mg, 1 mmol) were dissolved in 4 mL toluene under nitrogen. Pd(PPh$_3$)$_4$ (57 mg, 0.05 mmol) was added and the resulting mixture was stirred at 80° C. for 2 hours. After cooling down to room temperature, the reaction mixture was extracted with CH$_2$Cl$_2$ and washed twice with water and then dried with Na$_2$SO$_4$. After removing the solvent, the crude product was purified by column chromatography on silica gel and eluted with 50% dichloromethane/hexanes to provide T-TDO (Compound 5) as a yellow solid (138 mg, yield: 42%). Results of analyses performed on T-TDO (Compound 5) were as follows: $^1$H NMR (400 MHz, CDCl$_3$, ppm): δ 2.56 (s, 3H), 6.54 (d, J=5.2 Hz, 1H), 6.90 (d, J=5.2 Hz, 1H), 6.98 (d, J=4 Hz, 1H), 7.46 (d, J=4 Hz, 1H), $^{13}$C NMR (100 MHz, CDCl$_3$): δ (ppm) 20.46, 116.79, 118.15, 128.51, 129.39, 129.49, 129.89, 136.88, 143.87. HRMS (FAB) m/z calculated for C$_9$H$_7$BrO$_2$S$_3$: 323.2554, Found (isotopic pattern): 321.8788, 323.8772.

Example 3

Preparation of T-TDO-BDT-TDO-T (BTDO1)

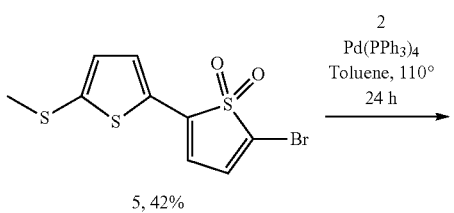

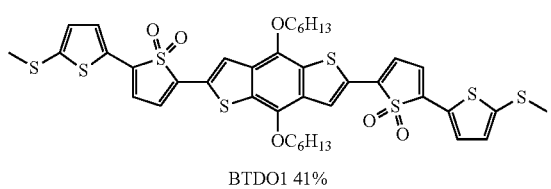

BTDO1 41%

Compound 2 (160 mg, 0.224 mmol) and Compound 5 (145 mg, 0.45 mmol) were dissolved in 5 mL toluene under nitrogen. To this was added Pd(PPh$_3$)$_4$ (13 mg, 0.011 mmol) and the resulting mixture was stirred at 110° C. for 24 h. After cooling down to room temperature, the solvent was removed under reduce vacuum, and the crude product was purified by column chromatography on silica gel and eluted with dichloromethane/hexanes (ratio 3:2) to provide T-TDO-BDT-TDO-T as a dark red solid (80 mg, yield: 41%). Results of analyses performed on Compound T-TDO-BDT-TDO-T were as follows: $^1$H NMR (400 MHz, CDCl$_3$, ppm): δ 0.92-0.97 (m, 6H), 1.38-1.43 (m, 8H), 1.54-1.59 (m, 4H), 1.86-1.90 (m, 4H), 2.59 (s, 6H), 4.30 (t, J=6.4 Hz, 4H), 6.70 (d, J=5.2 Hz, 2H), 6.86 (d, J=5.2 Hz, 2H), 7.02 (d, J=4 Hz, 2H), 7.54 (d, J=4 Hz, 2H), 7.94 (s, 2H). $^{13}$C NMR (100 MHz, CDCl$_3$): δ (ppm) 14.10, 22.66, 25.56, 30.53, 31.66, 74.50, 110.03, 117.20, 121.45, 121.74, 128.88, 129.57, 130.10, 130.29, 133.45, 135.58, 136.92, 143.73, 145.15. MS (FAB) m/z calculated for C$_{40}$H$_{42}$O$_6$S$_8$: 875.28, Found: 874.79.

Example 4

Preparation of T-TDO$_2$ (Compound 7)

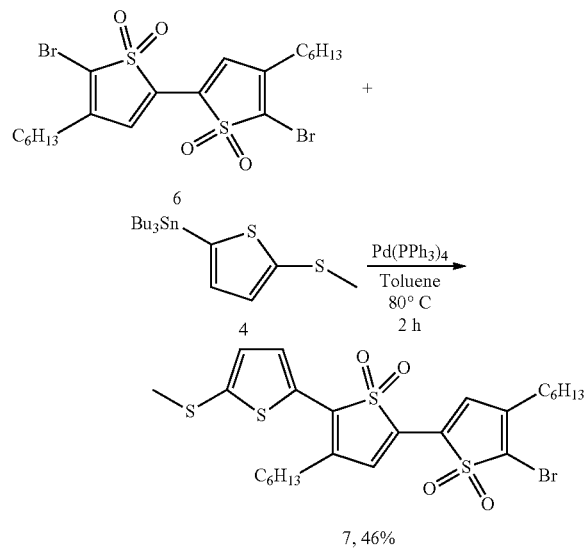

5,5'-Dibromo-4,4'-dihexyl-2,2'-bithiophene[all]-S,S-dioxide (Compound 6) (1.67 g, 3 mmol) and Compound 4 (1.26 g, 3 mmol) were dissolved in 8 mL toluene under nitrogen. To this was added Pd(PPh$_3$)$_4$ (173 mg, 0.15 mmol) and the resulting mixture was stirred at 80° C. for 2 hours. After cooling down to room temperature, the reaction mixture was extracted with CH$_2$Cl$_2$ and washed twice with water and then dried with Na$_2$SO$_4$. After removing the solvent, the crude product was purified by column chromatography on silica gel and eluted with 25% EtOAc/hexanes to provide T-TDO$_2$ (Compound 7) as red solid (0.82 g, yield: 46%). Results of analyses performed on T-TDO$_2$ (Compound 7) were as follows: $^1$H NMR (400 MHz, CDCl$_3$, ppm): δ 0.88-0.94 (m, 6H), 1.26-1.4 (m, 12H), 1.58-1.66 (m, 4H), 2.46 (t, J=7.6 Hz, 2H), 2.59 (s, 3H), 2.67 (t, J=8 Hz, 2H), 7.06 (d, J=4 Hz, 2H), 7.21 (s, 1H), 7.58 (d, J=4 Hz, 1H). $^{13}$C NMR (100 MHz, CDCl$_3$): δ (ppm) 13.97, 20.61, 22.42, 22.46, 26.34, 27.27, 28.84, 29.23, 30.04, 30.29, 31.33, 31.40, 116.90, 125.56, 127.99, 128.75, 129.29, 129.93, 130.15, 130.46, 132.36, 134.15, 142.42, 144.57. HRMS (FAB) m/z calculated for C$_{25}$H$_{33}$BrO$_4$S$_4$: 605.7026, Found (isotopic pattern): 604.0445, 605.0475, 606.0425.

Example 5

Preparation of T-TDO$_2$-BDT-TDO$_2$-T (BTDO2)

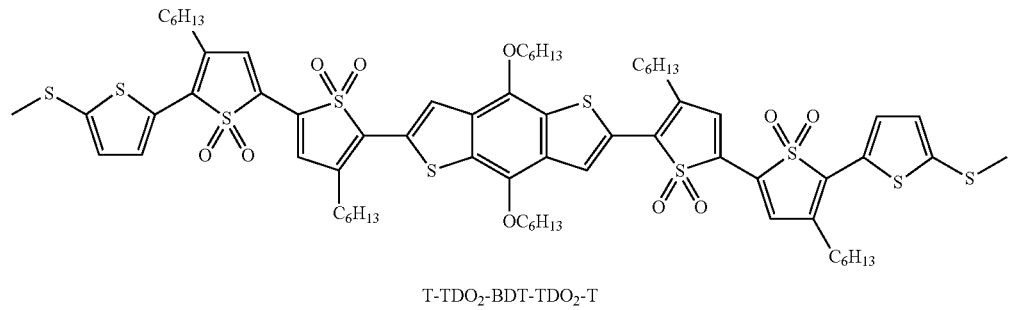

T-TDO$_2$-BDT-TDO$_2$-T

Pd$_2$(dba)$_3$ (55 mg, 0.06 mmol) and P(o-tolyl)$_3$ (36 mg, 0.12 mmol) under nitrogen was added to a stirred solution of Compound 7 (727 mg, 1.2 mmol) and Compound 2 (430 mg, 0.6 mmol) in 30 mL toluene. The resulting mixture was stirred for 24 hours at 110° C. After cooling down to room temperature, the reaction mixture was poured into water (60 mL) and extracted with CH$_2$Cl$_2$. The organic layer was washed with water and then dried over Na$_2$SO$_4$. After removal of solvent, the crude product was purified by column chromatography on silica gel using a mixture of dichloromethane and hexanes (3:2) as eluent to afford the target compound (T-TDO$_2$-BDT-TDO$_2$-T) as dark blue solid (312 mg, 36%). Results of analyses performed on T-TDO$_2$-BDT-TDO$_2$-T were as follows: $^1$H NMR (400 MHz, CDCl$_3$, ppm): δ 0.88-0.94 (m, 18H), 1.26-1.77 (m, 44H), 1.91 (m, 4H), 2.61 (s, 6H), 2.70 (t, J=8.4 Hz, 4H), 2.86 (t, J=8 Hz, 4H), 4.35 (t, J=6.4 Hz, 4H), 7.08 (d, J=4 Hz, 2H), 7.22 (s, 2H), 7.26 (s, 2H), 7.61 (d, J=4 Hz, 2H), 8.11 (s, 2H). $^{13}$C NMR (100 MHz, CDCl$_3$): δ (ppm) 14.00, 14.07, 20.68, 22.49, 22.64, 25.75, 27.31, 27.80, 29.28, 29.69, 30.40, 30.48, 30.64, 31.44, 31.63, 74.72, 123.22, 127.41, 128.02, 128.77, 129.03, 129.16, 129.41, 130.05, 130.36, 132.39, 132.56, 134.51, 134.59, 138.18, 144.35, 145.08. HRMS (FAB) m/z calcd for C$_{72}$H$_{94}$O$_{10}$S$_{10}$: 1440.16, Found: 1440.6490.

Example 6

Preparation of POLY-(BDT-TDO) (PBTDO1)

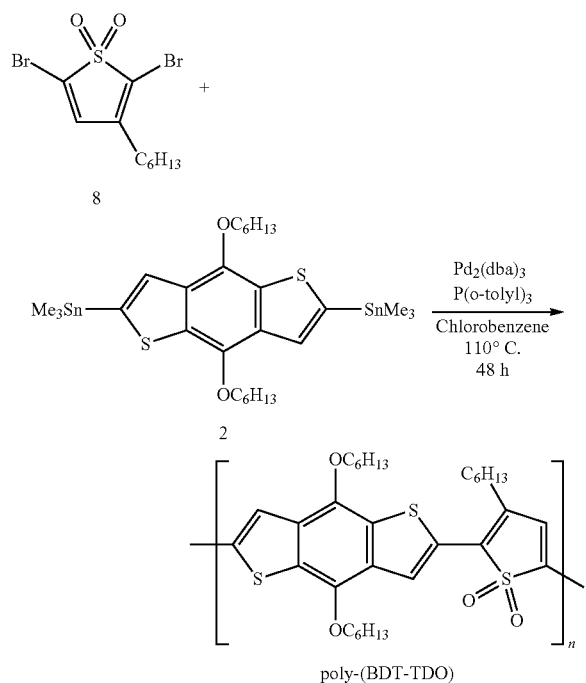

A 20-mL reaction vial was charged with a stirrer bar, 2,5-dibromo-3-hexyl-thiophene-S,S-dioxide (Compound 8) (215 mg, 0.6 mmol), Compound 2 (431 mg, 0.6 mmol), Pd$_2$(dba)$_3$ (27 mg, 0.03 mmol), P(o-tol)$_3$ (18 mg, 0.06 mmol) and 4 mL chlorobenzene. The reaction vial was purged with nitrogen and securely sealed. The reaction mixture was stirred at 130° C. for 48 hours. After cooling down to room temperature, the reaction mixture was precipitated into a mixture of methanol (50 mL) and 37% HCl (5 mL). The dark red powder was filtered off and washed with methanol, following by further purification with sequential Soxhlet extraction with methanol, hexanes and dichloromethane to afford the polymer as a dark red solid (259 mg, 73%). Results of analyses performed on poly-(BDT-TDO) were as follows: $^1$H NMR (400 MHz, CDCl$_3$, ppm): δ 0.93 (broad, 9H), 1.30-1.54 (broad, 20 H), 1.91 (m, 4H), 2.86 (m, 2H), 4.34-4.36 (m, 4H), 7.65 (broad, 1H), 8.13 (m, 2H). GPC: Mn=7.9 K, PDI=1.48.

Example 7

Preparation of POLY-(BDT-TDO$_2$) (PBTDO2)

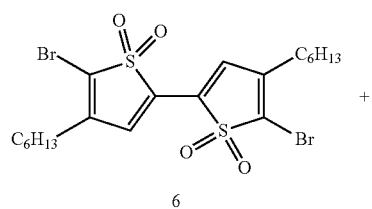

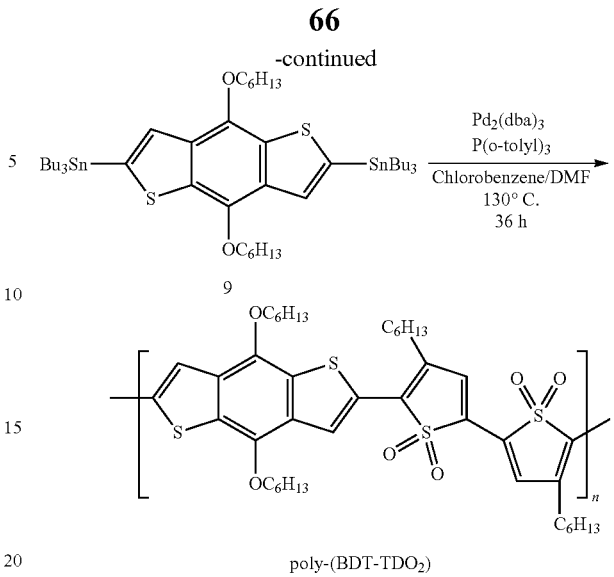

A 20-mL reaction vial was charged with a stirrer bar, 5,5'-Dibromo-4,4'-dihexyl-2,2'-bithiophene-[all]-S,S-dioxide (Compound 6) (278 mg, 0.5 mmol), Compound 9 (484 mg, 0.5 mmol), Pd$_2$(dba)$_3$ (23 mg, 0.025 mmol), P(o-tol)$_3$ (16 mg, 0.05 mmol) and 3 mL chlorobenzene. The reaction vial was purged with nitrogen and securely sealed. The reaction mixture was stirred at 130° C. for 36 hours. After cooling down to room temperature, the reaction mixture was precipitated into a mixture of methanol (50 mL) and 37% HCl (5 mL). The dark powder was filtered off and washed with methanol, following by further purification with sequential Soxhlet extraction with methanol, hexanes and dichloromethane to afford the polymer as a dark blue solid (271 mg, yield: 68%). Results of analyses performed on poly-(BDT-TDO$_2$) were as follows: $^1$H NMR (400 MHz, CDCl$_3$, ppm): δ 0.96 (broad, 12 H), 1.26-1.60 (m, 24H), 1.77 (m, 4H), 1.89-1.93 (m, 4H), 2.88 (broad, 4H), 4.29-4.37 (m, 4H), 7.32 (broad, 2H), 8.15 (broad, 2H). GPC: 19.6 K, PDI=1.53.

Example 8

Preparation of Compound 11

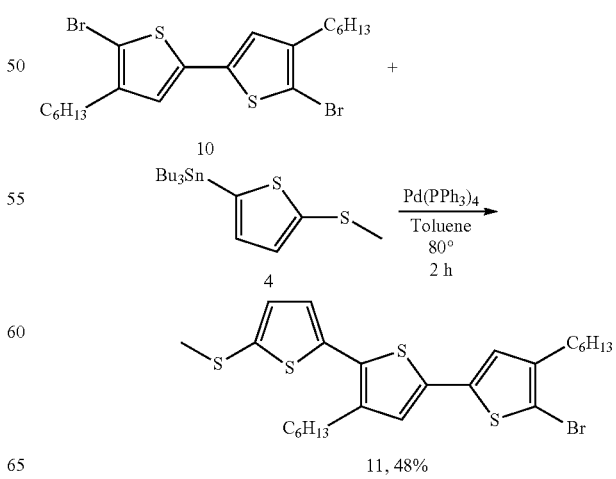

Compound 10, 5,5'-Dibromo-4,4'-dihexyl-2,2'-bithiophene, (492 mg, 1 mmol) and Compound 4 (419 mg, 1 mmol) were dissolved in 10 mL toluene under nitrogen. Pd(PPh₃)₄ (58 mg, 0.05 mmol) was added and the resulting mixture was stirred at 80° C. for 4 hours. After cooling down to room temperature, the reaction mixture was extracted with CH₂Cl₂, washed twice with water, and then dried with Na₂SO₄. After removing the solvent, the crude product was purified by column chromatography on silica gel using hexane as eluent to afford Compound 11 as yellow oil (262 mg, yield: 48%).

Results of analyses performed on Compound 11 were as follows: $^1$H NMR (400 MHz, CDCl₃, ppm): δ 0.91 (t, J=6.4 Hz, 6H), 1.30-1.41 (m, 12H), 1.56-1.67 (m, 4H), 2.51-2.55 (m, 5H), 2.71 (t, J=8 Hz, 2H), 6.84 (s, 1H), 6.91 (s, 1H), 6.95 (d, J=3.6 Hz, 1H), 7.01 (d, J=3.6 Hz, 1H). $^{13}$C NMR (100 MHz, CDCl₃): δ 14.08, 22.04, 22.57, 28.86, 29.17, 29.31, 29.53, 29.57, 30.44, 31.58, 107.65, 124.27, 125.83, 126.36, 129.39, 131.28, 134.49, 136.43, 137.08, 137.95, 140.36, 142.91.

Example 9

Preparation of Compound BT2

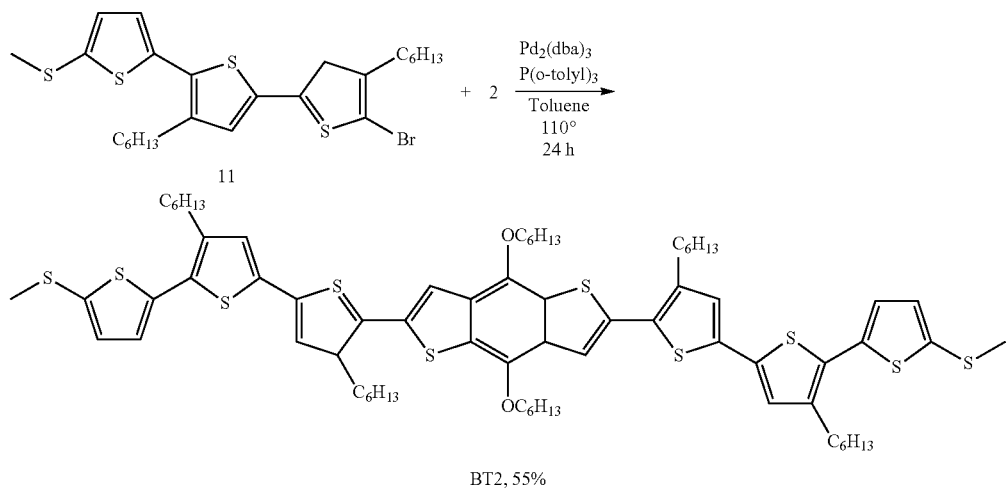

BT2, 55%

To a stirred solution of Compound 11 (202 mg, 0.372 mmol) and Compound 2 (133 mg, 0.186 mmol) in 8 mL toluene was added Pd₂(dba)₃ (17 mg, 0.0186 mmol) and P(o-tolyl)₃ (12 mg, 0.0372 mmol) under nitrogen. The resulting mixture was stirred for 24 hours at 110° C. After cooling down to room temperature, the reaction mixture was poured into water (15 mL) and extracted with CH₂Cl₂. The organic layer was washed with water and then dried over Na₂SO₄. After removal of solvent, the crude product was purified by column chromatography on silica gel using a mixture of dichloromethane and hexanes (1:4) as eluent to afford Compound BT2 as orange solid (135 mg, yield: 55%).

Results of analyses performed on Compound BT2 were as follows: $^1$H NMR (400 MHz, CDCl₃, ppm): δ 0.89-0.96 (m, 18 H), 1.32-1.41 (m, 32 H), 1.60-1.73 (m, 12H), 1.87-1.93 (m, 4H), 2.54 (s, 6H), 2.73 (t, J=8 Hz, 4H), 2.87 (t, J=8 Hz, 4H), 4.30 (t, J=6.4 Hz, 4H), 6.98 (d, J=3.6 Hz, 2H), 7.04 (m, 6H), 7.45 (s, 2H). $^{13}$C NMR (100 MHz, CDCl₃): δ (ppm) 14.18, 22.19, 22.61, 22.64, 22.67, 25.79, 29.22, 29.31, 29.36, 30.48, 30.52, 30.57, 31.56, 31.68, 73.95, 118.20, 125.79, 126.56, 126.93, 131.32, 131.94, 134.69, 135.65, 135.87, 137.01, 138.06, 140.64, 141.75, 143.86.

Example 10

Preparation of PBT2

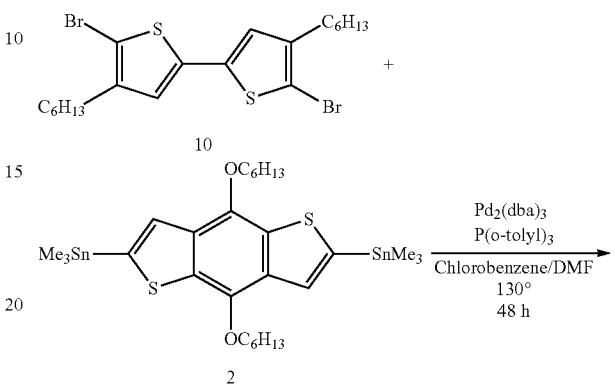

-continued

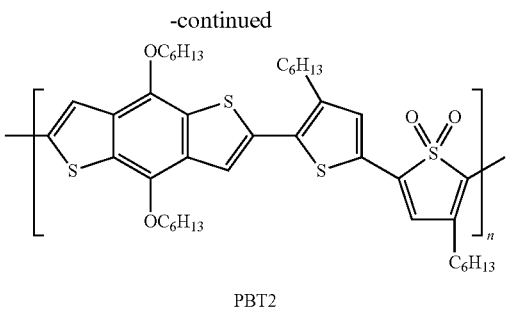

PBT2

A 50-mL round bottom flask was charged with a stir bar, 5,5'-Dibromo-4,4'-dihexyl-2,2'-bithiophene Compound 10 (296 mg, 0.6 mmol), Compound 2 (430 mg, 0.6 mmol), Pd₂(dba)₃ (27 mg, 0.03 mmol), P(o-tol)₃ (18 mg, 0.06 mmol), 20 mL chlorobenzene, and 5 mL DMF. The entire mixture was subjected to three freeze-pump-thaw cycles. The reaction mixture was stirred at 130° C. for 48 hours.

After cooling down to room temperature, the reaction mixture was precipitated into a mixture of methanol (150 mL) and 37% HCl (5 mL). The dark powder was filtered off and washed with methanol, following further purification with sequential Soxhlet extraction with methanol, hexanes, and dichloromethane to afford the polymer as a dark solid (282 mg, yield: 65%).

Results of analyses performed on Compound PBT2 were as follows: $^1$H NMR (400 MHz, CDCl$_3$, ppm): δ 0.92-0.96 (broad, 12 H), 1.26-1.62 (m, 24H), 1.75 (m, 4H), 1.89-1.93 (m, 4H), 2.89 (broad, 4H), 4.32 (broad, 4H), 7.09 (broad, 2H), 7.47 (broad, 2H). GPC: 4.8 K, Đ=1.53.

Example 11

Preparation of B-TOT

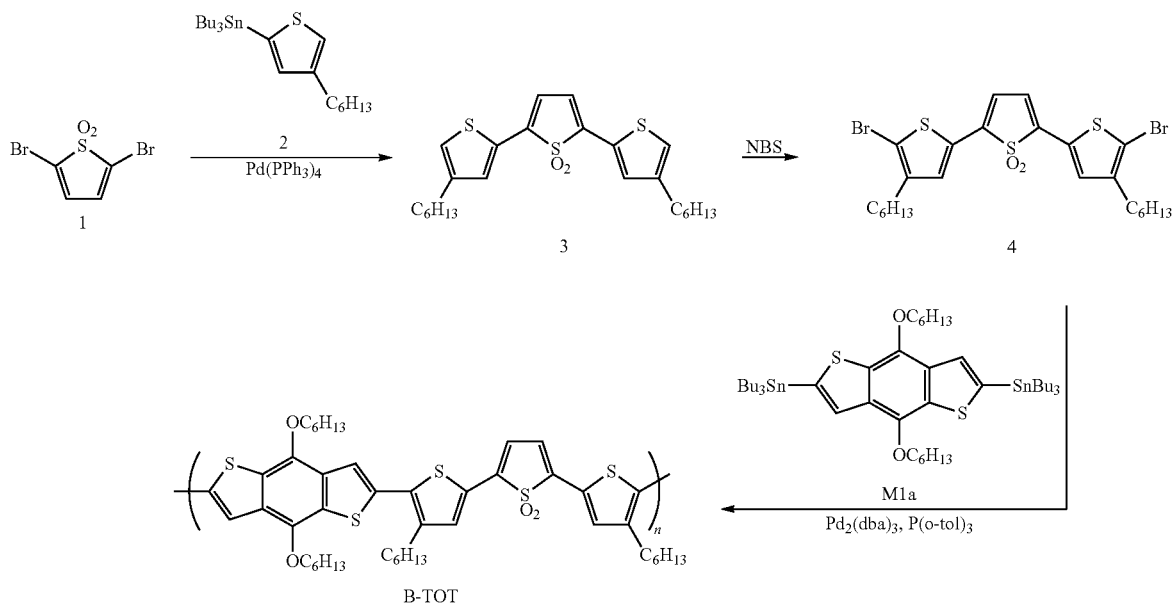

B-TOT

Polymers BDT-TDO1 and BDT-TDO2 were synthesized according to previously reported.[57] Monomer M1a and M1b were also synthesized as previously reported[58], as were Compound 1[59] and Compound 2[60]. The synthesis of the new polymers are detailed below.

Synthesis of Compound 3

Compound 1 (2.00g, 7.30mmol, 1 eq), compound 2 (9.30 g, 20.3 mmol, 2.78 eq) and Pd(PPh$_3$)$_4$ (422 mg, 5% eq) were placed in a schlenk flask which was evacuated and refilled with nitrogen. Dry toluene (100 mL) was added and the solution was stirred at 110° C. for 24 h. The solution was subsequently poured into water and extracted with dichloromethane. The organic extracts washed with water, then dried over MgSO$_4$. The solvent was removed and the crude product purified by column chromatography to yield the product as a yellow solid (2.69 g, 82%). $^1$H-NMR (400 MHz, CDCl$_3$) δ 7.46 (d, J=1.1 Hz, 2H), 7.02 (d, J=1.1 Hz, 2H), 6.71 (s, 2H), 2.62 (t, 4H), 1.64 (m, 4H), 1.42-1.25 (m, 12H), 0.89 (t, 6H). $^{13}$C-NMR (500 MHz, CDCl$_3$) δ 145.18, 136.16, 129.48, 129.12, 123.00, 118.15, 31.62, 30.36, 30.24, 28.97, 22.60, 14.09. HRMS (ASAP+) Calculated for [M+H]$^+$: 449.1643; Found: 449.1644.

Synthesis of Compound 4

Compound 3 (1.80 g, 4.01 mmol, 1 eq) was dissolved in a mixture of acetic acid (10 mL) and chloroform (100 mL) and protected from light. N-bromosuccinimide (1.57 g, 8.82 mmol, 2.2 eq) was added portion-wise and the reaction was stirred overnight at room temperature. Cold water was added to quench the reaction, which was subsequently extracted with chloroform. The organic extracts were washed with water and dried over MgSO$_4$. The solvent was removed and the crude product purified by column chromatography (silica gel, 40% DCM in hexanes as eluent) to yield the product as a red oil (2.21 g, 91%). $^1$H-NMR (400 MHz, CDCl$_3$) δ 7.29 (s, 2H), 6.63 (s, 2H), 2.57 (t, 4H), 1.61 (m, 4H), 1.42-1.25 (m, 12H), 0.90 (t, 6H). $^{13}$C-NMR (500 MHz, CDCl$_3$) δ 144.21, 135.19, 129.37, 128.79, 118.45, 113.17, 31.55, 29.57, 29.50, 28.93, 22.60, 14.10. FIRMS (ASAP+) Calculated for [M+H]$^+$: 606.9833; Found: 606.9847.

Synthesis of B-TOT

Compound D (152 mg, 0.25 mmol, 1 eq), compound M1a (242 mg 0.25 mmol, 1 eq), Pd$_2$(dba)$_3$ (12 mg, 5% eq) and P(o-tol)$_3$ (8.0 mg, 5% eq) were placed in a sealed reaction vial which was evacuated and refilled with argon. Dry chlorobenzene (2 mL) was added and the reaction was stirred at 130° C. for 48 h. The resulting polymer was precipitated into a mixture of methanol (50 mL) and HCl (5 mL) and the solid was filtered off and washed with methanol. Further purification by Soxhlet extraction with methanol, hexanes and dichloromethane afforded the product as a dark red solid (75 mg, 36%). HNMR. GPC: M$_n$=17.3K, Đ=1.78.

Example 12

Preparation of B-TOOT

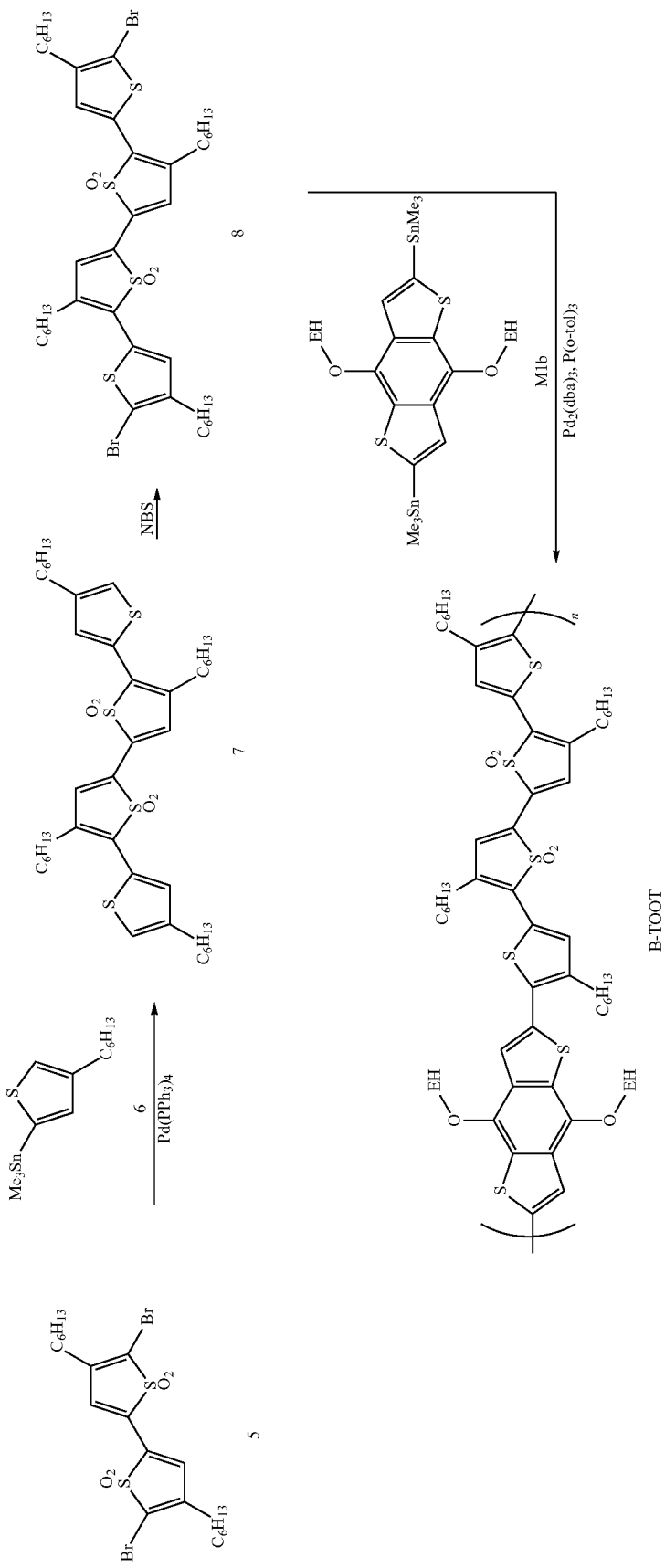
EH = 2-ethylhexyl

Compound 5[57] and 6[2] were synthesized according to previously published procedures.

Synthesis of Compound 7

Compound 5 (200 mg, 0.359 mmol, 1 eq), compound 6 (274 mg, 0.827 mmol, 2.3 eq) and Pd(PPh$_3$)$_4$ (21 mg, 5% eq) were placed in a sealed reaction vial which was evacuated and refilled with nitrogen. Dry toluene (8 mL) was added and the solution was stirred at 110° C. for 24 h. The solution was subsequently poured into water and extracted with dichloromethane. The organic extracts washed with water, then dried over MgSO$_4$. The solvent was removed and the crude product purified by column chromatography (silica gel, 40% DCM in hexanes as eluent) to yield the product as a violet solid (182 mg, 69%). $^1$H-NMIR (400 MHz, CDCl$_3$) δ 7.55 (d, J=1.2 Hz, 2H), 7.19 (s, 2H), 7.16 (d, J=1.2 Hz, 2H), 2.77-2.58 (m, 8H), 1.73-1.61 (m, 8H), 1.50-1.25 (m, 24H), 0.90 (m, 12H). $^{13}$C-NMR (500 MHz, CDCl$_3$) δ 144.79, 134.90, 132.61, 130.53, 128.20, 128.11, 127.94, 124.39, 31.62, 31.44, 30.34, 30.27, 29.29, 28.98, 27.19, 22.59, 22.50, 14.08, 14.01. HRMS (ESI+) Calculated for [M+Na]$^+$: 753.3116; Found: 753.3119.

Synthesis of Compound 8

Compound 7 (182 mg, 0.249 mmol, 1 eq) was dissolved in a mixture of trifluoroacetic acid (20 mL) and chloroform (10 mL) and protected from light. N-bromosuccinimide (102 mg, 0.573 mmol, 2.3 eq) was added in 2 portions and the reaction was stirred for 2 h at room temperature. Cold water was added to quench the reaction, which was subsequently extracted with chloroform. The organic extracts were washed with water and dried over MgSO$_4$. The solvent was removed and the crude product purified by column chromatography (silica gel, 40% DCM in hexanes as eluent) to yield the product as a dark red solid (162 mg, 72%). $^1$H-NMR (400 MHz, CDCl$_3$) δ 7.39 (s, 2H), 7.16 (s, 2H), 2.69-2.56 (m, 8H), 1.73-1.57 (m, 8H), 1.50-1.25 (m, 24H), 0.90 (m, 12H). $^{13}$C-NMR (500 MHz, CDCl$_3$) δ 143.78, 135.40, 131.83, 130.15, 128.32, 128.07, 127.89, 114.56, 31.54, 31.42, 30.39, 29.51, 29.47, 29.26, 28.92, 27.22, 22.57, 22.48, 14.07, 14.00. HRMS (ESI+) Calculated for [M+Na]$^+$: 911.1308; Found: 911.1346.

Synthesis of B-TOOT.

Compound D (152 mg, 0.25 mmol, 1 eq), compound M1a (242 mg 0.25 mmol, 1 eq), Pd$_2$(dba)$_3$ (12 mg, 5% eq) and P(o-tol)$_3$ (8.0 mg, 5% eq) were placed in a sealed reaction vial which was evacuated and refilled with argon. Dry chlorobenzene (2 mL) was added and the reaction was stirred at 130° C. for 48 h. The resulting polymer was precipitated into a mixture of methanol (50 mL) and HCl (5 mL) and the solid was filtered off and washed with methanol. Further purification by Soxhlet extraction with methanol, hexanes and dichloromethane afforded the product as a dark red solid (75 mg, 36%). HNMR. GPC: M$_n$=17.3K, Đ=1.78.

Example 13

Preparation of B-TTOTT

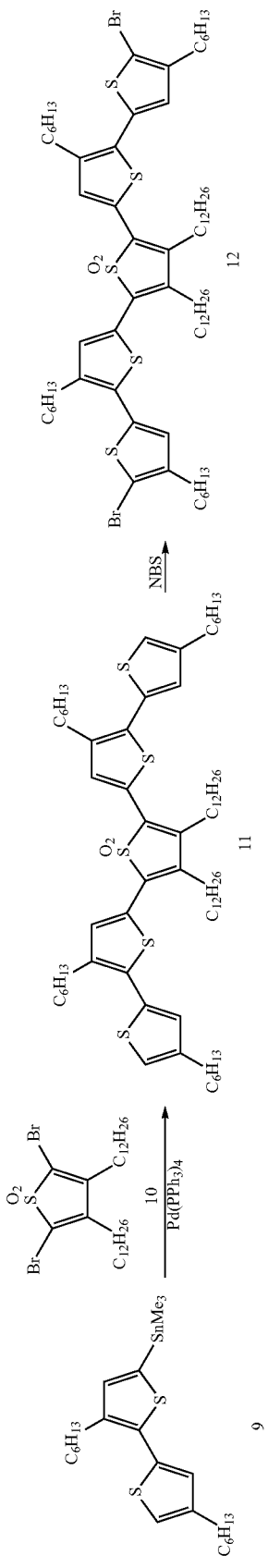
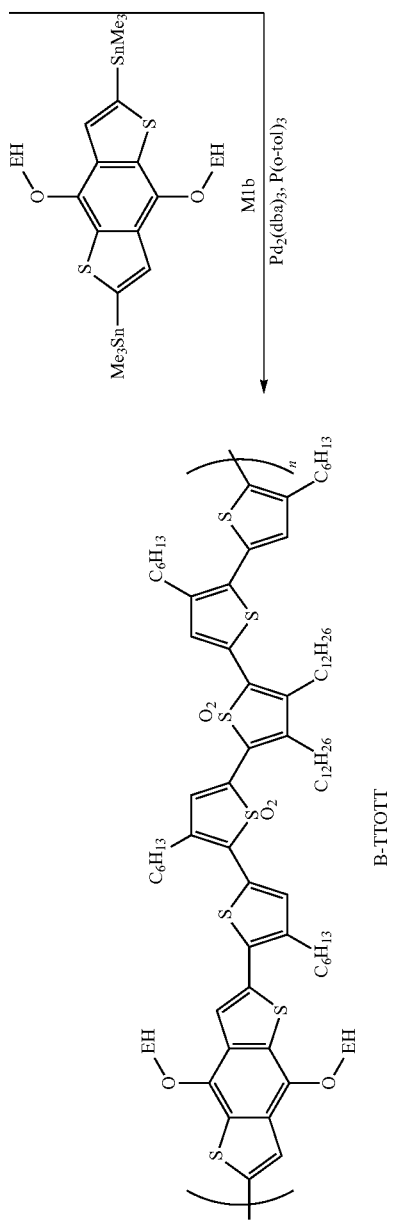

Compound 9[61] was synthesized according to a previously reported method.

Synthesis of Compound 10

This compound has previously been synthesized from 2,5-dibromo-3,4-didodecylthiophene using mCPBA as the oxidant.[62] Here, we use Rozen's reagent, the detailed preparation of which for the oxidation of thiophenes has been described elsewhere.[63,64] A solution of 2,5-dibromo-3,4-dodecylthiophene (1.05 g, 1.82 mmol, 1 eq) in dichloromethane (15 mL) was cooled to 0° C. and a freshly prepared solution of HOF—CH$_3$CN (0.165M, 44 mL, 7.26 mmol, 4 eq) was added dropwise. The reaction was allowed to warm to room temperature and stirred for 20 min, then quenched with saturated sodium bicarbonate solution. The mixture was extracted twice with dichloromethane and the organic layer was washed with water and dried over MgSO$_4$. The crude product was purified by column chromatography (silica gel, 10% ethyl acetate in hexanes as eluent) to yield the product as a white solid (724 mg, 65%). $^1$H-NMR (400 MHz, CDCl$_3$), δ 2.41 (t, 4H), 1.54-1.21 (m, 40H), 0.88 (t, 6H).

Synthesis of Compound 11

Compound 9 (863 mg, 1.74 mmol, 2.2 eq), compound 10 (482 mg, 0.789 mmol, 1 eq) and Pd(PPh$_3$)$_4$ (46 mg, 5% eq) were placed in a sealed reaction vial which was evacuated and refilled with nitrogen. Dry toluene (15 mL) was added and the solution was stirred at 110° C. for 24 h. The solution was subsequently poured into water and extracted with chloroform. The organic extracts were washed with water, then dried over MgSO$_4$. The solvent was removed and the crude product purified by column chromatography (silica gel, 15% DCM in hexanes as eluent) to yield the product as a viscous dark red liquid (358 mg, 40%). $^1$H-NMR (500 MHz, CDCl$_3$) δ 7.56 (s, 2H), 7.01 (s, 2H), 6.95 (s, 2H), 2.78 (t, 4H), 2.72-2.58 (m, 8H), 1.74-1.57 (m, 12H), 1.53-1.46 (m, 4H), 1.45-1.18 (m, 56H), 0.94-0.84 (m, 18H). $^{13}$C-NMR (500 MHz, CDCl$_3$) δ 143.91, 140.24, 136.68, 134.81, 134.07, 131.55, 129.99, 127.86, 126.35, 120.94, 31.94, 31.69, 31.61, 30.47, 30.46, 30.39, 29.94, 29.70, 29.66, 29.55, 29.38, 29.29, 29.19, 29.01, 28.49, 27.15, 22.70, 22.62, 14.12, 14.09, 14.08. HRMS (ESI+) Calculated for [M+H]$^+$: 1117.7031; Found: 1117.7014.

Synthesis of Compound 12

Compound 11 (90 mg, 0.0805 mmol, 1 eq) was dissolved in chloroform (10 mL), protected from light, and cooled in an ice bath. N-bromosuccinimide (22 mg, 0.403 mmol, 1.5 eq) was added in 3 portions (waiting 1 h between portions and monitoring by TLC). The reaction was stirred at room temperature overnight and a final portion of N-bromosuccinimide (9 mg, 0.0483 mmol, 0.6 eq) was added. The reaction then was left to stir for another 24 h at room temperature. Cold water was added to quench the reaction, which was subsequently extracted with chloroform. The organic extracts were washed with water and dried over MgSO$_4$. The solvent was removed and the crude product purified by column chromatography (silica gel, 30% DCM in hexanes as eluent) to yield the product as a dark red liquid (90 mg, 87%). $^1$H-NMR (400 MHz, CDCl$_3$) δ 7.54 (s, 2H), 6.86 (s, 2H), 2.73 (t, 4H), 2.66 (m, 4H), 2.58 (t, 4H), 1.71-1.55 (m, 12H), 1.53-1.20 (m, 60H), 0.94-0.84 (m, 18H). $^{13}$C-NMR (500 MHz, CDCl$_3$) δ 142.77, 140.76, 137.07, 134.59, 133.01, 131.54, 129.95, 127.38, 126.73, 109.79, 31.93, 31.62, 31.58, 30.46, 29.92, 29.70, 29.66, 29.55, 29.53, 29.38, 29.25, 29.17, 28.91, 28.48, 27.14, 22.70, 22.61, 14.12, 14.07. HRMS (ESI+) Calculated for [M+Na]$^+$: 1297.5049; Found: 1297.5077.

Synthesis of B-TTOTT

Compound D (152 mg, 0.25 mmol, 1 eg), compound M1a (242 mg 0.25 mmol, 1 eq), Pd$_2$(dba)$_3$ (12 mg, 5% eq) and P(o-tol)$_3$ (8.0 mg, 5% eq) were placed in a sealed reaction vial which was evacuated and refilled with argon. Dry chlorobenzene (2 mL) was added and the reaction was stirred at 130° C. for 48 h. The resulting polymer was precipitated into a mixture of methanol (50 mL) and HCl (5 mL) and the solid was filtered off and washed with methanol. Further purification by Soxhlet extraction with methanol, hexanes and dichloromethane afforded the product as a dark red solid (75 mg, 36%). HNMR. GPC: M$_n$=17.3K, Đ=1.78.

Example 14

Preparation of B-TOTOT

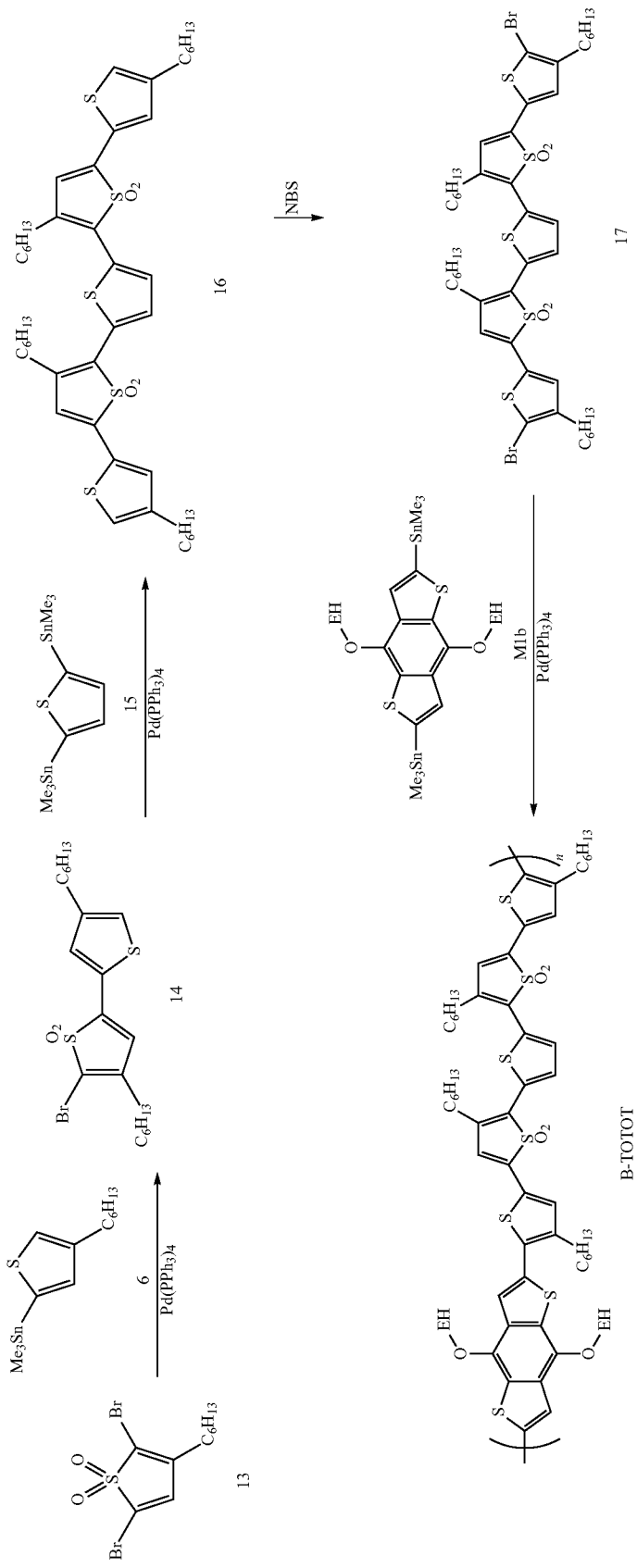

Compound 13[61,63] was synthesized as previously reported. Compound 15 was purchased from Sigma and used without further purification.

Synthesis of Compound 14

Compound 13 (1.09 mg, 3.03 mmol, 1 eq), compound 6 (1.00 mg, 3.03 mmol, 1 eq) and Pd(PPh$_3$)$_4$ (175 mg, 5% eq) were placed in a sealed reaction vial which was evacuated and refilled with nitrogen. Dry toluene (10 mL) was added and the reaction was stirred at 95° C. for 2 h. The solvent was removed and the residue was dissolved in DCM, washed with water and dried over MgSO$_4$. After removal of solvent, the crude product was purified by column chromatography (silica gel, 20% DCM in hexanes as eluent). The product was isolated as a yellow oil (548 mg, 40%). $^1$H-NMR (400 MHz, CDCl$_3$) δ 7.46 (d, J=0.9 Hz, 1H), 7.03 (d, J=0.9 Hz, 1H), 6.58 (s, 1H), 2.61 (t, 2H), 2.42 (t, 2H), 1.68-1.54 (m, 4H), 1.44-1.24 (m, 12H), 0.96-0.83 (m, 6H). $^{13}$C-NMR (500 MHz, CDCl$_3$) δ 145.31, 141.73, 138.03, 130.33, 129.08, 123.38, 119.78, 113.38, 31.60, 31.44, 30.30, 30.23, 30.02, 28.93, 28.84, 26.40, 22.59, 22.47, 14.08, 14.03. HRMS (ASAP+) Calculated for [M+H]$^+$: 447.0851; Observed: 447.0853.

Synthesis of Compound 16

Compound 14 (547 mg, 1.23 mmol, 2.05 eq), compound 15 (245 mg, 0.599 mmol, 1 eq) and Pd(PPh$_3$)$_4$ (34 mg, 5% eq) were placed in a sealed reaction vial which was evacuated and refilled with nitrogen. Dry toluene (10 mL) was added and the solution was stirred at 110° C. for 24 h. The solution was subsequently poured into water and extracted with chloroform. The organic extracts were washed with water, then dried over MgSO$_4$. The solvent was removed and the crude product purified by column chromatography (silica gel, 40% DCM in hexanes as eluent) to yield the product as a dark purple solid (432 mg, 89%). $^1$H-NMR (400 MHz, CDCl$_3$) δ 7.71 (s, 2H), 7.51 (d, J=0.8 Hz, 2H), 7.05 (d, J=0.8 Hz, 2H), 6.67 (s, 2H), 2.69 (t, 4H), 2.63 (t, 4H), 1.74-1.58 (m, 8H), 1.50-1.24 (m, 24H), 0.96-0.83 (m, 12H). $^{13}$C-NMR (500 MHz, CDCl$_3$) δ 145.33, 136.98, 136.64, 130.91, 129.85, 129.10, 128.92, 123.50, 121.36, 31.61, 31.56, 30.60, 30.35, 30.25, 29.36, 28.96, 27.40, 22.60, 22.54, 14.09, 14.05. HRMS (ASAP+) Calculated for [M+H]$^+$: 813.3173; Observed: 813.3163.

Synthesis of Compound 17

Compound 16 (200 mg, 0.246 mmol, 1 eq) was dissolved in a mixture of trifluoroacetic acid (15 mL) and chloroform (10 mL), protected from light and placed in an ice bath. N-bromosuccinimide (101 mg, 0.566 mmol, 2.3 eq) added portion-wise over half an hour, and the reaction was allowed to stir for 1 h at room temperature. Cold water was added to quench the reaction, which was subsequently extracted with chloroform. The organic extracts were washed with water and dried over MgSO$_4$. Following removal of solvent, the crude product was purified by column chromatography (silica gel, 40% DCM in hexanes as eluent) to yield pure product as a dark purple solid (155 mg, 65%). $^1$H-NMR (400 MHz, CDCl$_3$) δ 7.70 (s, 2H), 7.34 (s, 2H), 6.61 (s, 2H), 2.68 (t, 4H), 2.58 (t, 4H), 1.72-1.56 (m, 8H), 1.49-1.24 (m, 24H), 1.00-0.82 (m, 12H). $^{13}$C-NMR (500 MHz, CDCl$_3$) δ 144.34, 136.90, 135.67, 130.94, 129.48, 129.31, 129.09, 128.90, 121.72, 113.43, 31.53, 30.57, 29.57, 29.49, 29.34, 28.91, 27.40, 22.57, 22.53, 14.07, 14.03. HRMS (ESI+) Calculated for [M+Na]$^+$: 993.1185; Observed: 993.1122.

Synthesis of B-TOTOT.

Compound D (152 mg, 0.25 mmol, 1 eq), compound M1a (242 mg 0.25 mmol, 1 eq), Pd$_2$(dba)$_3$ (12 mg, 5% eq) and P(o-tol)$_3$ (8.0 mg, 5 % eq) were placed in a sealed reaction vial which was evacuated and refilled with argon. Dry chlorobenzene (2 mL) was added and the reaction was stirred at 130° C. for 48 h. The resulting polymer was precipitated into a mixture of methanol (50 mL) and HCl (5 mL) and the solid was filtered off and washed with methanol. Further purification by Soxhlet extraction with methanol, hexanes and dichloromethane afforded the product as a dark red solid (75 mg, 36%). HNMR. GPC: M$_n$=17.3K, Đ=1.78.

The content of all patents, patent applications, published articles, abstracts, books, reference manuals and abstracts, as cited herein are hereby incorporated by reference in their entireties to more fully describe the state of the art to which the disclosure pertains.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variations that fall within the scope of the appended claims.

Example 15

Transient Absorption Spectroscopy Polymer Analysis

Transient absorption spectroscopy was conducted using a commercial Ti:Sapphire laser system (SpectraPhysics|800 nm|100 fs|3.5 mW|1 kHz). Excitation light was generated via a commercial optical parametric amplifier (LightConversion). Super continuum probe light was generated by focusing 800 nm fundamental into a sapphire disc. The probe light was split into signal and reference beams, both of which were detected on a shot-by-shot basis with fiber-coupled Silicon (visible) or InGaAs (infrared) diode arrays. The pump-probe delay was controlled with a mechanical delay stage (Newport).

Example 16

Comparative Example

The initial building blocks that were tested comprised of benzodithiophene as the electron rich unit (D), thiophene as a weak donor (WD), and the mono- or bi-thiophene-1,1-dioxide (TDO1, and TDO2, respectively) that acted as a strong electron acceptor. Both the polymers p-BDT-TDOn and small molecules BDT-TDOn had the core architecture shown in FIG. 1, where it is postulated that, upon exciton generation, formation of a charge transfer exciton between BDT (electron donor) and TDO (electron acceptor) moieties would provide strong charge-transfer-mediated coupling to the intramolecular ME state (see FIG. 1). The energy levels of the four SF materials exhibited low-lying LUMOs (see Table 1). The unoxidized versions of the materials were used as controls. The compounds are illustrated below:

Single fission polymers and small molecules:

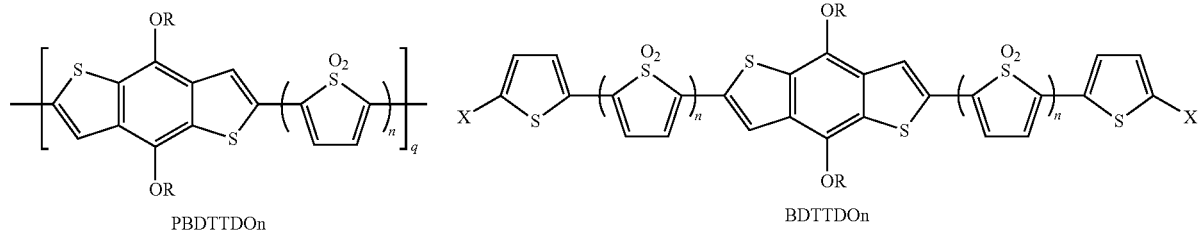

PBDTTDOn

BDTTDOn n = 1, 2

Control polymers and small molecules:

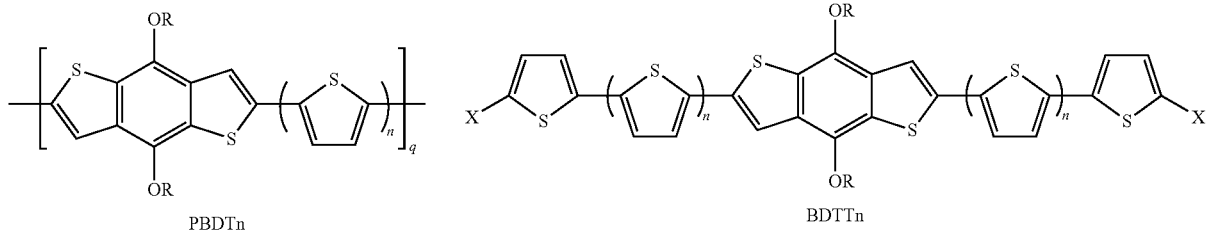

PBDTn

TDO4

BDTTn

To understand the effects of thiophene oxidation on the optical properties of the above materials, the linear absorption spectra were first analyzed as shown in two spectra in FIGS. 6A and 6B. Substituting thiophene with TDO universally reduced the bandgap of the resultant oligomer or polymer, which yielded significant red-shifting of the absorption spectrum (see Table 1). The optical absorption spectra of the molecular systems (FIG. 6A) were broad visible absorption with a single peak and no prominent structure, which is a characteristic of many small molecule systems. The polymeric systems (FIG. 6B) showed distinct transitions for the singlet exciton (S) and charge transfer (CT) excitations, which is typical for polymers in donor-acceptor configurations. The energy of the singlet transition remained roughly constant for all polymers, though its relative strength varied with the number of TDO units. The reduction in bandgap upon oxidation ranges from 300 to 760 meV. Generally, the bandgap reduction was more dramatic in oligomers than polymers and in systems with a larger number of oxidized units. As confirmed by cyclic voltammetry (Table 1), this bandgap reduction was predominantly due to stabilization of the LUMO energy (lowering the conduction band).

To properly confirm that intramolecular singlet fission was occurring, three parameters had to be verified: 1) triplet formation via fission should occur on ultrafast timescales, 2) the spectrum of the SF-generated triplet should match that of triplets generated through other means, 3) the triplet pairs generated via SF decay faster than the native single triplet, 4) the associated dynamics are insensitive to the concentration of the molecules in solution. Taken together, these criteria unambiguously established the fact that the triplets were formed by intramolecular singlet fission rather than intersystem crossing, which was primarily reflected in the distinct formation and recombination dynamics associated with multiple exciton states populated on a single molecular unit.

To characterize the rates of triplet formation in the above TDO-containing materials of the invention, a technique with sub-picosecond resolution and sensitivity to singlet and triplet populations was used. For this purpose, broadband femtosecond transient absorption (TA) spectroscopy was employed. The results showed that the substitution of thiophene for TDO induced several new singlet deactivation processes, which significantly decreased the singlet exciton lifetimes. The process that is of greatest interest is singlet fission.

Beginning with p-BDT-TDO1, the TDO-containing material with the longest excited state lifetime and highest SF yield. TA spectroscopy of p-BDT-TDO1 resolved three spectrally distinct states following optical excitation. The initially formed state was assigned as a singlet charge-transfer exciton (CTE), as is commonly observed in donor-acceptor polymer systems. This state and its associated nIR induced absorption band have an about 1ps lifetime. The decay of the CTE induced absorption feature was correlated with the rise of a second spectral feature (FIG. 7C). This population was assigned as a triplet exciton formed as the product of singlet fission. Approximately 85% of the initial excitations went on to form triplet pairs. Following formation, the triplet decayed via triplet-triplet annihilation with an about 70 ps time constant. The third spectral feature was a very broad induced absorption spanning most of the visible spectral range. This feature was generated within the 100 fs instrument response, persisted for about a nanosecond and accounts for about 10% of the initially excited population. This feature was assigned as polaron resulting from auto-ionization and noted that excitation with high energy photons yielded more of this state, which offered further support for this assignment.

To confirm the above assignment of the triplet (T1→Tn) induced absorption feature, a pulsed radiolysis triplet transfer (PRTT) experiment was performed. This experiment used an electron pulse to generate triplets that were then optically probed to yield the triplet induced absorption spectrum (FIGS. 7C and 7D, circles) and native triplet lifetime. The spectral agreement of the PRTT T1 spectra and proposed Ti induced absorption from TA confirmed that triplets were formed on an ultrafast timescale following optical excitation in all TDO-containing material studied here. The molecular PRTT T1 spectrum was used to confirm the presence of triplet in the analogous polymers. Since the triplet was localized to the TDO subunits, all TDOn-containing materials would have similar T1 spectra (aside from any overlapping ground state bleach contributions). Thus, the ultrafast production of triplet was confirmed in the four TDO-containing molecular and polymeric systems (FIGS. 7C and FIG. 7D).

Once the presence of triplet had been verified, the triplet generation mechanism was evaluated to confirm that the triplet generation mechanism was indeed SF. In all studied TDO-containing systems, TA spectroscopy revealed triplet formation occurred in less than 10 ps, which supported SF as the triplet generation mechanism rather than ISC. Triplet formation was possible through ISC, but observation of ISC on such fast timescales was generally limited to systems containing heavy atoms that facilitated spin-orbit coupling as a means of circumventing angular momentum conservation selection rules. The combined lack of heavy atoms and very fast triplet formation supported the assertion that triplets were formed by SF rather than ISC.

The triplet recombination dynamics also supported SF as the mechanism of triplet generation. In all studied TDO-containing materials, triplets generated from optical excitation recombined within less than 1ns, thereby suggesting that the triplet (pairs) were recombining geminately rather than decaying through intersystem crossing on a much longer timescale. This, combined with the triplet formation rate, allowed for the unlikely possibility of triplet generation via less than 10-ps intersystem crossing to be eliminated, further confirming the presence of singlet fission in p-BDT-TDO1.

To confirm that the observed singlet fission was intramolecular, BDT-TDO2 was subjected to a solution concentration dependence. The steady state absorption spectrum, SF yield, and SF triplet lifetime were found to be independent of chromophore concentration over more than an order of magnitude in concentration variation. The absorption spectrum concentration independence suggested that significant aggregate formation was not occurring, at least to the extent that no significant chromophore-chromophore interactions were observed in the steady state optical properties. This supported that the studied solutions were fully dispersed rather than aggregated. In addition, SF yield and triplet lifetime were also observed as independent of chromophore concentration, which allowed for the possibility that diffusional intermolecular SF could be eliminated. This was further supported by the sub-picosecond (faster than diffusion-limited) SF timescale. These combined measurements verified that SF was intramolecular, and ruled out both potential intermolecular SF mechanisms.

Once the protocol for identifying intramolecular singlet fission was established, it was used on a variety of structures, including oligomers, to probe important design criteria for efficient fission materials. Notably, an oligomer consisting of two strong acceptors and one donor molecule was sufficient for introducing a measurable single fission yield. Though the overall efficiency was lower than in the p-BDT-TDO1 polymer system, these studies suggested that this was not an inherent limitation of a small molecule system since the fast deactivation processes that lead to an overall smaller yield in the oligomers was also found in another polymer with multiple consecutive strong acceptor units, p-BDT-TDO2.

The photophysical and electronic material properties are listed for the TDO-containing materials studied here. Optical bandgaps were determined with the linear absorption spectra (FIGS. 6A and 6B). The reduction and oxidation potentials were determined with cyclic voltammetry. The SF yield and lifetimes were determined by exponential fitting of TA bleach recovery kinetics, except for BDT-TDO$_1$ that required global analysis to deconvolute populations.

TABLE 5

MATERIAL PROPERTIES

| Material | Bandgap, optical (eV) | Ered (eV) | Eox (eV) | $\Phi_{T, (SF)}$ | $\tau_{T(SF)}$ (ps) |
|---|---|---|---|---|---|
| BDT-TDO$_1$ | 1.82 | −5.5 | −4.1 | 0.2-0.3 | 75 ± 15 |
| BDT-TDO$_2$ | 1.62 | −5.8 | −4.0 | 0.3-0.7 | 13 ± 8 |
| p-BDT-TDO$_1$ | 1.75 | −5.7 | −3.8 | 1.7-1.75 | 80 ± 20 |
| p-BDT-TDO$_2$ | 1.50 | −5.5 | −3.7 | 0.5-0.6 | 23 ± 3 |

Details of the Deactivation Process and its Relationship to Fission

Modification of the donor-acceptor interactions may not only affect the criteria for fission, but also the competing decay pathways that can lower the overall yield. The highest singlet fission in p-BDT-TDO1 was observed, which showed a triplet quantum yield 1.75, based upon the bleach recovery component associated with the triplet-triplet recombination. Although singlet fission was also observed in three other TDO-containing materials presented above, an overall lower SF yield was measured due to the introduction of an efficient non-radiative relaxation process out of the singlet exciton state. Generally, BDT-TDO1, BDT-TDO2, and p-BDT-TDO2 showed repopulation of the ground state on two time scales: the majority of carriers underwent internal conversion within the first picosecond, and a smaller population decayed in several tens of picoseconds. The fast decay component was ascribed to an S2→S1→S0 sequential internal conversion process that replenished the ground state, and proposed that the initial S2→S1 internal conversion occurred within the approximately 100 fs instrument response of the TA system, and the decay observed in the TA data is the S1→S0 decay. The proceeding decay of the S1 state was associated with an nIR induced absorption feature that was assigned as an S1→Sn transition. The second decay component was assigned to triplet pairs formed by singlet fission and eliminated by triplet-triplet annihilation to replenish the ground state. Similarly to the above results for p-BDT-TDO1, this pathway was spectrally distinct; it was associated with a visible induced absorption feature with a tail that extended into the nIR (FIGS. 7C and 7D lines). This spectral feature was assigned to a triplet transition (T1→Tn), in agreement with PRTT results (FIGS. 7C and 7D circles). This state formed within the 100-fs instrument response and persisted for several tens of picoseconds in both molecular systems and p-BDT-TDO2. While the initial S2→S1 internal conversion process was not directly observed, it was clear that it was in competition with the (also instrument response limited) SF process. Additionally, the lack of a rise in the triplet population after 100-fs confirmed that SF originating from the S1 state was not occurring. Similar results were observed in BDT-TDO1, BDT-TDO2, and p-BDT-TDO2, where the SF yield was limited by competing internal conversion.

This ultrafast IC process can be qualitatively explained with consideration of the electronic structure of the TDO subunit. While thiophene acted as a typical aromatic moiety, TDO did not. The oxidation of a thiophene monomer resulted in a transition from a 6π→4π electron system. To an approximation, the TDO subunit was an electronic analogue of cis-butadiene (or cyclopentadiene). As a result, TDO-containing monomers and oligomers possessed electronic and photophysical properties similar to linear polyenes, like the carotenoids. The ultrafast deactivation in TDO systems was well-explained within this context. Polyenes are known for their fast recovery following excitation. The relaxation process generally occurred via two sequential internal conversion processes. The excitation formed a singlet excited state (S2, Blu symmetry), which quickly internally converted to a lower lying dark state (S1, Alg symmetry), and finally to the ground state (S0, Alg symmetry). These fast internal conversion processes were well studied within the context of the carotenoid family of polyenes, as well as polyene-containing polymers. The first internal conversion process generally occurred within a range of tens to hundreds of femtoseconds. The second internal conversion process repopulated the ground state within picoseconds to tens of picoseconds. Some TDO-containing materials studied here behaved in a qualitatively similar fashion.

The observation of singlet fission in this family of new materials provided insight into the mechanistic underpinnings of singlet fission in systems with strong intra-chain donor-acceptor interactions and allowed the establishment of the design criteria for new materials. For example, the absence of internal conversion in p-BDT-TDO1 demonstrated that the formation of the "dark" singlet state observed in the other material (along with the competing fast internal conversion pathway) was not inherent to SF-sensitized copolymers or TDO-containing systems. The materials presented here provide empirical insight into the control of IC. Within the polymer systems, it was observed that a single TDO subunit could efficiently act to induce singlet fission, but multiple sequential TDO-units were necessary for formation of the detrimental polyene-like S1|Alg dark state. As a result, caution was used when using multiple sequential TDO subunits as they may induce alternative singlet deactivation pathways. The relevant parameters for control of the IC process in the molecular systems presented here were less clear, as molecular systems with both one and two sequential TDO subunits showed fast IC in competition with SF.

Based upon the above materials characterization and discussion, the singlet fission process in donor-acceptor copolymers was proposed to be a charge transfer mediated process, similar to what has been observed in molecular SF systems. Within this context, the SF process was divided into two sequential charge transfer events. For molecular aggregates, the first charge transfer process began with a singlet exciton and resulted in neighboring cationic and anionic molecules. This charge transfer was from an electron transfer event, or it was an optically coupled charge transfer event resultant from the lowest lying excitation having some charge-transfer character. This principle also applied in the case of SF in intramolecular D-A materials, though the notation must be refined. In these systems, the lowest-lying electronic excitation was a charge transfer excitation typically denoted with the hole carrier density localized on the 'donor' monomer(s) and the electron density predominately on the 'acceptor' monomer(s). However, the above approximation of the electron and hole wave functions showed a localized electron and a delocalized hole, so the strictly localized Frenkel-type excitonic picture of charge-transfer-mediated SF was perhaps an over simplification. Viewing the SF process through the lens of a charge transfer mediated process was an informative means of understanding the design of singlet fission polymers.

The introduction of charge transfer character was the predominate mechanism for engineering low bandgap polymers; however, it also served to initiate the SF process. Since the lowest-lying excitation had significant CT character, SF proceeded efficiently via a charge transfer mediated process rather than the much less efficient direct SF mechanism (FIG. 1). Within this context, copolymers consisting of strong donor-acceptor moieties served as efficient materials for SF, provided that the energetic requirements for SF were met. The fulfillment of the energetic requirement was dependent on a negative (or slightly positive but thermally accessible) $\Delta E_{SF}$, where $\Delta E_{SF}$ was defined as the difference in the energy of the lowest lying singlet ($E_S$) and twice the triplet energy ($E_T$). [$\Delta E_{SF}=E_S-2E_T$]. $E_S$ was defined by the bandgap of the copolymer, as defined by the difference of the $E_{HOMO-DONOR}$ and $E_{LUMO-ACCEPTOR}$. $E_S$ was tuned by varying the selected donor and acceptor moieties. Ideally this should be chosen to match the $E_S$ and $2E_T$, since this would optimize the SF rate and yield while minimizing the amount of excess energy that is lost to thermalization. $E_T$ was defined by the polymer subunit that would host the triplet excitons. In the materials studied here, this is the TDO subunit. For localized triplet excitons, it was not expected that $E_T$ would vary significantly based upon the donor subunits that were selected for the polymer. However, the triplet energy was dependent on the number of sequential triplet acceptors, though care was taken as detrimental IC processes were introduced with this modification.

Thus, the present invention provides a family of singlet fission exhibiting materials based on a donor-acceptor copolymer configuration utilizing a bi-functional electron acceptor and singlet fission sensitizer, TDO. Singlet fission was confirmed in two molecular and two polymeric systems, the most efficient of which yielded an up to 1.85 charge carrier pairs per absorbed photon (1.75 triplet excitons and about 0.1 polaron pairs). These systems were generalized to provide a platform for the design of tunable singlet fission capable materials. Efficient singlet fission-capable polymers were constructed by assembling a copolymer of a strong donor and a strong acceptor, where one of the subunits had a triplet energy such that ES-2ET≤0.

Thus, the present invention provides the following numbered embodiments
1. A stable, soluble or solution-processing singlet fission material comprising Formula 1:

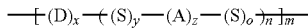

Formula 1 wherein "D" is any donor,
"A" is any acceptor,
"S" is any conjugated aromatic spacer,
"x," "z," "m," and "n" are each any positive integer, and
"o" and "y" are each 0 or any positive integer.
2. The material of embodiment 1, wherein D is a strong donor.
3. The material of embodiment 1, wherein D is benzodithiophene (BDT).
4. The material of embodiment 1, wherein A is a strong acceptor.
5. The material of embodiment 1, wherein A is thiophene-1,1-dioxide (TDO).
6. The material of embodiment 1, wherein S is selected from the group consisting of: thiophene, benzene, and thienothiophene.
7. The material of embodiment 1, wherein x and z are each 1.
8. The material of embodiment 1, wherein x is 1-3.
9. The material of embodiment 1, wherein z is 1-4.
10. The material of embodiment 1, wherein y is 0-4.
11. The material of embodiment 1, wherein o is 0-4.
12. The material of embodiment 1, wherein n is 1-2.
13. The material of embodiment 1, wherein m is 2-200.
14. The material of embodiment 1, wherein the material is selected from the group consisting of: is poly-benzodithiophene mono-thiophene-1,1-dioxide (PBTDO1) and polybenzodithiophene [2,2':5',2"-terthiophene]-1',1'-dioxide (PBTOT).
15. A polymer of Formula 2:

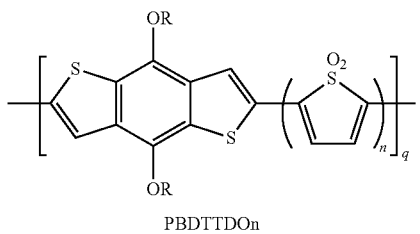

Formula 2

PBDTTDOn wherein
"n" and "q" are each the same or different positive integer,
"R" is the same or different, and is selected from the group consisting of: hydrogen, straight or branched chain alkyl of C1-20, alkenyl, alkynyl, oligoethylene glycols, and aromatic rings, and
wherein said polymer is a singlet fission polymer with a triplet yield of greater than 100%.
16. The polymer of embodiment 15, wherein the polymer comprises at least one benzodithiophene (BDT) donor unit and at least one thiophene-1,1-dioxide (TDO) acceptor unit.
17. The polymer of embodiment 15, wherein the polymer is poly-benzodithiophene mono-thiophene-1,1-dioxide (PBTDO1).
18. A stable, solution-processible singlet fission donor-acceptor material, comprising at least one donor coupled to at least one acceptor via zero or one or more than one spacer, wherein the material exhibits a singlet energy essentially greater than or essentially about twice a triplet pair energy, and the material produces a singlet fission yield of greater than about 100%.
19. The material of embodiment 18, wherein the donor is benzodithiophene (BDT).
20. The material of embodiment 18, wherein the acceptor is thiophene-1,1-dioxide (TDO).
21. The material of embodiment 18, wherein the material is poly-benzodithiophene mono-thiophene-1,1-dioxide (PBTDO1).
22. The material of embodiment 18, wherein the material is polybenzodithiophene [2,2':5',2"-terthiophene]-1',1'-dioxide (PBTOT).
23. A method of designing a stable, soluble or solution-processing singlet fission material of claim 1, comprising obtaining a triplet energy that is less than or about half a singlet energy of the material; and modulating the material to have a triplet yield of greater than 100%.
24. A method of designing a stable, soluble or solution-processing singlet fission material of claim 15, comprising obtaining a triplet energy that is less than or about half a singlet energy of the material; and modulating the material to have a triplet yield of greater than 100%.

The content of all patents, patent applications, published articles, abstracts, books, reference manuals and abstracts, as cited herein are hereby incorporated by reference in their entireties to more fully describe the state of the art to which the disclosure pertains.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variations that fall within the scope of the appended claims.

REFERENCES

1. Yu, G et al. Science 270, 1789-1791 (1995).
2. Tang, C. W. Appl. Phys. Lett. 48, 183-185 (1986).
3. Gélinas, S. et al. Science 343, 512-516 (2014).
4. Brédas, J.-L. et al. Acc. Chem. Res. 42, 1691-1699 (2009).
5. Erb, T. et al. Adv. Funct. Mater. 15, 1193-1196 (2005).
6. Kim, J. Y. et al. Science 317, 222-225 (2007).
7. You, J. et al. Nature Commun. 4, 1446 (2013).
8. Small, C. E. et al. Nature Photon. 6, 115-120 (2012).
9. Sun, Y. et al. Nature Mater. 11, 44-48 (2012).
10. Shockley, W. & Queisser, H. J. J. Appl. Phys. 32, 510-519 (1961).

11. Hanna, M. C. & Nozik, A. J. J. Appl. Phys. 100, 074510 (2006).
12. Ehrler, B. et al. Nature Commun. 3, 1019 (2012).
13. Tritsch, J. R. et al. Nature Commun. 4, 2679 (2013).
14. Congreve, D. N. et al. Science 340, 334337 (2013).
15. Johnson, J. C., et al. Acc. Chem. Res. 46, 1290-1299 (2013).
16. Smith, M. B. & Michl, J. Chem. Rev. 110, 6891-6936 (2010).
17. Roberts, S. T. et al. J. Am. Chem. Soc. 134, 6388-6400 (2012).
18. Yost, S. R. et al. Nature Chem. 6, 492-497 (2014).
19. Antognazza, M. R. et al. Chem. Phys. 373, 115-121 (2010).
20. Kraabel, B. et al. Chem. Phys. 227, 83-98 (1998).
21. Musser, A. J. et al. J. Am. Chem. Soc. 135, 12747-12754 (2013).
22. Gradinaru, C. C. et al. Proc. Natl Acad. Sci. USA 98, 2364-2369 (2001).
23. Papagiannakis, E. et al. J. Phys. Chem. B 107, 5642-5649 (2003).
24. Johnson, J. C. et al. J. Phys. Chem. B 117, 4680-4695 (2013).
25. Dell, E. J. & Campos, L. M. J. Mater. Chem. 22, 12945-12952 (2012).
26. Wei, S. et al. Angew. Chem. Int. Ed. 53, 1832-1836 (2014).
27. Beljonne, D. et al. Phys. Rev. Lett. 110, 226402 (2013).
28. Berkelbach, T. C. et al. J. Chem. Phys. 138, 114102 (2013).
29. Berkelbach, T. C. et al. J. Chem. Phys. 138, 114103 (2013).
30. Chan,W-L. et al. Acc. Chem. Res. 46, 1321-1329 (2013).
31. Chan,W-L. et al. Science 334, 1541-1545 (2011).
32. Chan,W-L. et al. Nature Chem. 4, 840-845 (2012).
33. Sharifzadeh, S. et al. J. Phys. Chem. Lett. 4, 2197-2201 (2013).
34. Zhou, H. et al. Macromolecules 45, 607-632 (2012).
35. Kitamura, C. et al. Chem. Mater. 8, 570-578 (1996).
36. Brédas, J. J. Chem. Phys. 82, 3808-3811 (1985).
37. Havinga, E. et al. Polym. Bull. 29, 119-126 (1992).
38. Szarko, J. M. et al. J. Phys. Chem. B 114, 14505-14513 (2010).
39. Guo, J. et al. J. Am. Chem. Soc. 131, 16869-16880 (2009).
40. Mullen, K. M. et al. J. Glob. Optim. 38, 201-213 (2007).
41. Van Stokkum, I. H. et al. Biochim. Biophys. Acta 1657, 82-104 (2004).
42. Wishart, J. F. et al. Rev. Sci. Instrum. 75, 4359-4366 (2004).
43. Head-Gordon, M. et al. J. Phys. Chem. 99, 14261-14270 (1995).
44. Oliva, M. M. et al. J. Am. Chem. Soc. 132, 6231-6242 (2010).
45. Amir, E. et al. J. Polym. Sci. A 49, 1933-1941 (2011).
46. Sreearunothai, P. et al. J. Phys. Chem. C 115, 19569-19577 (2011).
47. Heinzelmann, W. & Labhart, H. Chem. Phys. Lett. 4, 20-24 (1969).
48. Kanimozhi, C. et al. J. Phys. Chem. B. 114, 3095-3103 (2010).
49. Amir, E. et al. J. Am. Chem. Soc. 133, 10046-10049 (2011).
50. Barbarella, G., et al. Bioconjugate Chem. 17, 58-67 (2006).
51. Busby, E., et al. J. Phys. Chem. Lett. 2, 2764-2769 (2011).
52. Carmichael, I. et al. J. Phys. Chem. Ref. Data. 16, 239-260 (1987).
53. Casida, M. E. Recent advances in density functional methods. Part 1, edited by D. P. Chong (Singapore, World Scientific, 1995), pp. 155-192.
54. Wu, Q. & Van Voorhis, T. Phys. Rev. A. 72, 024502 (2005)
55. Shao, Y., et al. Phys. Chem. Chem. Phys. 8, 3172-3191 (2006)
56. Maitra, N. T. et al. J. Chem. Phys. 120, 5932-5937 (2004)
57. Busby, E. et al. Nat. Mater. 14, 426-433 (2015).
58. Cabanetos, C. et. al., J. Am. Chem. Soc. 135, 4656 (2013)
59. Dell et. al., Nat. Chem. 7, 209 (2015)
60. Liu, H-Y, et al. J. Am. Chem. Soc. 137 (32), 10420-10429 (2015).
61. Hagemann, O. et al. J. Org. Chem. 71, 5546-5559 (2006).
62. Berlin, A. et al. J. Mater. Chem. 13, 27-33 (2003)
63. Amir, E. et al. J. Am. Chem. Soc. 133, 10046-10049 (2011)
64. Wei, S. et al. Angew. Chem., Int. Ed. 53, 1832-1836 (2014)
65. Zhai, Y. et al. Phil. Trans. R. Soc. A. 373, 20140327 (2015)
66. McCormick, T. M. et al. Macromolecules 46:3879-3886 (2013)
67. Aryanpour et al., Phys. Rev. Lett. 115:267401 (2015).

We claim:

1. A polymer, comprising:
alternating electron donating subunits and electron accepting subunits having the formula [SD-SA]n, wherein SD is a strong electron donating subunit, SA is a strong electron accepting subunit, and n is an integer,
wherein the strong electron accepting subunit has one of the following formulas:

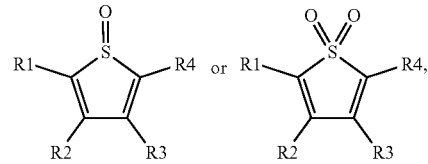

wherein in each of the above formulas, $R_1$, $R_2$, $R_3$, and $R_4$ are selected from the group consisting of hydrogen, straight chain or branched alkyl of $C_{1-20}$, alkenyl, alkynyl, alkoxy, halogen, sulfur, organotin compounds of the formula $Sn(R_5)_3$, wherein $R_5$ is selected from the group consisting of $C_{1-10}$ alkyl, an oligoethylene glycol, a hydroxide, sulfate, or carbonate of a Group 2 element, $C_1$-$C_6$ hydroxyalkyl, $C_{1-6}$ alkylcarboxylic acids, $C_{1-6}$ alkylketones, $C_{1-6}$ alkyl amines, $C_{1-6}$ alkylamides, $C_{1-6}$ carboxylate ions, and $C_{1-6}$ alkylammonium ions, wherein, in the final polymer, at least two of $R_1$ to $R_4$ are covalent linkages to a strong electron donating subunit, and wherein the strong electron donating subunit has at least one of:

(a) a general structural formula I or a general structural formula II, wherein the general structural formula I is as follows:

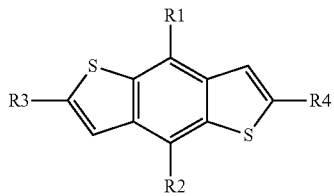

wherein the general structural formula II is as follows:

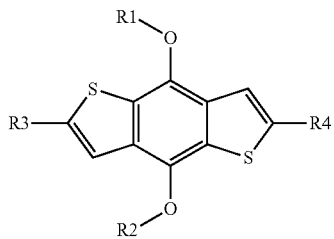

wherein in each of the general structural formula I and the general structural formula II, each $R_1$ and $R_2$ is same or different from one another and selected from the group consisting of hydrogen, straight or branched chain $C_{1-20}$ alkyl, $C_{2-20}$ alkenyl, $C_{2-20}$ alkynyl, oligoethylene glycols, thiophene, benzene, and furan, and each of the $R_3$ and $R_4$ groups is same or different from one another and selected from the group consisting of hydrogen, straight or branched chain $C_{1-20}$ alkyl, $C_{2-20}$ alkenyl, $C_{2-20}$ alkynyl, $C_{1-20}$ alkoxy, boronic acids, boronic esters, and $Sn(R_5)_3$, and wherein $R_5$ is selected from the group consisting of $C_{1-10}$ alkyl, (b) a general structural formula III which is as follows:

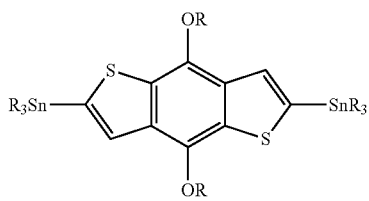

wherein in the general structural formula III, "R" is the same as defined for $R_1$ and $R_2$ in accordance with general structure II above and $SnR_3$ is an organo-tin compound, wherein $R_3$ represents three (3) "R" substituents selected from the group consisting of $C_{1-10}$ alkyl, an oligoethylene glycol, a beryllium, magnesium, calcium, strontium or barium hydroxide, sulfate, or carbonate, a $C_{1-6}$ alcohol, a $C_{1-6}$ carboxylic acid, a $C_{1-6}$ ketone, a $C_{1-6}$ amines, a $C_{1-6}$ amide, a $C_{1-6}$ carboxylate ion, and a $C_{1-6}$ ammonium ion, or (c) a general structural formula IV which is as follows:

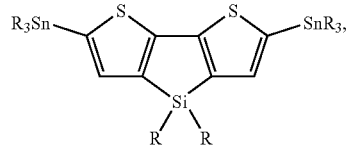

wherein in the general structural formula IV, "R" is the same as defined for $R_1$ and $R_2$ in accordance with the general structure I and $SnR_3$ is an organotin compound, wherein $R_3$ represents three (3) "R" substituents selected from the group consisting of $C_{1-10}$ alkyl, an oligoethylene glycol, a beryllium, magnesium, calcium, strontium or barium hydroxide, sulfate, or carbonate, a $C_{1-6}$ alcohol, a $C_{1-6}$ carboxylic acid, a $C_{1-6}$ ketone, a $C_{1-6}$ amines, a $C_{1-6}$ amide, a $C_{1-6}$ carboxylate ion, and a $C_{1-6}$ ammonium ion, wherein, in the final polymer, the strong electron donating subunits of the structural formulas I-IV are covalently linked to strong electron accepting subunits via covalent linkages at at least one of any of the unsubstituted positions on the structural formulas I-IV or through one or more of $R_1$ to $R_4$ in the structural formulas I-IV, and wherein one or more $R_1$ to $R_4$ in the strong electron donating subunit represents hydrogen, and in the final polymer, one or more of $R_1$ to $R_4$ represents a covalent linkage to a strong electron accepting subunit.

2. A polymer according to claim 1, further comprising at least one spacer between the electron donating subunits and the electron accepting subunit.

3. A polymer according to claim 2, wherein the polymer has the formula [SD-SP-SA]n, wherein SP is a spacer.

4. A polymer according to claim 3, wherein the polymer has the formula [SD-SP-SA-SP]n.

5. A polymer according to claim 3, wherein the spacer is at least one monomer containing at least one or more pi bonds.

6. A polymer having the formula:

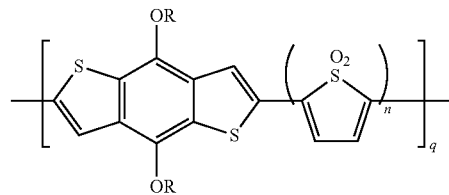

PBDTTDOn wherein "n" is a positive integer, "q" is a positive integer, and "R" may he the same or different and may be selected from: hydrogen, straight or branched chain alkyl of $C_{1-20}$, alkenyl, alkynyl, oligoethylene glycols, and aromatic rings.

7. A polymer according to claim 6, wherein n is 1.

8. A polymer according to claim 6, wherein q is greater than or equal to 2.

9. A polymer having the formula:

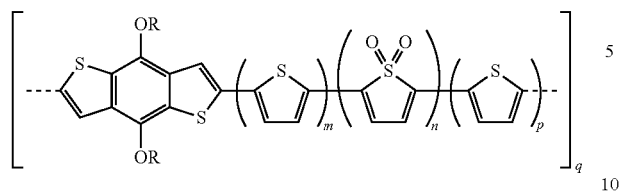

wherein "m" is a positive integer, "n" is a positive integer, "p" is a positive integer, "q" is a positive integer, and "R" may be the same or different and may be selected from: hydrogen, straight or branched chain alkyl of $C_{1-20}$, alkenyl, alkynyl, oligoethylene glycols, and aromatic rings.

10. A polymer according to claim 9, wherein m is 1.
11. A polymer according to claim 9, wherein n is 1.
12. A polymer according to claim 9, wherein p is 1.
13. A polymer according to claim 9, wherein q is greater than or equal to 2.
14. A photovoltaic device comprising a multi-functional layer comprising the polymer of claim: 1.

* * * * *